US011049962B2

(12) United States Patent
Sundaresan et al.

(10) Patent No.: US 11,049,962 B2
(45) Date of Patent: Jun. 29, 2021

(54) SILICON CARBIDE POWER DEVICES

(71) Applicant: GeneSiC Semiconductor Inc., Dulles, VA (US)

(72) Inventors: Siddarth Sundaresan, Dulles, VA (US); Ranbir Singh, Dulles, VA (US); Jaehoon Park, Dulles, VA (US)

(73) Assignee: GeneSiC Semiconductor Inc., Dulles, VA (US)

( * ) Notice: Subject to any disclaimer, the term of this patent is extended or adjusted under 35 U.S.C. 154(b) by 0 days.

(21) Appl. No.: 16/741,800

(22) Filed: Jan. 14, 2020

(65) Prior Publication Data

US 2021/0134998 A1    May 6, 2021

Related U.S. Application Data

(63) Continuation of application No. 16/670,963, filed on Oct. 31, 2019.

(51) Int. Cl.
*H01L 29/16* (2006.01)
*H01L 29/78* (2006.01)
*H01L 29/08* (2006.01)

(52) U.S. Cl.
CPC ...... *H01L 29/7802* (2013.01); *H01L 29/0865* (2013.01); *H01L 29/1608* (2013.01)

(58) Field of Classification Search
CPC ............ H01L 29/0863; H01L 29/1095; H01L 29/1608; H01L 29/7813; H01L 29/7801; H01L 29/7802; H01L 29/7835; H01L 29/14766
See application file for complete search history.

(56) References Cited

U.S. PATENT DOCUMENTS

2013/0313576 A1* 11/2013 Nakano .............. H01L 29/1608
                                                257/77
2020/0295139 A1* 9/2020 Sundaresan ......... H01L 29/1608

* cited by examiner

*Primary Examiner* — Cuong Q Nguyen
(74) *Attorney, Agent, or Firm* — Dave Law Group LLC; Raj S. Dave

(57) ABSTRACT

An embodiment relates to a device comprising a unit cell on a SiC substrate, the unit cell comprising a gate insulator film, a trench in the well region, and a first sinker region of a second conduction type, wherein the first sinker region has a depth that is equal to or greater than a depth of a well region; wherein the device has an on-resistance of less than 3 milliohm-cm$^2$, a gate threshold voltage of greater than 2.8V, a breakdown voltage of greater than 1450V, and an electric field of less than 3.5 megavolt/cm in the gate insulator film at a drain voltage of less than or equal to 1200 V.

19 Claims, 114 Drawing Sheets

5-kV Shielded 4H-SiC Inversion-Mode MOSFET Structure

P-type Implant
↓ ↓ ↓ ↓ ↓ ↓ ↓ ↓ ↓ ↓ ↓ ↓ ↓ ↓ ↓  A804 p-type Implant p-type implant n-type Implant

SILICON CARBIDE POWER DEVICES

RELATED APPLICATIONS

This is a continuation application of U.S. patent application Ser. No. 16/670,963 filed on Oct. 31, 2019, entitled as "SILICON CARBIDE POWER DEVICES." This application claims priority from the above-mentioned application and the disclosure of the above-mentioned application is herein incorporated by reference in its entirety.

FIELD OF THE INVENTION

This invention relates to power semiconductor devices using a vertical silicon carbide (SiC) Double-Implantation Metal oxide semiconductor field-effect transistor (DMOSFET). A power metal oxide semiconductor field-effect transistor (MOSFET) is a specific type of MOSFET designed to handle significant power levels.

BACKGROUND OF INVENTION

Silicon based power devices have long dominated power electronics and power system applications. On the other hand, SiC is a wider band-gap (Eg) material with Eg=3.3 eV as compared to silicon (Eg=1.1 eV); therefore, SiC has a higher blocking voltage than Si. SiC has a higher breakdown electric field ($3 \times 10^6$ V/cm to $5 \times 10^6$ V/cm) compared to Si (breakdown electric field for Si is $0.3 \times 10^6$ V/cm) and is a better thermal conductor (3.7 (W/cm-K) for SiC versus 1.6 (W/cm-K) for Si). SiC has been a material of choice for power MOSFETs. However, "[e]ven with the successful introduction of SiC power MOSFETs into the commercial market place, several key reliability issues have not been fully resolved." [Source: Key Reliability Issues for SiC Power MOSFETs, A. Lelis, D. Habersat, R. Green, and E. Mooro of the U.S. Army Research Laboratory, published in ECS Transactions, 58 (4) 87-93 (2013), DOI: 10.1149/05804.0087ecst].

SiC exists in a kind of polymorphic crystalline building known as a polytype, e.g. 3C-SiC, 4H-SiC, 6H-SiC. FIG. 1a is the prior art SiC DMOSFET structure reported by B. J. Baliga in Advanced High-Voltage Power Device Concepts (Springer Press, 2011). FIG. 1b shows the electric field contours simulated for the prior art SiC DMOSFET structure of FIG. 1a. The electric field distribution near the surface of the 5-kV shielded 4H-SiC inversion-mode power MOSFET structure is shown in FIG. 1b to allow examination of the electric field in the junction gate field-effect transistor (JFET) region and the gate region. The sharp peak of the electric field at the edge of the P+ shielding region can be observed in this prior art device which will result in a high electric field in the gate oxide, thereby resulting in a poor performance of this MOSFET device. FIG. 1c shows the electric field distribution in the shielded 4H-SiC inversion-mode MOSFET. The simulated results in the figure show an electric field as high as 4 MV/cm in the gate oxide for the prior art SiC DMOSFET structure of FIG. 1a.

A typical SiC MOSFET device structure such as that shown in FIG. 1a results in high electric field concentration at the corner of the p-well region, which results in a high electric field in the gate oxide layer, especially during high drain bias (blocking mode) operation. The high critical electric fields for breakdown in 4H-SiC 3 MV/cm) results in a very high (>5 MV/cm) electric field in the gate oxide. Fowler-Nordheim tunneling currents are observed at such high electric fields in the gate oxide, which can result in trapped charge in the gate oxide, which leads to poor device reliability.

The manufacturing processes for Si uses techniques like diffusion of dopants but these conventional manufacturing processes are not possible for making SiC device because the diffusion coefficients in SiC are negligible at temperatures below 1800° C. SiC devices are manufactured by ion implantation of both source and p-well regions but ion implantation and deep ion implantation is difficult in SiC. Therefore, there is a long-felt need for improved power devices that address the reliability issues for SiC power MOSFETs.

Due to the limited (10-25 cm2/Vs) MOS channel mobility achievable on the state-of-the-art SiC planar DMOSFETs, it is necessary to form MOS channels with sub-micron channel lengths so that the overall ON resistance of the power MOSFET is not significantly degraded. "[I]f the p-well regions and N+ source regions were formed using different masks, the misalignment of two masks would result in a different channel length on each side of the cell. To avoid the decrease of threshold voltage (Vth) and degrade the breakdown voltage (Vbr), the N+ mask is in a self-aligned fashion with respect to the P-well." [source: Design and Fabrication of 1.2 kV 4H-SiC DMOSFET by R. Huang et al. published in 2016 13th China International Forum on Solid State Lighting: International Forum on Wide Bandgap Semiconductors China (SSLChina: IFWS)]. The MOSFET channel region is formed as a result of the offset between the p-well and the N+ source regions in a DMOSFET structure. If the p-well and N+ source regions are formed by two separate masking steps, there will inevitably be a certain amount of lithographic misalignment between these levels, resulting in different (or asymmetric) MOS channel lengths on the two sides of the unit cell. The lithographic misalignment between two masking levels using projection lithography techniques typically used in high-volume semiconductor manufacturing can range from +/−0.05 μm to +/−0.2 μm or greater, which sets a lower limit on the practically realizable MOS channel lengths without significant asymmetry. For a target channel length of 0.5 μm, a +/−0.2 μm mis-alignment between the N+ source and p-well masking steps can result in a MOS channel length of 0.3 μm on one side of the unit cell and a MOS channel length of 0.7 μm on the other side of the unit cell. While the ON resistance of the MOSFET is increased at higher MOS channel lengths, lower than optimal MOS channel lengths can result in undesirable effects such as gate threshold voltage (Vth) degradation and other short-channel effects such as drain-induced barrier lowering (DIBL).

Self-aligned techniques for eliminating the misalignment between p-well and N+ source regions have been proposed in the literature. Self-aligned MOS channel formation with channel length defined by sidewall spacer deposition and etching is one such technique. FIG. 2 is the prior art process flow of self-aligned implantation technique with channel length defined by sidewall spacer deposition and etching as reported by R. Huang et al. in "Design and Fabrication of 1.2 kV 4H-SiC DMOSFET".

Additionally, the "[t]hreshold voltage of the power MOSFET is an important design parameter from an application stand-point. A minimum threshold voltage must be maintained at above 1 volt for most system applications to provide immunity against turn-on due to voltage spikes arising from noise. At the same time, a high threshold voltage is not desirable because the voltage available for creating the charge in the channel inversion layer is determined by ($V_G$-$V_T$) where $V_G$ is the applied gate bias and $V_T$ is the threshold voltage." [source: B. J. Baliga, Silicon Carbide Power Devices, Springer Press (2005), Page 234]

FIG. 3 [source: B. J. Baliga, Silicon Carbide Power Devices, Springer Press (2005), Page 235] shows the threshold voltage of 4H-SiC planar MOSFETSs for the case of a gate oxide thickness of 0.1 microns. The results obtained for a silicon power MOSFET with the same gate oxide thickness is also provided in the figure for comparison.

In the race to achieve lower $R_{DS,ON}$ of planar gate SiC MOSFETs with high breakdown voltage ratings, it is a common practice to make the channel lengths ($L_{CH}$) as short as possible which reduces a great part of the conduction loss that is associated to the channel. The trade-off in doing so is that, as the channel lengths are becoming shorter, the MOSFET devices become susceptible to undesirable phenomena such as the DIBL effect (the Drain Induced Barrier Lowering effect) which is responsible for the poor device performance including but not limited to the roll-off of the threshold voltage (VTH) at high drain bias and the increase of the drain leakage (IL) at high drain bias. A conventional approach to mitigate this problem is to uniformly increase the doping concentration in the channel region, but this approach suffers from a higher than optimal gate threshold voltage and on-resistance, which can offset the gains achieved from the channel length reduction.

SUMMARY OF INVENTION

An embodiment relates to a device comprising a unit cell on a SiC substrate, the unit cell comprising a gate insulator film, and a first sinker region of a second conduction type, wherein the first sinker region has a depth that is equal to or greater than a depth of a well region; wherein the device has an on-resistance of less than 3 milliohm-cm$^2$, a gate threshold voltage of greater than 2.8V, a breakdown voltage of greater than 1450V, and an electric field of less than 3.5 megavolt/cm in the gate insulator film at a drain voltage of less than or equal to 1200 V.

Other embodiments relate to the following: wherein the device comprises a semiconductor metal-insulator-semiconductor transistor component; wherein the unit cell further comprises a semiconductor body of a first conduction type that comprises a drift zone; the well region of the second conduction type next to an insulator-semiconductor interface; and a source region of a first conduction type formed within the well region; wherein the device further comprises a trench in the well region; wherein a depth of the trench is greater than or equal to a thickness of the source region; wherein the first sinker region is located below the trench; wherein the device further comprises a second sinker region of the second conduction type; wherein a depth of the second sinker region is less than a depth of the first sinker region; and wherein a depth of the second sinker region is greater than a depth of the well region.

Another embodiment relates to a device comprising a unit cell on a SiC substrate, the unit cell comprising a well region, a source region, and a trench, wherein a depth of the trench is greater than a depth of the source region; wherein the device has an avalanche energy of greater than 15 J/cm$^2$, calculated by dividing an avalanche energy in joules by a total die area in cm$^2$.

Other embodiments relate to the following: wherein the unit cell further comprises a first sinker region of a second conductivity type, wherein an avalanche failure is located within the unit cell.

Another embodiment relates to a device comprising silicon carbide, the device having a second conductivity type shield region that is outside a junction field-effect transistor region, wherein a doping concentration in a second conductivity type well region within a MOSFET channel is non-uniform, wherein the device has a gate threshold voltage of greater than 3.8 V, a breakdown voltage of greater than 4100 Volt, an on-resistance of less than 12 milliohm-cm$^2$, an electric field of less than 3.5 megavolt/cm at less than or equal to a drain voltage of 3500 Volt, and a short-circuit withstand time of greater than 6 μs at a drain voltage of 1500 Volt.

Other embodiments relate to the following: wherein the second conductivity type shield region is located inside the second conductivity type well region in a manner that a lateral location of a point having a higher doping concentration than that of an average background doping concentration of the second conductivity type well region is positioned within the second conductivity type well region; wherein the second conductivity type shield region extends beyond the second conductivity type well region; wherein the second conductivity type shield region extends beyond a vertical extent of the second conductivity type well region; wherein the device comprises multiple second conductivity type shield regions; wherein doping concentration profiles of the second conductivity type shield region in different regions are different; and wherein doping concentration profiles of the second conductivity type shield region in different regions are not substantially different.

BRIEF DESCRIPTION OF THE FIGURES

The patent or application file contains at least one drawing executed in color. Copies of this patent or patent application publication with color drawing(s) will be provided by the Office upon request and payment of the necessary fee.

FIG. 1b shows the electric field contours simulated for the prior art SiC DMOSFET structure in FIG. 1a.

FIG. 1c shows the electric field distribution for the prior art SiC DMOSFET structure in FIG. 1a.

FIG. 4b shows the breakdown simulation of the SiC DMOSFET structure in FIG. 4a.

FIG. 7b shows the breakdown simulation of the SiC DMOSFET structure designed according to embodiments shown in FIG. 5 and FIG. 7a.

FIG. 8a to FIG. 8j are cross sectional views showing the process steps for manufacturing the SiC DMOSFET structure in FIG. 7a.

FIG. 9b shows the breakdown simulation of the SiC MOSFET structure in FIG. 9a.

FIG. 10a to FIG. 10bb are cross sectional views showing the process steps for manufacturing the SiC DMOSFET structure in FIG. 9a.

FIG. 24a to FIG. 24u are cross sectional views showing the process steps for manufacturing the SiC DMOSFET structure in FIG. 24a.

FIG. 26a to FIG. 26u are cross sectional views showing the process steps for manufacturing the SiC DMOSFET structure in FIG. 25a.

DETAILED DESCRIPTION

Definitions and General Techniques

Figure 1A:
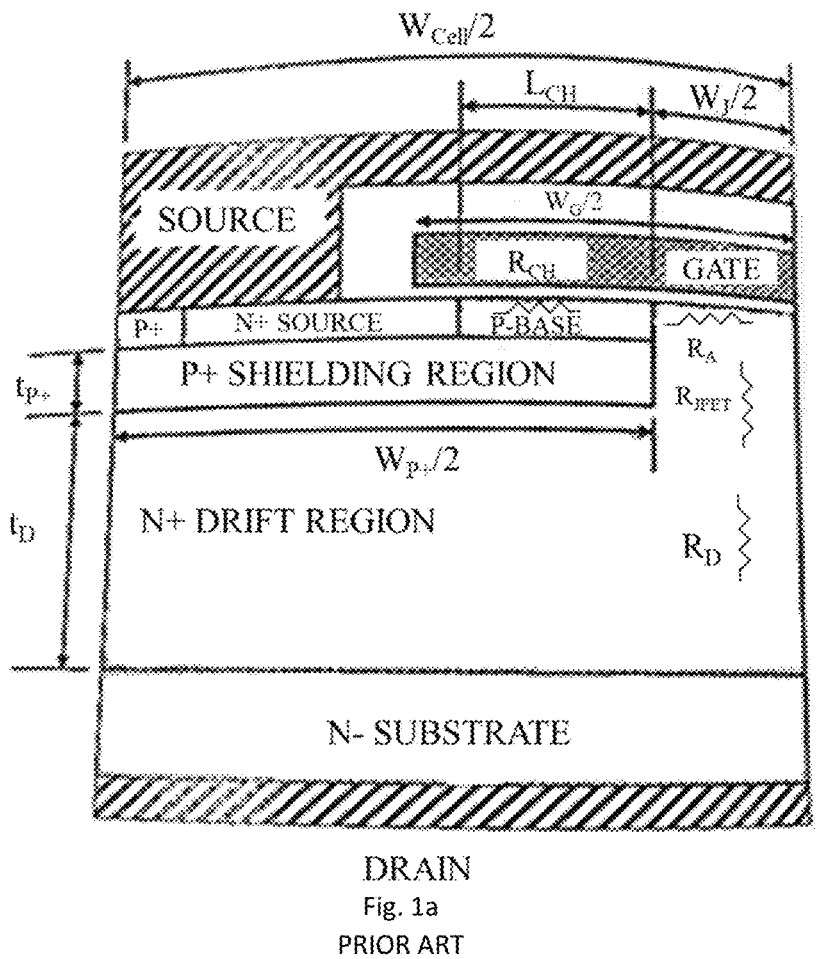
FIG. 1a shows the prior art SiC DMOSFET structure reported by B. J. Baliga in Advanced High-Voltage Power Device Concepts, Springer Press, 2011.
Figure 1B:
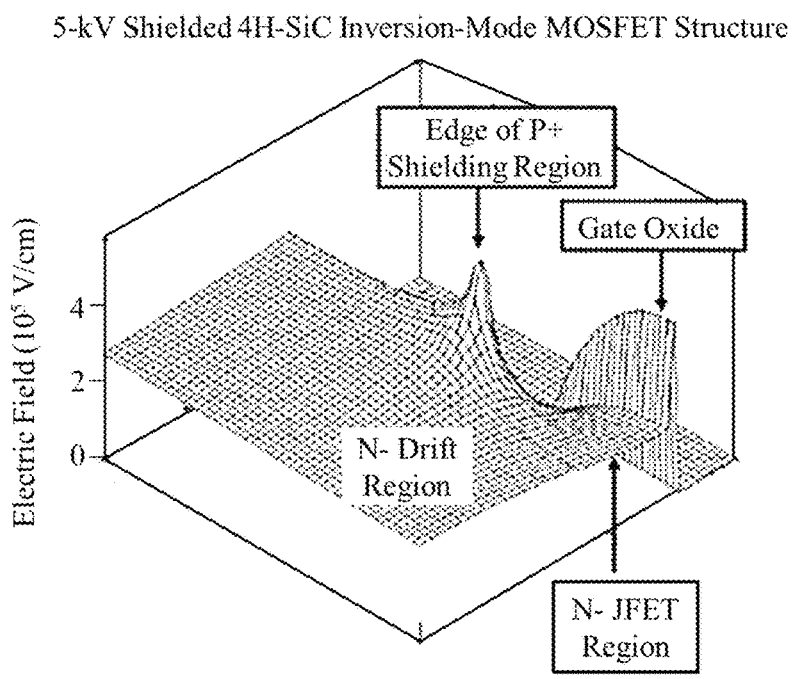
Figure 1C:
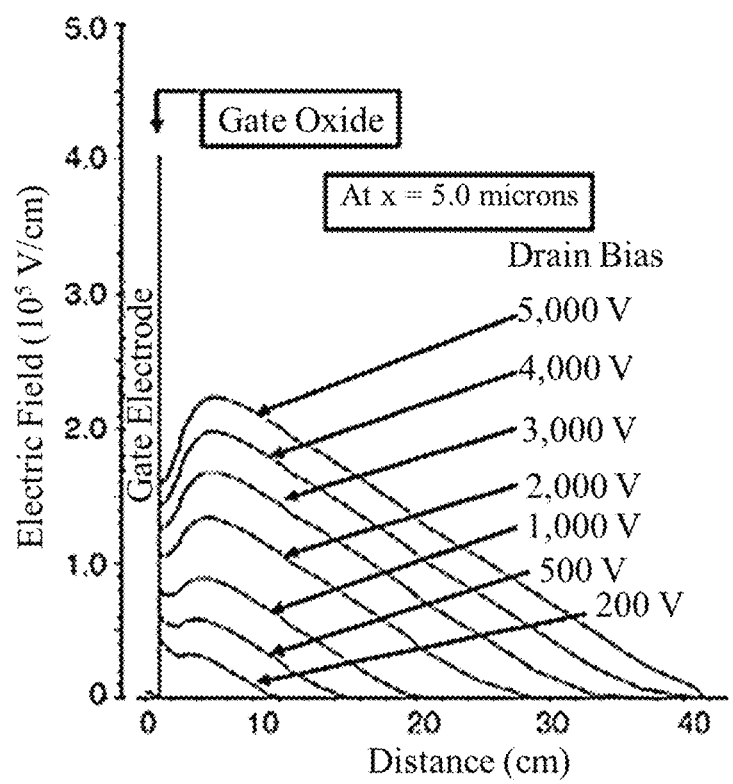

Unless otherwise defined herein, scientific and technical terms used in connection with the present invention shall have the meanings that are commonly understood by those of ordinary skill in the art. Further, unless otherwise required by context, singular terms shall include pluralities and plural terms shall include the singular. Generally, nomenclatures used in connection with, and techniques of, semiconductor processing described herein are those well-known and commonly used in the art.

The methods and techniques of the present invention are generally performed according to conventional methods well known in the art and as described in various general and more specific references that are cited and discussed throughout the present specification unless otherwise indicated. The nomenclatures used in connection with, and the procedures and techniques of semiconductor device technology, semiconductor processing, and other related fields described herein are those well-known and commonly used in the art.

The following terms and phrases, unless otherwise indicated, shall be understood to have the following meanings.

The term "unit cell" as used herein refers to a piece of a pattern in a semiconductor which is repeated in the semiconductor.

The term "SiC" as used herein refers to silicon carbide which is a compound semiconductor and is a mixture of silicon and carbon with the chemical formula SiC. Silicon is covalently bonded with carbon. In 4H-SiC, 4H is written in the Ramsdell classification scheme where the number indicates the layer and the letter indicates the Bravais lattice. That means in a 4H-SiC structure four hexagonal layers of SiC are present. SiC exists in a kind of polymorphic crystalline building known as a polytype, e.g. 3C-SiC, 4H-SiC, 6H-SiC. Presently 4H-SiC is used in power device manufacturing.

The term "JFET" as used herein refers to junction field-effect transistor which is a three-terminal semiconductor device that can be used as electronically-controlled switches, amplifiers, or voltage-controlled resistors. A FET (field-effect transistor) is a unipolar transistor in which current carriers are injected at a source terminal and pass to a drain terminal through a channel of semiconductor material whose conductivity depends largely on an electric field applied to the semiconductor from a control electrode. There are two main types of FETs, a junction FET and an insulated-gate FET. In the junction FET, the gate is isolated from the channel by a pn-junction. In an insulated-gate FET, the gate is isolated from the channel by an insulating layer so that the gate and channel form a capacitor with the insulating layer as the capacitor dielectric.

The term "MOSFET" as used herein refers to metal oxide semiconductor field-effect transistor. which is a four terminal device with source (S), gate (G), drain (D) and body (B) terminals. The body of the MOSFET is frequently connected to the source terminal so making it a three terminal device like field effect transistor.

The term "DMOSFET" as used herein refers to double-implantation metal oxide semiconductor field-effect transistor. A common physical structure of SiC MOSFETs is the planar double-implanted MOSFET in 4H-SiC (SiC-DMOSFET).

The term "dopant" as used herein refers to an impurity added from an external source to a material by diffusion, coating, or implanting into a substrate, and changing the properties thereof. In semiconductor technology, an impurity may be added to a semiconductor to modify its electrical properties or to a material to produce a semiconductor having desired electrical properties. N-type (negative) dopants (e.g., such as phosphorus for a group IV semiconductor) typically come from group V of the periodic table. When added to a semiconductor, n-type dopants create a material that contains conduction electrons. P-type (positive) dopants (e.g., such as boron for a group IV semiconductor) typically come from group III and result in conduction holes (i.e., vacancies in the electron shells).

The term "drain" as used herein refers to the electrode of a field effect transistor which receives charge carriers which pass through the transistor channel from the source electrode.

The term "source" as used herein refers to the active region/electrode to which the source of charge carriers is connected in a field effect transistor.

The term "gate" as used herein refers to the control electrode or control region that exerts an effect on a semiconductor region directly associated therewith, such that the conductivity characteristic of the semiconductor region is altered in a temporary manner, often resulting in an on-off type switching action. The control electrode or control region of a field effect transistor is located between the source and drain electrodes, and regions thereof.

The term "impurity" as used herein refers to a foreign material present in a semiconductor crystal, such as boron or arsenic in silicon, which is added to the semiconductor to produce either p-type or n-type semiconductor material, or to otherwise result in material whose electrical characteristics depend on the impurity dopant atoms.

The term "PN junction" as used herein refers to the interface and region of transition between p-type and n-type semiconductors.

The term "polysilicon" as used herein refers to a polycrystalline form of silicon.

The term "p-type" as used herein refers to extrinsic semiconductor in which the hole density exceeds the conduction electron density.

The term "bandgap" as used herein refers to the difference between the energy levels of electrons bound to their nuclei (valence electrons) and the energy levels that allow electrons to migrate freely (conduction electrons). The band gap depends on the particular semiconductor involved.

The term "breakdown" as used herein refers to a sudden change from high dynamic electrical resistance to a very low dynamic resistance in a reverse biased semiconductor device (e.g., a reverse biased junction between p-type and n-type semiconductor materials) wherein reverse current increases rapidly for a small increase in reverse applied voltage, and the device behaves as if it had negative electrical resistance.

The term "channel" as used herein refers to a path for conducting current between a source and drain of a field effect transistor.

The term "chip" as used herein refers to a single crystal substrate of semiconductor material on which one or more active or passive solid-state electronic devices are formed. A chip may contain an integrated circuit. A chip is not normally ready for use until packaged and provided with external connectors.

The term "contact" as used herein refers to the point or part of a conductor which touches another electrical conductor or electrical component to carry electrical current to or from the conductor or electrical component.

The term "die" as used herein refers to a tiny piece of semiconductor material, separated from a semiconductor slice, on which one or more active electronic components are formed. It is sometimes called a chip.

The term "sinker" as used herein refers to deep implanted regions at key locations within the DMOSFET structure The term "plug" as used herein refers to the structure used to ground the well and the source contact.

The term "drift layer" as used herein refers to lightly doped region to support the high voltage in power MOSFET The term "well" used herein refers certain regions in a metal-oxide-semiconductor (MOS) transistor. MOS transistors are always created in a "well" region. A PMOS (positive-channel MOS) transistor is made in an N-doped region, called "n-well" region. Similarly, an NMOS transistor (negative-channel MOS) is made in a "p-type" region called "p-well". This ensures that the leakage between two transistors, through the bottom side, is low due to the reverse bias between the transistor areas and the well region.

The term "source interconnect metallization" as used herein refers to interconnection metallization that interconnects many MOSFETs using fine-line metal patterns.

The term "self-aligned" used herein refers to processing steps in manufacturing of semiconductor devices. It is often necessary to achieve precise alignment between structures fabricated at different lithographic stages of integrated circuit fabrication. Stringent requirements on lithographic alignment tolerance can be relaxed if the structures are "self-aligned" which means one is forced into a specific position relative to the other for a wide range of lithographically defined positions.

The term "device" as used herein refers to the physical realization of an individual electrical element in a physically independent body which cannot be further divided without destroying its stated function.

The term "surface" as used herein refers to the outer or exterior boundary of a thing.

The term "trench" as used herein refers to electrical isolation of electronic components in a monolithic integrated circuit by the use of grooves or other indentations in the surface of the substrate, which may or may not be filled with electrically insulative (i.e., dielectric) material.

The term "dielectric" as used herein refers to a nonconductor of electricity, otherwise known as an insulator.

The term "mobility" as used herein refers to the facility with which carriers move through a semiconductor when subjected to an applied electric field. Electrons and holes typically have different mobilities in the same semiconductor.

The term "RIE" as used herein refers to reactive ion etching which is an etching technology used in microfabrication. RIE is a type of dry etching which has different characteristics than wet etching. RIE uses chemically reactive plasma to remove material deposited on wafers. The plasma is generated under low pressure (vacuum) by an electromagnetic field. High-energy ions from the plasma attack the wafer surface and react with it.

The term "ILD" as used herein refers to interlayer dielectric a dielectric material used to electrically separate closely spaced interconnect lines arranged in several levels (multi-level metallization) in an advanced integrated circuit.

The term "CVD" as used herein refers to chemical vapor deposition is method used to produce high quality, high-performance, solid materials, typically under vacuum. The process is often used in the semiconductor industry to produce thin films. In typical CVD, the wafer (substrate) is exposed to one or more volatile precursors, which react and/or decompose on the substrate surface to produce the desired deposit. Frequently, volatile by-products are also produced, which are removed by gas flow through the reaction chamber.

The term "PECVD" as used herein refers to plasma-enhanced chemical vapor deposition process used to deposit thin films from a gas state (vapor) to a solid state on a substrate. Chemical reactions are involved in the process, which occur after creation of a plasma of the reacting gases.

The term "LPCVD" as used herein refers to low pressure chemical vapor deposition technology that uses heat to initiate a reaction of a precursor gas on the solid substrate. This reaction at the surface is what forms the solid phase material.

The term "DIBL" as used herein refers to drain induced barrier lowering and is a short-channel effect in MOSFETs referring originally to a reduction of threshold voltage of the transistor at higher drain voltages. In a classic planar field-effect transistor with a long channel, the bottleneck in channel formation occurs far enough from the drain contact that it is electrostatically shielded from the drain by the combination of the substrate and gate, and so classically the threshold voltage was independent of drain voltage. In short-channel devices this is no longer true: The drain is close enough to gate the channel, and so a high drain voltage can open the bottleneck and turn on the transistor prematurely.

The term "p-shield" as used herein refers to a carefully designed p-type doped region strategically located close to or within the MOSFET channel region, with the objective of shielding the MOSFET channel from the high potential applied to the drain terminal during off-state or blocking operation.

The term "avalanche failure" as used herein refers a phenomenon that can occur in both insulating and semiconducting materials. It is a form of electric current multiplication that can allow very large currents within materials which are otherwise good insulators. It is a type of electron avalanche. The avalanche process occurs when carriers in the transition region are accelerated by the electric field to energies sufficient to create mobile or free electron-hole pairs via collisions with bound electrons. The voltage at which the breakdown occurs is called the breakdown voltage. Avalanche failure can cause structural damage to a semiconductor device.

The term "avalanche energy" as used herein is defined as the amount of energy the MOSFET can withstand when it is set into avalanche mode or its breakdown voltage is exceeded.

The terms "first conductivity type region" and "second conductivity type region" as used herein, are used to describe n-type and p-type regions respectively for a N type device. For a P type device "first conductivity type region" and "second conductivity type region" are used to describe p-type and n-type regions respectively.

Embodiments relate to SiC DMOSFET power devices where the p-well regions effectively shield the sensitive gate oxide from the high electric fields present in SiC especially during high drain bias or blocking mode operation.

An embodiment relates to using a P+-plug to ground the p-well region with the N+ source contact.

An embodiment relates to making the lateral spacing between the p-well regions narrow enough to suppress the electric field in the gate oxide while ensuring the ON-resistance is not high.

An embodiment relates to replacing the P+ plug region of the DMOSFET with a deep P-type Sinker #1 region.

Embodiments relate to formation of one or more deep implanted sinker regions at certain locations within the MOSFET device structure such as a first P-type sinker region at the center of the MOSFET unit cell whose depth may be equal to or greater than the depth of the p-well region.

Embodiment relates to forming a second P-type sinker region under the N+ source region, whose depth may be equal to or greater than the p-well region, but less than or equal to the depth of the first P-type sinker region.

Embodiment relates to boron implantation which may be advantageously used for forming the deep sinker regions since boron has a larger implant range than aluminum that can result in deeper implant profiles Embodiment relates to the formation of a first trench with desired shape which may be etched in the N+ source region, prior to the formation of the first P-type sinker region, which may serve to increase the depth of the first P-type sinker region. The depth of the first trench may range from 0.01 µm up to 2 µm. The depth of the resulting first sinker region may be 0% to 100% larger than the depth of the p-well region. The depth of the first P-type sinker region can be as large as the entire epitaxial layer.

Embodiment relating to the formation of the first trench in the N+ source region may reduce or eliminate the need of expensive ultra-high energy implantation steps for forming the first P-type sinker region.

Embodiment relating to the first trench may be advantageously used to remove the N+ source implant from the first P-type sinker region, which may be desirable to prevent compensation of the first P-type sinker region by the N+ source implant. This is especially useful, if the N+ source region is self-aligned to the p-well region.

Embodiment relates to a gradually decreasing implant concentration which may be employed for forming the first and second P-type sinker regions in lieu of a box-shaped implant profile, as this may be advantageous in appropriately shaping the electric field under high drain bias. The doping in the P-type sinker regions may be varied linearly from a maximum value close to the SiC surface to a value equal to or slightly higher than the drift layer doping concentration at the other end of the P-type sinker regions.

Embodiment of a design of the first and second sinker regions may simplify the design of the p-well region, which can be designed to support metal-oxide-semiconductor (MOS) channel formation and may be advantageously designed for achieving low on-resistance, without compromising other performance metrics, such as reverse leakage current and electric field in gate oxide.

SiC devices in power electronics feature fast switching times, high blocking voltage capabilities, and the ability to operate at high temperatures. These characteristics, along with recent advancements in manufacturing processes, suggest that SiC has the potential to revolutionize power electronics as a successor to traditional silicon-based (Si) devices. SiC is a wide band gap material (3.3 eV) and has higher breakdown electric field ($3 \times 10^6$ V/cm to $5 \times 10^6$ V/cm) compared to Si (Si band gap is 1.1 eV and breakdown electric field for Si is $0.3 \times 10^6$ V/cm). SiC is a better thermal conductor (3.7 (W/cm-K) for SiC versus 1.6 (W/cm-K) for Si) which enables SiC devices to operate at extremely high-power levels and still dissipate the large amounts of excess heat generated. These material properties of SiC offer multiple advantages of using SiC instead of Si on power devices. In a comparison of SiC and Si semiconductor die with identical structures and dimensions, the SiC die exhibit a lower specific ON resistance and a higher breakdown voltage than the Si die.

The disclosed embodiments herein provide novel techniques for SiC DMOSFET design and fabrication for shaping of the electric field over the device structure and reducing concentration of electric fields at singular points. The embodiments herein reduce the electric field in the gate oxide region to less than 3.5 MV/cm and improve the device reliability.

The manufacturing process in Si uses techniques like diffusion of dopants but these conventional manufacturing processes are not possible for making SiC device because the diffusion coefficients in SiC are negligible at temperatures below 1800° C. SiC devices are manufactured by ion implantation of both source and p-well regions but ion implantation and especially deep ion implantation is difficult in SiC. In the embodiments herein, the ion implantation of source and p-well regions are made deep with novel techniques.

The increased reliability, higher operating temperature, increased efficiency, higher voltage capabilities of the SiC devices of the embodiments herein as compared to the silicon devices make them highly desirable in the electric vehicle and renewable energy industries. Traction inverters in electric vehicles are subjected to high thermal (>150° C.) and load cycling and renewable energy converters are subjected to extreme environmental conditions. The embodiments described herein for the SiC devices maximize power conversion efficiency to >98% for example while providing high reliability thus making it an ideal candidate for electric vehicles to minimize maintenance and downtime, which is expensive for the operators of the electric vehicles.

The disclosed embodiments change the way in which SiC power DMOSFET devices can effectively shield the sensitive gate oxide from the high electric fields present in 4H-SiC especially during high drain bias (blocking mode operation).

In embodiments herein, SiC power DMOSFET devices overcome the trade-off between achieving a low ON resistance and achieving a robust blocking performance, which implies a low electric field in the structure close to a gate oxide.

Embodiments herein include a unit cell of a SiC power DMOSFET comprising a vertical MOSFET. Certain regions of the SiC power DMOSFET device are a p-well region, which is formed by an implantation, an N+ source region, a N− drift layer, and an N+ substrate. In the embodiment herein, during the ON state the current flows vertically from the drain, through the inversion layer which is formed at the top of the p-well layer, when a gate voltage is applied to this device in through the N+ source region and out through the source metallization. In the OFF state or the blocking state, in the embodiments herein a voltage is supported across the p-well and N− drift layer junction. There is a PN junction which is formed between the p-well and the N drift layer. The voltage applied to the structure is supported across this PN junction in the reverse bias.

In the embodiments herein, a power MOSFET has several physical dimensions, including: the pitch of the unit cell, which is the repeat unit for the MOSFET; the channel length, which is the portion of the p-well in which the inversion channels is formed; the distance between two successive p-wells, referred to as the junction field-effect transistor (JFET) region or the JFET gap; the thickness of the gate oxide; and an inter-layer dielectric (ILD) layer, which is used to insulate the source interconnect metallization from the poly-silicon gate.

In the embodiments herein, the advantage of using SiC over Si is that for similar chip sizes, SiC can support much higher power density. The amount of voltage one can support in SiC can be ten times more than in Si, and the current that the SiC chip can carry through the MOSFET can be 10 to 50 times more than in Si. SiC MOSFETs form convenient switch, because one can achieve much higher power density. The performance advantage relates to the trade-off between voltage and current. Voltage blocking and current conduction capability, is about 200 times better in the case of SiC as compared to Si.

In the embodiment herein, the P+ plug, which is in the center of the SiC DMOSFET unit cell, is replaced by the PS #1 region. In the embodiment the PS #1 region extends below the p-well region. During the blocking condition, the electric field or the main region where the breakdown can happen, is at the center of the unit cell of a SiC DMOSFET, which is basically between the PS #1 region and the N− drift layer. SiC structures tend to break down between the p-well and the N− drift layer, and especially at the curvature of the p-well region. In the embodiments herein, the structure will break down between the PS #1 region and the N− drift layer. Here the location of the breakdown has been moved towards the center of the unit cell which results in a lower electric field closer to the gate oxide region. There is a reduced electric field close to the gate oxide region in the embodiment due to PS #1 region, and this should make for a more robust device.

The embodiments herein have difference in structure, difference in the method of manufacturing, difference in the functionality of the devices, and difference in the results that the devices produce than the prior art SiC devices. Simulation data of the embodiments herein show the differences in performance and results of structures. In addition to the PS #1 region, the devices of the embodiments herein also have a PS #2 region, which is placed under the N+ source region. This improves the electric field profile in the embodiment in a way that during the blocking mode of operation, the voltage is shed across a larger area of the unit cell, which results in even more robust operation. In the embodiments herein, the PS #2 region could be deeper than the p-well region and could be made shallower than the PS #1 region. In the embodiment herein of all the P-type regions in the SiC DMOSFET structure, the deepest of them is the PS #1 region, the intermediate one is the PS #2 region, and the shallower one is the p-well region. The embodiments herein show more appropriate electric field shaping from these PS #1 and PS #2 structures.

In the embodiments herein, another advantage of including the PS #2 region is that the PS #2 serves as a secondary p-well region. The design of the p-well region needs to satisfy several different constraints. The electrical dose in the p-well region can be large enough such that the desired breakdown voltage is realized while at the same time, the doping of the p-well region near the gate oxide region where the MOS channel is formed, can be low enough such that a reasonably low threshold voltage is realized.

In the embodiment the p-well region could now satisfy conflicting requirements. By placing the PS #2 under the N+ source region, it relaxes the design of the p-well region, whose purpose now is solely for channel definition and channel formation. In embodiments herein, the p-well does not have to be designed with the objective of supporting the breakdown voltage. The embodiments herein give a lot more flexibility to the designer to design the p-well region suitably only for MOS channel formation.

In the embodiment herein, the PS #1 is formed after a trench is etched into the N+ source region which is in the middle of the unit cell of the SiC DMOSFET. The advantage of this trench is that it moves the electric field location farther away from the gate oxide interface and to the middle of the unit cell of the SiC DMOSFET. In the embodiment etching a recess trench into the N+ source region, effectively creates a deeper PS #1 region. The electric field moves even further away from the gate oxide region, which would make for more robust blocking capability. In the embodiments herein, one of the reasons for doing the trench is because ion implantation and particularly deep ion implantation in SiC is difficult. Deep PS #1 sinker region can be made because of source trench. In the embodiments herein etching a trench and then doing the ion implantation, allows to make a deeper PS #1 region, which is effective and achieves the functionality.

In the embodiments herein since the trench helps in making a deeper PS #1 due to the source trench allows to make a thinner oxide region by reducing the oxide. SiC DMOSFET needs a thicker oxide to prevent them from breaking down in a dielectric field. In the embodiments herein by introducing the P-type sinker regions, one can use thinner oxide.

In the embodiments herein, the SiC DMOSFET devices are made using a series of masking steps followed by either ion implantation or etching and a deposition step. In the embodiments herein, the unit cell is produced where a series of structures are made using photolithography that is used to mask certain portions of the wafer or certain portion of device, and implementing certain steps, and then removing that mask, and doing the other steps. To minimize the number of steps is of great importance to realize cost-effectiveness. That is, cost structure is lower if one can somehow reduce number of steps. Also, certain steps in manufacturing of SiC are expensive, and the embodiments herein minimize the number of those expensive steps. For example, ion implantation is a relatively expensive step in SiC. p-well, P-plug, and N+ source regions are made using ion implantation. Ion implantations are expensive steps, particularly deeper ion implantation is even more expensive. So, minimizing deep ion implantation is of importance. Further, P-type Implantation is 5 to 10 times more expensive than doing N-type Implantation, since P-type implantation needs to be performed at higher temperatures (400-1000° C.) in contrast to N-type implants which can be performed at room-temperature. So, minimizing P-type implants, is also of importance.

In the embodiments, herein the wafer goes through a series of ion implantation steps first, which is typically called the front end of the process, then there is a high temperature annealing, which is used to anneal out the implant damage and electrically activate the implants. The back end of the process typically consists of forming the gate oxide, ILD and other metallization steps.

In the embodiments herein to make the SiC DMOSFET structure, photolithography would be used to mask a certain part of the wafer to create a p-well region, following which, a next masking step could be used to realize an N+ source region, followed by another masking step would be used to realize the P+ plug region. The wafers would need to be annealed to activate the implanted regions. After this, a gate oxide or a gate dielectric can be grown by either thermal oxide or using a deposited oxide. A gate metallization can be formed using a poly-silicon or other refractory metals. The gate metallization is then selectively patterned and etched to access the N+ source regions, following which the ILD is deposited and then patterned to realize the window for creating these ohmic contacts for the N+ source regions. The ohmic contact can be realized on the backside of the wafer, which is the drain, for the drain region. At the end of the process, a source interconnect metallization is used to connect the various unit cells.

SiC MOSFET is typically produced in several masking steps. Some of these masking steps, could be for forming implanted regions, while other masking steps are for forming structures such as gate oxide, ILD etc. The embodiments herein are all done in 11 masking steps without increasing a masking step for any additional feature like PS #1, PS #2, source trench formations or other structures in the embodiments.

In SiC, ion implantation is a method to introduce dopants since diffusion does not work well. So, to realize the PS #1 region to be deeper than p-well region, requires higher implantation energy. In the embodiments herein typically either aluminum or boron is used for realizing P-type regions in SiC. So, for realizing the PS #1 region and a deep PS #1 region, in the embodiments herein boron implantation is used in lieu of aluminum implantation, since for a given energy, the boron implantation can result in deeper regions as compared to aluminum implantation. Another way to realize a deep PS #1 region is to use a much higher energy and still use aluminum as the P-type dope.

In an embodiment herein, a p-well region is formed, following which, the N+ source region is formed. While forming the N+ source region, ion implantation is performed to realize the PS #2 region. The same masking step is used for forming the N+ source region and the PS #2 region. In the embodiment herein, this enables one to realize a PS #2 region exactly under the N+ source region.

In the embodiments herein, the N+ source implant is made self-aligned to the p-well implant, to reduce or even eliminate misalignment which could occur if the two regions are realized in different masking steps.

In the embodiment herein to realize sub 0.5-micron channel lengths or sub 1-micron channel lengths the first p-well region is formed using traditional implantation masking step. A dielectric layer of a sufficient thickness is deposited, and then using photolithography, one would selectively pattern this layer, and then perform ion implantation, to realize the p-well region. Once this is done, a second dielectric layer is deposited on top of this patterned first dielectric layer, and then subjected to a blanket etch. This, results in a dielectric spacer region which then defines the region which is subjected to the N+ source implant. So, by choosing an appropriate thickness of the second dielectric layer, one can define the MOS channel length.

In the embodiment herein to realize a channel which is 0.5-micron wide first create a p-well region using conventional photolithography technique, for example one may deposit and pattern silicon dioxide layer, then one may deposit a second silicon dioxide layer of a thickness equal to like 0.5-micron. When one etches this layer down, one would realize a spacer which would be 0.5-micron also. When one performs the N+ source implant, one would have effectively an MOS channel length of 0.5-micron.

In the embodiment, the channel length is formed not by the limitations of lithography techniques, but by the ability of depositing dielectric layers, for example silicon dioxide, where one has much better control. One can deposit a dielectric or silicon dioxide layers with a resolution which is much better than what lithography can allow.

In one method called the subtractive method, the process first fabricates a N+ source, then deposits a dielectric layer, and then form the P+ layer through the poly-silicon variation. The embodiments herein do the additive method, where first one does the p-well, and then deposits the dielectric of a controlled thickness, which will define the channel length, and then put the N+ source. So, the order of N+ and p-well is reversed in the embodiments herein when compared to how prior art SiC DMOSFET's are formed.

The embodiments herein avoid implanting N+ source region in the gate region. In a SiC MOSFET structure there exists a parasitic NPN transistor, that can get triggered not during normal operation but when you're switching this device from OFF to ON or ON to OFF with extremely high speed.

In the embodiments herein, the trench into the N+ source region is formed prior to the implantation of the PS #1 region results in a deeper PS #1 region. But another benefit of doing this is that one can also remove the N+ source regions from the portions of the device that do not want the N+ source region to be implanted. So, that is the secondary benefit of having a trench etched into the N+ source region. The same masking step is used for performing the SiC dry etch, and then implanting the PS #1 region. This is achieved with just one masking step. In an embodiment, the PS #2 region is formed along with the N+ source region with the same masking step. The SiC trench and the PS #1 region are again formed using the same masking step. In this embodiment, four features are made using two masking steps.

In the embodiments herein, the cost of PS #1 sinker is reduced, because one does not have to employ deep ion implantation. Deep ion implantation, which are high doses, is expensive. And on the periphery, having a deep P+ is also beneficial, to prevent breakdown regions that can be formed. In the embodiments herein, one is avoiding the breakdown region at the periphery because one is using a single step for creating PS #1 and the trench. When one forms the MOS channel in a self-aligned fashion, N+ source region is formed everywhere where one has a p-well region, which extends to even the periphery of the device. In the embodiments herein, one avoids the breakdown at the periphery due to formation of trench and PS #1.

Figure 4A:
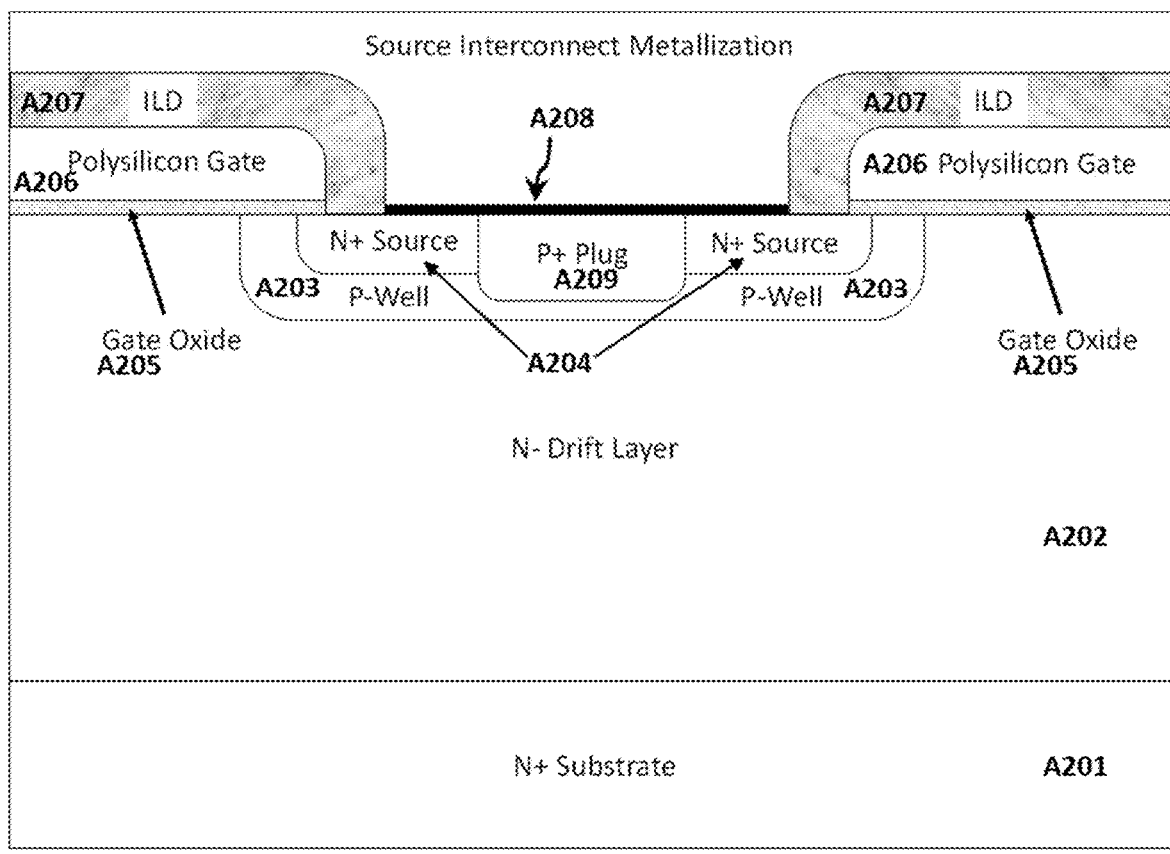
FIG. 4a shows an embodiment of a SiC DMOSFET with the P+ plug region to ground the p-well region with the N+ source contact.

An embodiment shown in FIG. 4a is the unit cell of a cross-sectional structure of a SiC DMOSFET. The key regions of this device are a p-well region A203, which is formed by ion-implantation or epitaxial re-growth of a p-type species such as aluminum or boron. There is an N+ source region A204, N− drift layer A202, and an N+ substrate A201. In the ON state when a gate voltage is applied to the polysilicon gate A206, the current flows vertically from the drain A201, through the inversion layer which is formed at the top of the p-well layer A203, through the N+ source region A204, and out through the source metallization A208. In the OFF state or the blocking state, a voltage is supported across the p-well A203, N− drift layer A202 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide A205. Another feature is an ILD layer A207 which is used to insulate the source interconnect metallization A208 from the poly-silicon gate A206. At the very center of the unit cell, there is a P+ plug layer A209 which is grounded with the N+ source metallization. The purpose of the P+ plug in SiC DMOSFET is to ground the p-well region with the N+ source contact. Typically, the depth of the P+ plug implant is made shallower than the p-well region as shown in FIG. 4a. The DMOSFET device structure can result in high electric field concentration at the corner of the p-well region A203, which results in a high electric field in the gate oxide layer A205, especially during high drain bias (blocking mode) operation. The high critical electric fields for breakdown in 4H-SiC (≈3 MV/cm) results in a very high (>5 MV/cm) electric field in the gate oxide. Fowler-Nordheim tunneling currents are observed at such high electric fields in the gate oxide, which can result in trapped charge in the gate oxide, which leads to poor device reliability. In the embodiment herein, the lateral spacing between p-well regions (JFET region) is made narrow enough to suppress the electric field in the gate oxide while making sure that the MOSFET ON-resistance is low enough.

Figure 4B:
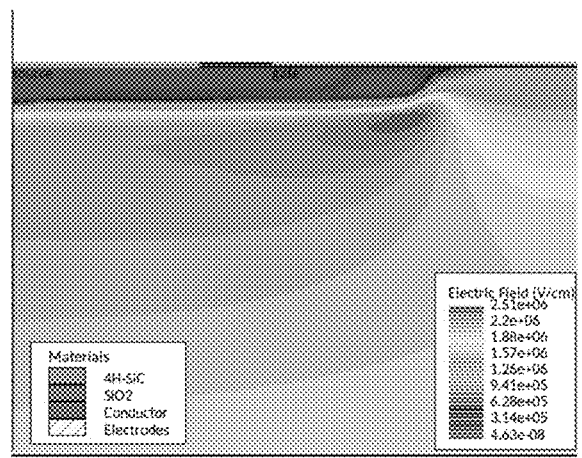

FIG. 4b is the breakdown simulation of a SiC MOSFET shown in FIG. 4a. The simulation shows the peak electric field located at the corner of the p-well region, which results in a certain high electric field in the gate oxide layer. The electric field is strongly concentrated at the corner of the p-well region because that is the region of maximum curvature. (this embodiment has limitation)

Figure 2:
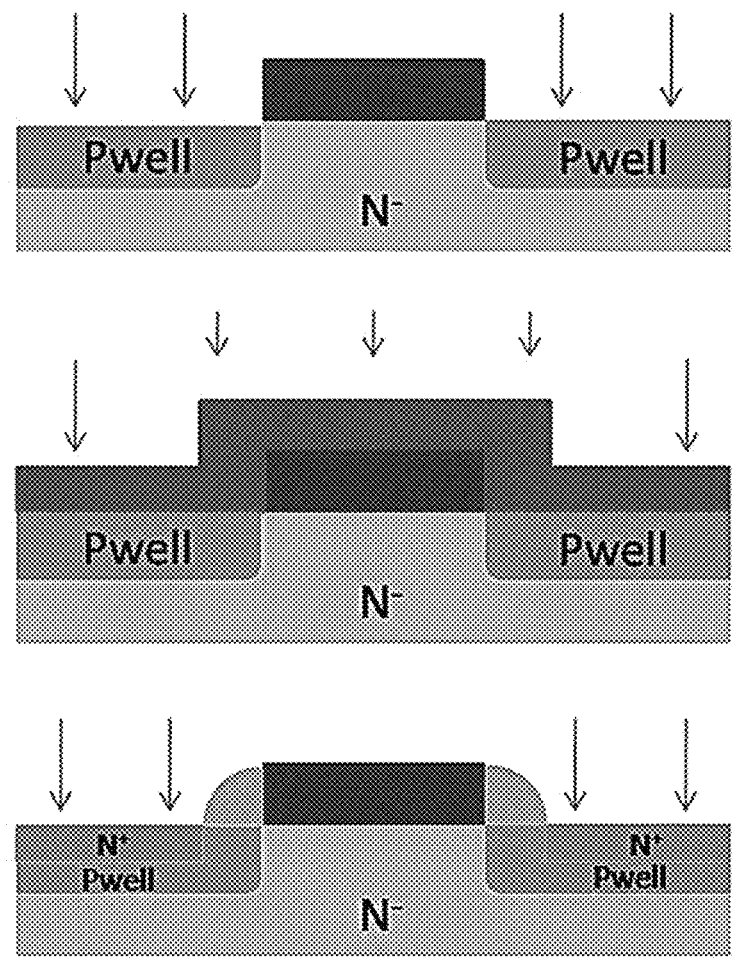
FIG. 2 shows the prior art SiC DMOSFET process flow for self-aligned MOS channel formation.
Figure 3:
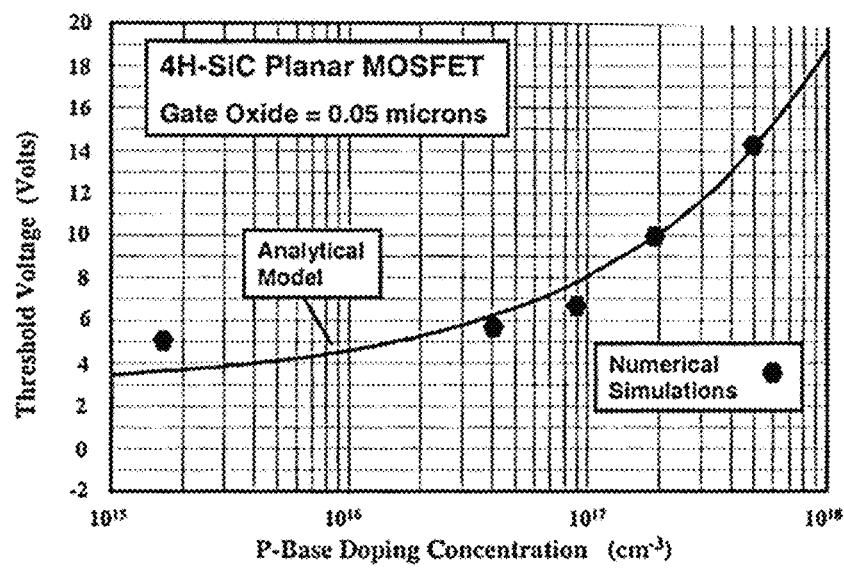
FIG. 3 is the prior art and shows the plot of threshold voltage versus p-base doping concentration for a 4H-SiC planar MOSFET.
Figure 5:
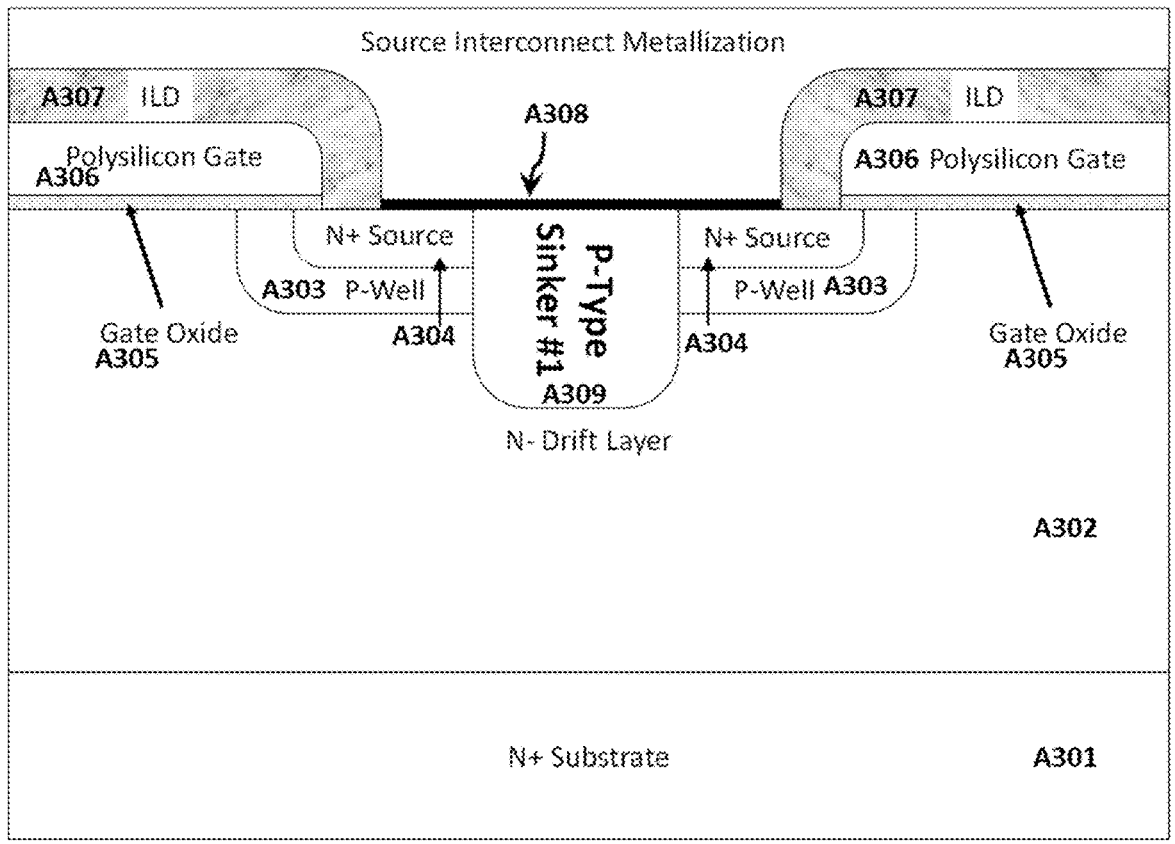
FIG. 5 shows an embodiment of a SiC DMOSFET where the P+ plug region in FIG. 4a is replaced with a deep P-type Sinker #1 region.

An embodiment shown in FIG. 5 is the cross-sectional unit cell of a SiC DMOSFET. The key regions of this device are a p-well region A303, which is formed by ion-implantation or epitaxial re-growth of a p-type species such as aluminum or boron. There is an N+ source region A304, N− drift layer A302, and an N+ substrate A301. In the ON state when a gate voltage is applied to the polysilicon gate A306, the current flows vertically from the drain A301, through the inversion layer which is formed at the top of the p-well layer A303, through the N+ source region A304, and out through the source metallization A308. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide A305. Another feature is an ILD layer A307 which is used to insulate the source interconnect metallization A308 from the poly-silicon gate A306. Here the P+ plug region A209 of the SiC DMOSFET from FIG. 4a is replaced with a deep P-type Sinker #1 (PS #1) region A309. The depth of the PS #1 region, is greater than the depth of the p-well region. During the OFF state or the blocking condition, the structure shown in FIG. 2a, will break down between the p-well A203 and the N− drift layer A202 especially at the curvature of the p-well region. But with the PS #1 region A309 being introduced in FIG. 3 the electric field or the main region where the breakdown will happen, is now at the very center of the drawing, which is basically between the PS #1 region A309 and the N− drift layer A302. The presence of the deeper PS #1 region results in moving the peak electric field location from the corner of the p-well region A303 to the PS #1 region A309. The location of the peak electric field in 4H-SiC during high drain bias operation has been moved farther away from the gate oxide A305. The electric field in the gate oxide A305 is now lower than that of FIG. 4a device.

Figure 6A:
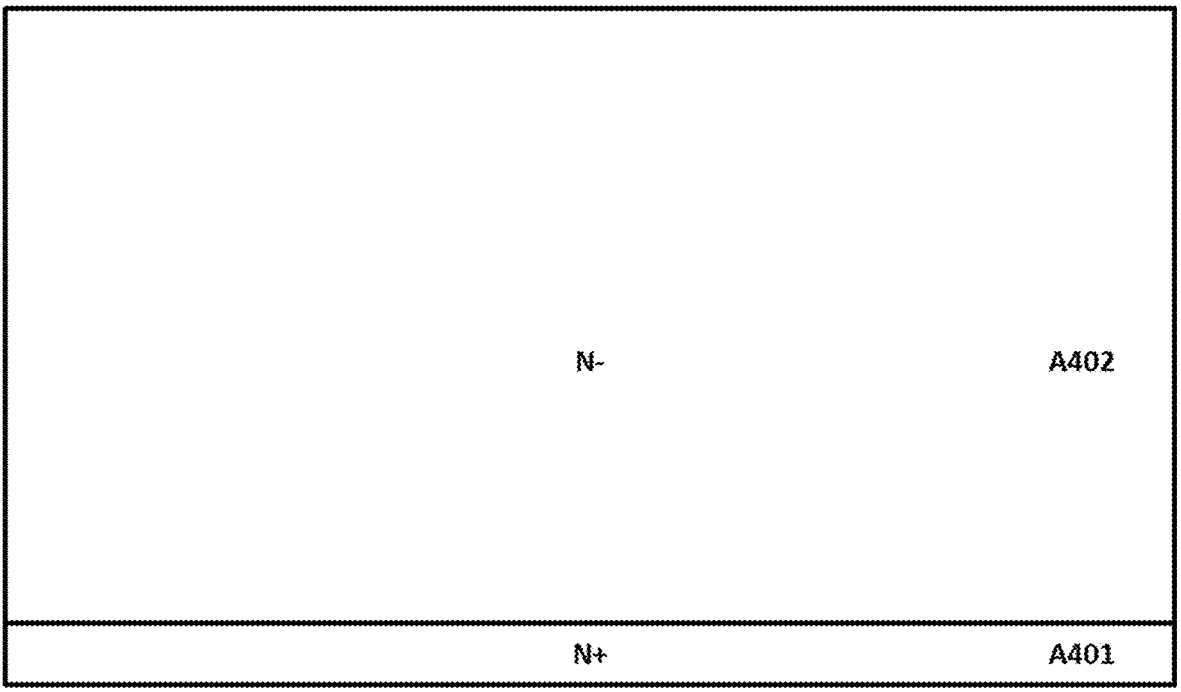
FIG. 6a to FIG. 6r are cross sectional views showing the process steps for manufacturing the SiC DMOSFET structure in FIG. 5.
Figure 6B:
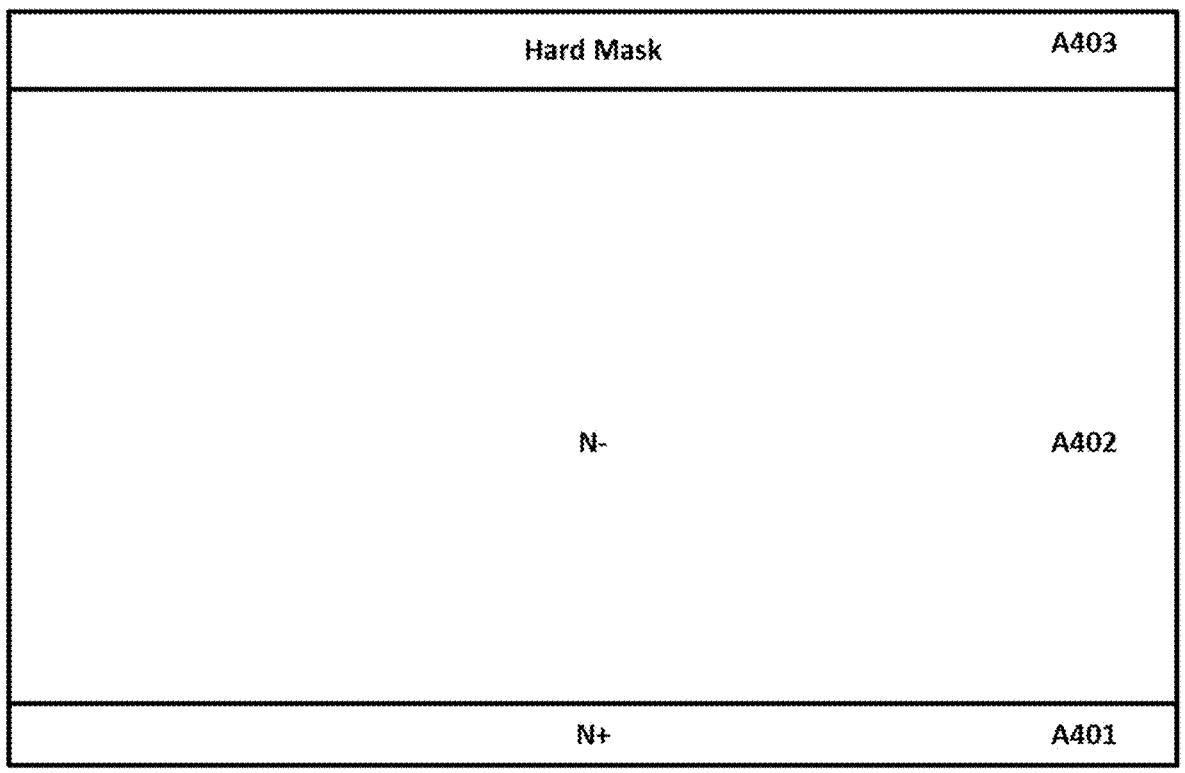
Figure 6C:
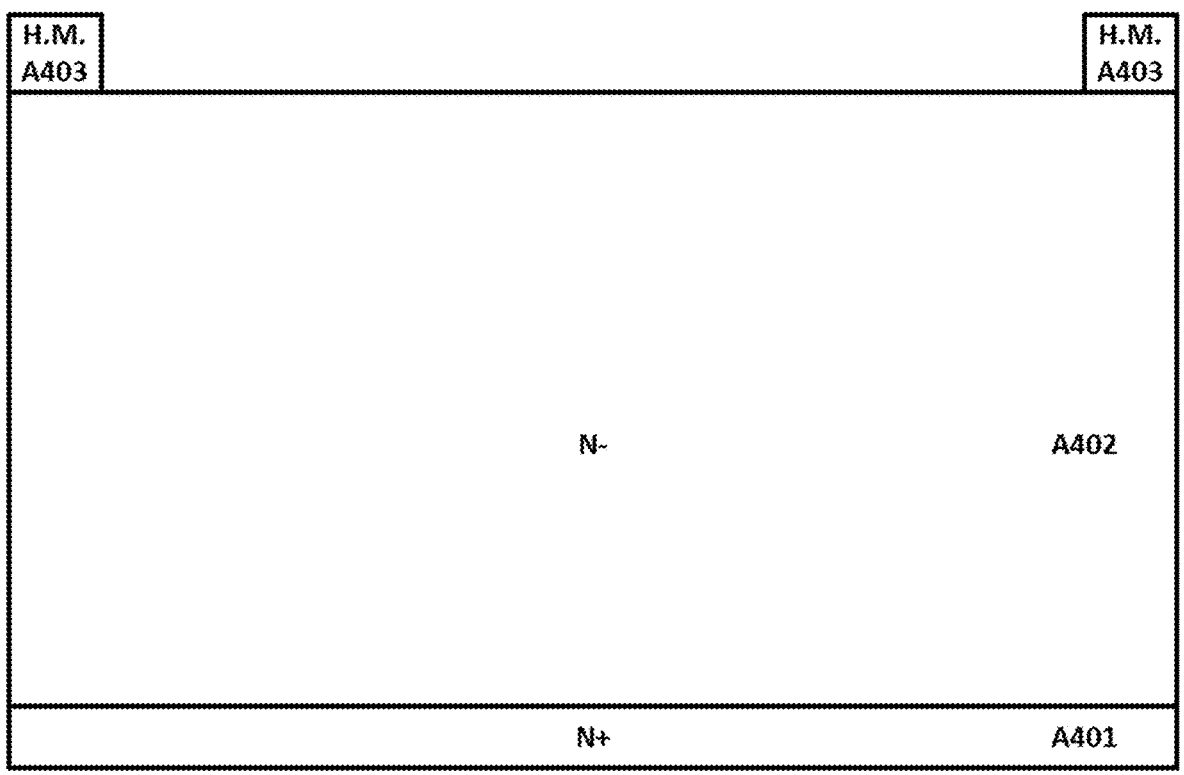
Figure 6D:
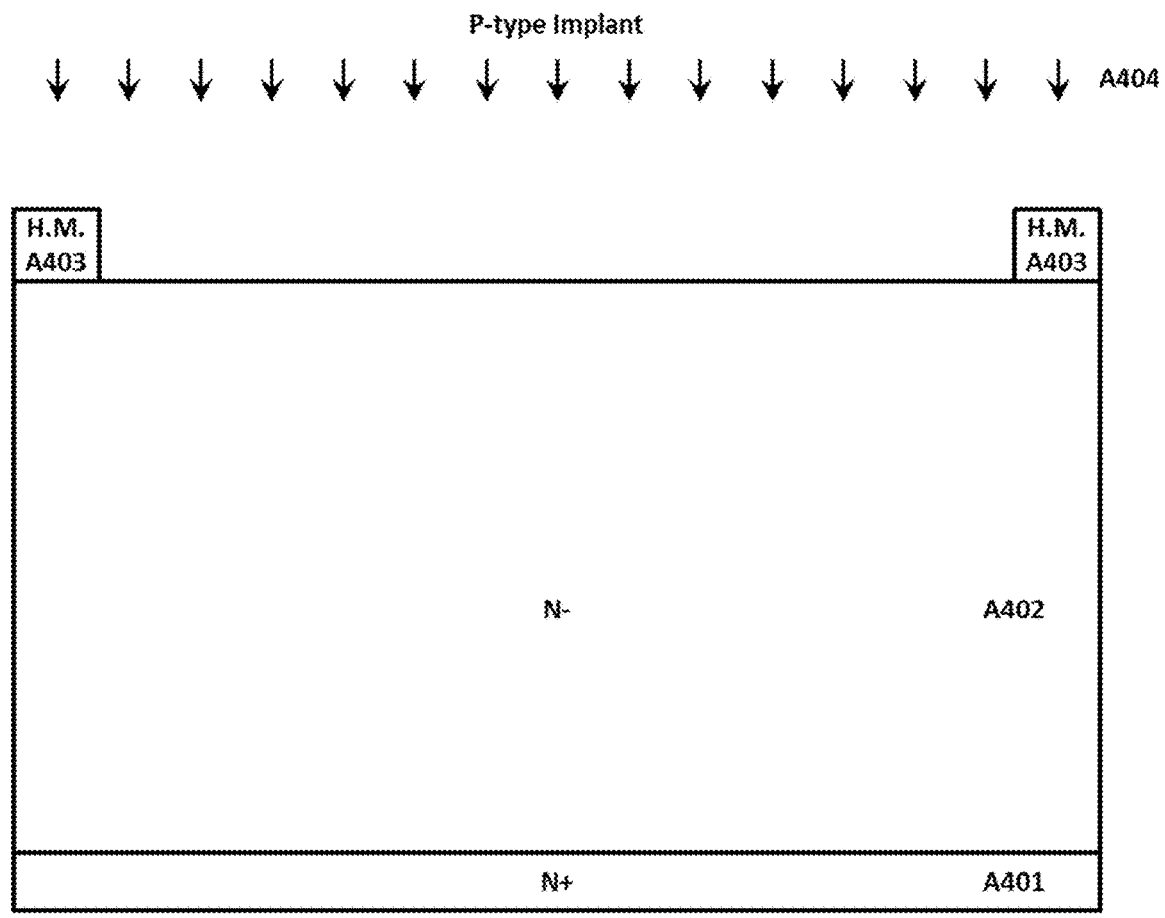
Figure 6E:
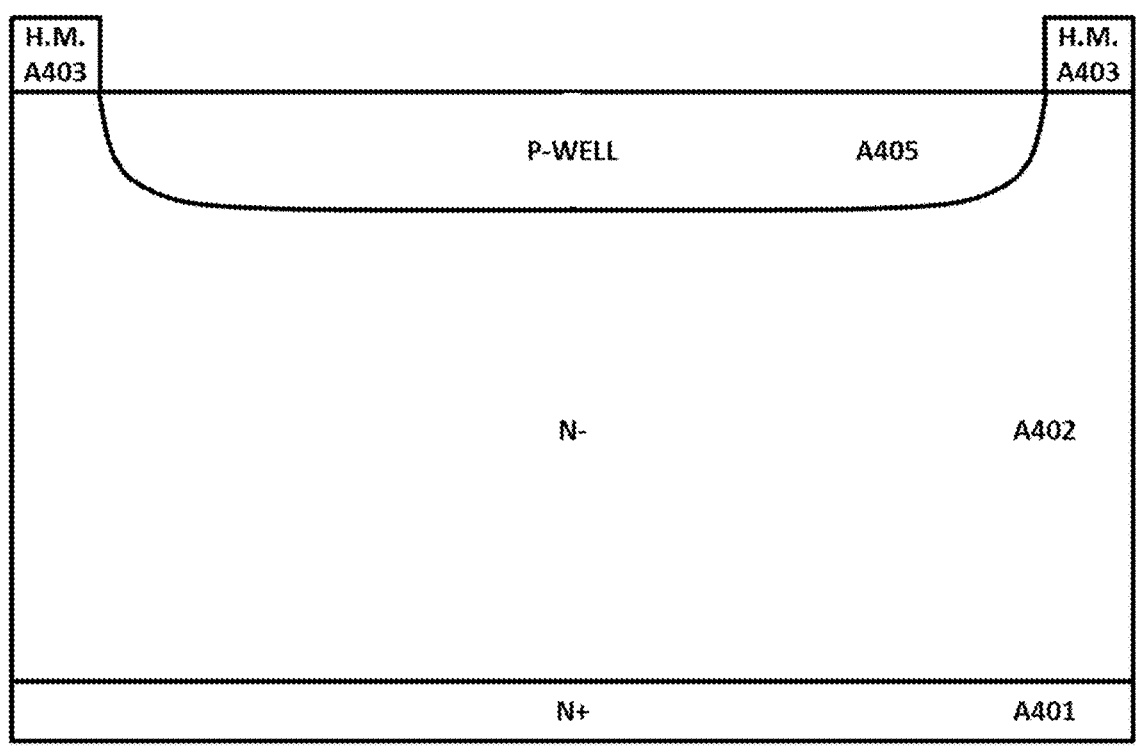
Figure 6F:
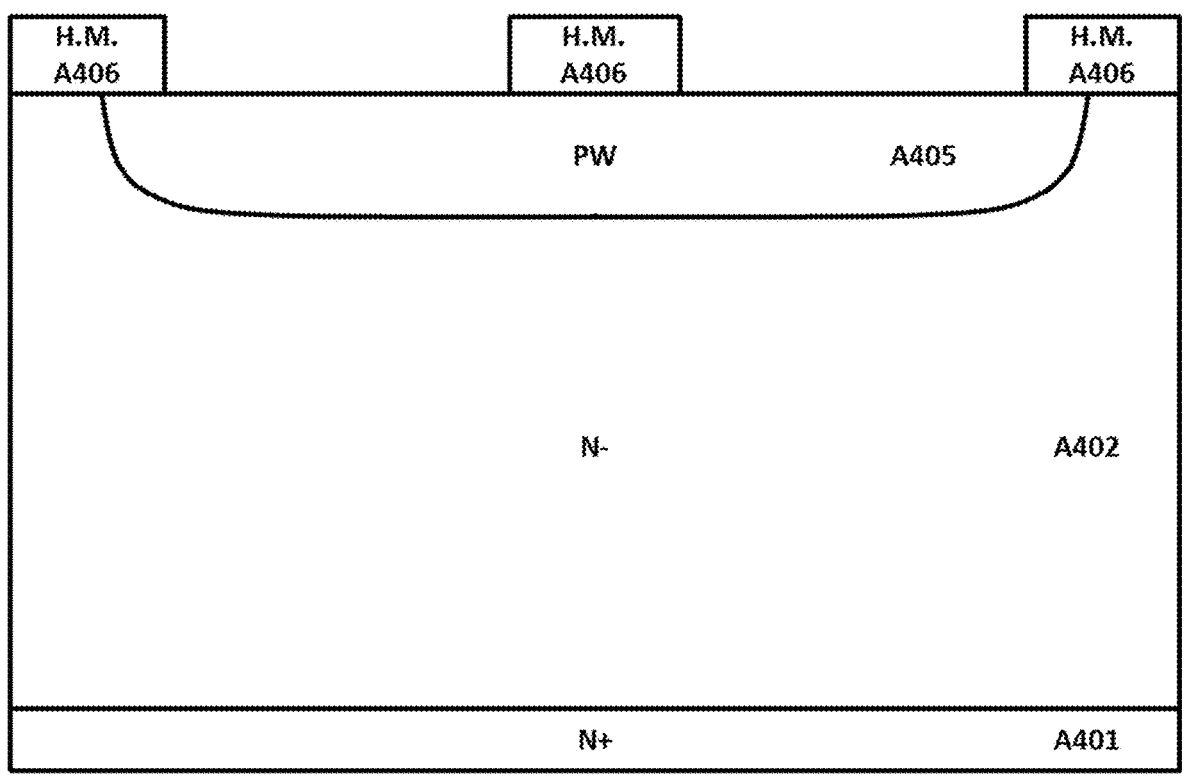
Figure 6G:
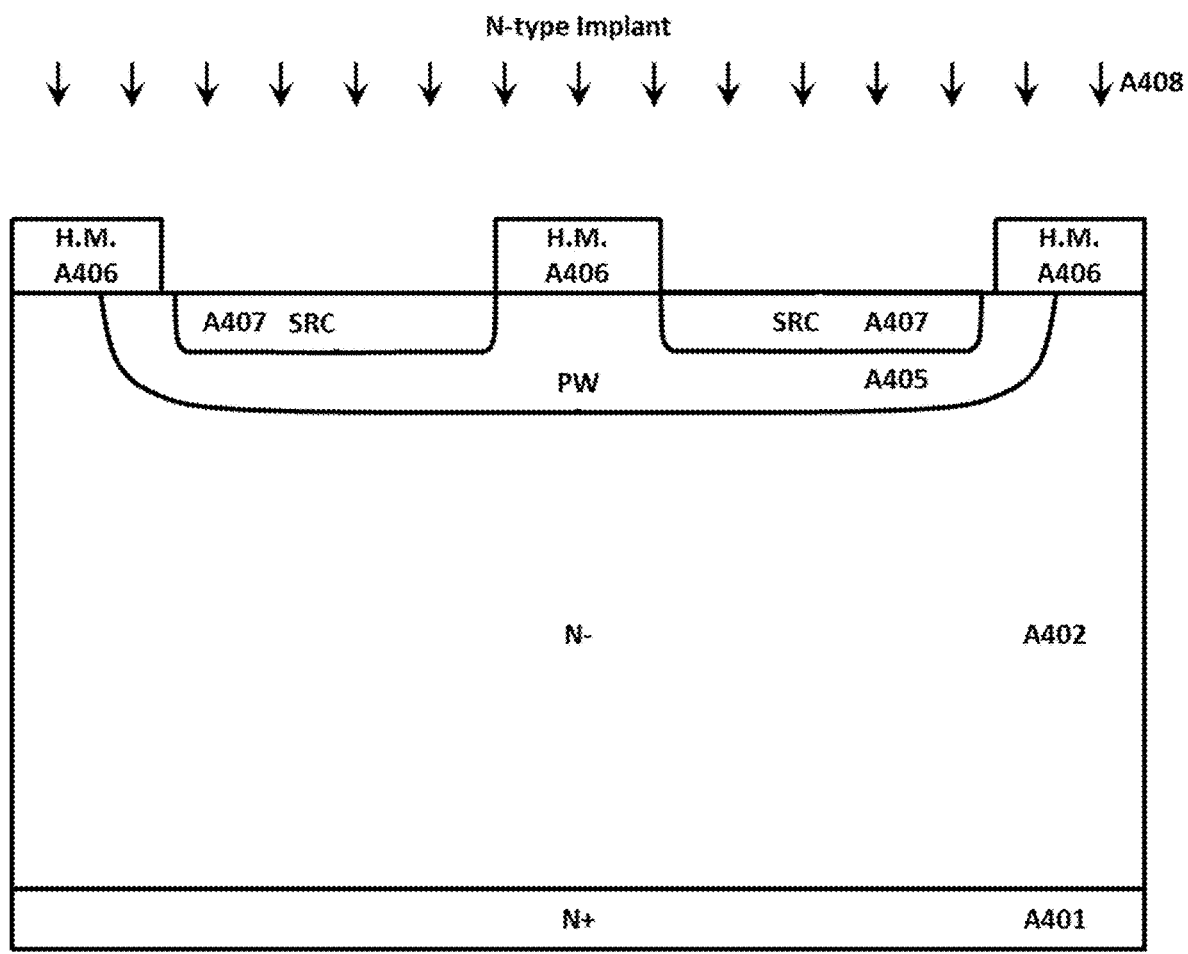
Figure 6H:
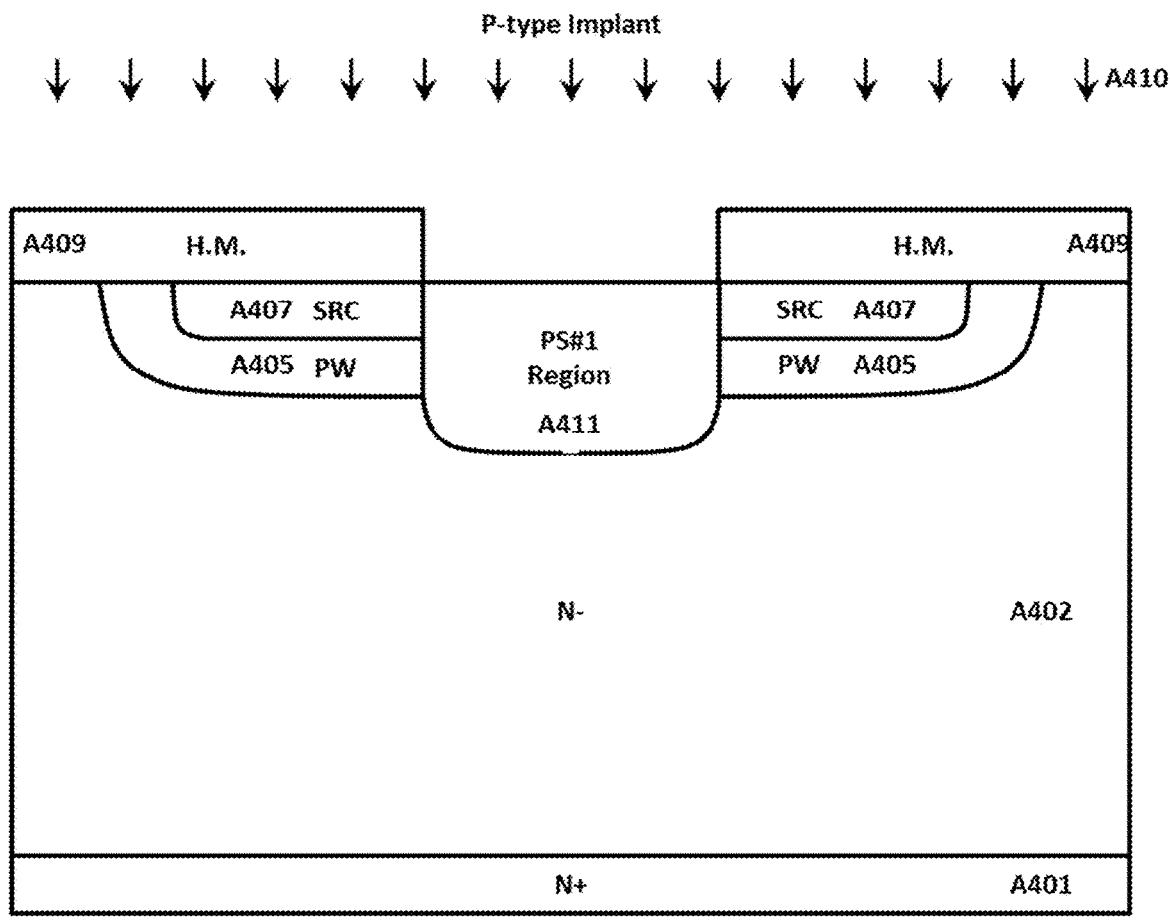
Figure 6I:
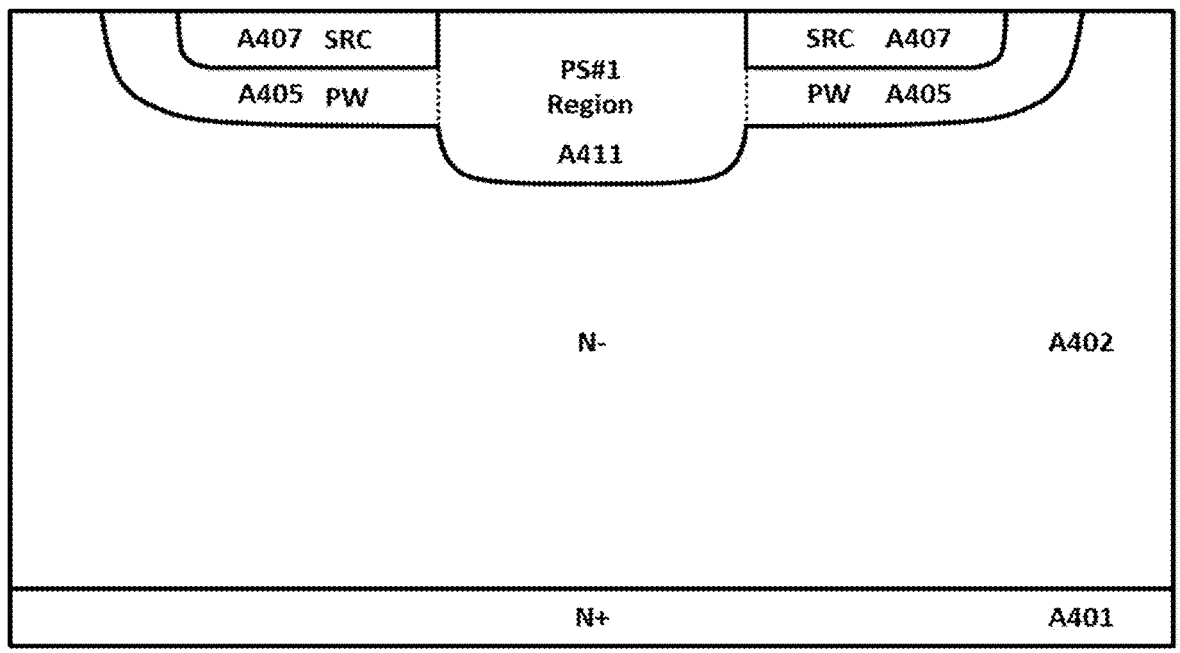
Figure 6J:
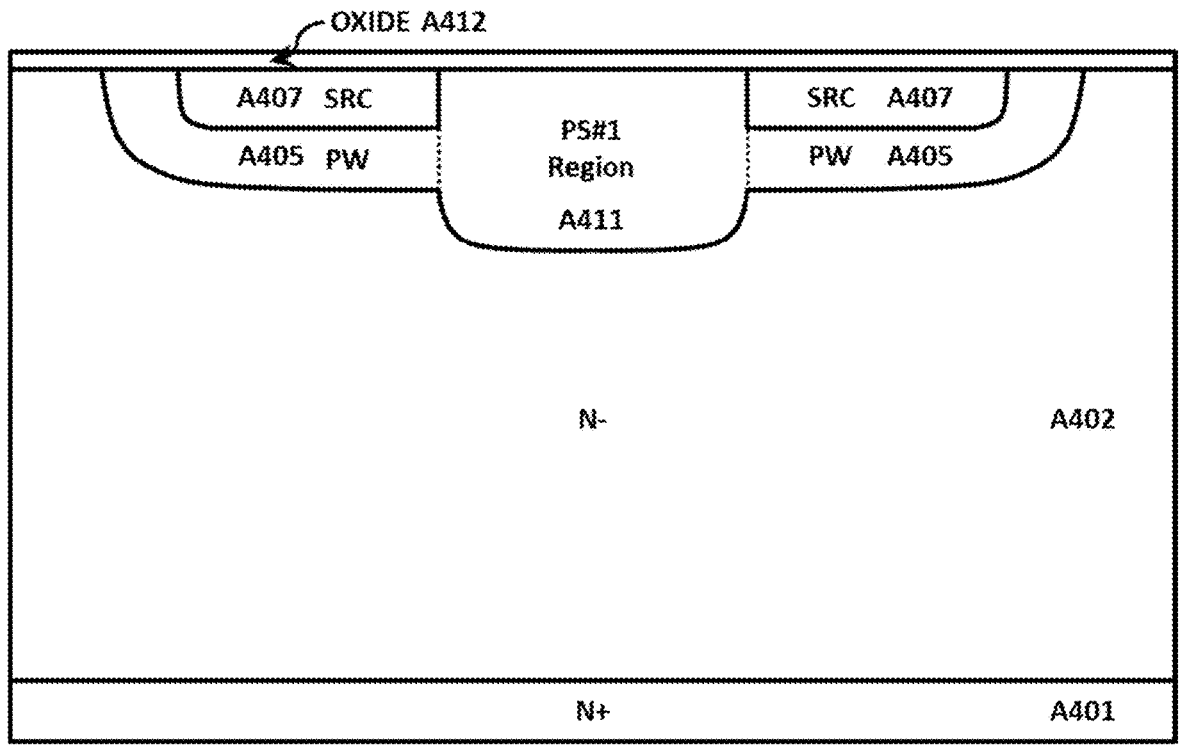
Figure 6K:
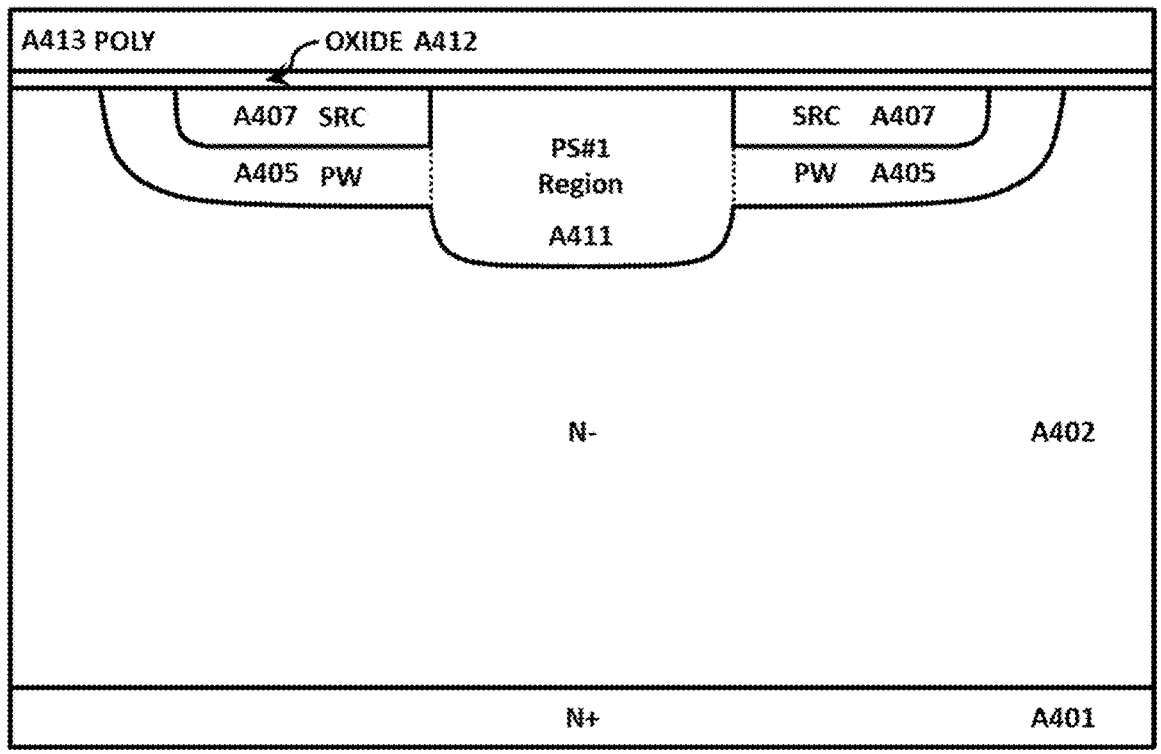
Figure 6L:
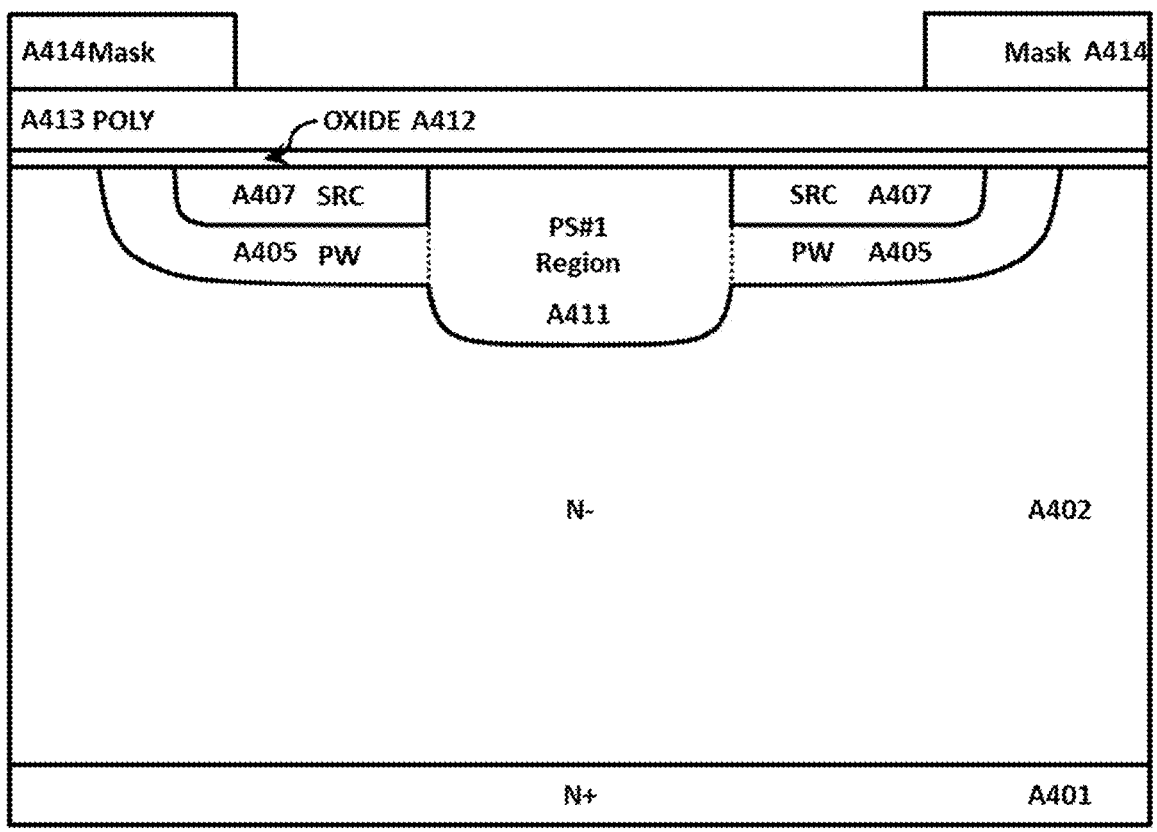
Figure 6M:
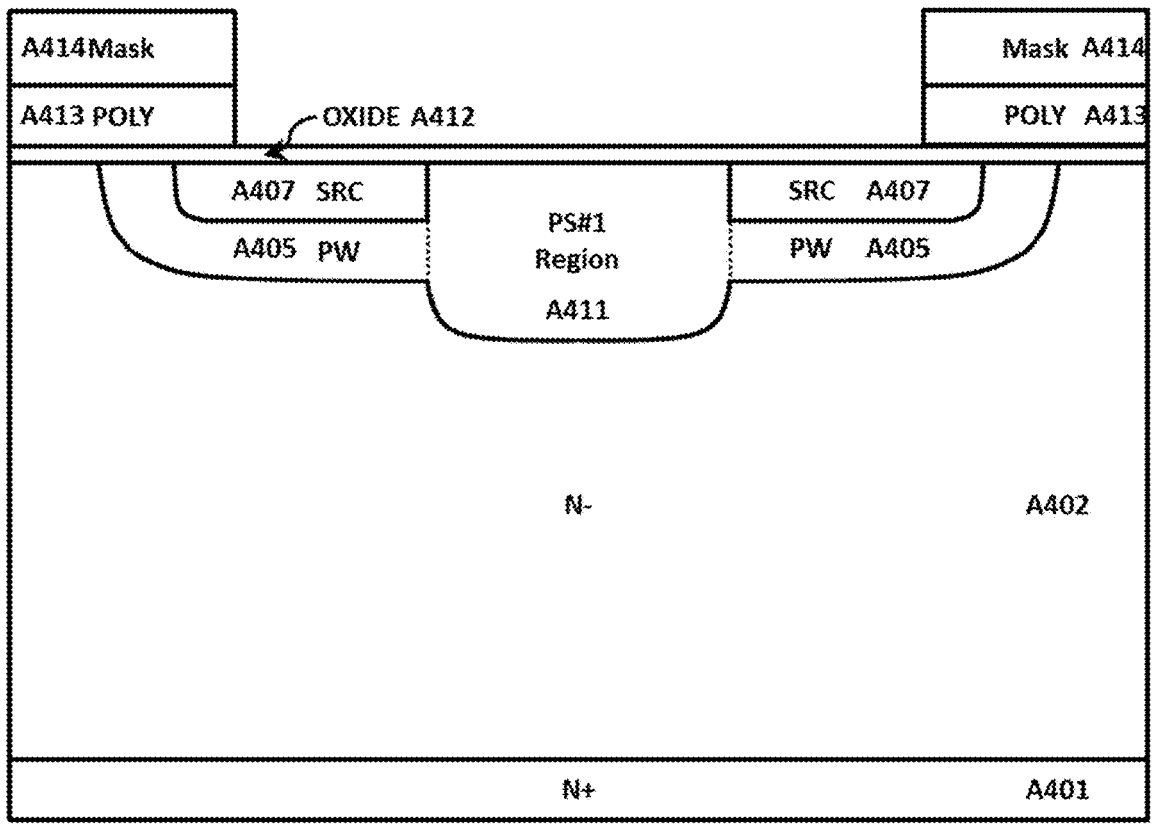
Figure 6N:
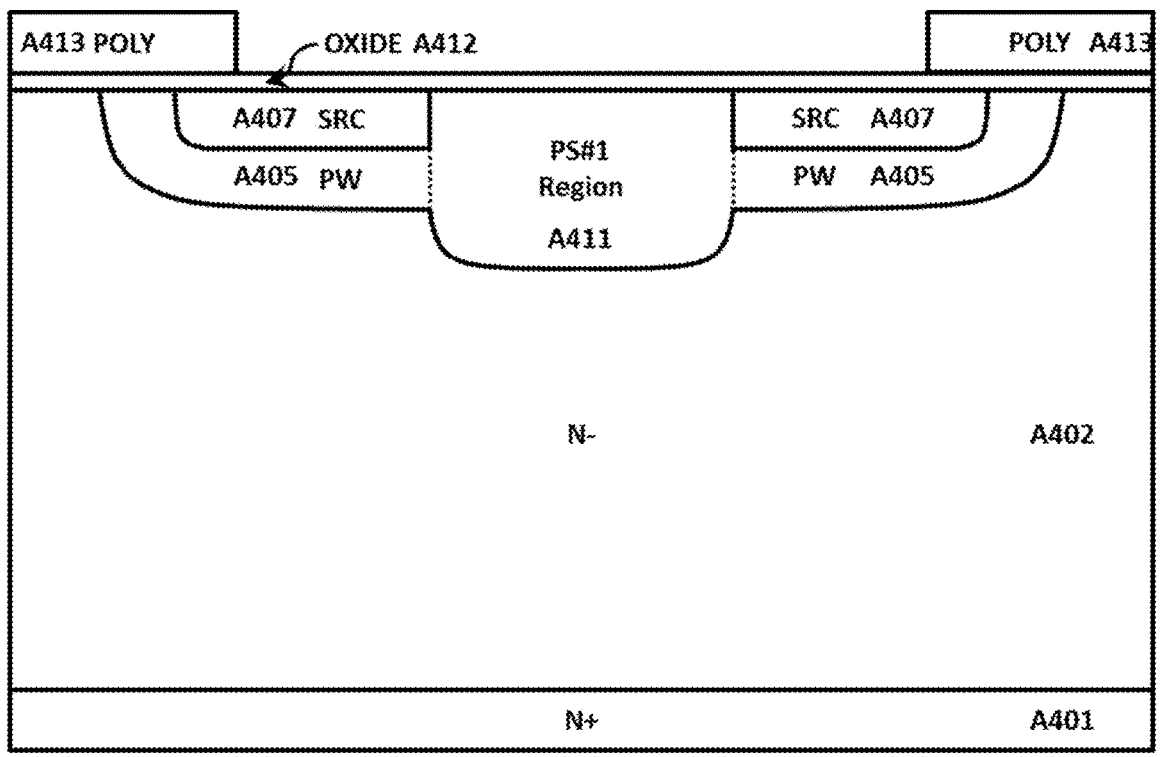
Figure 6O:
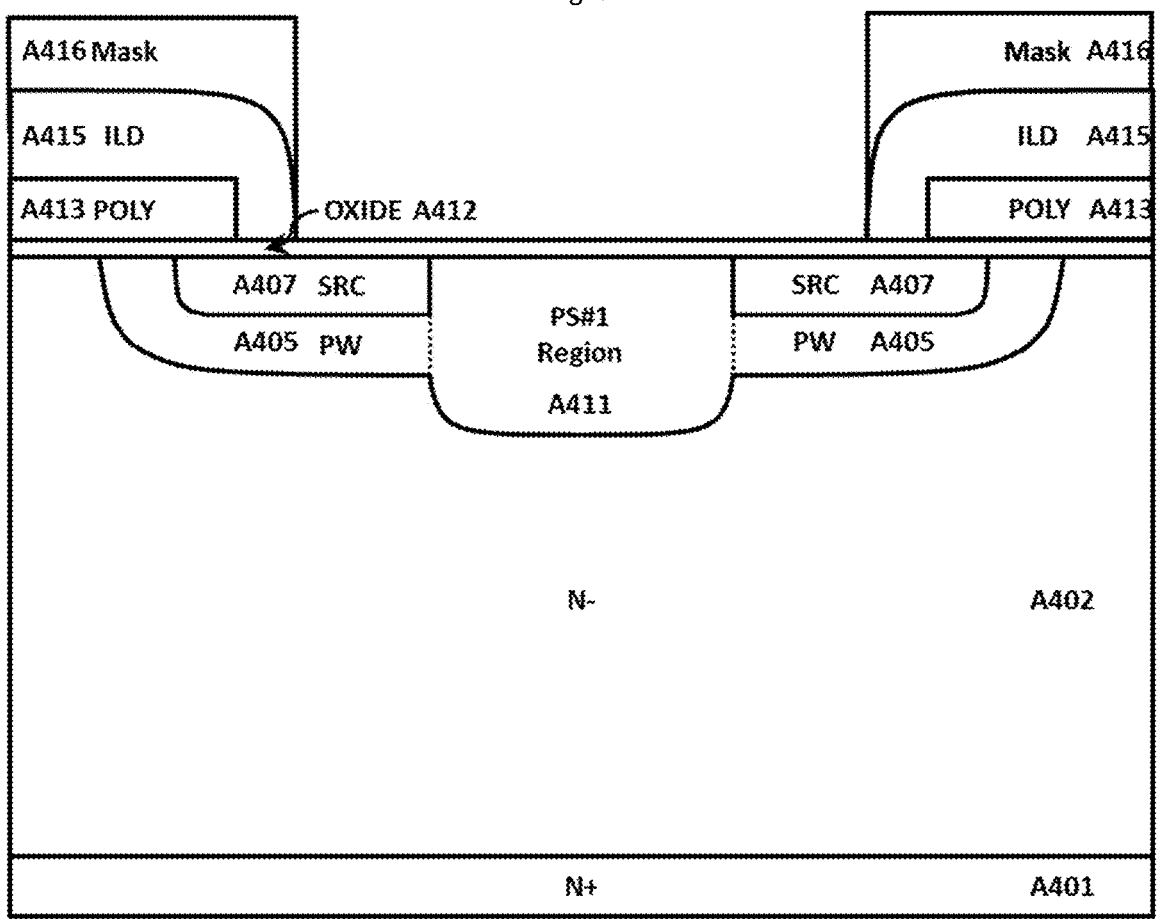
Figure 6P:
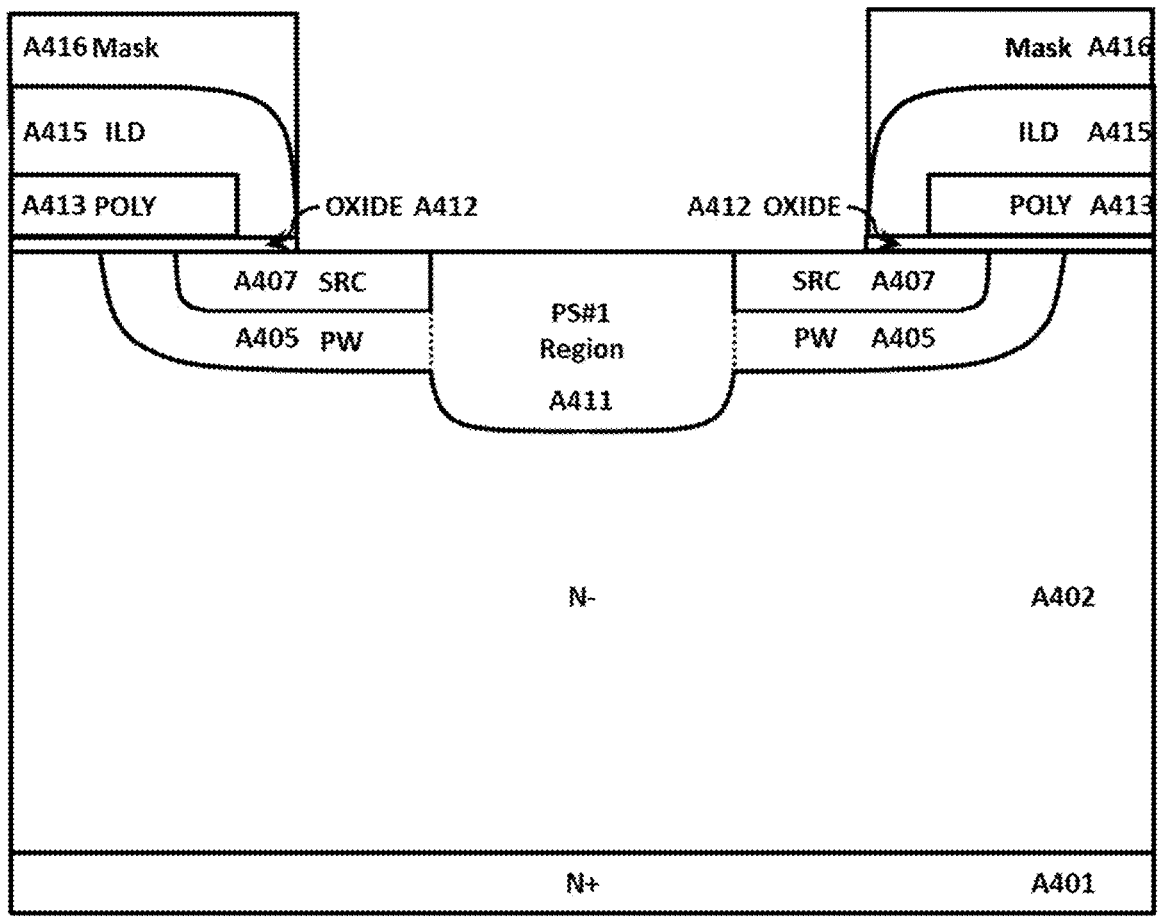
Figure 6Q:
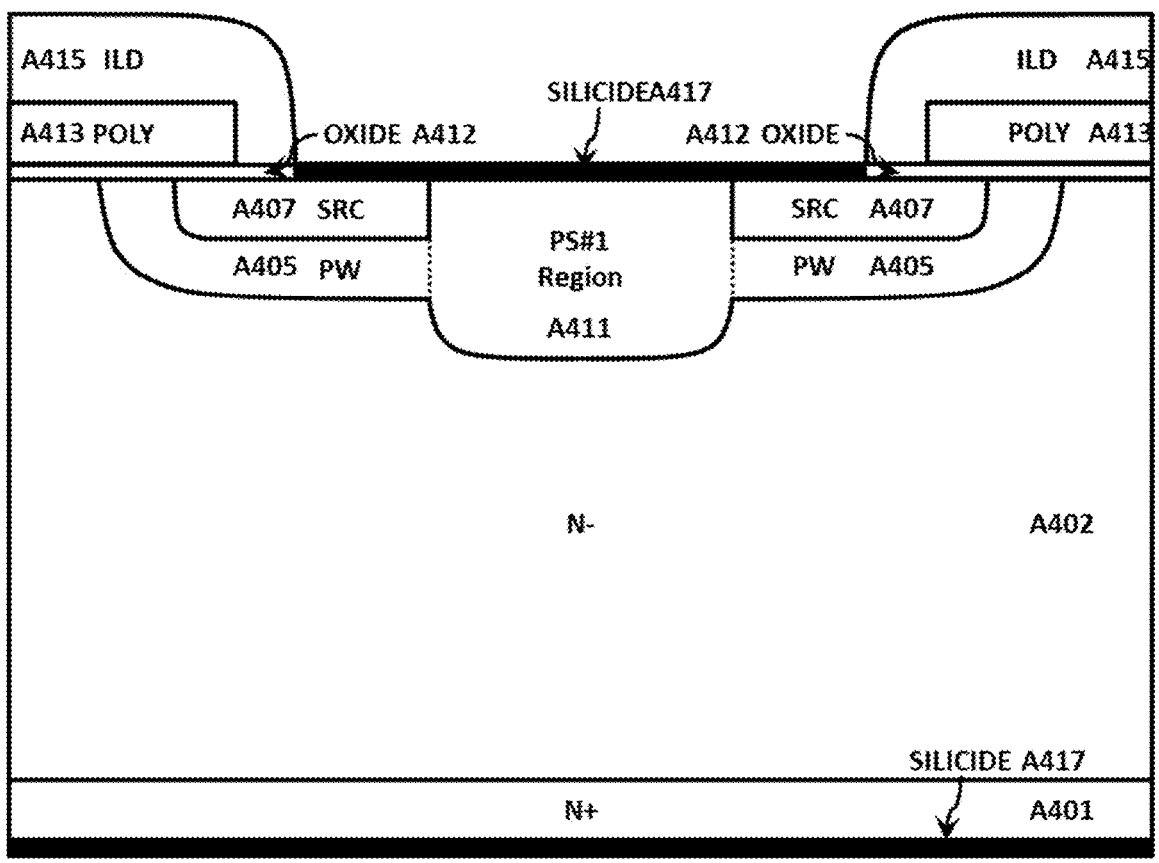
Figure 6R:
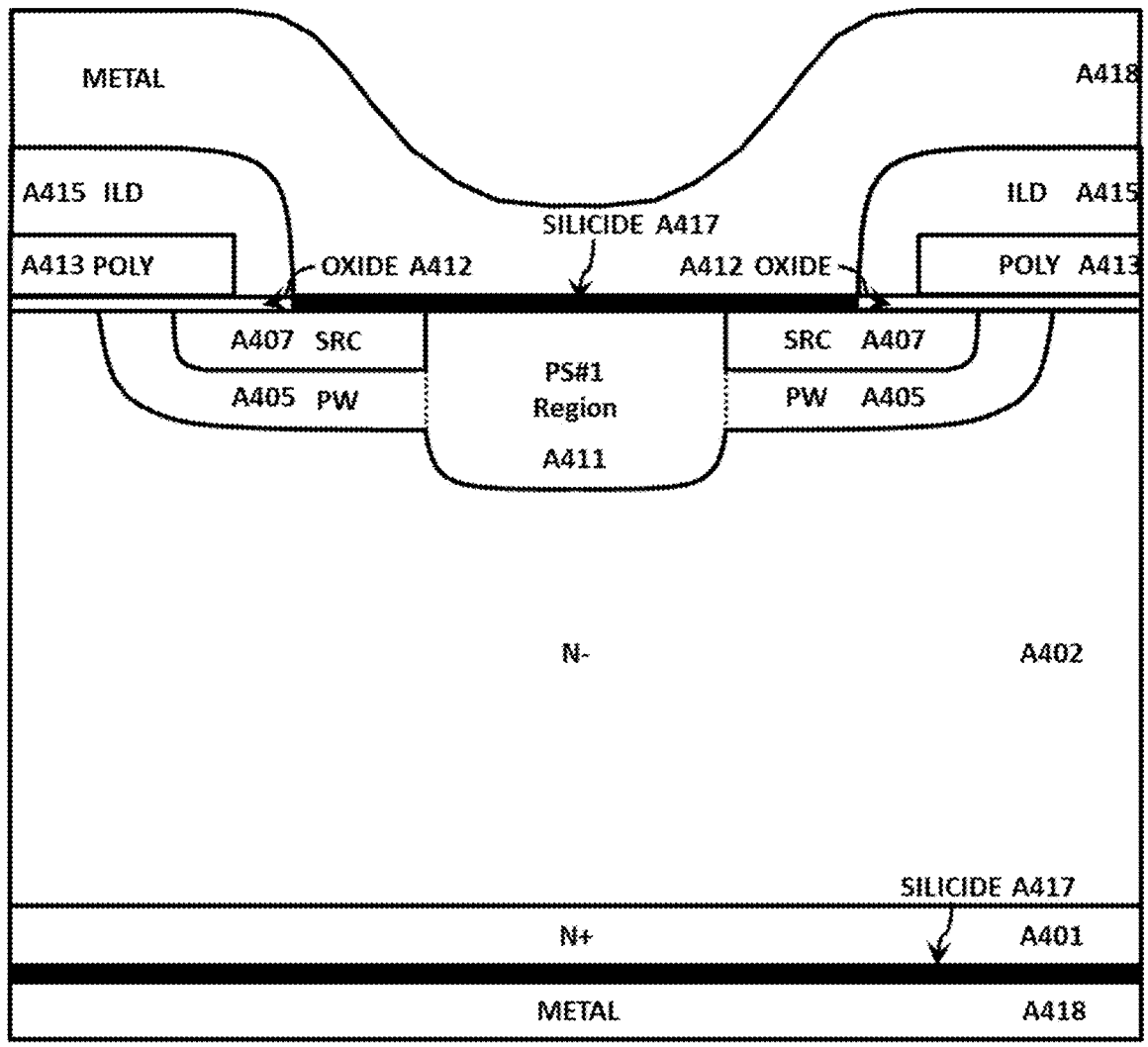

FIG. 6a to FIG. 6r describes the process of manufacturing the structure shown in FIG. 5. The manufacturing process for a SiC DMOSFET is on a SiC substrate A401 and starts with using a 4H-SiC Si-face epi-wafer with suitable doping ($10^{14}$-$10^{18}$ cm$^{-3}$) and thickness (1 μm to 300 μm) for the epilayer A402 shown in FIG. 6a. A blanket hard mask A403 comprising a CVD deposited layer of silicon dioxide, silicon nitride, silicon oxynitride, or a metallic layer such as nickel, with thickness ranging from 50 nm to 5 μm is deposited in FIG. 6b and then patterned using photolithography followed by a dry etch (using a reactive ion-etch for example) as shown in FIG. 6c. A P-type implantation A404 comprising boron or aluminum, at energies ranging from 10 keV to 800 keV, at implant doses ranging from $10^{12}$ cm$^{-2}$ to $10^{15}$ cm$^{-2}$ in FIG. 6d is performed to create a p-well A405 in FIG. 6e. The mask A403 is removed, and another hard mask layer A406 is deposited comprising a CVD deposited layer of silicon dioxide, silicon nitride, silicon oxynitride, or a metallic layer such as nickel, with thickness ranging from 50 nm to 5 μm and patterned in FIG. 6f to define the N+ source region. Notice that the center of the unit cell is masked for source (SRC) implantation. The SRC (N+ source region) A407 is formed by implantation of the n-type (N+) impurity A408 comprising nitrogen or phosphorus, at energies ranging from 10 keV to 500 keV, at implant doses ranging from $10^{13}$ cm$^{-2}$ to $10^{16}$ cm$^{-2}$ as shown in FIG. 6g. After removing the hard mask A406 another hard mask layer A409 is deposited and patterned in FIG. 6h. The PS #1 region A411 is formed by implantation of the p-type impurity A410 in FIG. 6h. The deep PS #1 region can be formed using ion-implantation of aluminum or boron, which are commonly used p-type dopants in 4H-SiC. Boron can be advantageously used for forming this deep P-type Sinker region, since it has significantly higher implant range as compared to aluminum, and deep implants using boron can be formed with lower ion-implantation energies. In one example, the PS #1 region can be formed with boron implantation with a 20-50% higher depth as compared to the p-well region. The boron implant may comprise of energies ranging from 10 keV to 800 keV, at implant doses ranging from $10^{12}$ cm$^{-2}$ to $10^{15}$ cm$^{-2}$. In a related embodiment of this invention, the doping profile of the PS #1 region can be formed with gradually decreasing doping concentration with a peak value at the SiC surface. This graded doping profile for the PS #1 region can prevent the formation of sharp corners in the 3-Dimensional landscape and is beneficial for spreading the peak electric field during high drain bias operation over a larger area which results in a higher breakdown voltage. In one example, the PS #1 region can be formed with a peak doping in the range of $10^{19}$ cm$^{-3}$ to $10^{20}$ cm$^{-3}$ close to the SiC surface, which linearly decreases as a function of depth into the silicon carbide to the background N-drift layer doping (in the range of $10^{14}$-$10^{16}$ cm$^{-3}$). A linearly graded doping profile of the PS #1 region results in a sufficient portion of the drain potential being supported within the PS #1 region and not only the N− drift region. This results in a pseudo charge-balanced structure, which promotes breakdown over a larger SiC region, which results in a lower critical electric field at breakdown and consequently a lower electric field in the gate insulator. This is followed by the removal of the hard mask A409 using either dry or wet etching techniques commonly practiced by those in the field in FIG. 6i. Then the oxide layer A412 which is the gate oxide is either thermally grown or deposited using chemical vapor deposition (CVD) in FIG. 6j. The thickness of the gate oxide could range from 10 nm to 100 nm. Either dry or wet thermal oxidation could be used for oxide growth. Plasma-enhanced CVD (PECVD) or low-pressure CVD (LPCVD) could be used for gate oxide deposition. A polysilicon gate layer is then deposited on the top A413 in FIG. 6k. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. A hard mask A414 is deposited on top and patterned as shown in FIG. 6l. The polysilicon gate layer A413 is etched by using the patterned mask layer A414 in FIG. 6m. The mask layer A414 is then removed from the top in FIG. 6n. An interlayer dielectric (ILD) layer A415 comprising 50 nm-1000 nm thick silicon dioxide, silicon nitride, silicon oxynitride layers or a stacked combination thereof is deposited on the wafer; a hard mask A416 is deposited and patterned on top to define the ILD opening; the ILD layer is patterned using the hard mask A416 as shown in FIG. 6o. Further the gate oxide is etched using the same mask A416 in FIG. 6p. The mask A416 is then removed and a nickel silicide region A417 is formed on the exposed SiC surface in FIG. 6q. Interconnect metal layers A418 (either Al or Ag or Au) is deposited and patterned on the top and bottom of the chip in. FIG. 6r The main problem in the prior art device in FIG. 1a as recognized by the authors of this invention is that the p-well regions do not effectively shield the sensitive gate oxide from the high electric fields present in 4H-SiC especially during high drain bias (blocking mode operation). The presence of the deeper PS #1 region results in moving the peak electric field location from the corner of the p-well region to the PS #1 region. In other words, the location of the peak electric field in 4H-SiC during high drain bias operation has been moved farther away from the gate oxide.

The advantage of this embodiment shown in FIG. 5 is that the breakdown location has been moved from the corner of the p-well region to the base of the newly formed PS #1 region, which is both farther away from the gate oxide interface and deeper into the semiconductor. The electric field in the gate oxide for the device structure incorporating the PS #1 region is now significantly lower than the prior art device which is shown using device simulation using SILVACO ATLAS in FIG. 7b.

Figure 7A:
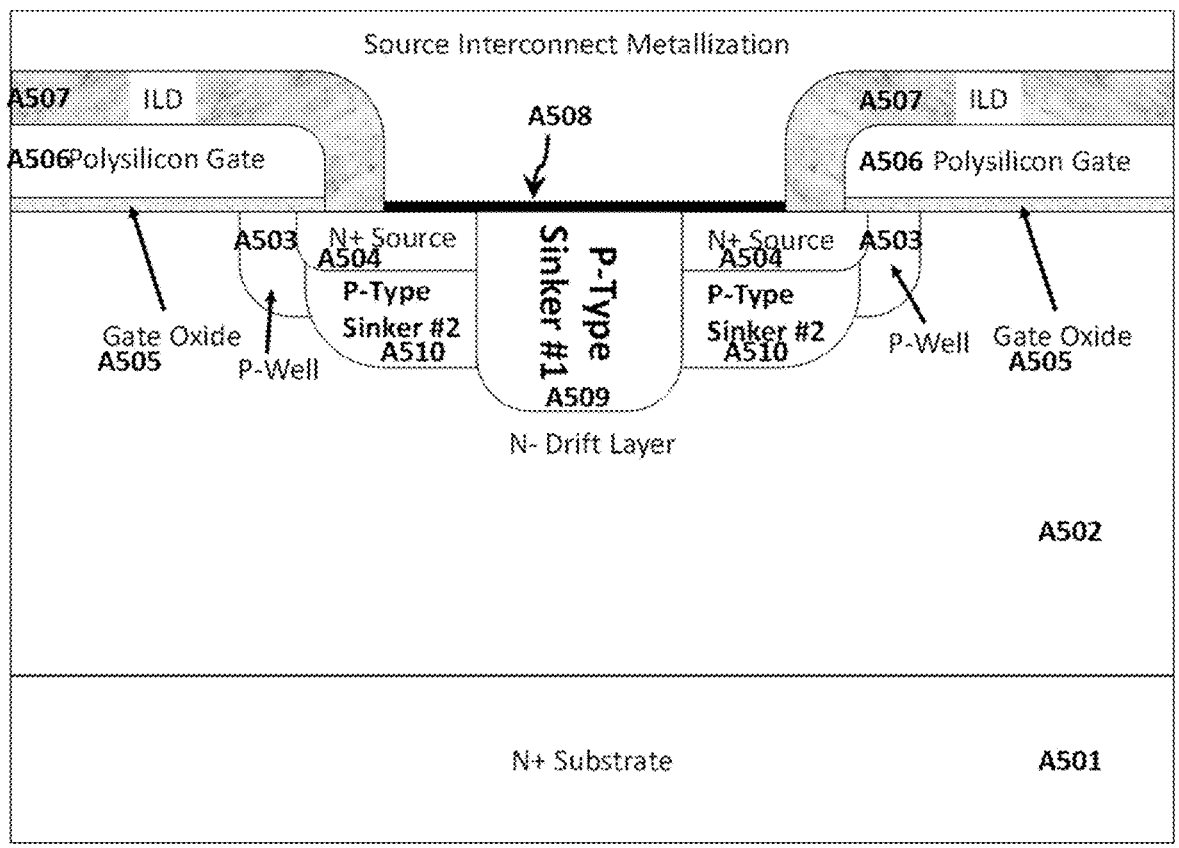
FIG. 7a shows an embodiment of a SiC DMOSFET where a P-type Sinker #2 region under the N+ source region is formed in addition to the deep P-type Sinker #1 region.

An embodiment shown in FIG. 7a is the cross-sectional unit cell of a vertical power DMOSFET. The key regions of this device are a p-well region A503, which is formed by ion-implantation or epitaxial re-growth of a p-type species such as aluminum or boron. There is an N+ source region A504, N− drift layer A502, and an N+ substrate A501. In the ON state when a gate voltage is applied to the polysilicon gate A506, the current flows vertically from the drain A501, through the inversion layer which is formed at the top of the p-well layer A503, through the N+ source region A504, and out through the source metallization A508. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide A505. Another feature is an ILD layer A507 which is used to insulate the source interconnect metallization A508 from the poly-silicon gate A506. Here a second P-type Sinker #2 (PS #2) region A510 under the N+ source region A504 is formed in addition to the PS #1 region A509 already described in an embodiment shown in FIG. 5. The PS #2 region is formed deeper than the p-well region A503 but shallower than the PS #1 region A509. For example, the PS #2 region A510 can be made 20% deeper than the p-well region A503, while the PS #1 region A509 can be made 20% deeper than the PS #2 region A510.

The presence of the PS #2 region results in a sharing of the peak electric field under high drain bias operation between the PS #1 and PS #2 regions. The presence of the PS #2 region alleviates a local maximum of the peak electric field in the device structure under high drain bias conditions. In the prior art SiC MOSFET shown in FIG. 1a, the design of the p-well region needs to satisfy conflicting requirements. The electrical dose in the p-well region under the N+ source region must be high enough to prevent reach-through breakdown under off-state (high drain bias) operation. But, at the same time, the surface doping of the p-well region must be low enough to maintain a reasonably low gate threshold voltage and device ON resistance. In this context, the PS #2 region introduced in this embodiment can be thought of as a secondary p-well region and can be designed with the main purpose of preventing reach-through breakdown and for appropriately shaping the electric field profile under high drain bias operation. The presence of the PS #2 region frees up the constraint in the design of the primary p-well region, which can be used for ON-state related device metrics such as gate threshold voltage and ON resistance. Since with the introduction of the PS #2 region, p-well region does not have to be designed with the objective of supporting the breakdown voltage it gives a lot more flexibility to the designer to design the p-well region suitably for just MOS channel formation.

Figure 7B:
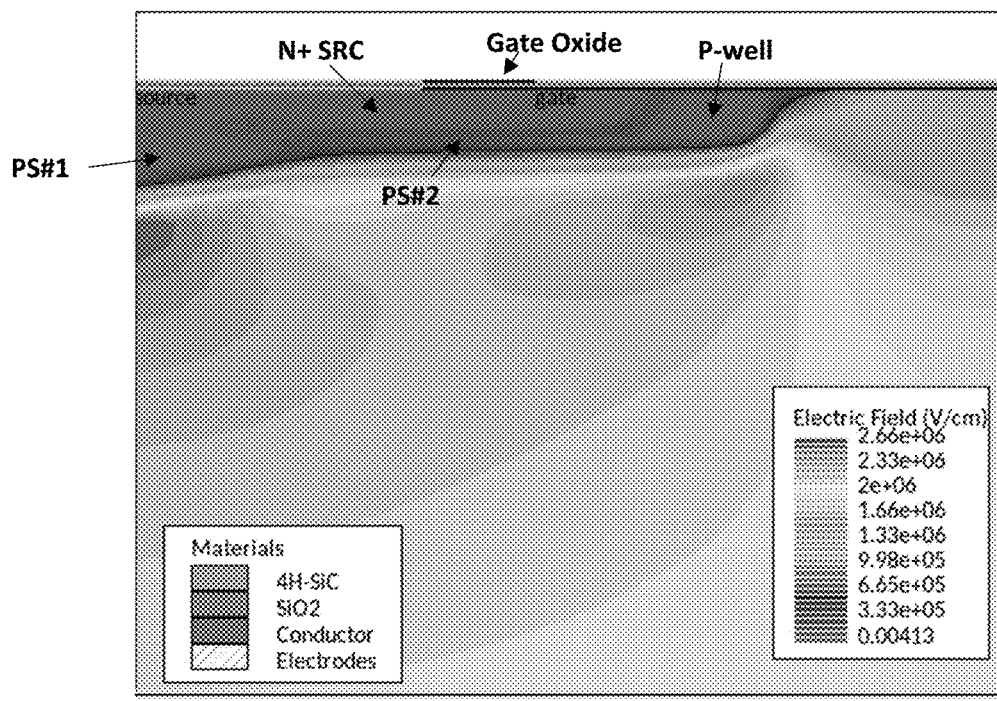

Breakdown simulation FIG. 7b of a SiC DMOSFET designed according to the two embodiments described in FIG. 5 and FIG. 7a shows that the peak electric field location has been moved away from the corner of the p-well region to the center of the unit cell, which results in a lower electric field in the gate oxide layer. More specifically, using the structural innovations disclosed in this document, one can achieve a peak electric field in the gate insulator of less than 3.5 MV/cm.

Figure 8A:
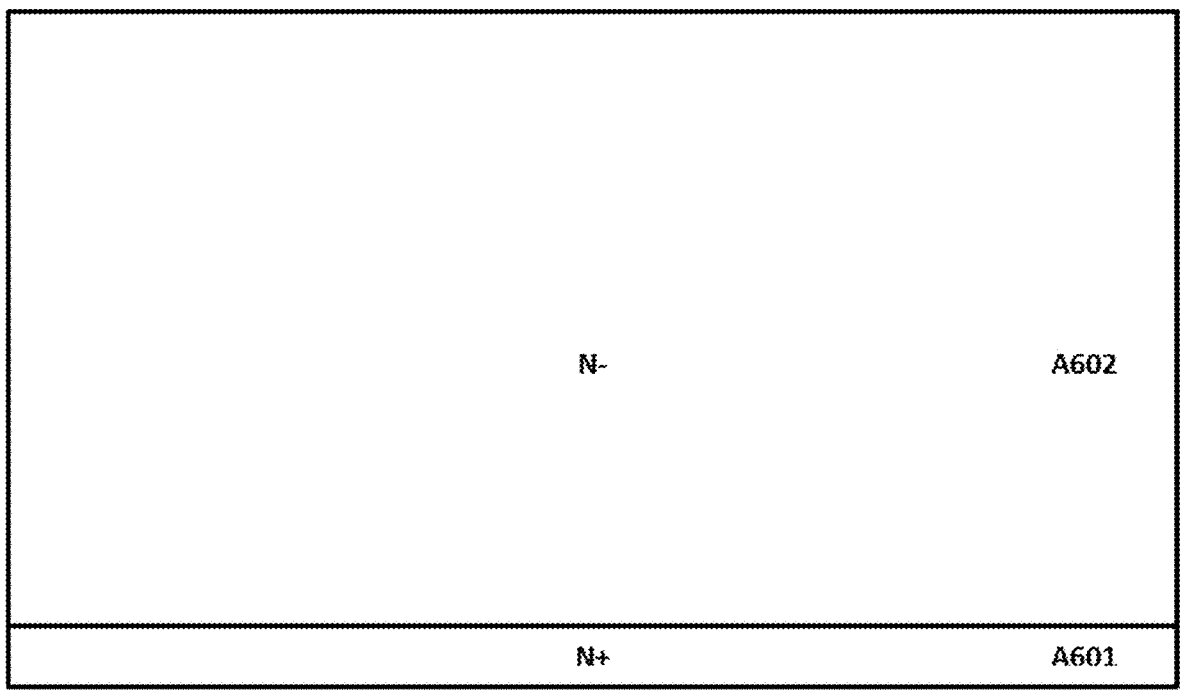
Figure 8B:
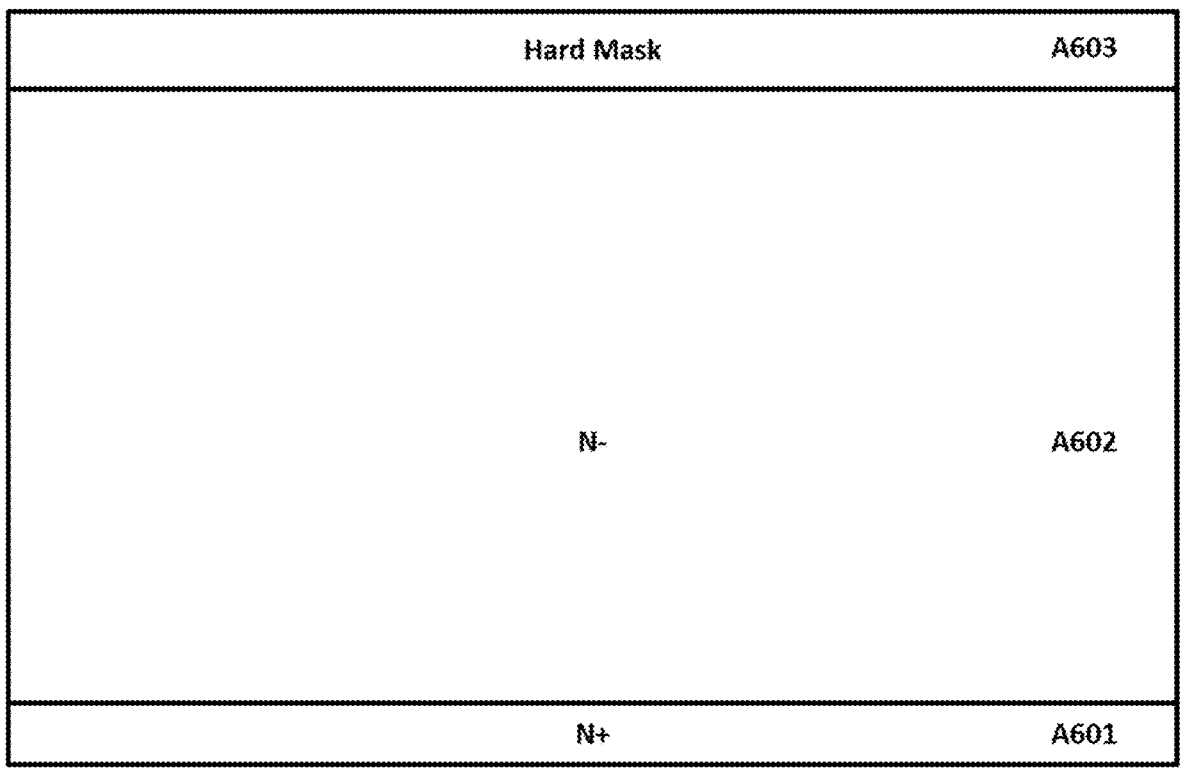
Figure 8C:
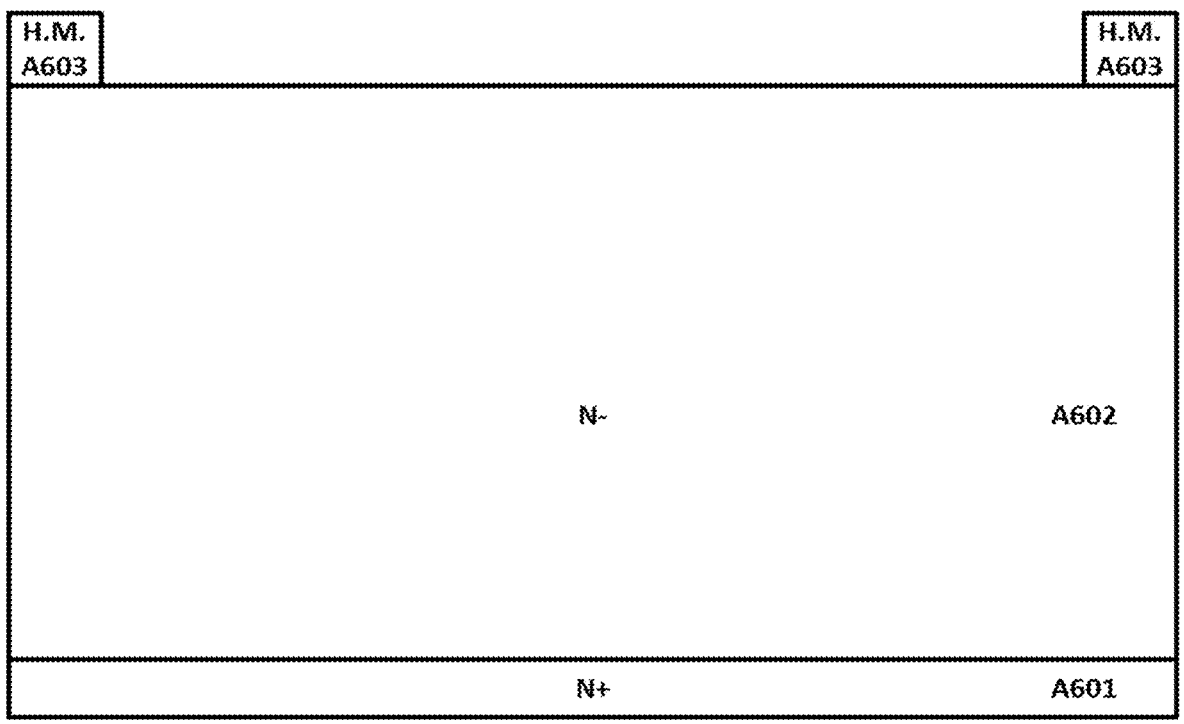
Figure 8D:
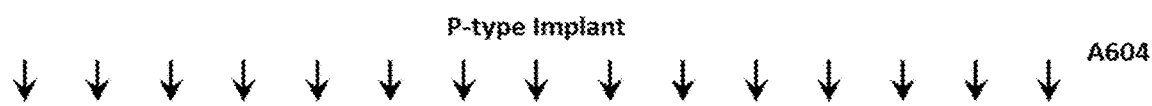
Figure 8D:
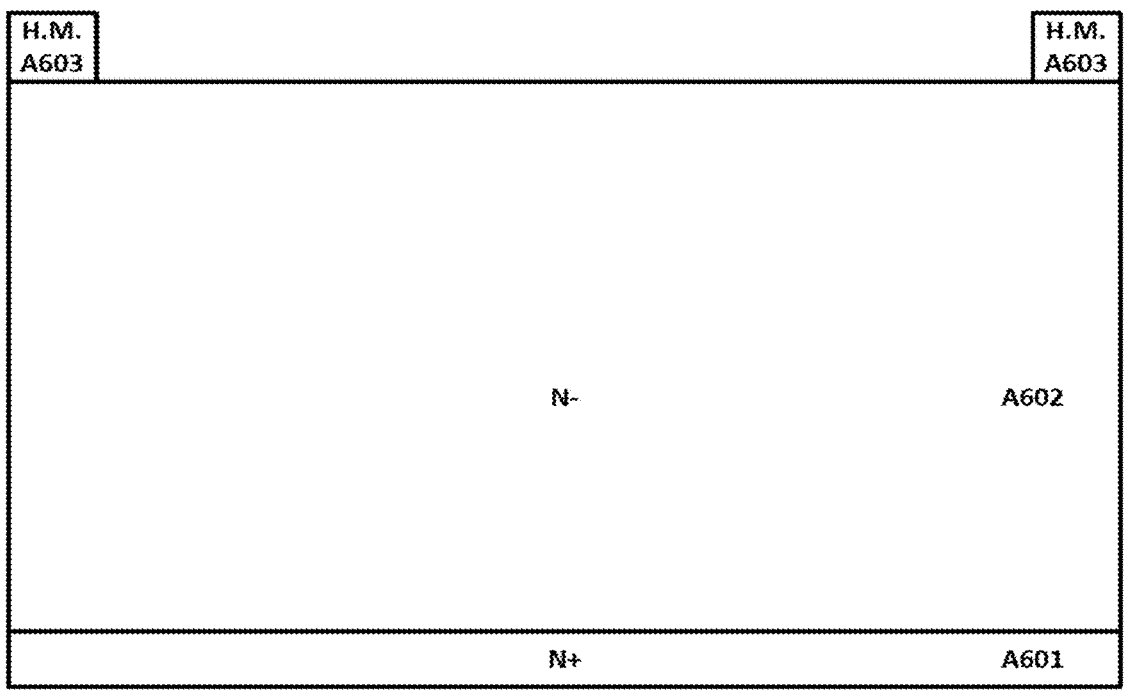
Figure 8E:
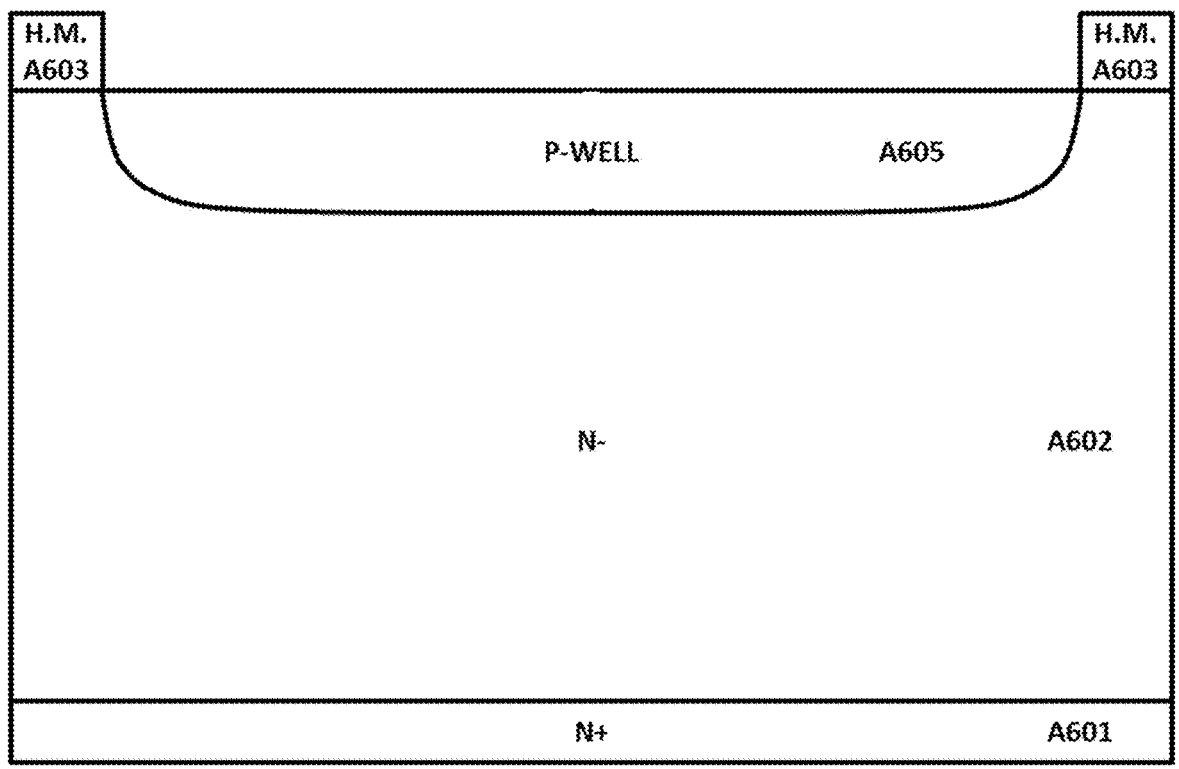
Figure 8F:
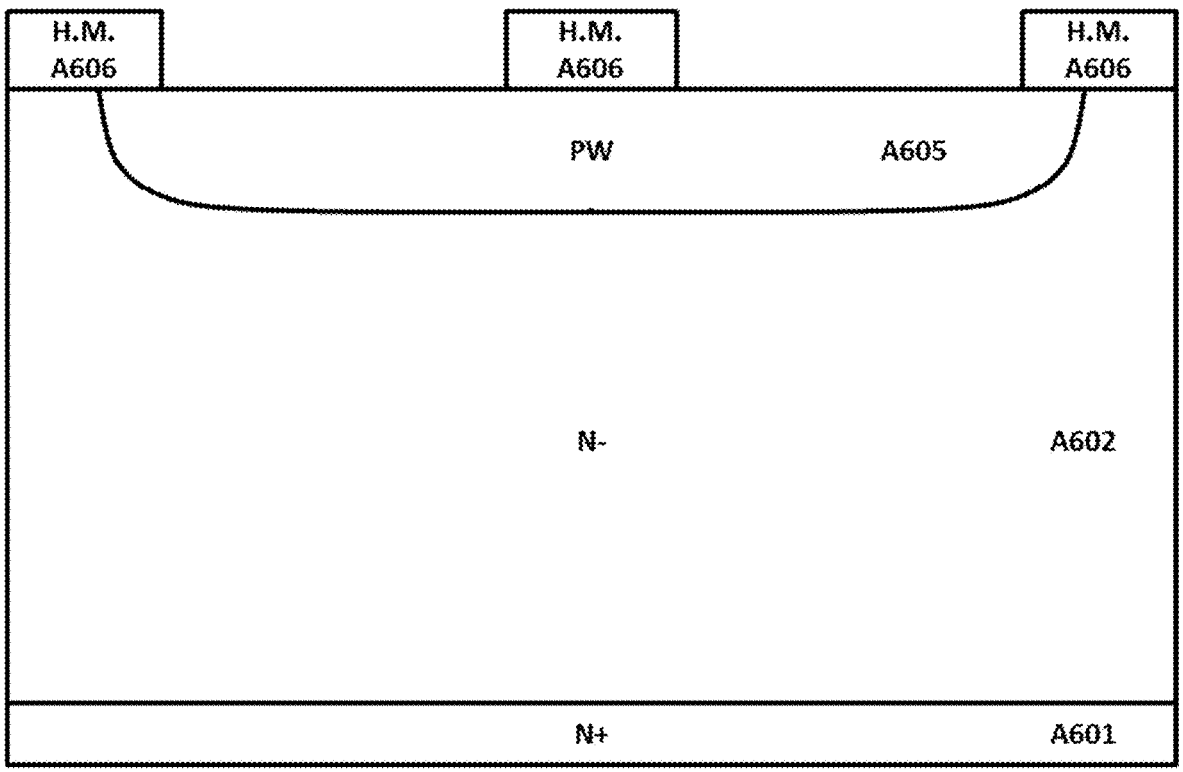
Figure 8G:
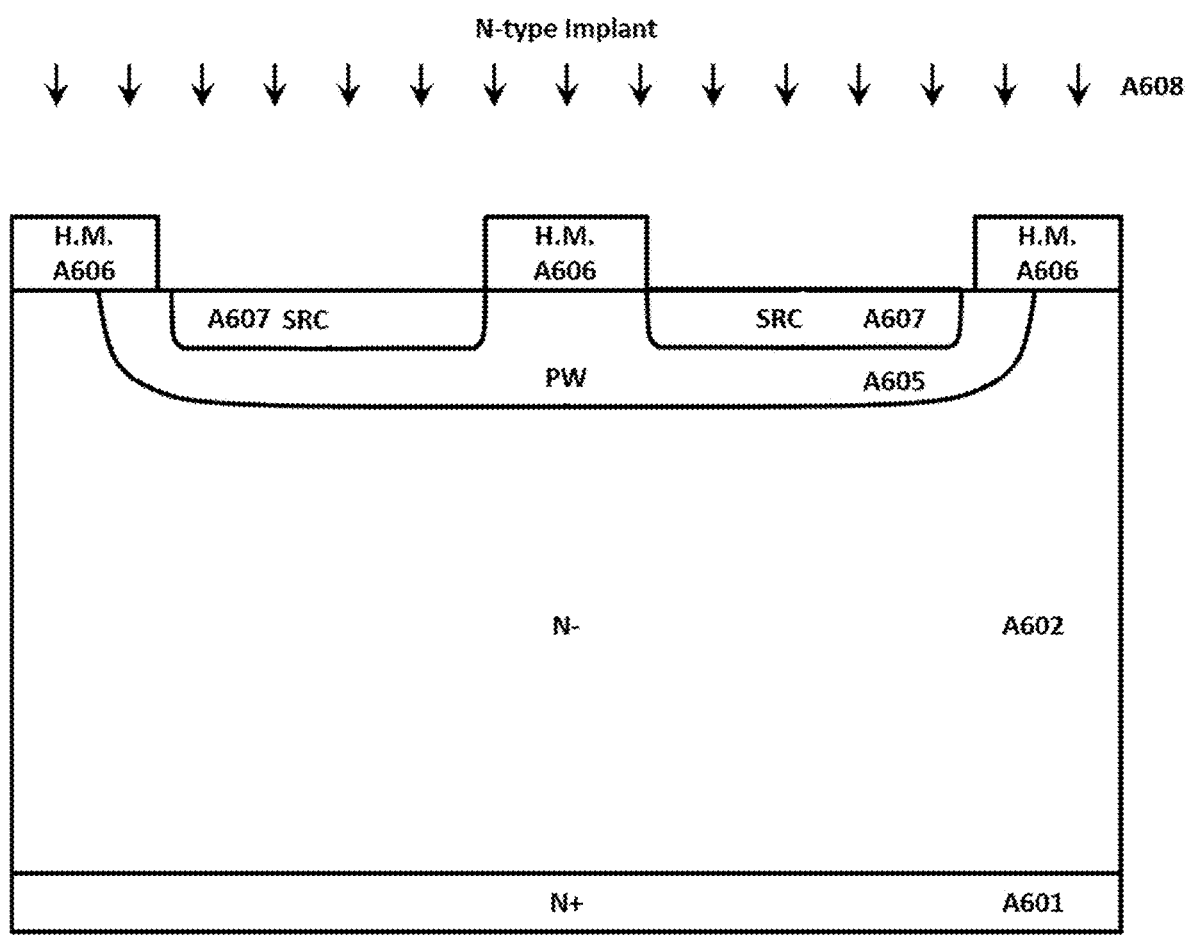
Figure 8H:
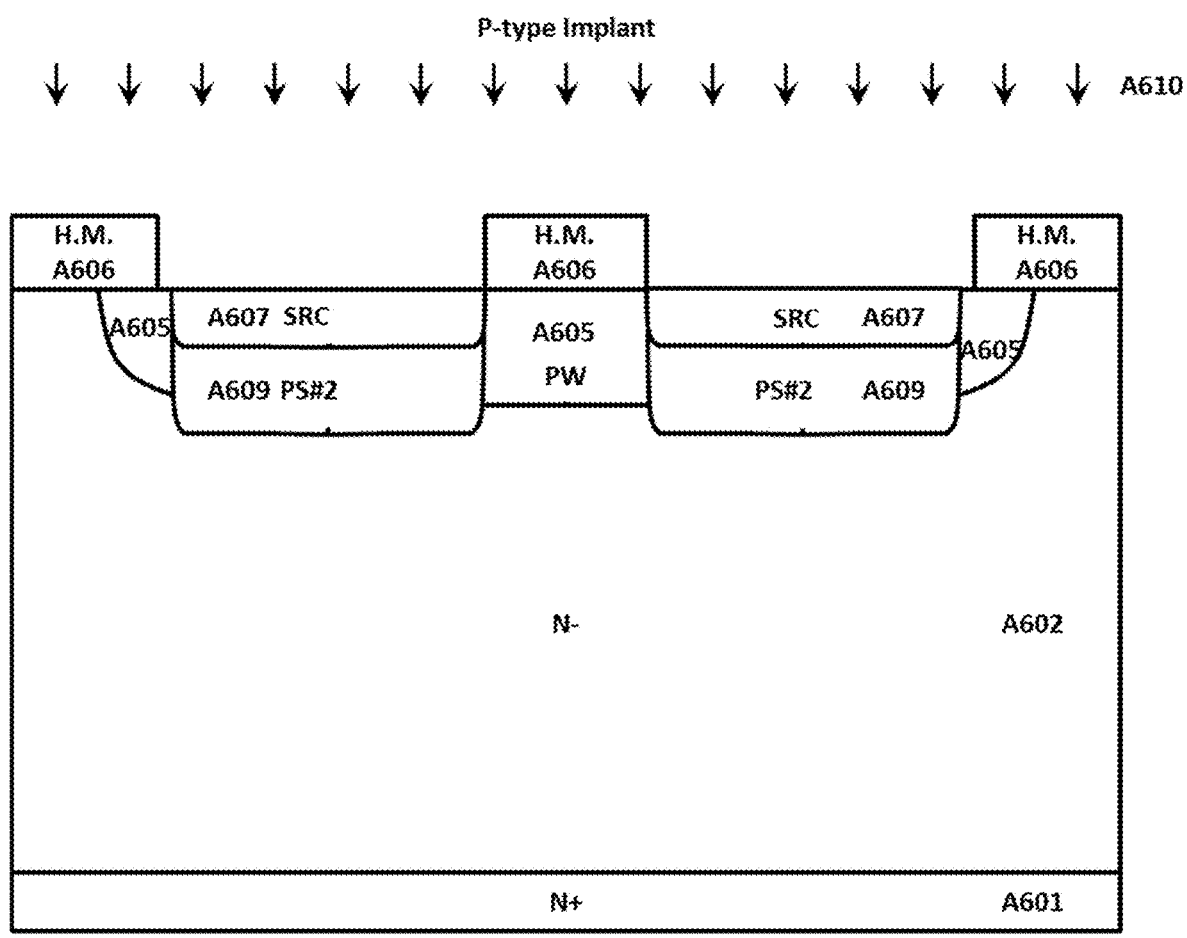
Figure 8I:
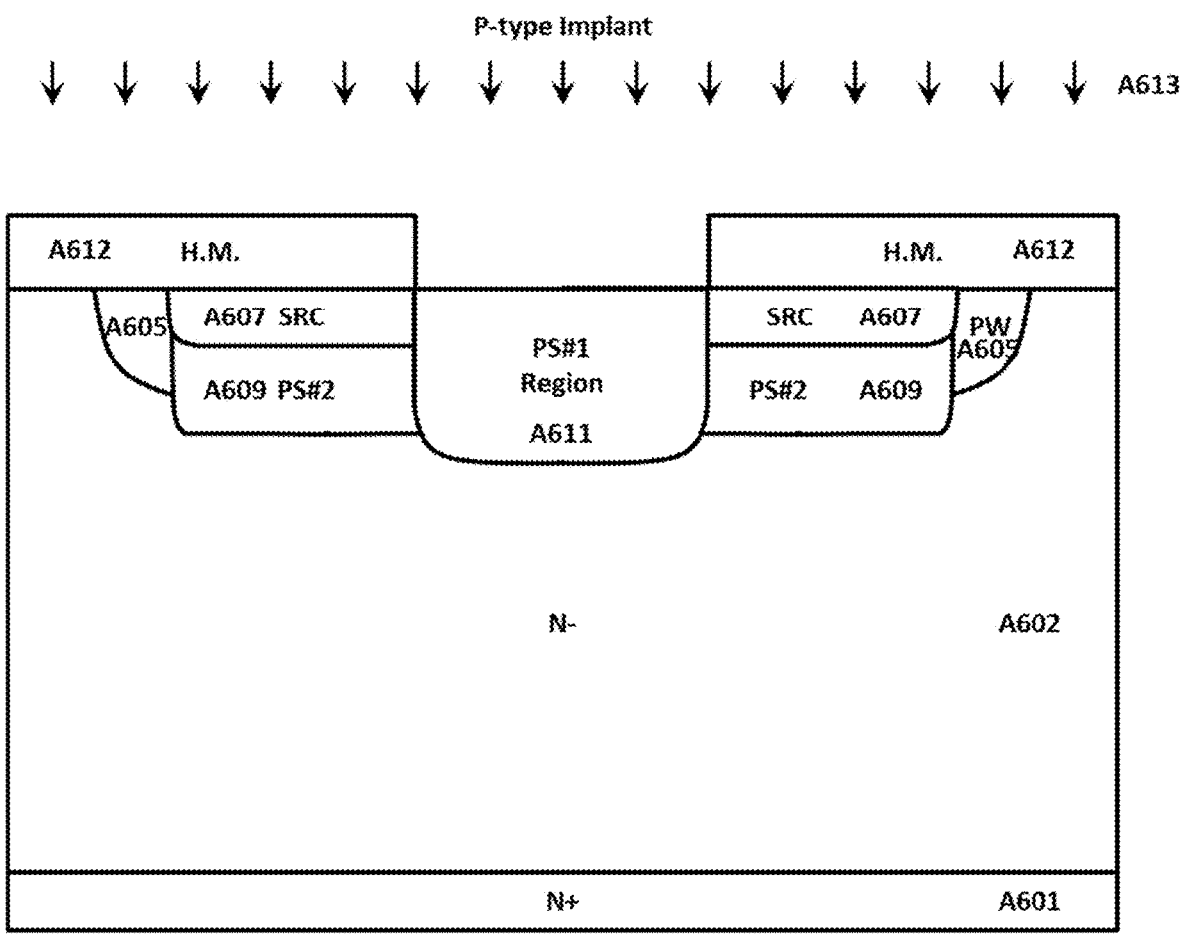
Figure 8J:
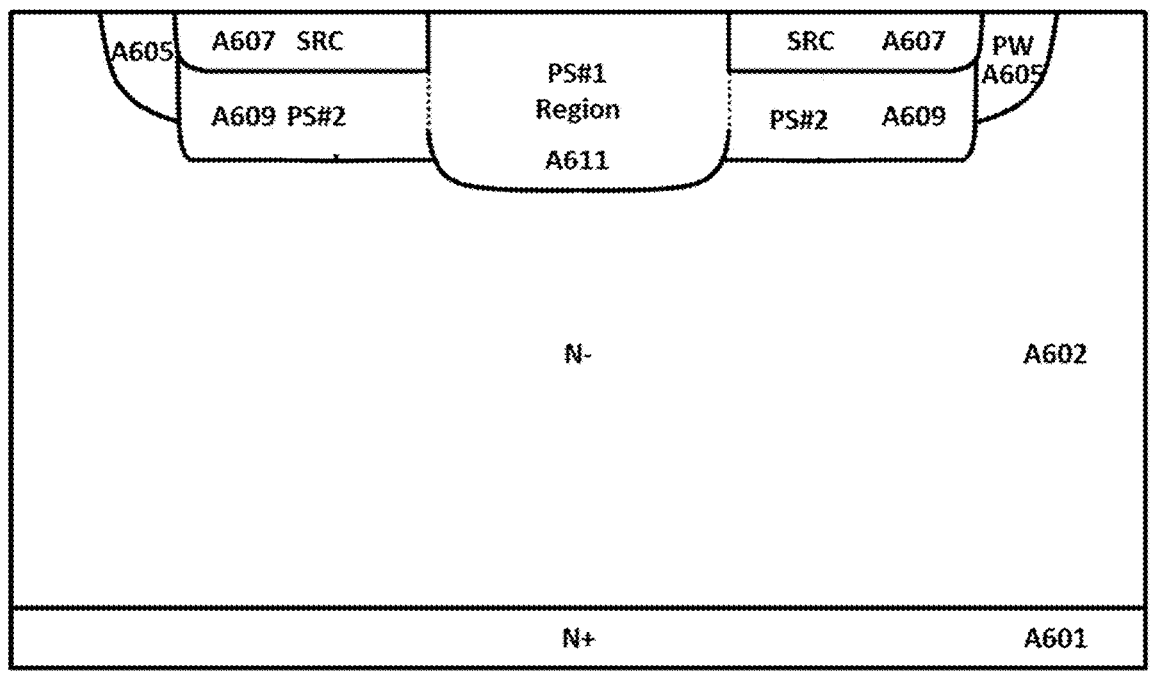

FIG. 8a to FIG. 8j describes the process of manufacturing the structure shown in FIG. 7a. The manufacturing process for a SiC DMOSFET is on a SiC substrate A601 and starts with using a 4H-SiC Si-face epi-wafer with suitable doping ($10^{14}$-$10^{18}$ cm$^{-3}$) and thickness (1 µm to 300 µm) for the epilayer A602 shown in FIG. 8a. A blanket hard mask A603 comprising a CVD deposited layer of silicon dioxide, silicon nitride, silicon oxynitride, or a metallic layer such as nickel, with thickness ranging from 50 nm to 5 µm is deposited in FIG. 8b and then patterned using photolithography followed by a dry etch (using a reactive ion-etch for example) as shown in FIG. 8c. A P-type implantation A604 comprising Boron or Aluminum, at energies ranging from 10 keV to 800 keV, at implant doses ranging from $10^{12}$ cm$^{-2}$ to $10^{15}$ cm$^{-2}$ is performed in FIG. 8d to create a p-well A605 in FIG. 8e. The mask A603 is removed, and another hard mask layer A606 is deposited comprising a CVD deposited layer of silicon dioxide, silicon nitride, silicon oxynitride, or a metallic layer such as nickel, with thickness ranging from 50 nm to 5 µm and patterned in FIG. 8f to define the N+ source region. Notice that the center of the unit cell is masked for source (SRC) implantation. The SRC (N+ source region) A607 is formed by implantation of the n-type (N+) impurity A608 comprising nitrogen or phosphorus, at energies ranging from 10 keV to 500 keV, at implant doses ranging from $10^{13}$ cm$^{-2}$ to $10^{16}$ cm$^{-2}$ as shown in FIG. 8g. The PS #2 region A609 is formed by implantation of the P type impurity A610 as shown in FIG. 8h. The deep PS #2 region can be formed using ion-implantation of aluminum or boron, which are commonly used p-type dopants in 4H-SiC. Boron can be advantageously used for forming this deep P-type Sinker region, since it has significantly higher implant range as compared to aluminum, and deep implants using boron can be formed with lower ion-implantation energies. If using aluminum, the PS #2 region may comprise implant energies ranging from 100 keV to 1 MeV and implant dose ranging from $10^{13}$ cm$^{-2}$ to $10^{16}$ cm$^{-2}$. If using boron, the PS #2 region may comprise implant energies ranging from 50 keV to 800 keV and implant dose ranging from $10^{13}$ cm$^{-2}$ to $10^{16}$ cm$^{-2}$. The same hard mask A606 utilized for forming the N+ source region is utilized for defining the ion-implanted PS #2 region. In this case, the PS #2 region is self-aligned under the N+ source region. The hard mask A606 is removed and another hard mask layer A612 is deposited and patterned in FIG. 8i. The PS #1 region A611 is formed by implantation of the P-type impurity A613 that may comprise aluminum or boron. Boron can be advantageously used for forming the PS #1 region, since it has significantly higher implant range as compared to aluminum, and deep implants using boron can be formed with lower ion-implantation energies. If using aluminum, the PS #1 region may comprise implant energies ranging from 100 keV to 1 MeV and implant dose ranging from $10^{13}$ cm$^{-2}$ to $10^{16}$ cm$^{-2}$. If using boron, the PS #1 region may comprise implant energies ranging from 50 keV to 800 keV and implant dose ranging from $10^{13}$ cm$^{-2}$ to $10^{16}$ cm$^{-2}$. PS #2 region can be formed with a depth higher than that of the p-well region but lower than that of the PS #1 region. As a second example of this embodiment, the PS #2 region can be made 20% deeper than the p-well region, while the PS #1 region can be made 20% deeper than the PS #2 region. In a related embodiment of this invention, the doping profile of the PS #1 and PS #2 regions can be formed with gradually decreasing doping concentration with a peak value at the SiC surface. This graded doping profile for the PS #1 and PS #2 regions can prevent the formation of sharp corners in the 3-Dimensional landscape and is beneficial for spreading the peak electric field during high drain bias operation over a larger area which results in a higher breakdown voltage. As examples, the PS #1 and PS #2 regions can be formed with a peak doping in the range of $10^{19}$ cm$^{-3}$ to $10^{20}$ cm$^{-3}$ close to the SiC surface and close to the N+ Source region, respectively. The doping concentration in the PS #1 and PS #2 regions may linearly decrease as a function of depth into the silicon carbide to the background N-drift layer doping (in the range of $10^{14}$-$10^{16}$ cm$^{-3}$). A linearly graded doping profile of the PS #1/PS #2 regions results in a sufficient portion of the drain potential being supported within the PS #1/PS #2 regions and not only the N– drift region. This results in a pseudo charge-balanced structure, which promotes breakdown over a larger SiC region, which results in a lower critical electric field at breakdown and consequently a lower electric field in the gate insulator. The formation of the PS #1 region is followed by the removal of the hard mask A612 (dry or wet etch) in FIG. 8j. The remaining steps in the process to create the structure shown in FIG. 7a exactly follows the same steps shown in FIG. 6j to FIG. 6r.

This "staircase" arrangement of the PS #1 and PS #2 regions with certain depths can result in an even lower electric field in the gate oxide under high drain bias operation. Yet another benefit of the PS #2 region is that the p-well region can be made shallower and with a lower implant dose, which can reduce the device ON-resistance while simultaneously increasing the gate threshold voltage, both of which are desirable from an applications standpoint. Thus, a better trade-off between the off-state and on-state performance is enabled by the teachings of this invention.

Figure 9A:
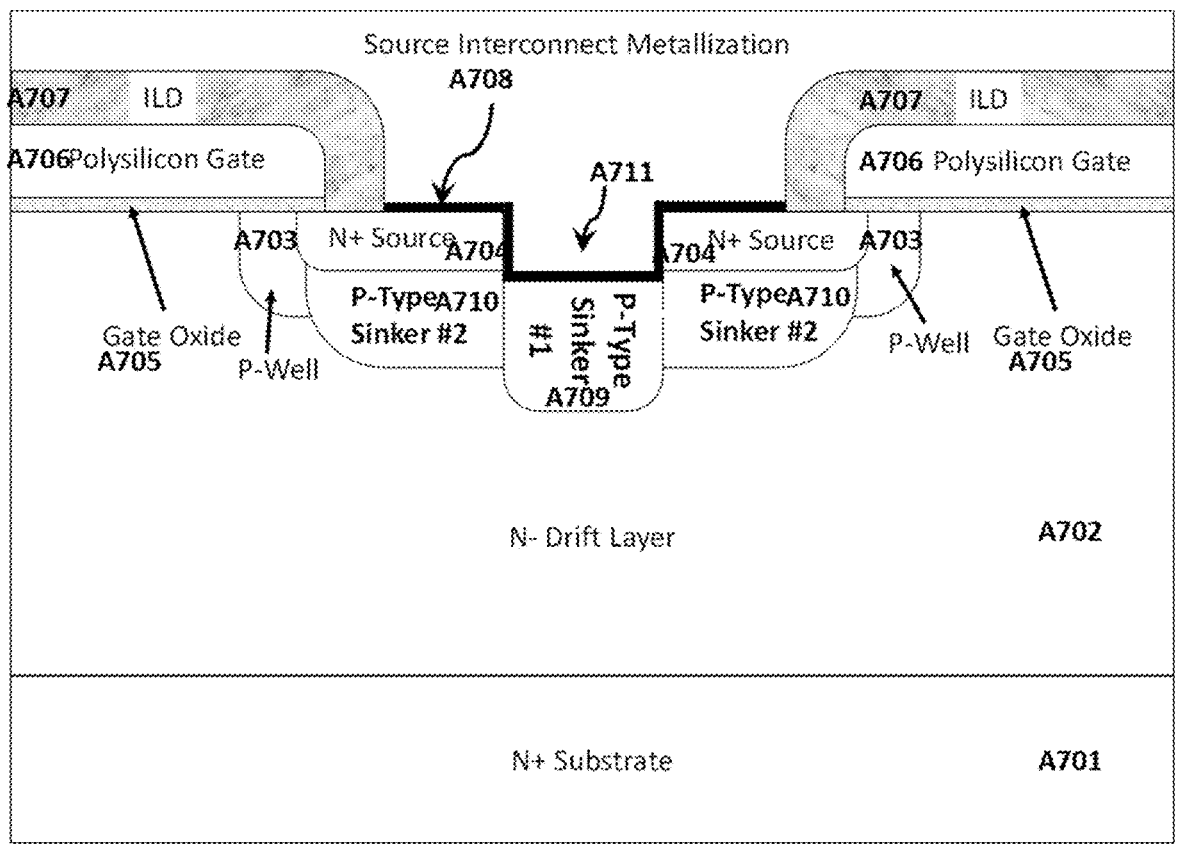
FIG. 9a shows an embodiment of a SiC DMOSFET where a trench is etched into the N+ source region before implanting the P-type Sinker #1 region.

An embodiment shown in FIG. 9a is the cross-sectional unit cell of a SiC DMOSFET. The key regions of this device are a p-well region A703, which is formed by ion-implantation or epitaxial re-growth of a p-type species such as aluminum or boron. There is an N+ source region A704, N- drift layer A702, and an N+ substrate A701. In the ON state when a gate voltage is applied to the polysilicon gate A706, the current flows vertically from the drain A701, through the inversion layer which is formed at the top of the p-well layer A703, through the N+ source region A704, and out through the source metallization A708. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide A705. Another feature is an inter-layer dielectric (ILD) layer A707 which is used to insulate the source interconnect metallization A708 from the poly-silicon gate A706. Here a trench A711 is etched into the N+ source region A704 before implanting the PS #1 region A709. Here PS #2 region A710 under the N+ source region A704 is formed in addition to the PS #1 region A709. The PS #2 region is formed deeper than the p-well region A703 but shallower than the PS #1 region A709. It is desirable to move the electric field location as far away from the gate oxide interface for robust blocking capability of the device operation which improves the device reliability. Moving the breakdown location to the middle of the unit cell which is furthest away from the gate oxide A705 is an embodiment and by etching a recess trench A711 into the N+ source region A704, you have effectively created a deeper PS #1 region than what was in FIG. 5 and FIG. 7a and moved the electric field even further away from the gate oxide region.

The PS #1 region is designed with the greatest depth among the P-type Sinker regions. While boron implantation is one technique to create such deep P-type regions in SiC technology, when you consider the maximum range of commercial ion-implanters available it becomes clear that ion implantation in SiC is not an easy process and deep ion implantation is particularly difficult. The function of the N+ source region which is also referred to as source trench is that the PS #1 region can be realized with lower ion-implantation energies, which lowers the cost and time of this implantation step, without any compromise in implantation depth. In the embodiment herein, a trench can be dry etched into SiC after the implantation of the N+ source region but before the implantation of the PS #1 region. The same hard mask layer used for the PS #1 implant can be used for etching the source trench into the SiC. In this embodiment herein, the hard mask layer is first patterned, followed by dry etching the trench into SiC, which is immediately followed by ion-implantation of the PS #1 region. The formation of the source trench naturally extends the depth of the PS #1 region. Hence, the PS #1 region can be realized with lower ion-implantation energies, which lowers the cost/time of this implantation step, without any compromise in implant depth. The formation of the source region also removes the N+ source region and enables a direct connection of the P-well region with the N+ source ohmic contact thereby grounding the p-well and shorting the P-well region with the N+ source region.

Figure 9B:
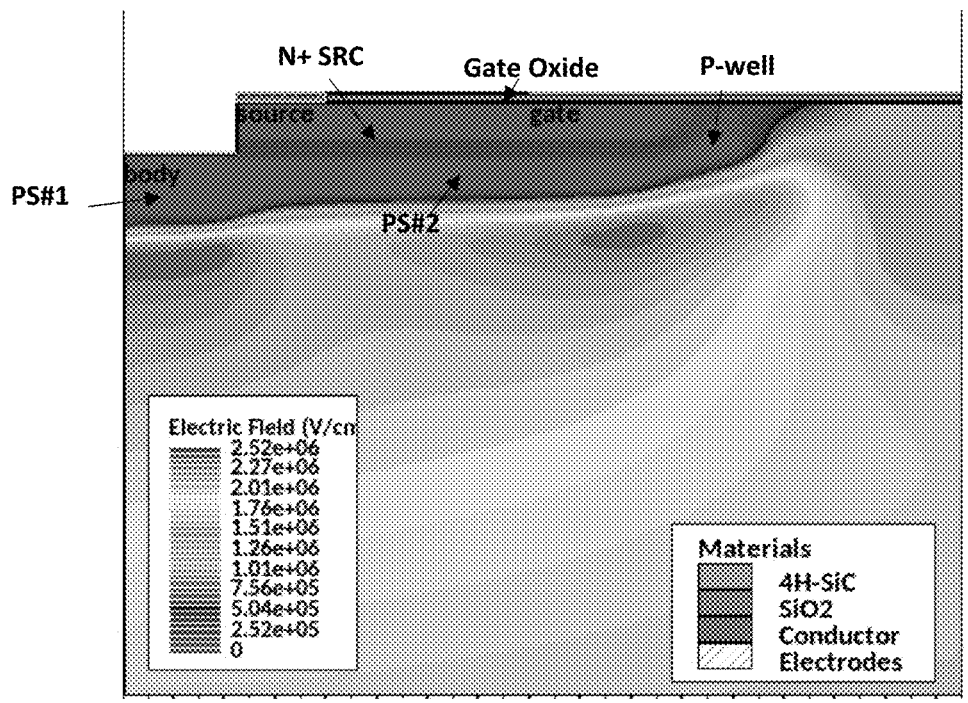

FIG. 9b is the breakdown simulation of a SiC MOSFET designed according to Embodiment shown in FIG. 9a which shows that the peak electric field location has been moved away from the corner of the p-well region to the center of the unit cell, which results in a lower electric field in the gate oxide layer.

Figure 10A:
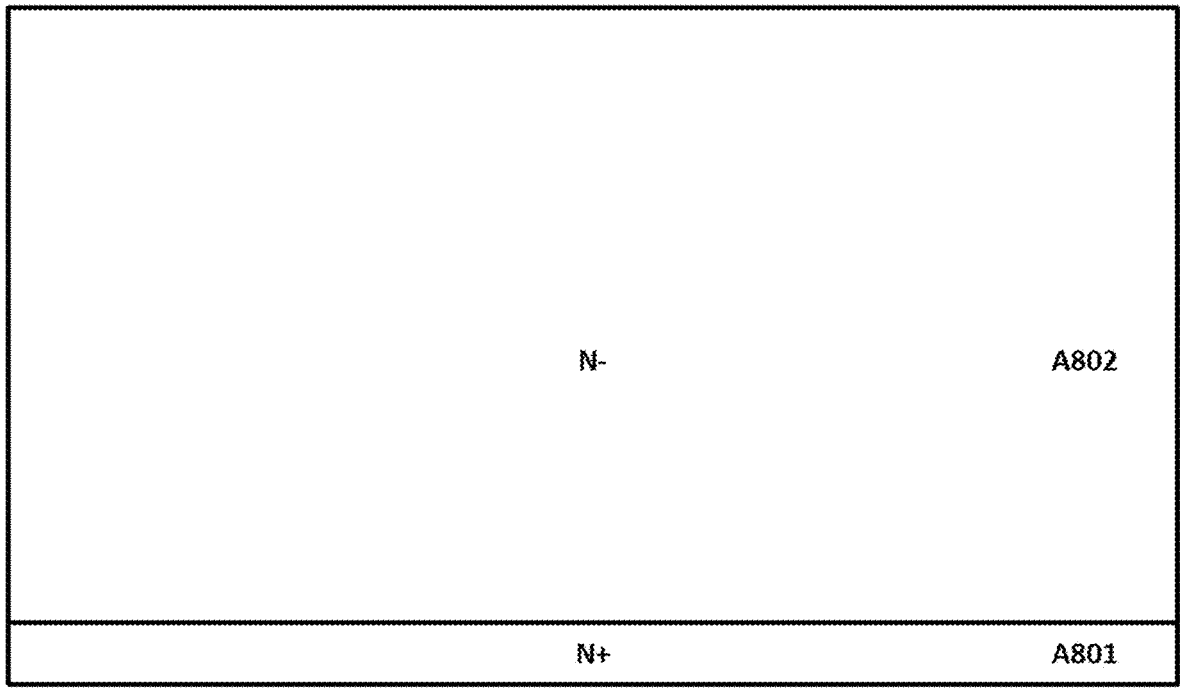
Figure 10B:
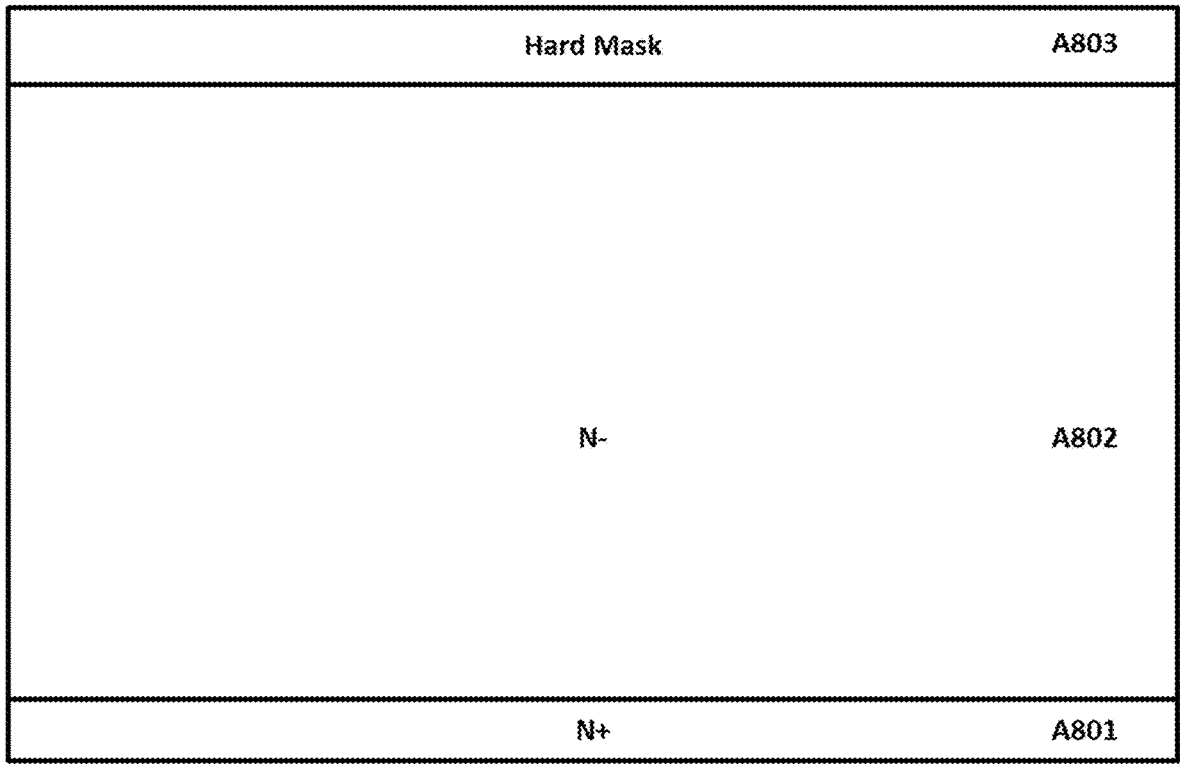
Figure 10C:
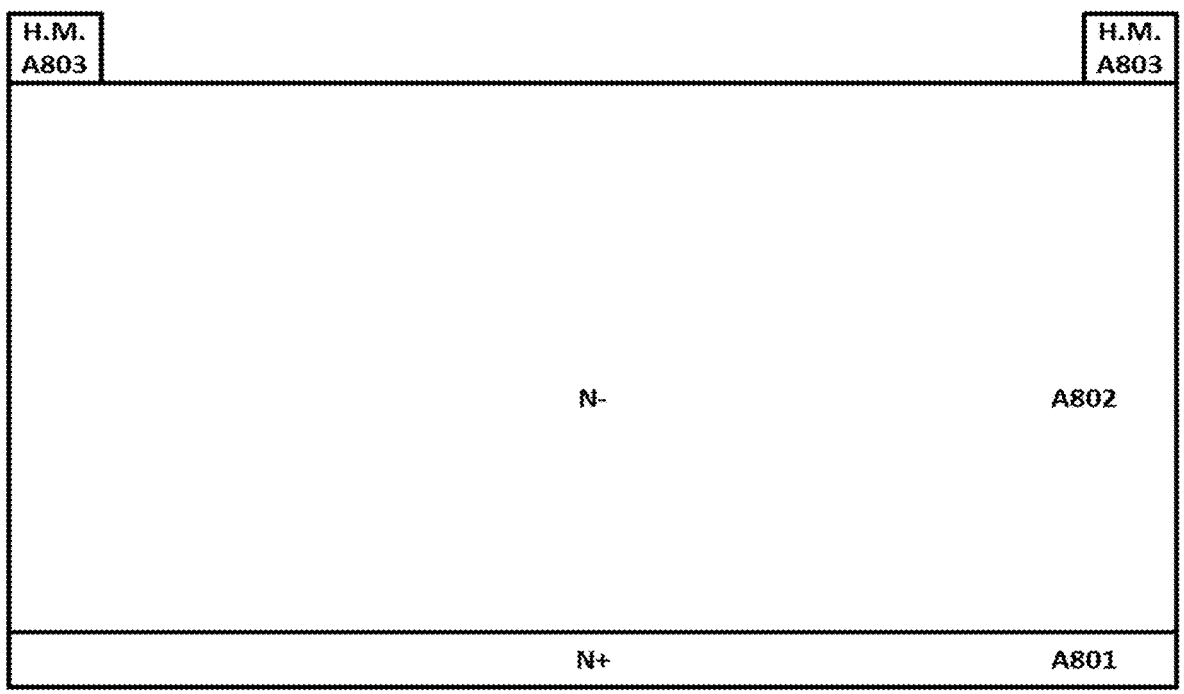
Figure 10D:
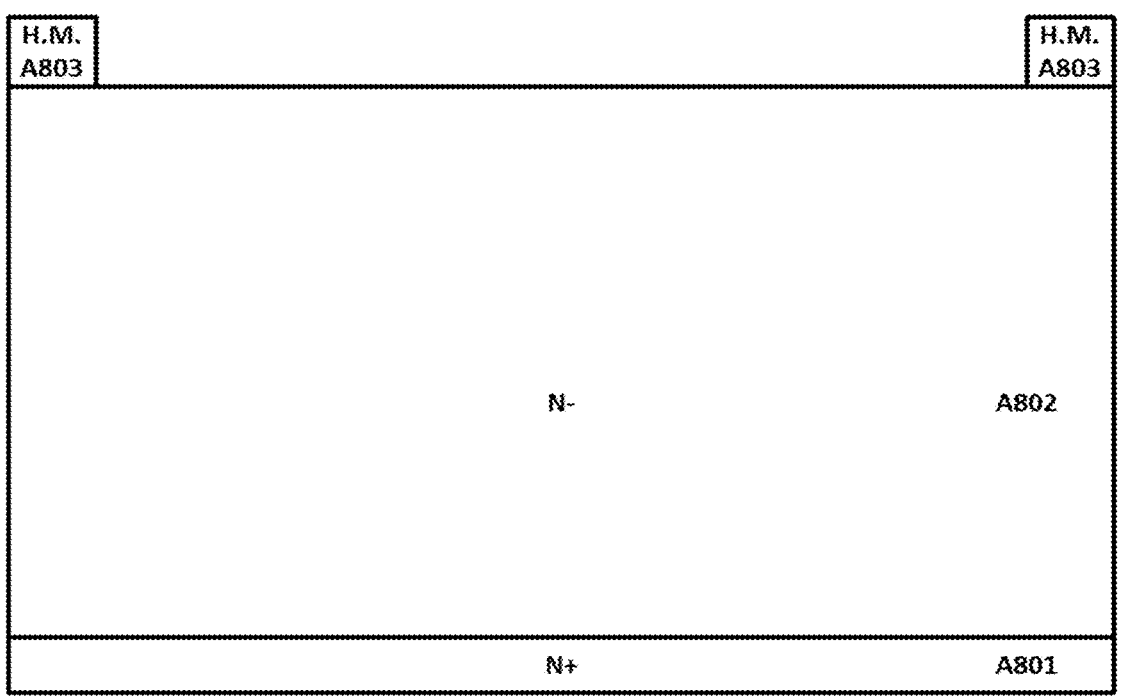
Figure 10E:
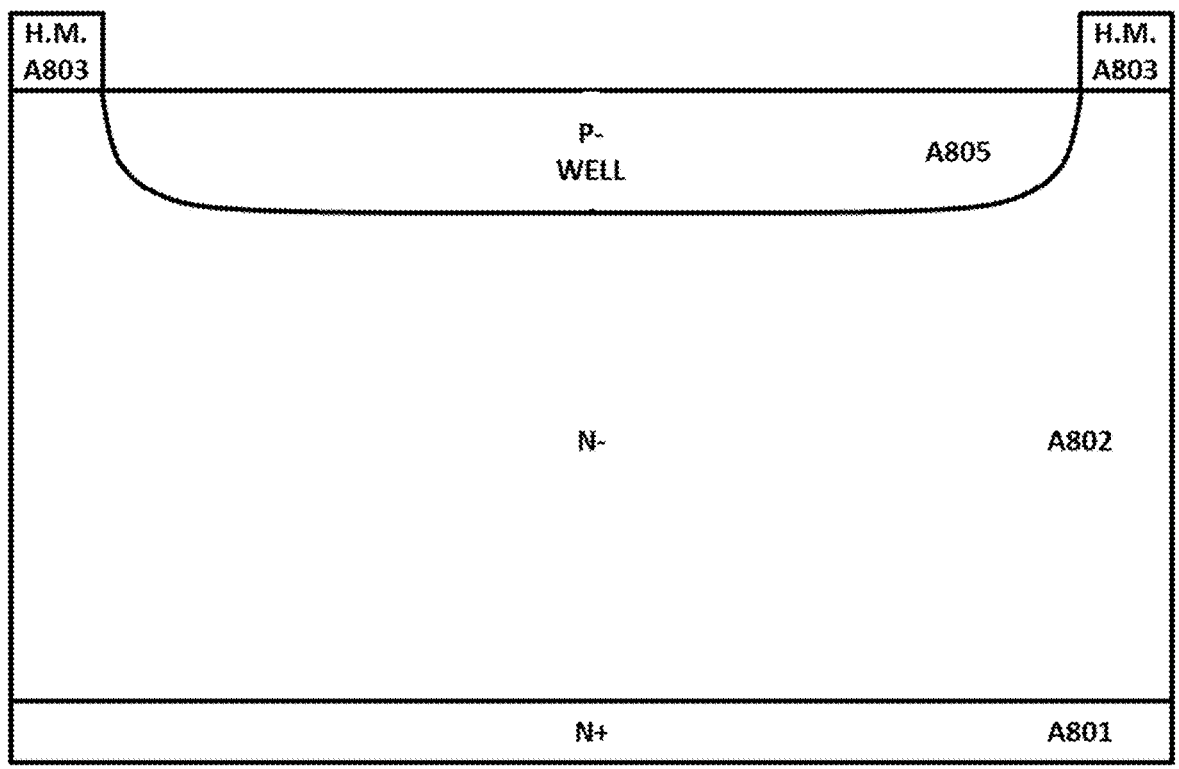
Figure 10F:
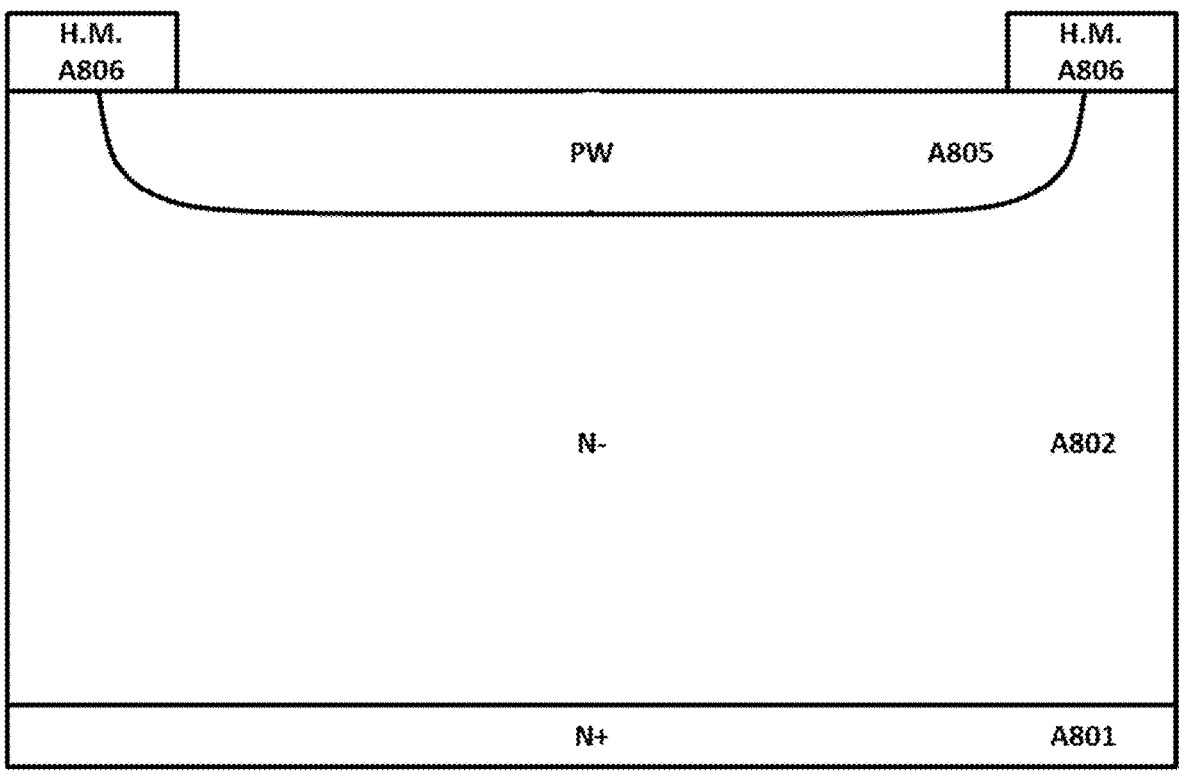
Figure 10G:
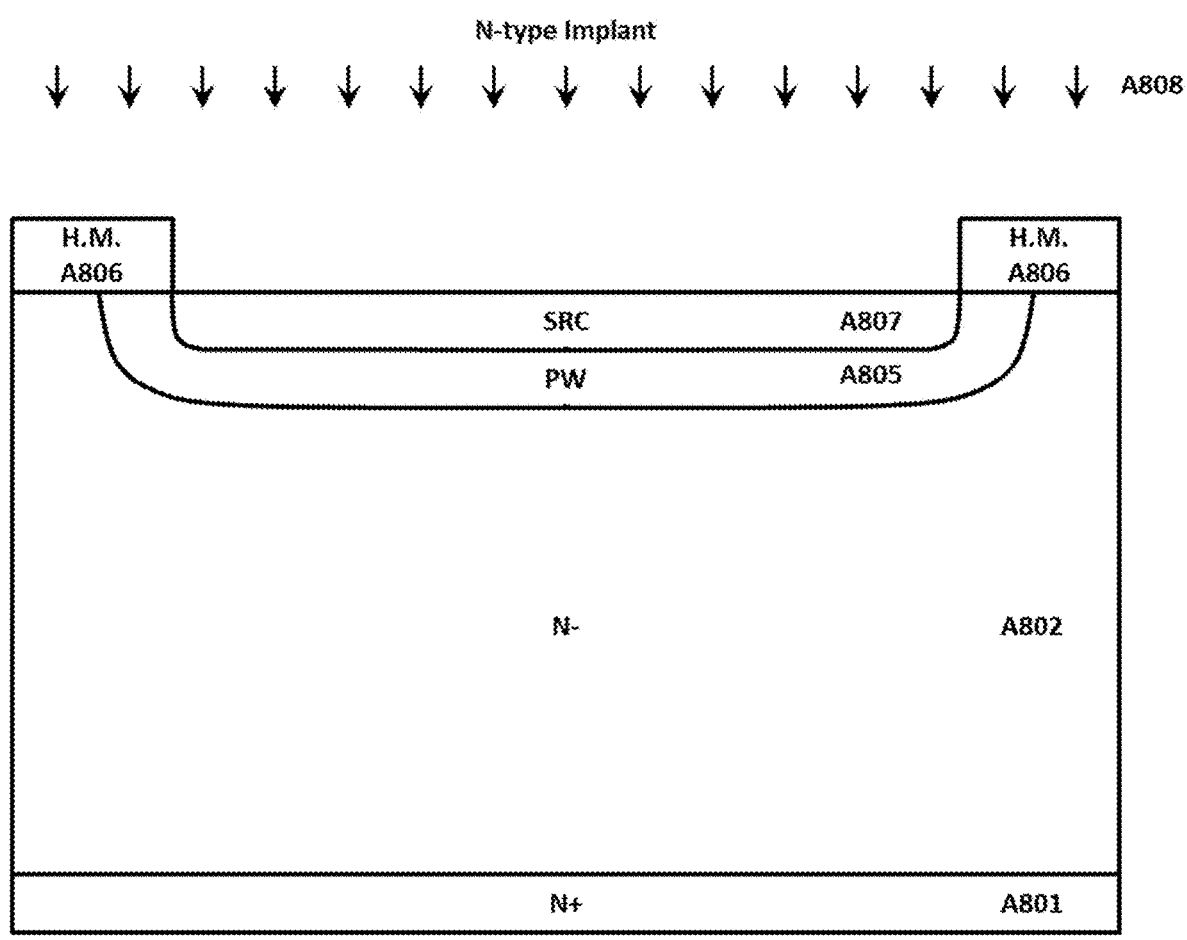
Figure 10H:
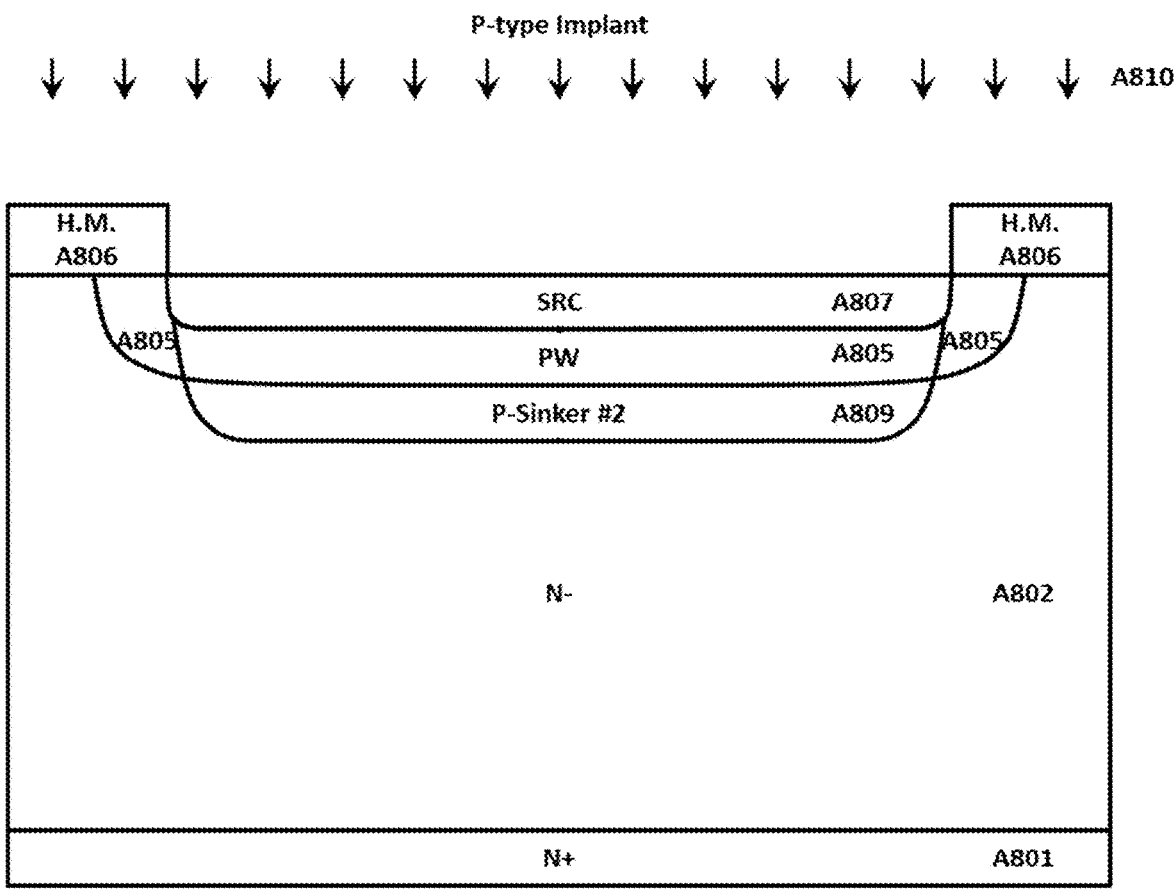
Figure 10I:
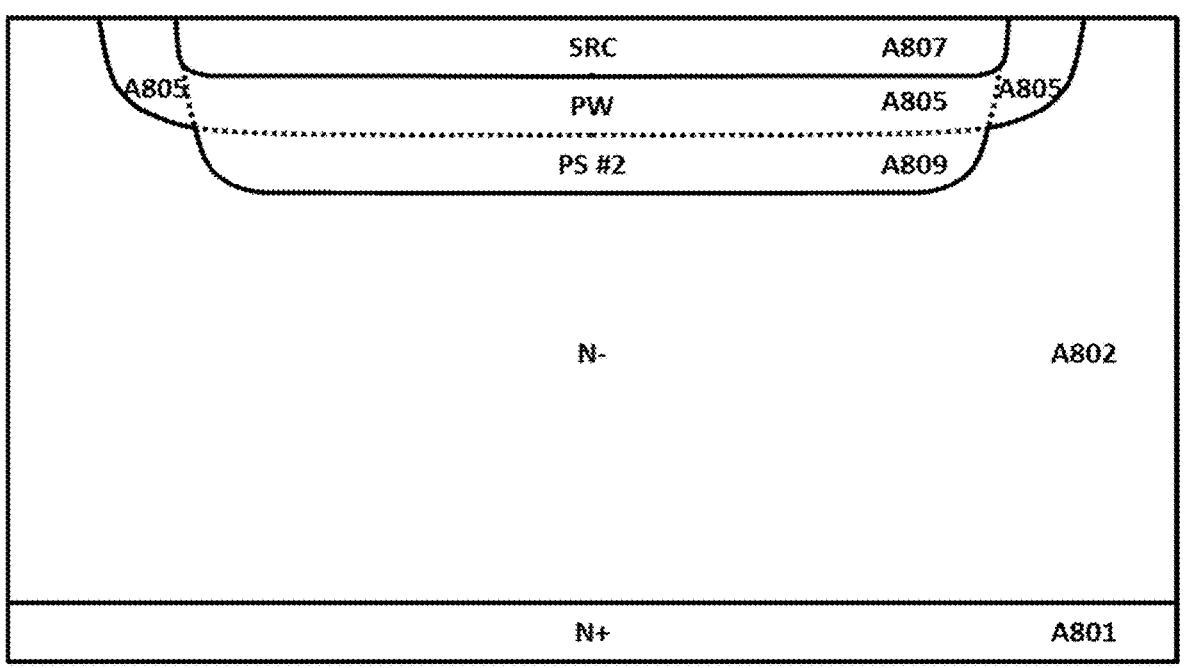
Figure 10J:
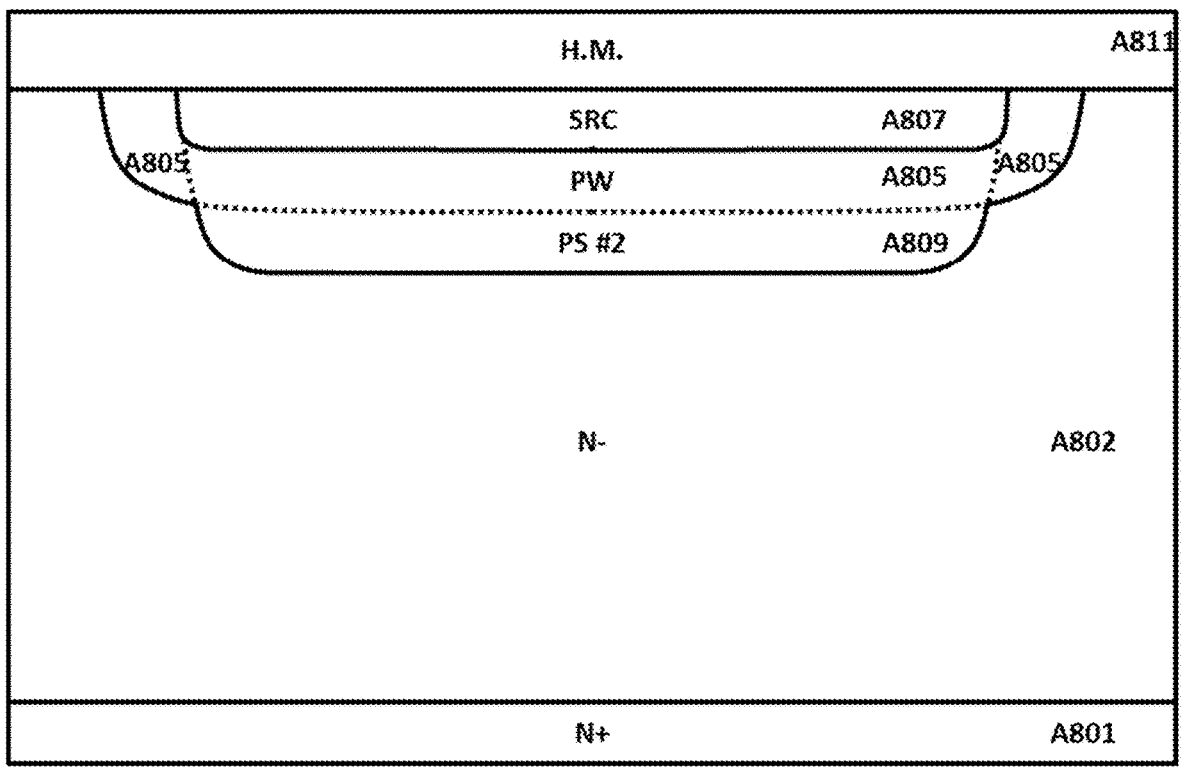
Figure 10K:
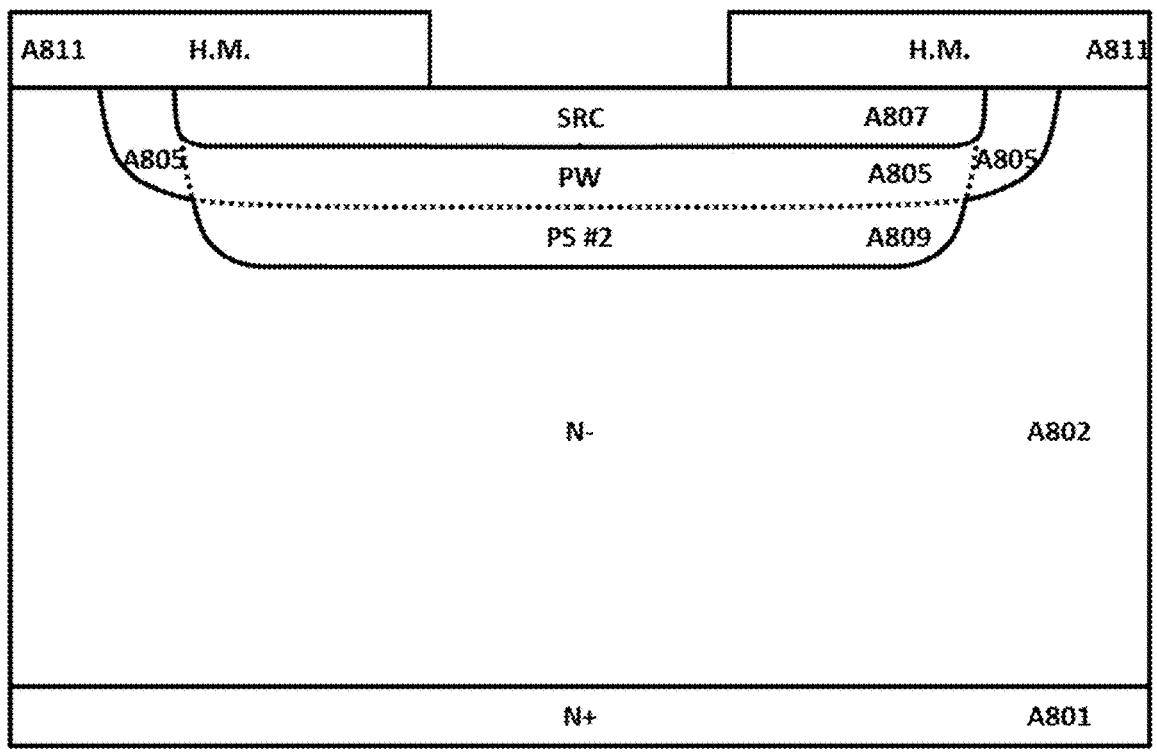
Figure 10L:
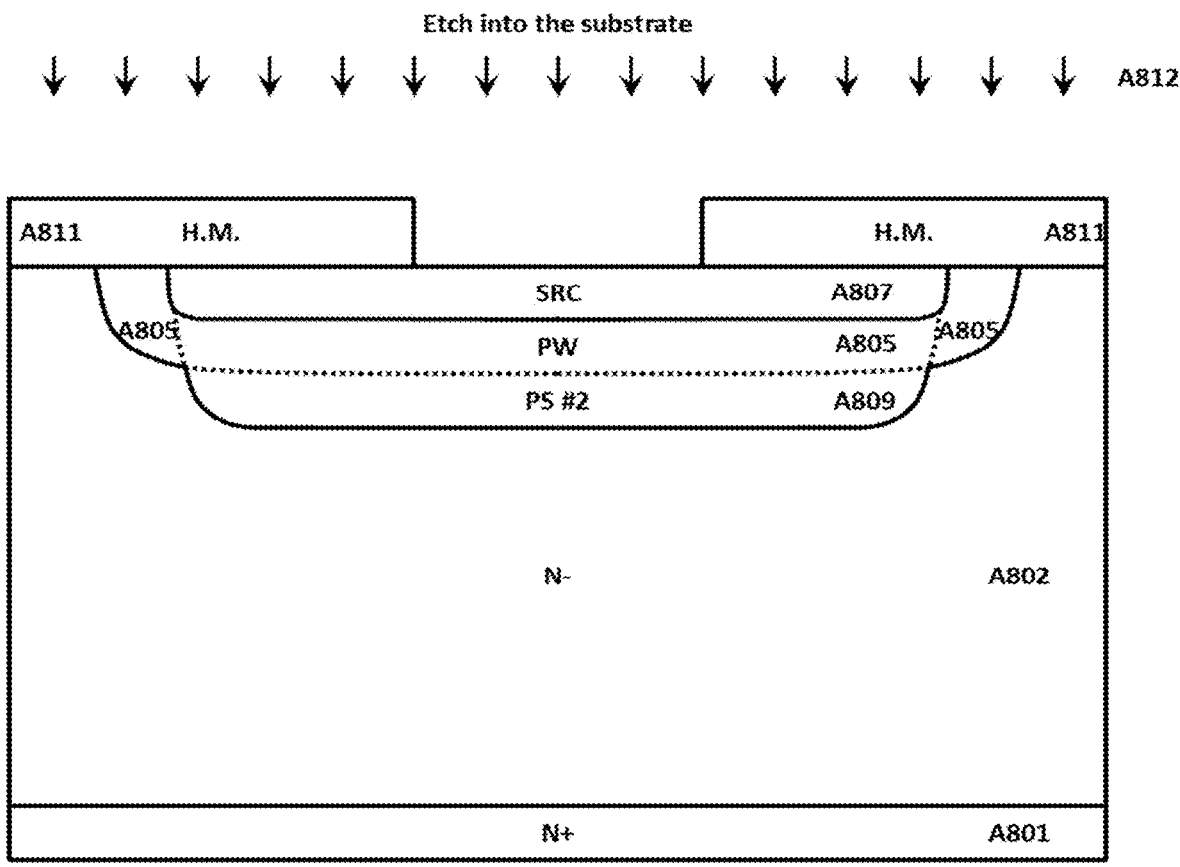
Figure 10M:
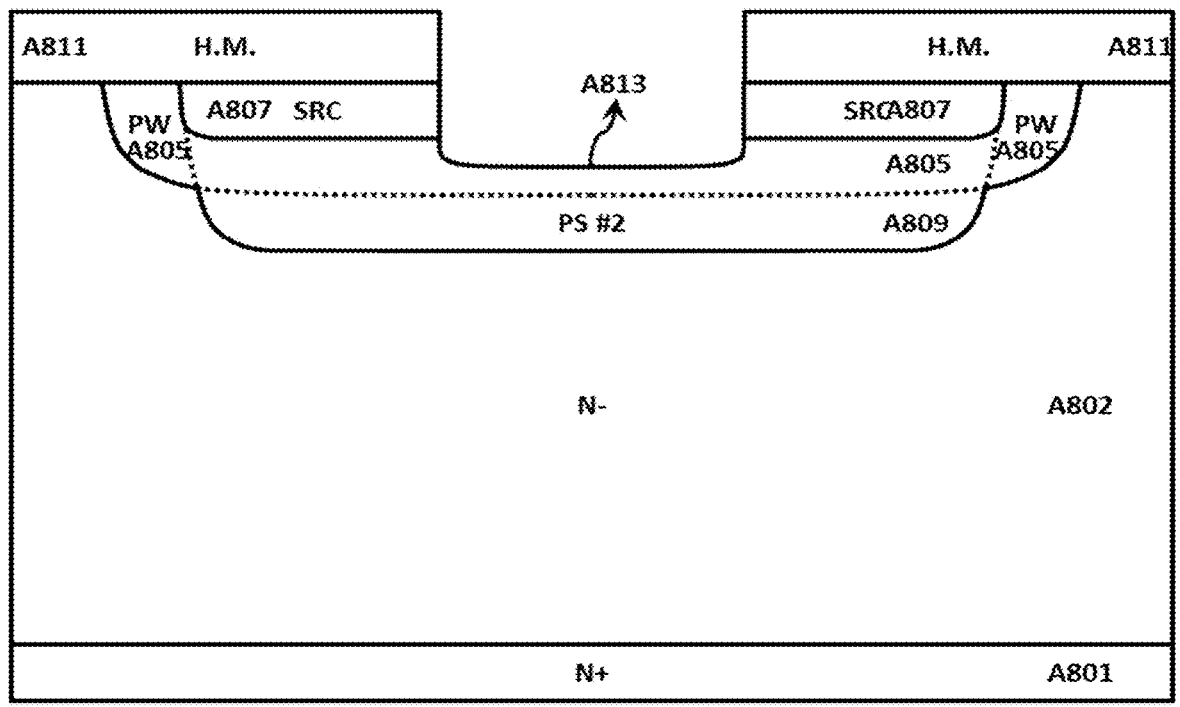
Figure 10N:
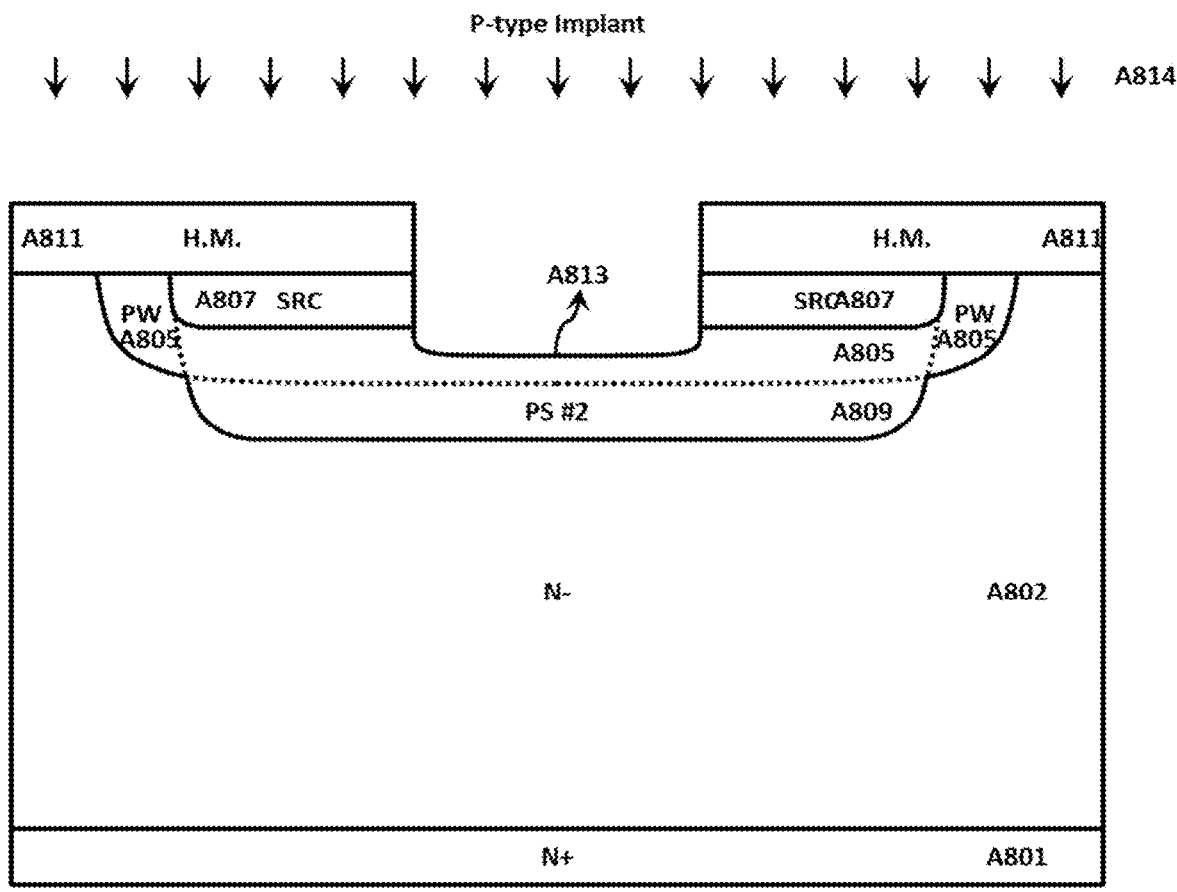
Figure 10O:
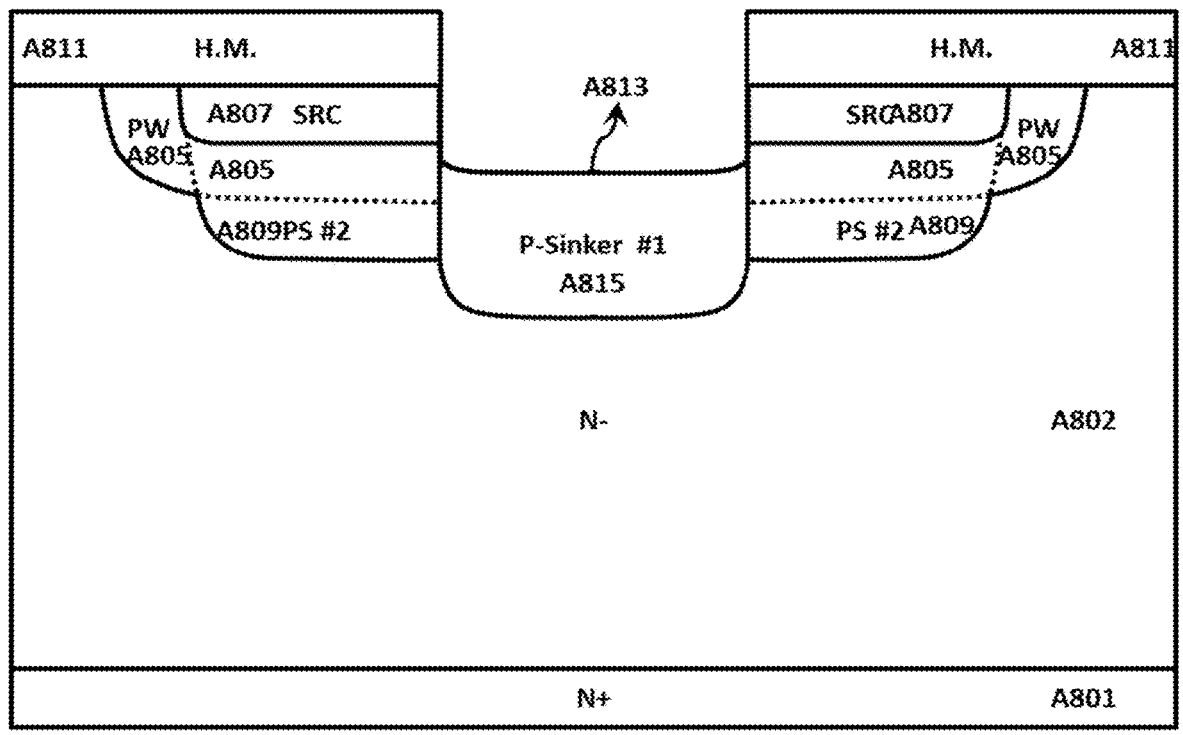

FIG. 10a to FIG. 10bb describes the process of manufacturing the SiC DMOSFET structure shown in FIG. 10a. The manufacturing process for a SiC DMOSFET is on a SiC substrate A801 and starts with using a 4H-SiC Si-face epi-wafer with suitable doping ($10^{14}$-$10^{18}$ cm$^{-3}$) and thickness (1 μm to 300 μm) for the epilayer A802 shown in FIG. 10a. A blanket hard mask A803 comprising a CVD deposited layer of silicon dioxide, silicon nitride, silicon oxynitride, or a metallic layer such as nickel, with thickness ranging from 50 nm to 5 μm is deposited in FIG. 10b and then patterned using photolithography followed by a dry etch (using a reactive ion-etch for example) as shown in FIG. 10c. A P-type implantation A804 comprising boron or aluminum, at energies ranging from 10 keV to A800 keV, at implant doses ranging from $10^{12}$ cm$^{-2}$ to $10^{15}$ cm$^{-2}$ in FIG. 10d is performed to create a p-well A805 in FIG. 10e. The mask A803 is removed, and another hard mask layer A806 is deposited comprising a CVD deposited layer of silicon dioxide, silicon nitride, silicon oxynitride, or a metallic layer such as nickel, with thickness ranging from 50 nm to 5 μm and patterned in FIG. 10f to define the N+ source region. The N+ source region A807 is formed by implantation of the n-type (N+) impurity A808 comprising Nitrogen or Phosphorus, at energies ranging from 10 keV to 500 keV, at implant doses ranging from $10^{13}$ cm$^{-2}$ to $10^{16}$ cm$^{-2}$ as shown in FIG. 10g. The PS #2 region A809 is formed by the implantation of the P-type impurity A810 in FIG. 10h. The deep PS #2 region can be formed using ion-implantation of aluminum or boron, which are commonly used p-type dopants in 4H-SiC. Boron can be advantageously used for forming this deep P-type Sinker region, since it has significantly higher implant range as compared to aluminum, and deep implants using boron can be formed with lower ion-implantation energies. The patterned hard mask A806 is removed from the top in FIG. 10i. Another hard mask layer A811 is formed on the top in FIG. 10j and patterned in FIG. 10k. The patterned mask A811 is used to etch A812 into the substrate in FIG. 10l for creating a recessed region. The source trench which is the recessed region A813 is formed in the substrate by penetrating the source region in FIG. 10m. A P-type implant A814 in FIG. 10n is performed for creating the PS #1 region. If using aluminum, the PS #1 region may comprise implant energies ranging from 100 keV to 1 MeV and implant dose ranging from $10^{13}$ cm$^{-2}$ to $10^{16}$ cm$^{-2}$. If using boron, the PS #1 region may comprise implant energies ranging from 50 keV to A800 keV and implant dose ranging from $10^{13}$ cm$^{-2}$ to $10^{16}$ cm$^{-2}$. The PS #1 A815 is formed by the self-aligned implantation of the p-type impurity in FIG. 10o. As described more completely in the above embodiments, a linearly graded doping profile of the PS #1/PS #2 regions may be preferable utilized in lieu of a uniform (abrupt) doping profile, which results in a sufficient portion of the drain potential being supported within the PS #1/PS #2 regions and not only the N− drift region. This results in a pseudo charge-balanced structure, which promotes breakdown over a larger SiC region, which results in a lower critical electric field at breakdown and consequently a lower electric field in the gate insulator.

PS #1 region is designed with the greatest depth among the P-type Sinker regions using Boron implantation and the formation of the trench naturally extends the depth of the PS

1 region. The same hard mask used for etching the source trench A811 is utilized to define the PS #1 region. As will be apparent to those in the field of this invention, the SiC trench can be formed using dry etching techniques including reactive ion-etching, inductively coupled plasma (ICP)-RIE, etc. While a 90° sidewall slope is shown for this trench region in FIG. 10a, it is advantageous to form the trench regions with lower angle (60-90°) sidewalls, since this will reduce the curvature of the PS #1 region, and therefore improve the blocking performance of the device.

Figure 10P:
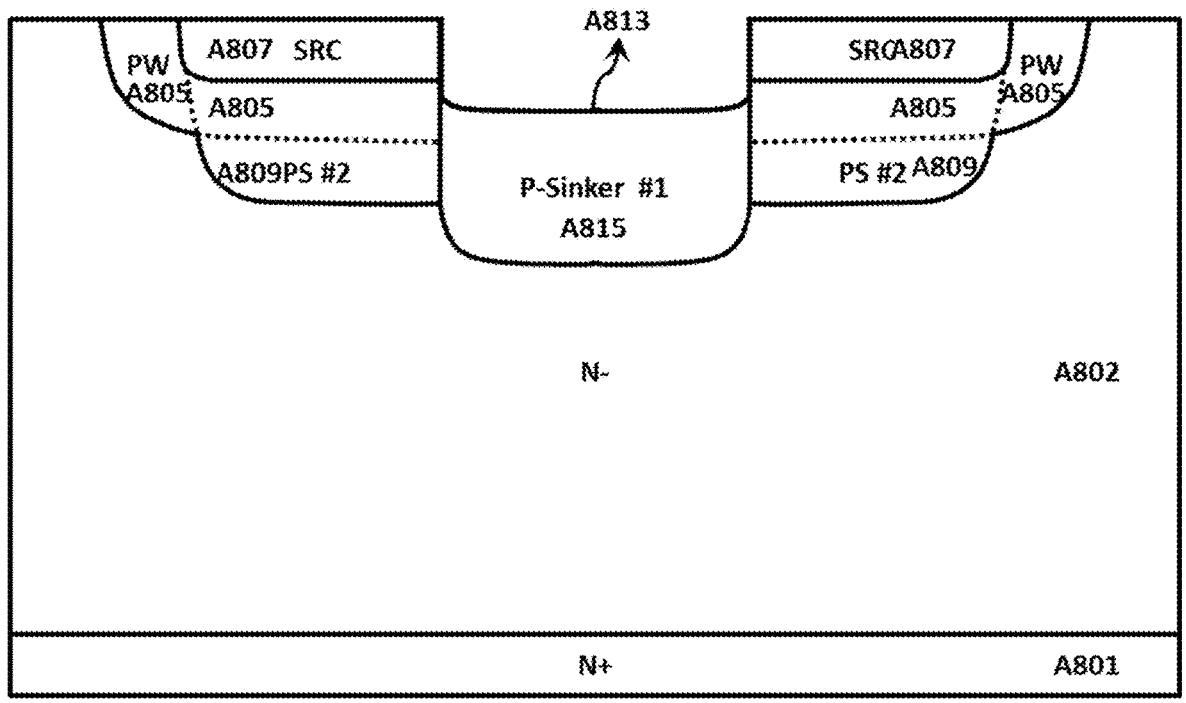
Figure 10Q:
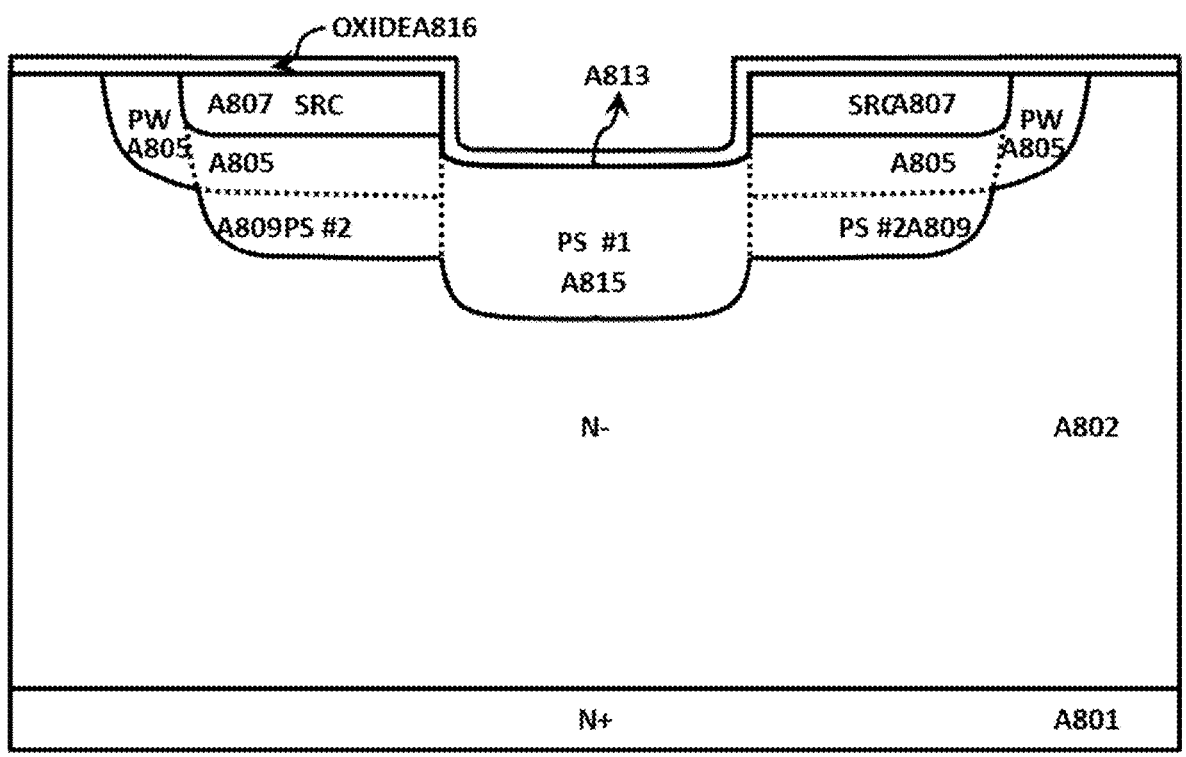
Figure 10R:
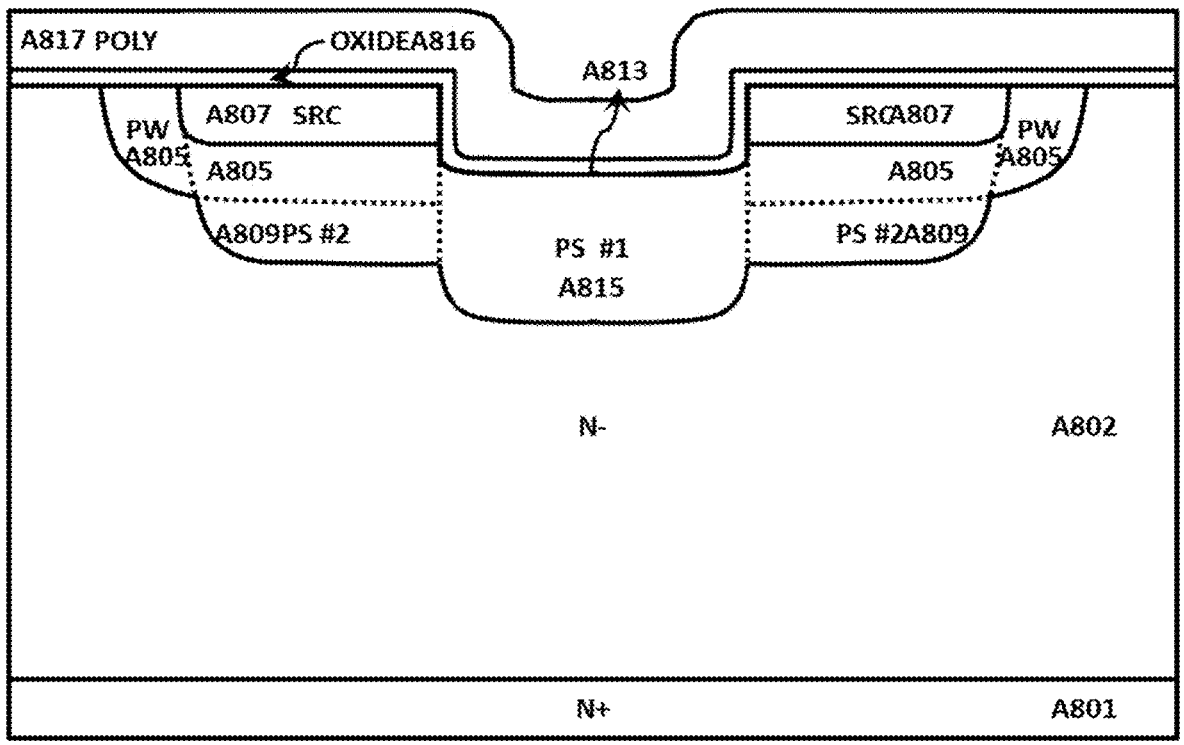
Figure 10S:
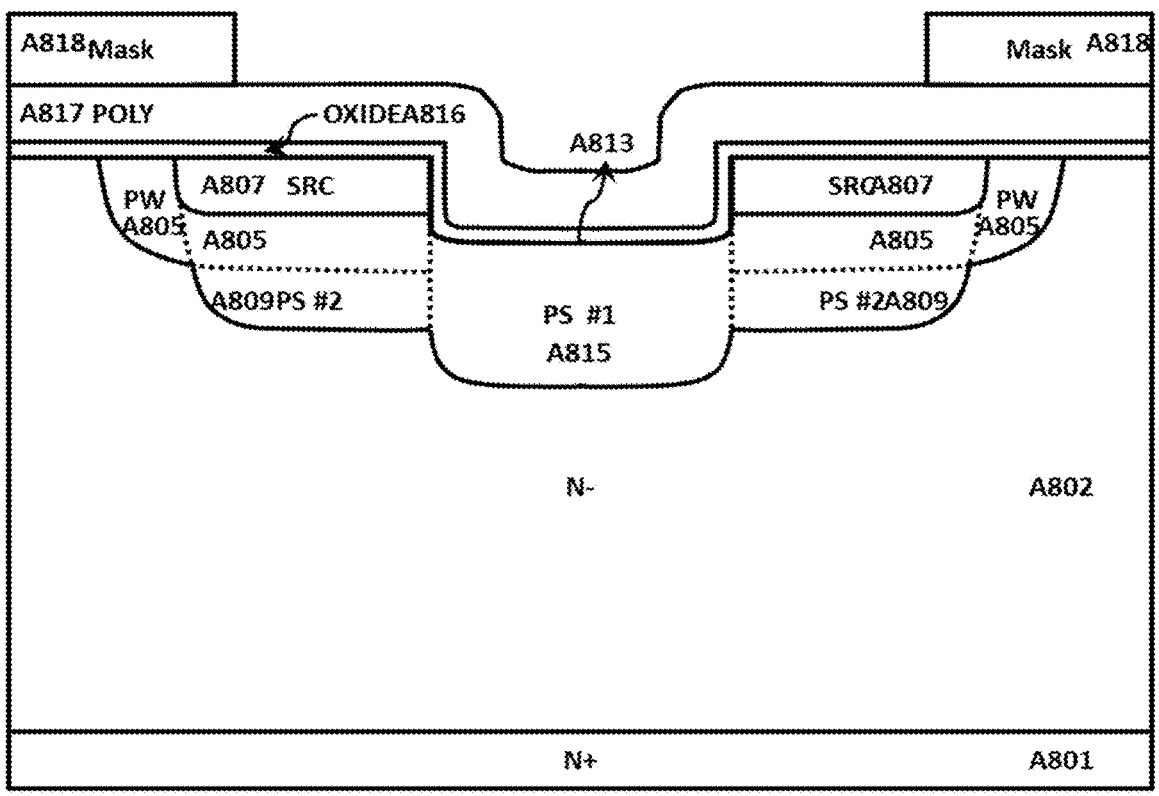
Figure 10T:
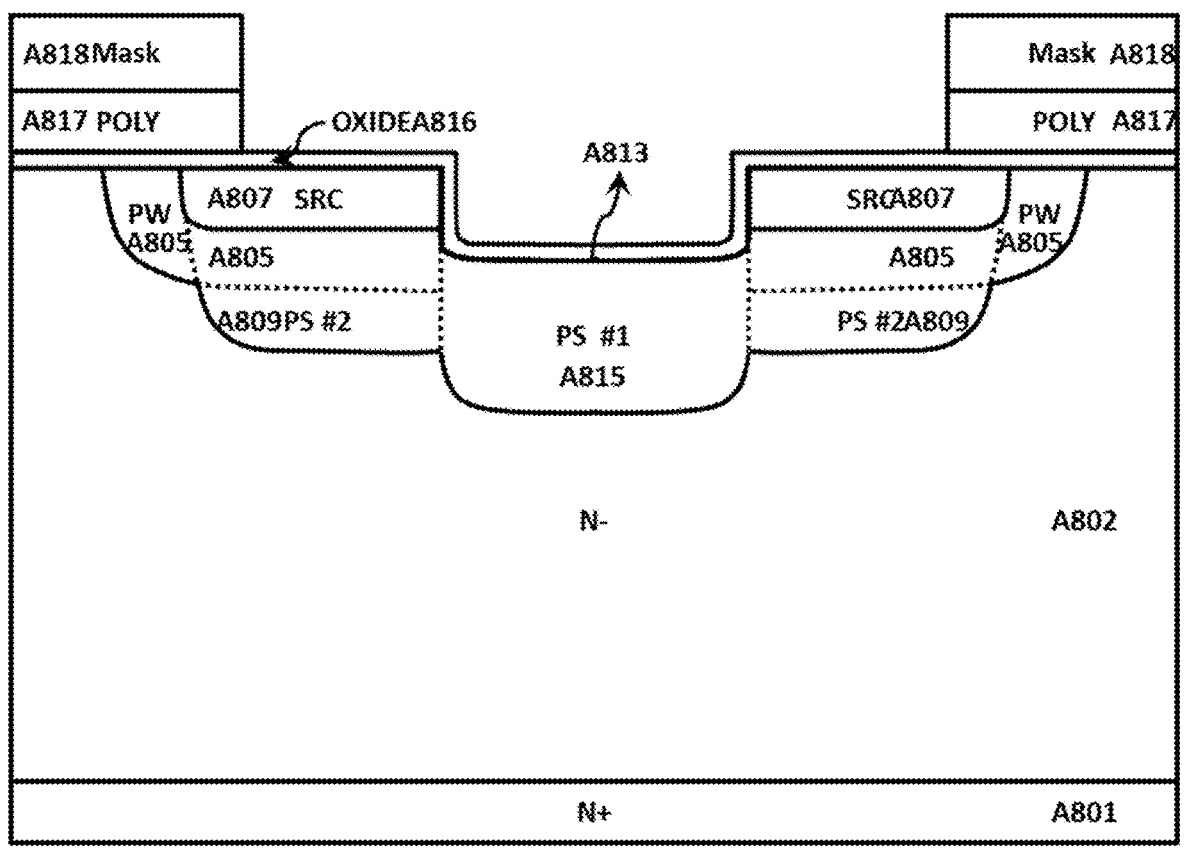
Figure 10U:
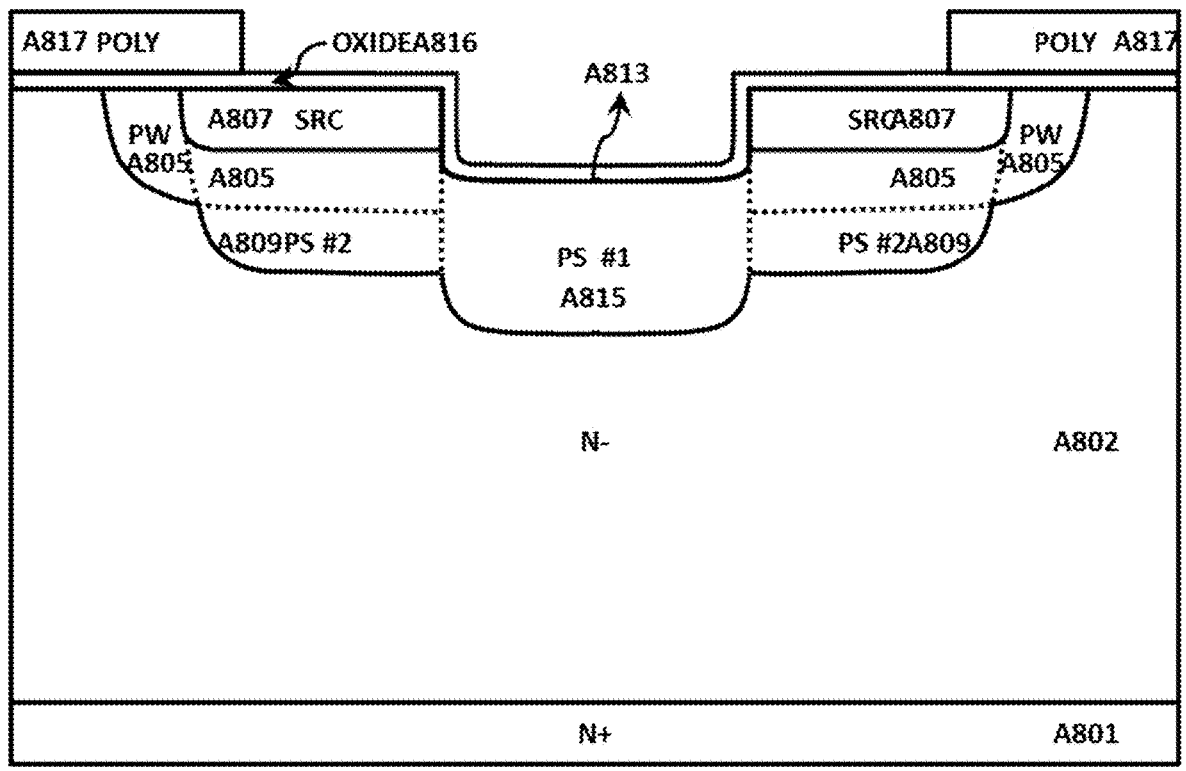
Figure 10V:
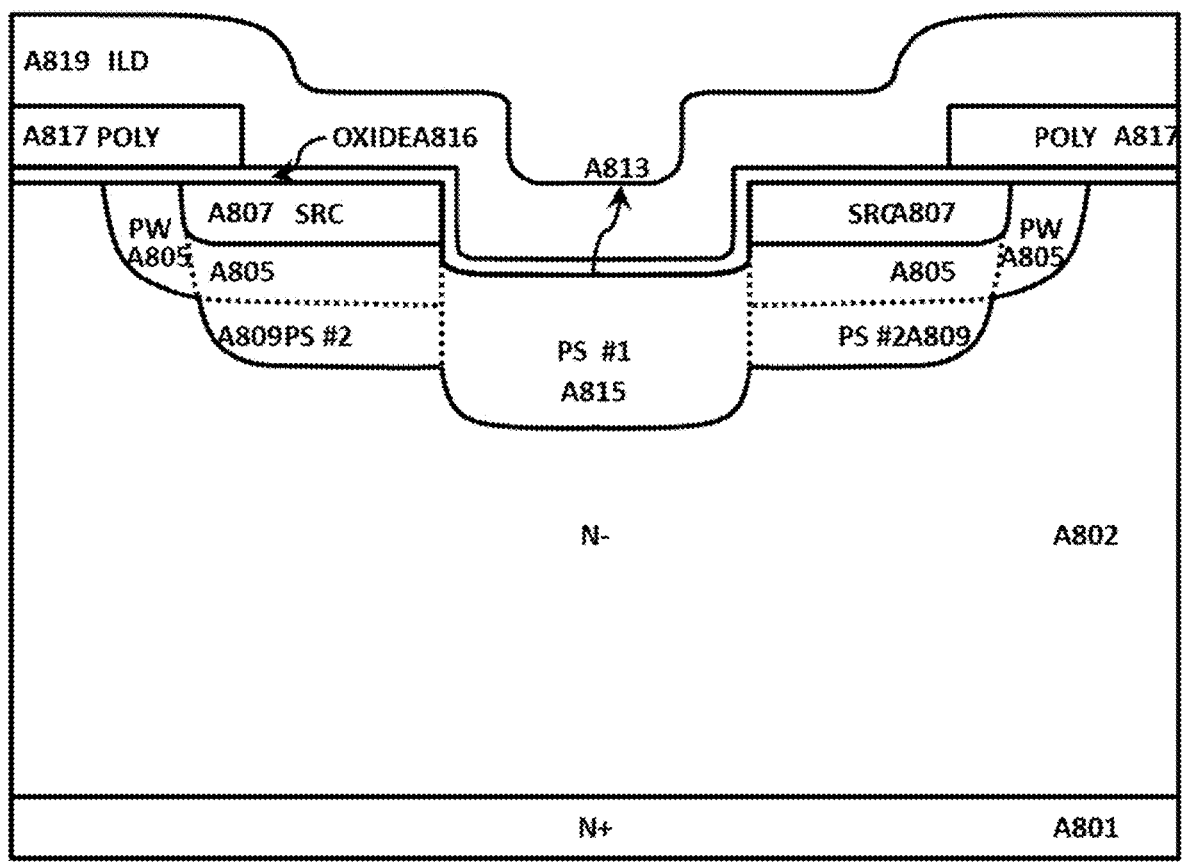
Figure 10W:
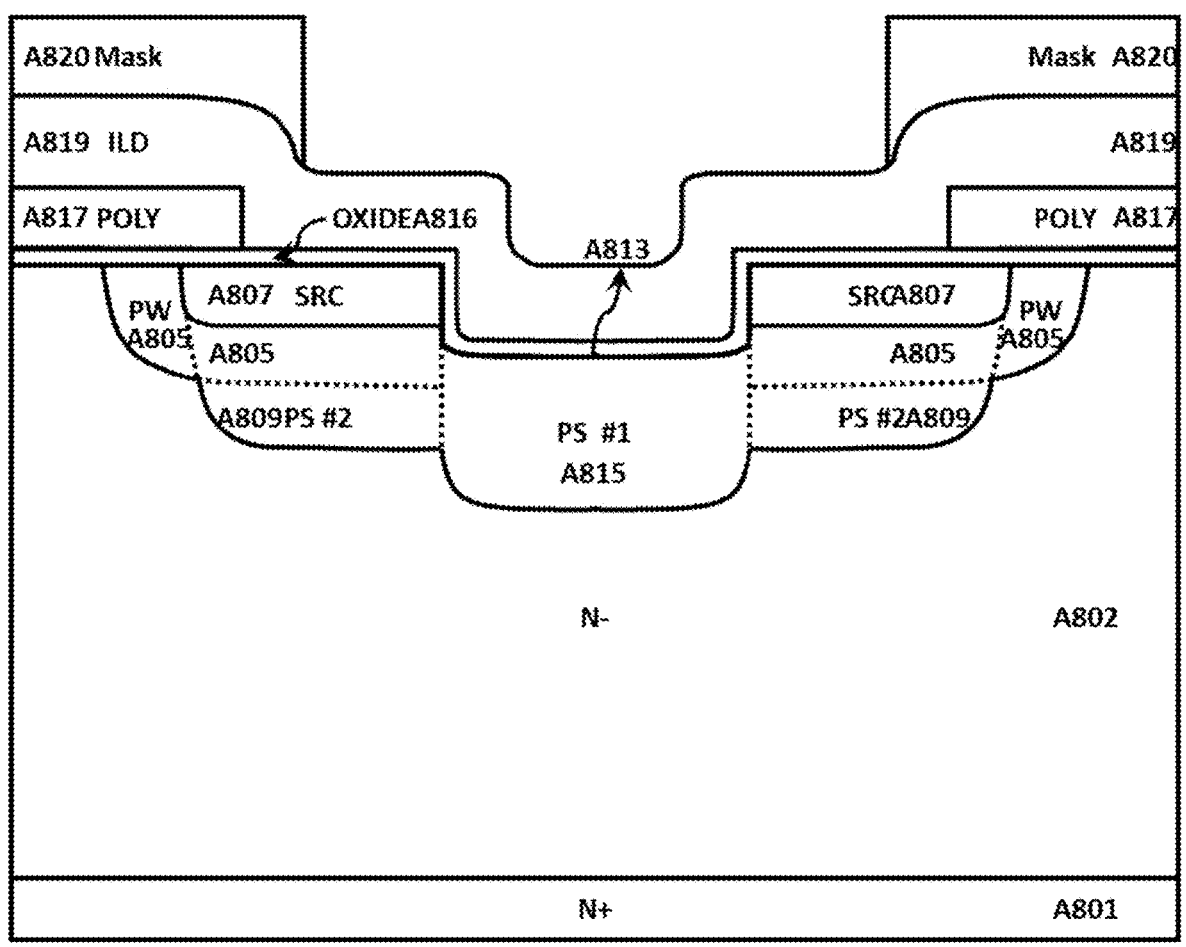
Figure 10X:
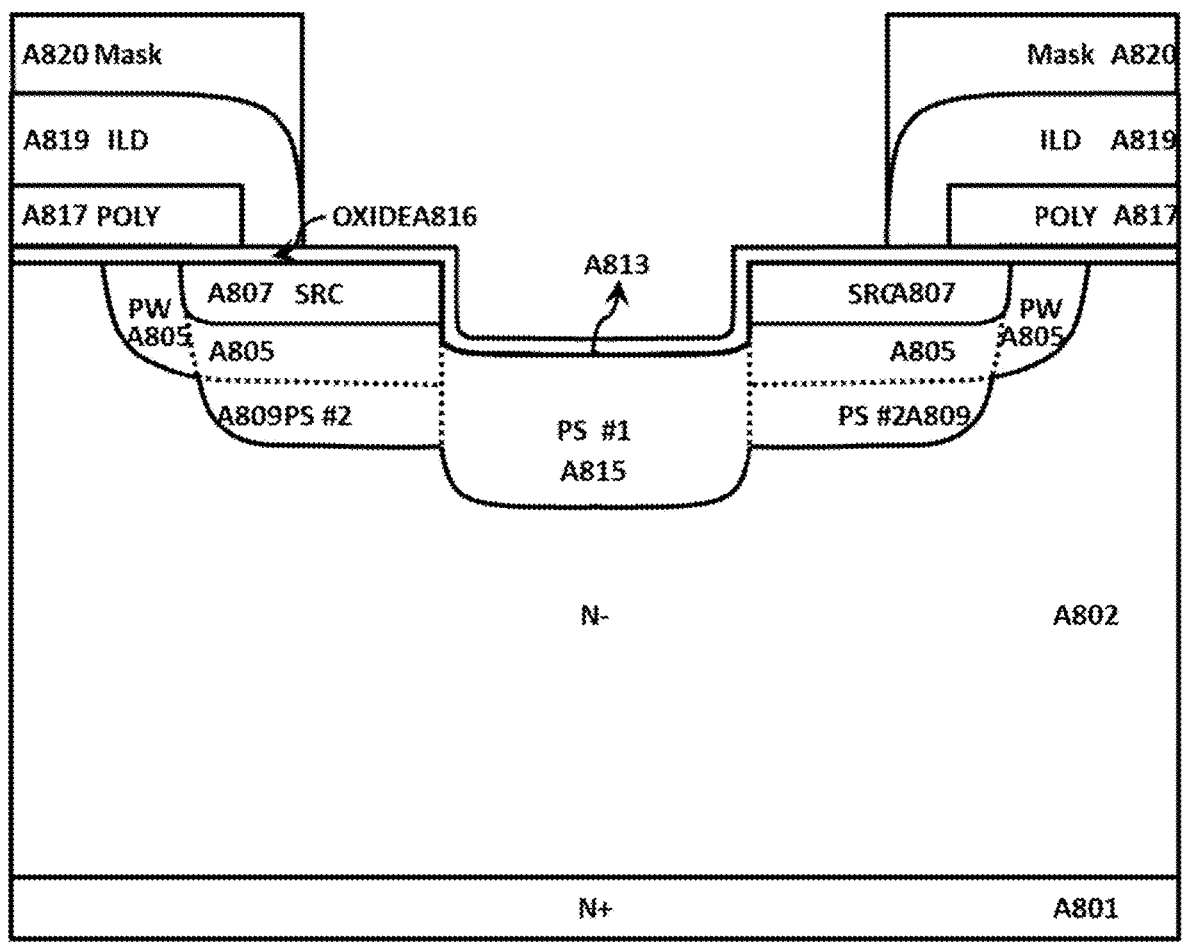
Figure 10Y:
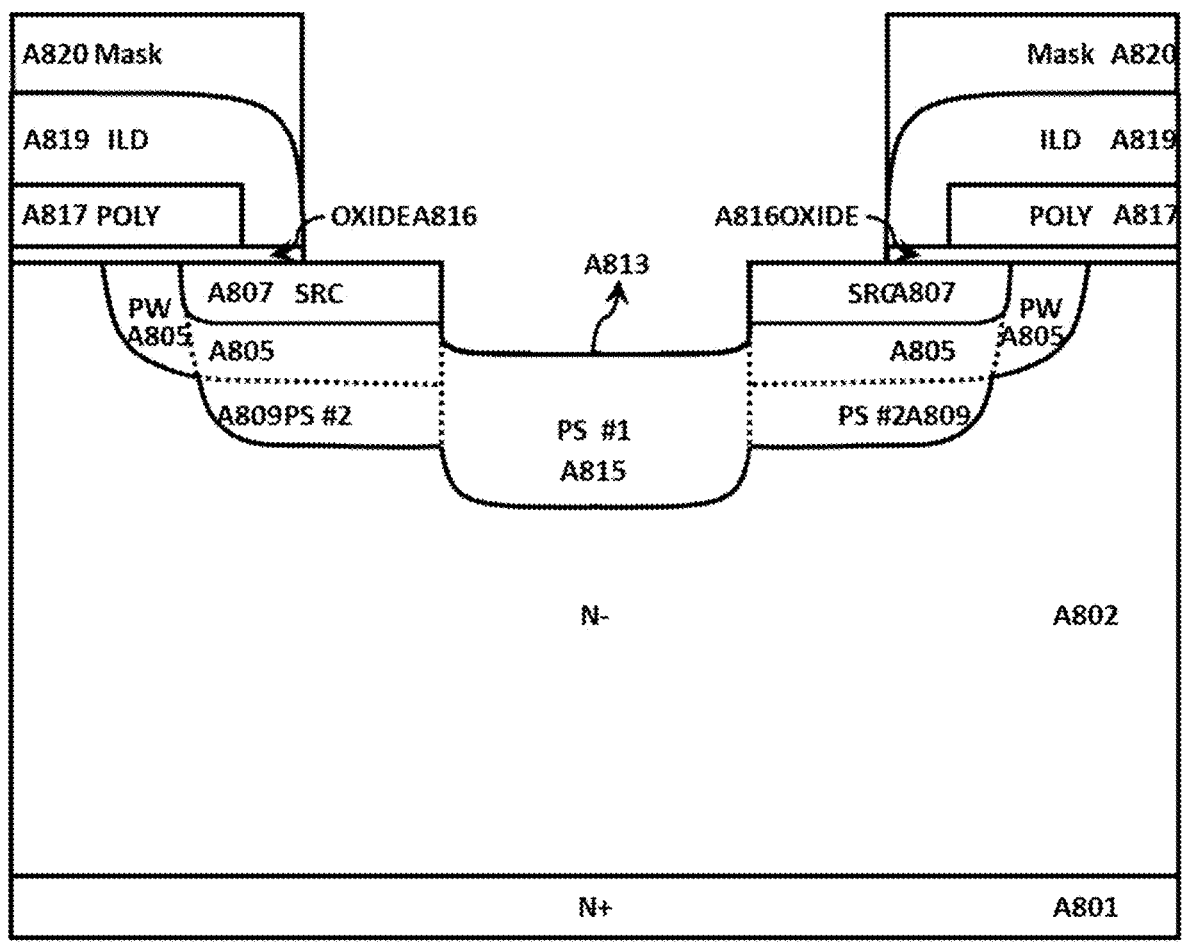
Figure 10Z:
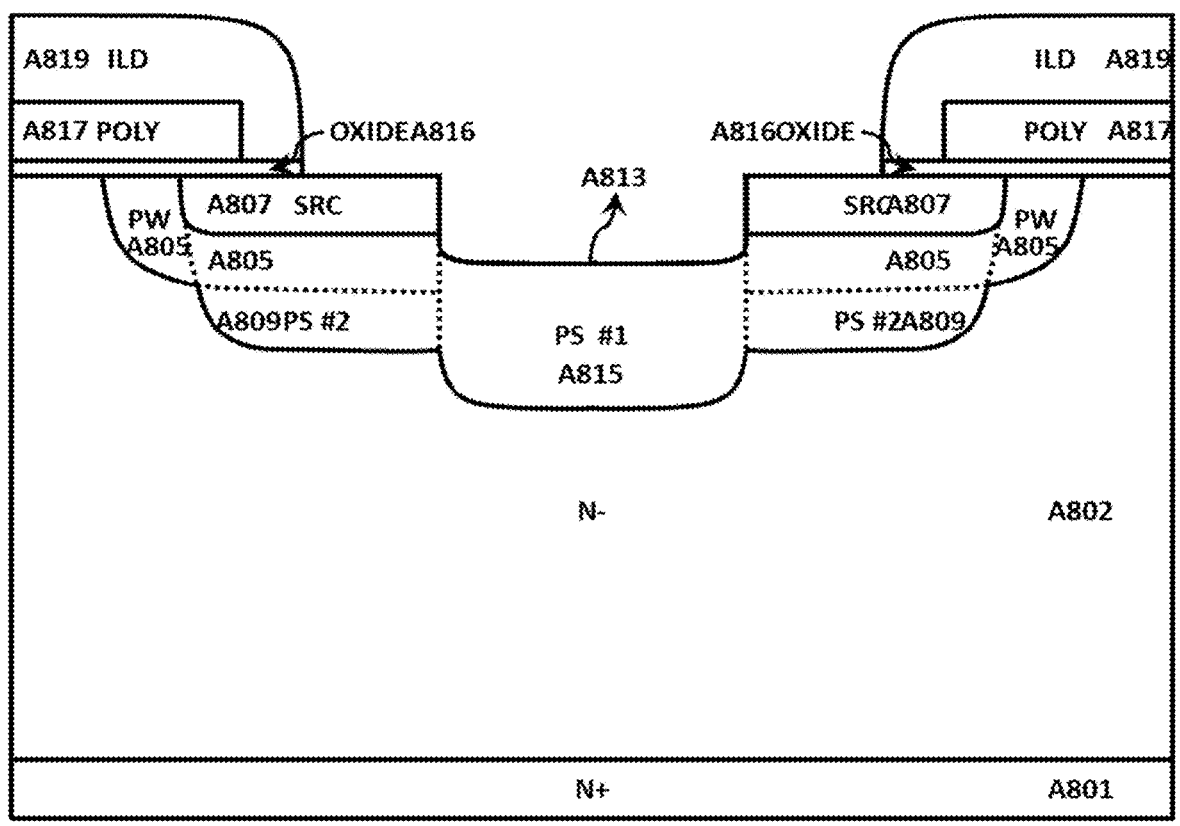
Figure 10A:
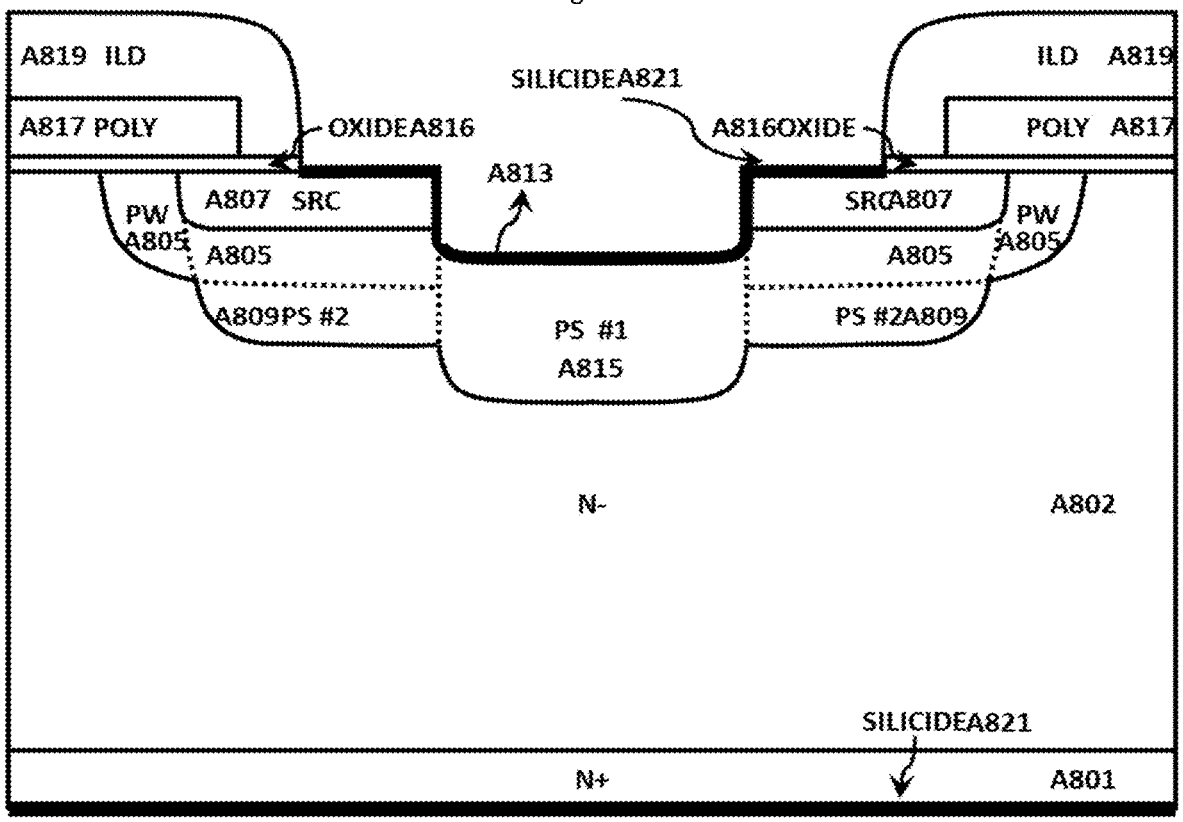
Figure 10B:
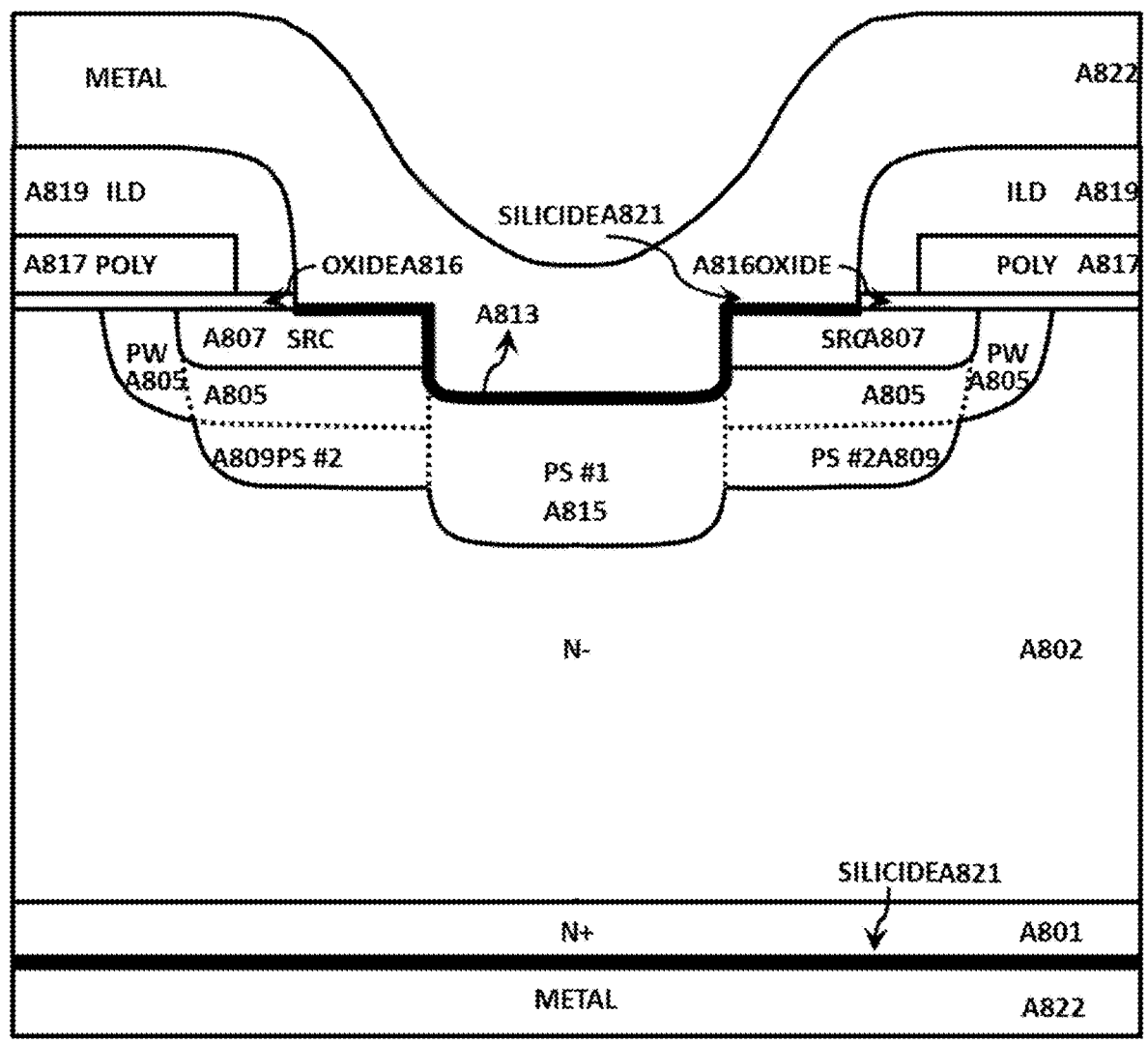

The patterned hard mask A811 is removed from the top in FIG. 10p. An oxide layer A816 for gate oxide is grown in FIG. 10q. A polysilicon gate layer is deposited on the top A817 in FIG. 10r. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of $POCl_3$ followed by a drive-in step at temperatures ranging from 700-900° C. A hard mask A818 is deposited on top and patterned as shown in FIG. 10s. The polysilicon gate layer A817 is etched by using the patterned mask layer A818 in FIG. 10t. The mask layer A818 is then removed from the top in FIG. 10u. An interlayer dielectric (ILD) layer A819 comprising 50 nm-1000 nm thick silicon dioxide, silicon nitride, silicon oxynitride layers or a stacked combination thereof is deposited on the wafer in FIG. 10v. A hard mask A820 is deposited and patterned on top to define the ILD opening in FIG. 10w. The ILD layer is patterned using the hard mask A820 as shown in FIG. 10x. Further the gate oxide A816 is etched using the same mask A820 in FIG. 10y. The mask A820 is then removed in FIG. 10z. A nickel silicide region A821 is formed on the exposed SiC surface in FIG. 10aa. Interconnect metal layers A822 (either Al or Ag or Au) are deposited and patterned on the top and bottom of the chip in. FIG. 10bb The advantage of the embodiment herein is that by etching the source trench region, prior to the implantation of the PS #1 region, the breakdown location has been moved further into the semiconductor and farther away from the gate oxide layer. Due to the inherent hardness of silicon carbide, the observed range (depth) of ion-implanted dopants is significantly lower than in silicon. For example, forming deep (>0.3 μm) ion-implanted layers in silicon carbide requires extremely high implantation energies (>300 keV), which requires doubly or triply ionized implantation species, which drastically reduces the throughput and increase the cost of these ion-implantation steps. Forming the source trench as described in this embodiment obviates the need for doubly/triply ionized implantation steps, and low-cost with high-throughput singly ionized implantation can be utilized for realizing the PS #1 region.

Figure 11A:
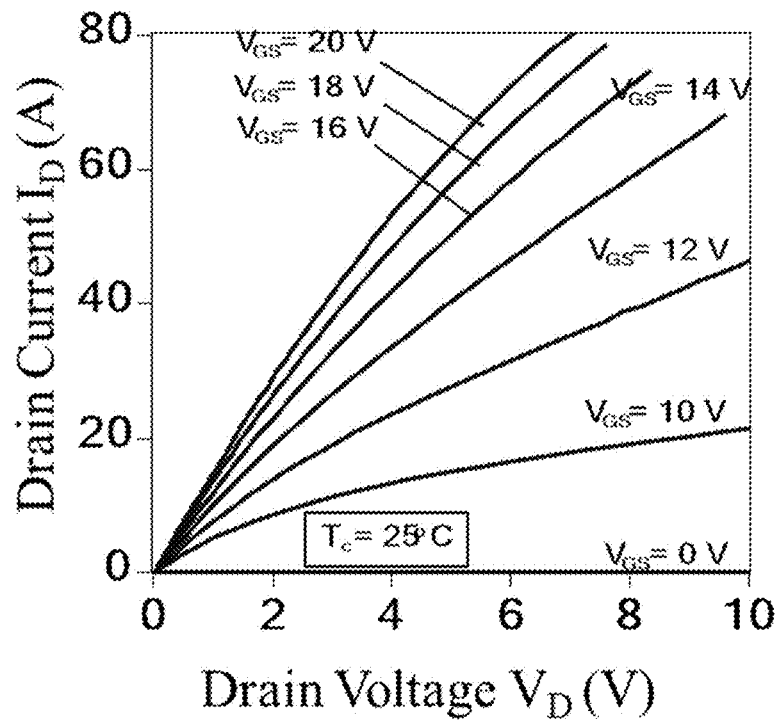
FIG. 11a and FIG. 11b show the output and breakdown I-V characteristics of 1200 V SiC DMOSFETs fabricated using the teachings of this invention.
Figure 11B:
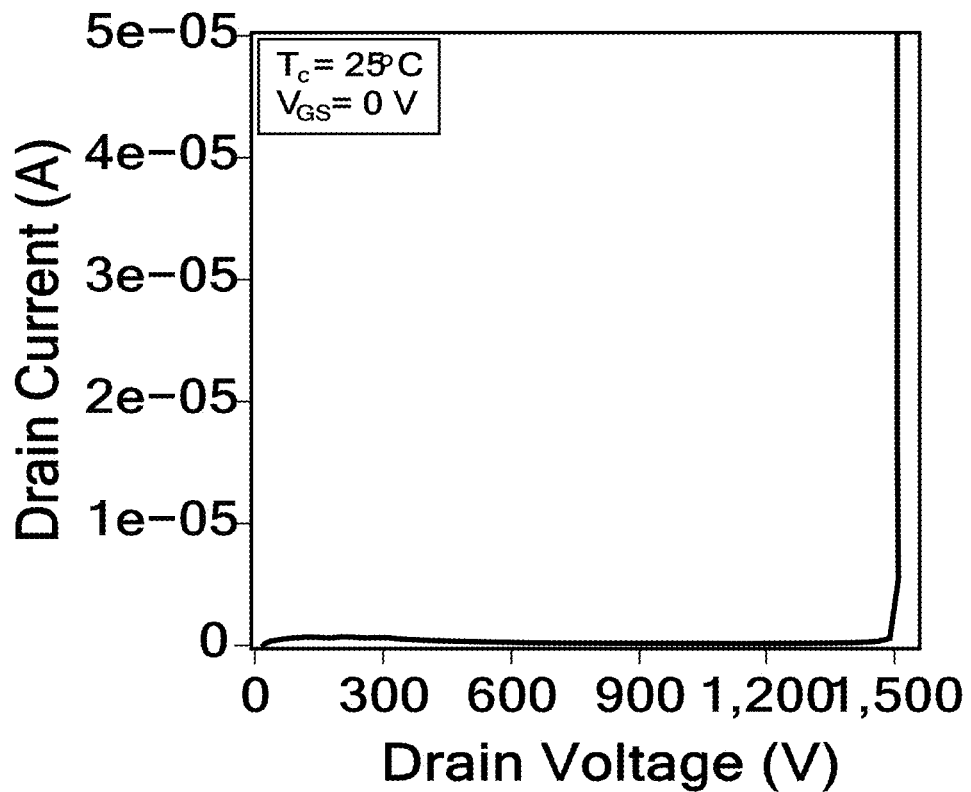

FIG. 11a and FIG. 11b show the output and breakdown I-V characteristics of 1200 V SiC DMOSFETs fabricated using the teachings of this invention. A specific on-resistance of 2.9 mΩ-cm2, gate threshold voltage of 3.0 V and breakdown voltages in the 1400 V-1500 V range are achieved.

Figure 12A:
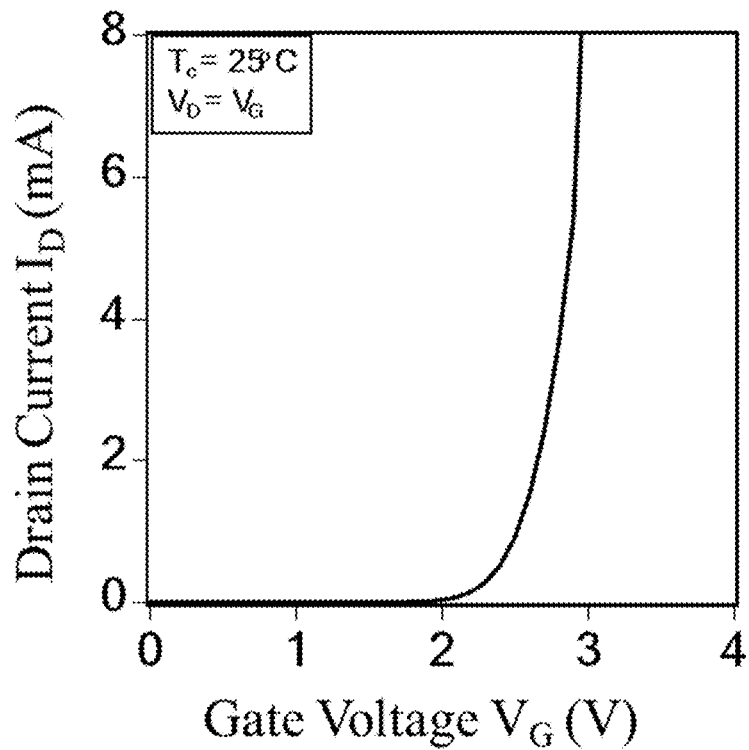
FIG. 12a and FIG. 12b show the transfer (ID v/s VGS) characteristics of 1200 V SiC MOSFETs fabricated using the teachings of this invention
Figure 12B:
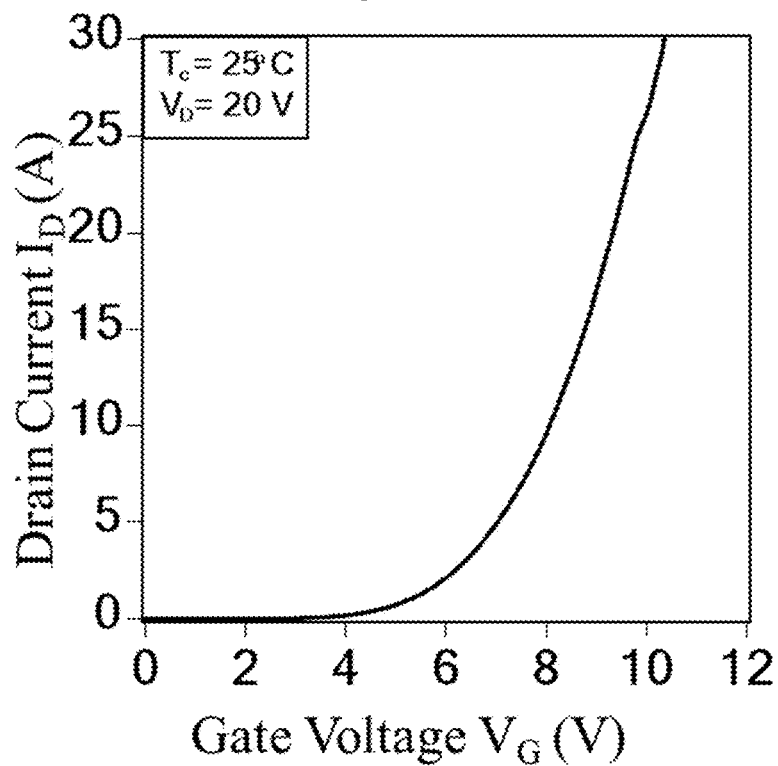

FIG. 12a and FIG. 12b show the transfer (ID v/s VGS) characteristics of 1200 V SiC MOSFETs fabricated using the teachings of this invention are shown. The devices feature a gate threshold voltage of 2.9 V, a sub-threshold slope of 150 mV/decade and a transconductance of 9.2 S measured at a drain current of 20 A.

Figure 13:
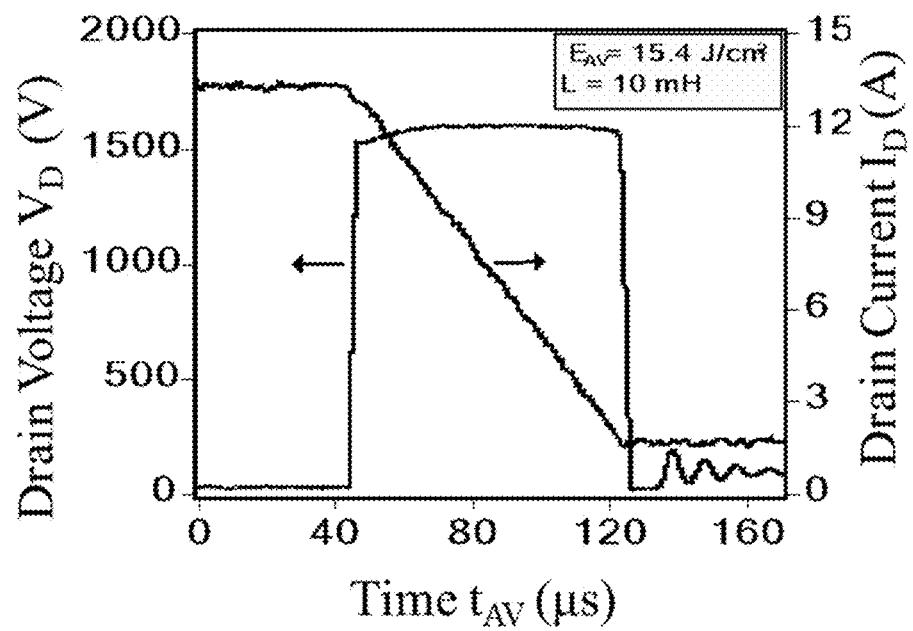
FIG. 13 is a single-pulse avalanche energy measured for a 1200 V SiC MOSFET fabricated using the teachings of this invention.

FIG. 13 shows a single-pulse avalanche energy of 1.05 J is measured for a 1200 V SiC MOSFET fabricated using the teachings of this invention. This corresponds to an energy density of 15.4 J/cm², when normalized to the total chip size (Avalanche Energy/Chip Size).

Embodiments relate to SiC DMOSFET power devices that can be used for fabricating self-aligned power MOSFETs.

An embodiment relates to increasing MOS channel density.

An embodiment relates to increasing effective field-effect mobility.

An embodiment relates to improved device reliability.

An embodiment relates to reducing ON resistance for a given chip size.

An embodiment relates to design and manufacturing of self-aligned power devices.

An embodiment relates to design and manufacturing MOS channels with sub-micron channel lengths.

An embodiment relates to removal of the parasitic N+ source region inadvertently formed in the periphery of the device.

An embodiment relates to proper grounding of the p-well region with the source ohmic contact in the active region of the device An embodiment relates to removal of the parasitic NPN transistor formed in active and peripheral regions of self-aligned power devices.

An embodiment relates to a combination of an appropriately located source trench and ion-implanted P+ plug region to enable proper grounding of the p-well region in the main active MOSFET region and removal of a parasitic N+ source region formed in the periphery of the MOSFET An embodiment relates to the formation of highly doped P+ plug regions in the periphery of the MOSFET, especially under the gate pad and gate bus regions.

An embodiment relates to the suppression of false turn-on of the MOSFET during fast switching transitions, at vulnerable locations, due to threshold voltage lowering by the body bias effect.

An embodiment relates to the improvement of the maximum dV/dt rating of the MOSFET.

An embodiment relates to the improvement of the maximum avalanche energy rating of the MOSFET.

An embodiment relates to a dedicated process step being utilized for masking the implantation of the N+ source region in the device periphery. The P+ plug region is formed first in this embodiment, while the source trench is created later on in the process at the ILD etch step.

An embodiment relates to a dedicated hard mask applied after the sidewall spacer is formed and before the N+ source implantation. This layer prevents the formation of the N+ source region in the device periphery and hence parasitic NPN structures in the device periphery are avoided.

An embodiment relates to a p-well region (P-Well #2) placed under the N+ source region and electrically connected to the main p-well region. The P-Well #2 provides additional electrical dose under the N+ source implant, to prevent reach-through breakdown, especially after the source trench formation.

An embodiment relates to a dedicated process step is utilized for masking the implantation of the N+ source region in the device periphery as well as the N+ source region in the middle of the unit cell in the active region to enable ohmic contact to the p-well region.

An embodiment relates to the formation of the segmented polysilicon gate metallization in the periphery of the device instead of a contiguous gate bus which will decrease the gate-body capacitance of the MOSFET.

An embodiment relates to the decrease of the gate capacitance of the MOSFET.

An embodiment relates to the increase of the switching speed of the MOSFET.

The embodiments described herein show novel techniques for design and manufacture of self-aligned SiC DMOSFET power devices. Due to limited mobility achievable on SiC planar DMOSFET it is necessary to form n-well channels that are submicron length, so that the overall power and ON resistance of the MOSFET are not degraded.

In a MOSFET, the channel region is formed due to the offset between the p-well and the N+ source region. If the p-well and the N+ source regions are formed by two separate masking steps, there can be lithographic misalignment, which will result in asymmetric MOSFET channel lengths on the two sides of a unit cell. In the embodiments described herein, to minimize this asymmetry in the MOS channel length, the p-well and the N+ source implant are done in a self-aligned fashion. There are several techniques proposed in the literature for achieving self-aligned MOSFET, including ones that use an oxide spacer approach to form self-aligned p-well and N+ source regions, with the N+ source implant under p-well implant.

The embodiments herein describe several innovative techniques during self-aligned channel formation that not only allow for the elimination of the misalignment error during manufacturing of SiC MOSFETs, but also allow the possibility of reducing the channel length. The channel lengths can be made smaller with narrow spacers. While the self-aligning process does provide the benefits of making an arbitrarily short channel length as well as eliminating misalignment, it does create some other problems with respect to the structure of the device outside the unit cells, because n+ regions are co-incident with the p-well regions.

In a conventional MOSFET where the p-well and the N+ source regions are not self-aligned there is a dedicated masking step that will be used for forming the N+ source implant. In the embodiments described herein, in a self-aligned process, there is no dedicated masking step performing the N+ source implant. There is a dedicated masking step performing the p-well implant and followed by depositing the spacer, then etching the spacer followed by implantation for realizing the N+ source region. Everywhere there is a p-well region, there will be N+ source implant as well. It is not desirable to have N+ source implant at the periphery of the device. It is important to terminate the device with just the p-type implant. The various embodiments described herein introduce techniques in which one can get rid of the N+ source implants in the periphery of the device and replace it with some other regions.

The active region of the MOSFET is where the current conduction happens while the periphery region of the MOSFET is where the edge termination of the device is provided to block any voltage. The gate pad and gate bus regions are also considered to be part of the peripheral regions of the MOSFET, for the purposes of describing the innovations in this document. In an embodiment described herein, a combination of an appropriately located source trench and ion-implanted P+ plug region enables proper grounding of the p-well region in the main active MOSFET region and removal of a parasitic N+ source region formed in the periphery of the MOSFET.

In a conventional MOSFET where there is no self-alignment, one can put the source implant wherever needed and then create a region for grounding the p-well. In a self-aligned DMOSFET since the source implant is self-aligned to the p-well, one would have not only the p-well extending all the way to the periphery but also have the N+ source region extend all the way to the periphery.

A parasitic NPN transistor exists in the active region of the MOSFET unit cell, formed by the N+ source region which acts like the N+ emitter, the p-well region which forms the P-base and the N+ source ohmic contact. In the periphery of the device and also under the gate pad metallization, there is no N+ source ohmic contact, and as a result, the emitter and base regions of the parasitic NPN transistor are not shorted in this region. The parasitic NPN transistor will not be activated under normal DC or switching operation of the MOSFET, but operating the device under extreme conditions can cause the triggering of the parasitic NPN transistor.

In the active region, by creating the source trench one has shorted the emitter and the base of this parasitic NPN transistor and ensured that in the active region of the device, this parasitic transistor will not turn ON. In the periphery of the device without a source trench, the parasitic NPN transistor exists even though it is shorted in the active region. It is possible that the parasitic NPN transistor may turn on in the peripheral region and it is not desirable.

In the embodiment herein, by creating a source trench in the periphery of the device and by providing a p-type implanted plug region, it is ensured that the parasitic NPN transistor is completely removed. Since the emitter of this transistor has been completely removed there is no chance for any kind of parasitic BJT structure. Typically, a separate masking step is carried out for masking the N+ source region from being formed at these locations, but in the embodiment herein, the source trench can be advantageously used for removing the parasitic N+ source regions and replacing them with a P+ plug region, which is self-aligned with the source trench and electrically connected to the p-well region.

The doping concentration of the P+ plug or sinker region to be placed in the device periphery can be advantageously be made very high. In doing so, another parasitic device effect described here can be avoided. In a typical power MOSFET device structure, moderately doped P-well regions exist in the device periphery with or without a parasitic N+ Source region, as described above. If the N+ Source region is co-incident with the p-well region in the device periphery (i.e. the n+ source region is not deliberately masked from the peripheral region), this results in a partial compensation of the p-type electrical dose of the p-well region. In either case, the p-well regions in the device periphery can be extremely resistive from an electrical standpoint. During switching of the power MOSFET from off- to on-state or vice-versa, the extremely high rate of change of drain voltage (or dV/dt) can result in capacitive current flow through these resistive peripheral p-well regions, which are only collected by the Source ohmic contact in the active region of the MOSFET. In other words, the capacitive current caused by the high dV/dt during device switching has to traverse an extremely long distance from the device periphery to the Source ohmic contact in the active region. The high resistivity of p-well regions in prior art MOSFETs can result in a significant body bias effect, which has the result of lowering the device threshold voltage in those regions. So, these portions of the device can exhibit a false turn-on, which can result in premature device failure/destruction. The highly doped P+ plug regions in this embodiment can alleviate the aforementioned effect by reducing the amount of body bias developed in the peripheral regions of the MOSFET, which makes the MOSFET described in this embodiment more resilient to dV/dt induced failure. In other words, the MOSFET structure described in this embodiment will exhibit a higher dV/dt rating and avalanche energy density than prior art MOSFETs. More specifically, the MOSFET structures introduced in this embodiment will enable a single-pulse avalanche energy density of over 15 Joules/cm2, when normalized to the total chip area. This reduces the switching losses and increases the circuit efficiency.

In an embodiment herein, a dedicated process step is utilized for masking the implantation of the N+ source region in the device periphery. The P+ plug region is formed first in this embodiment, while the source trench is created later on in the process at the ILD etch step.

In the embodiment herein, there is a source trench in the active region of the device but there is no source trench in the periphery of the device. A dedicated masking step is interspersed between the formation of the sidewall spacer after the p-well implant and before the N+ source implant to mask the N+ source implant from the peripheral regions of the MOSFET. The masking layer protects the periphery of the device from the source implanted region. A second deeper p-well region (P-Well #2) is formed using the same masking step used for the N+ source implant. P+ plug regions are formed in a later step in both the active regions of the device as well as the device periphery. A trench is later etched through the N+ source regions at discrete locations in the active region to contact the P+ plug regions, which get shorted to the N+ source region by the ohmic or silicide metallization.

In an embodiment herein, the source region implantation is masked from the periphery of the device. A dedicated process step is utilized for masking the implantation of the N+ source region in the device periphery as well as the N+ source region in the middle of the unit cell in the active region to enable ohmic contact to the p-well region.

In an embodiment herein, the polysilicon metallization has been segmented in the periphery of the device and is not one continuous layer as commonly seen. There is a dedicated masking step interspersed between formation of the sidewall spacer, after the p-well implant and before the implementation of the N+ source implant, to mask the N+ source region, from both the peripheral regions of the device as well as the selected areas in the active region.

In an embodiment herein segmenting the polysilicon metallization reduces the parasitic gate to body or gate to source capacitance which are parasitic capacitances. The islands of polysilicon are not disconnected but are connected at a position orthogonal to the plane of the drawing. Reducing the parasitic capacitance will enable the device to switch faster, which will increase the circuit efficiency by reducing the switching losses.

Figure 14:
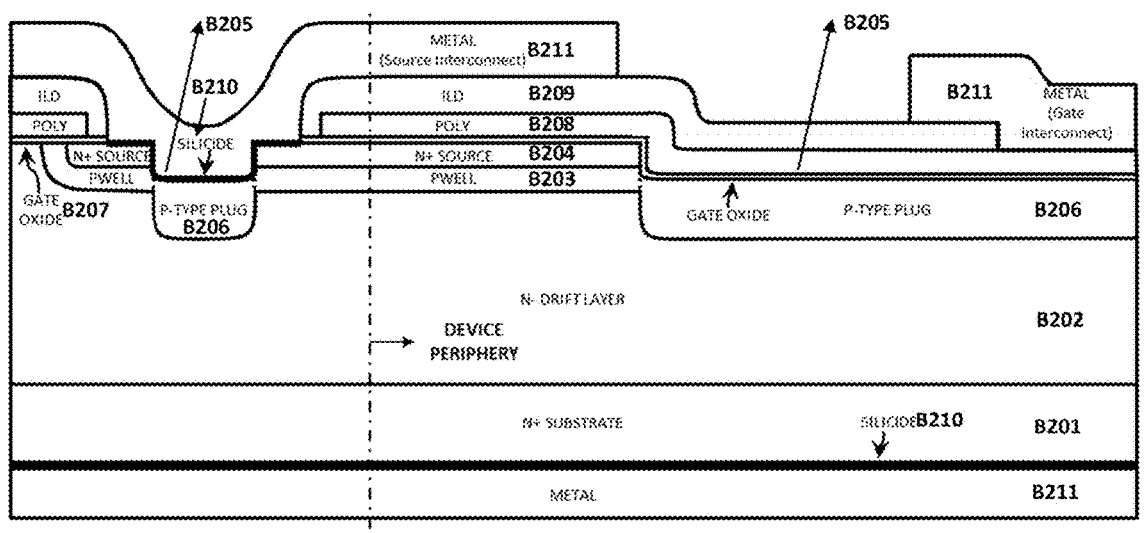
FIG. 14 shows an embodiment of a SiC DMOSFET structure for removal of a parasitic N+ source region formed in the periphery.

An embodiment shown in FIG. 14 is the unit cell and the device periphery of a cross-sectional structure of a SiC DMOSFET. The key regions of this device are a p-well region B203, which is formed by ion-implantation or epitaxial re-growth of a p-type species such as aluminum or boron. There is an N+ source region B204, N− drift layer B202, and an N+ substrate B201. In the ON state when a gate voltage is applied to the polysilicon gate B208 the current flows vertically from the drain B201, through the inversion layer which is formed at the top of the p-well layer B203, through the N+ source region B204, and out through the source metallization B211. In the OFF state or the blocking state, a voltage is supported across the p-well B203, N− drift layer B202 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the junction field-effect transistor (JFET) region or the JFET gap and the thickness of the gate oxide B207. Another feature is an ILD layer B209 which is used to insulate the source interconnect metallization B211 from the polysilicon gate B208. A nickel silicide region B210 is formed on the exposed SiC surface.

Source trench regions B205 are realized by dry etching through the N+ source layer at selected locations of the device, followed by a p-type ion-implantation step to realize P+ plug regions B206 under the source trench. At the very center of the unit cell, there is a P+ plug layer B206 which is grounded with the N+ source metallization. The purpose of the P+ plug in SiC DMOSFET is to ground the p-well region with the N+ source contact.

The formation of the source trench B205 device structure enables proper grounding of the p-well region in the main active MOSFET region and removal of a parasitic N+ source region B204 formed in the periphery of the MOSFET. When the N+ source region is formed in a self-aligned fashion with the p-well region, the formation of the source trench after the N+ source region formation removes parasitic N+ source regions from the device periphery of the chip and from under the gate pad region.

In the embodiment herein, combination of the source trench and the ion-implanted P+ plug region provides three important functions. First it provides proper grounding of the p-well region with the source ohmic contact in the active region of the device and second it helps in the removal of the parasitic N+ source region inadvertently formed in the periphery of the device. Third, the highly doped P+ plug region increases the dV/dt rating of the MOSFET. In the embodiment herein both of the above ensures the removal of the parasitic NPN transistor that would be otherwise formed in those regions.

While a parasitic NPN transistor also exists within the MOSFET unit cell, the N+ emitter (formed by the N+ source region) and the P-base (formed by the p-well region) are shorted by the N+ source ohmic contact. However, in the periphery of the device and also under the gate pad metallization, there is no N+ source ohmic contact, and as a result, the Emitter and Base regions of the parasitic NPN transistor are not shorted in this region. While this parasitic NPN transistor will not be activated under normal DC or switching operation of the MOSFET, operation of the device under extreme conditions like short-circuit or avalanche-mode results in the simultaneous presence of extremely high junction temperatures, high dV/dt and high current densities, which can cause the triggering of the parasitic NPN transistor. Typically, a separate masking step is carried out for masking the N+ source region from being formed at these locations. But in the embodiment herein, the source trench can be advantageously used for removing the parasitic N+ source regions and replacing them with a P+ plug region, which is self-aligned with the source trench and electrically connected to the p-well region.

Figure 15A:
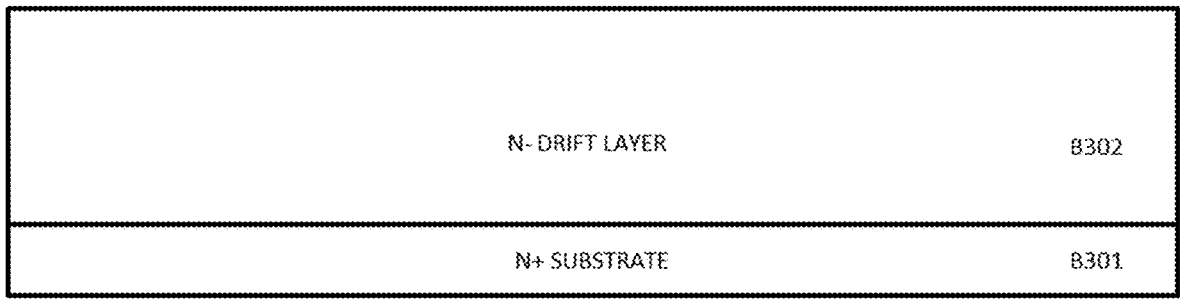
FIG. 15a to FIG. 15gg are cross sectional views showing the process steps for manufacturing the SiC DMOSFET structure in FIG. 14.
Figure 15B:
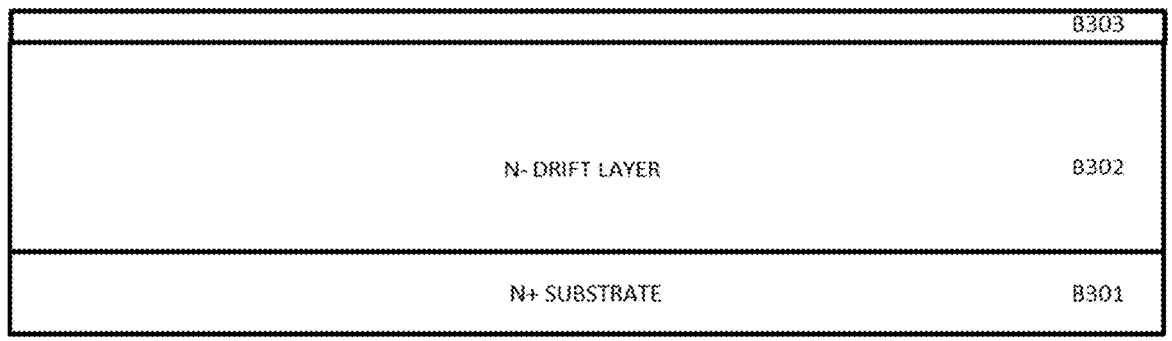
Figure 15C:
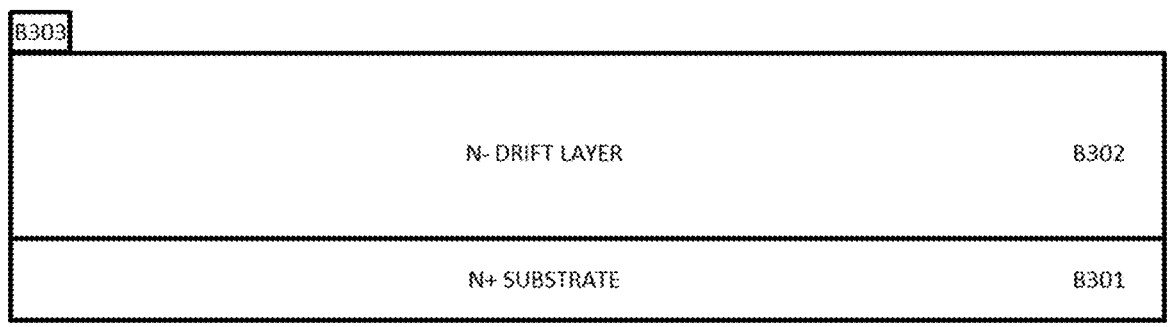
Figure 15D:
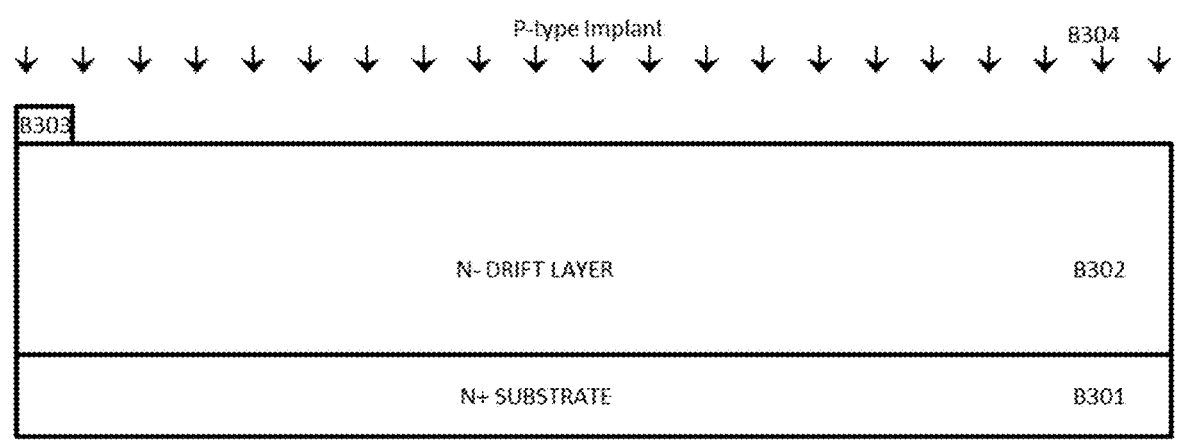
Figure 15E:
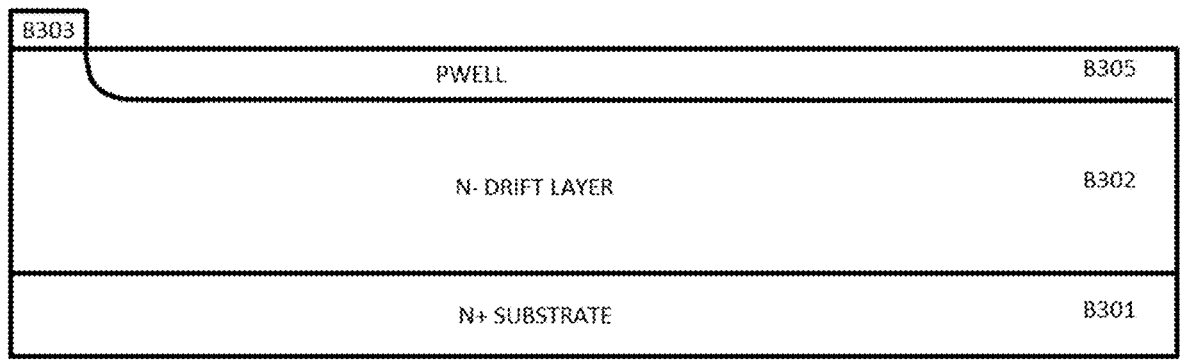

FIG. 15a to FIG. 15gg describes the process of manufacturing the structure shown in FIG. 14. The manufacturing process for a SiC DMOSFET is on a SiC substrate B301 and starts with using a 4H-SiC Si-face epi-wafer with suitable doping ($10^{14}$-$10^{18}$ cm$^{-3}$) and thickness (1 μm to 300 μm) for the epilayer B302 shown in FIG. 15a. A blanket hard mask B303 comprising a chemical vapor deposition (CVD) deposited layer of silicon dioxide, silicon nitride, silicon oxynitride, or a metallic layer such as nickel, with thickness ranging from 50 nm to 5 µm is deposited in FIG. 15*b* and then patterned using photolithography followed by a dry etch using reactive ion etching (ME) for example as shown in FIG. 15*c*. Then p-well region is first formed by ion-implantation or epitaxial growth using aluminum or boron as the p-type impurity. A p-type implantation B304 comprising boron or aluminum, at energies ranging from 10 keV to 800 keV, at implant doses ranging from $10^{12}$ cm$^{-2}$ to $10^{15}$ cm$^{-2}$ in FIG. 15*d* is performed to create a p-well B305 in FIG. 15*e*.

Figure 15F:
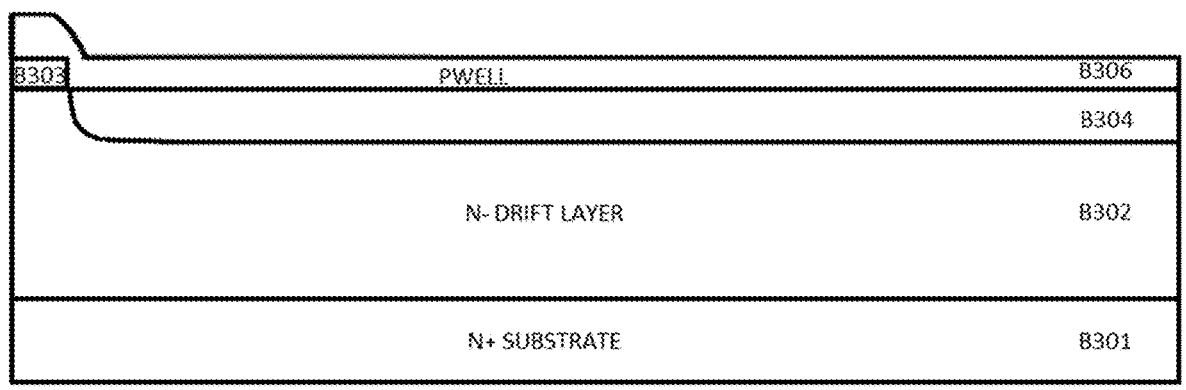
Figure 15G:
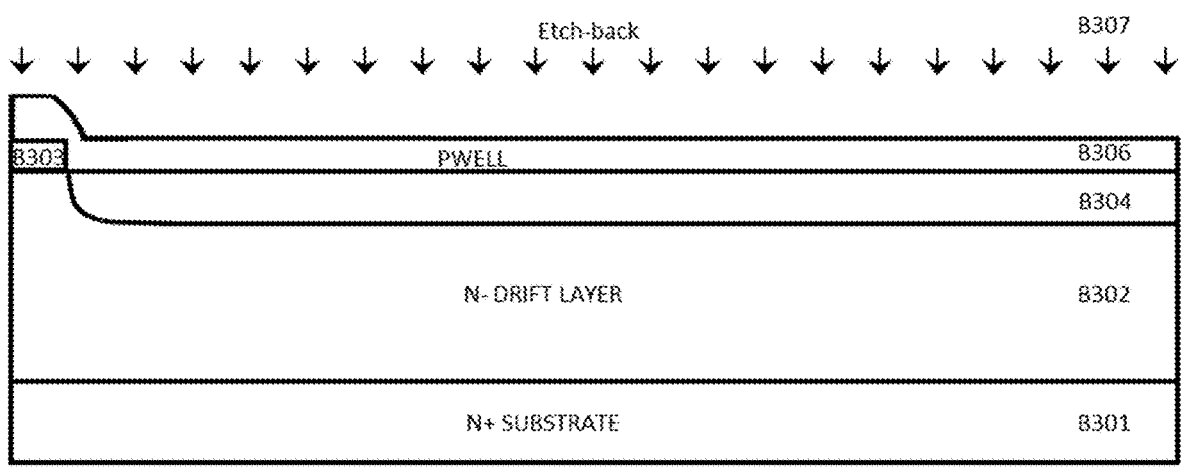
Figure 15H:
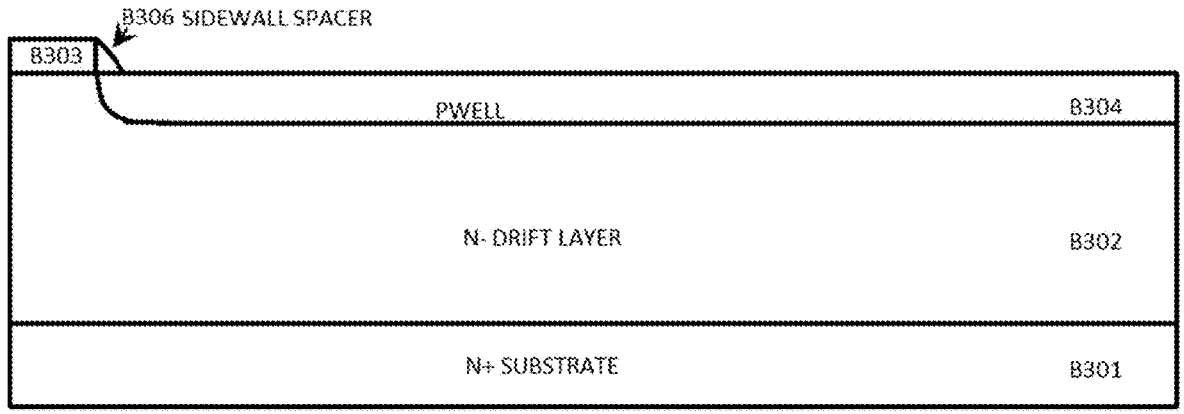

A second hard mask layer B306 is deposited by a CVD deposited layer of silicon dioxide, silicon nitride, silicon oxynitride, or a metallic layer such as nickel, with thickness ranging from 50 nm to 5 µm in FIG. 15*f* on top of the patterned first hard mask layer B303. This is followed by an anisotropic etching B307 in FIG. 15*g* to form a sidewall spacer B306 as shown in FIG. 15*h*.

Figure 15I:
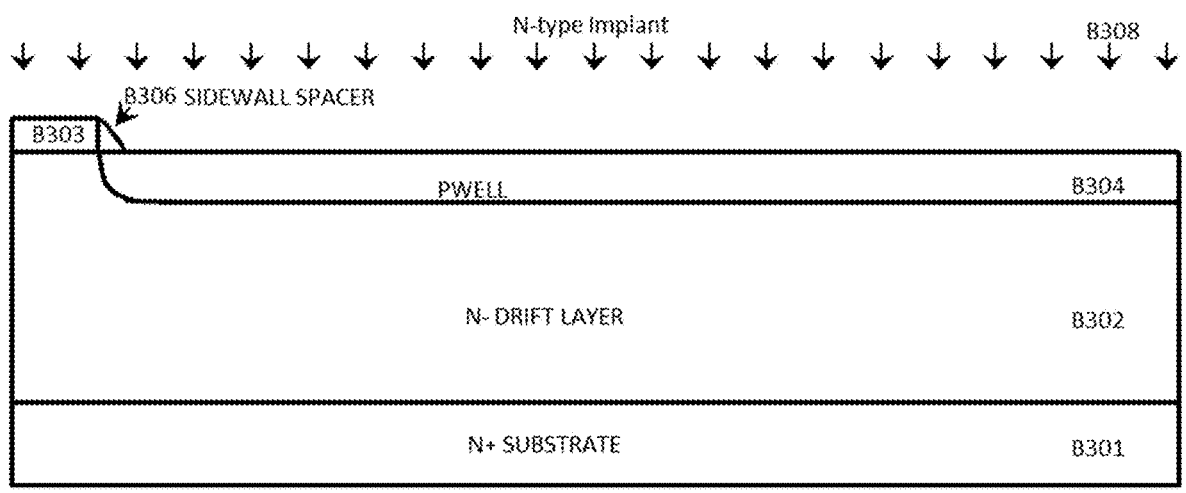
Figure 15J:
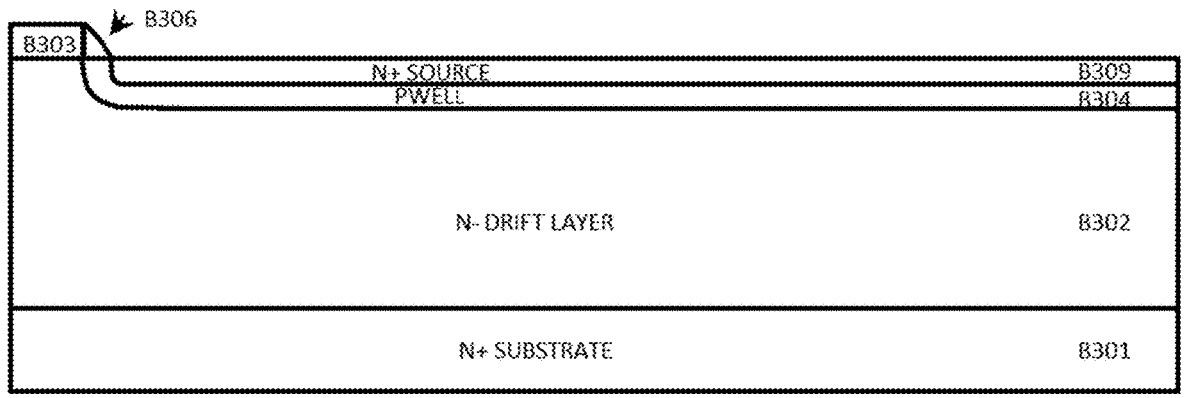
Figure 15K:
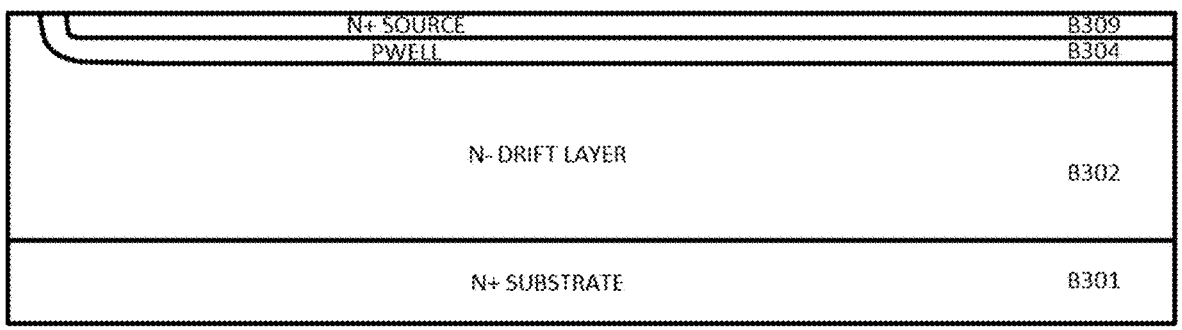

A n-type implant B308 is done in FIG. 15*i* for creating a N+ source region B309 in FIG. 15*j*. A N+ source region is formed by ion-implantation or by epitaxial re-growth by a n-type impurity such as nitrogen or phosphorus. Thus, the source region B309 is formed in a self-aligned fashion with the p-well region B304. The first and second hard mask layers B303 and B306 respectively, are removed in FIG. 15*k*. While the aforementioned sequence of process steps constitutes one method to form self-aligned p-well and N+ source region, other methods may be employed to achieve the same result. For example, the N+ source region B309 may first be formed after deposition and patterning of a first hard mask layer, followed by further etch back of the first hard mask layer to then form the p-well region B304.

Figure 15L:
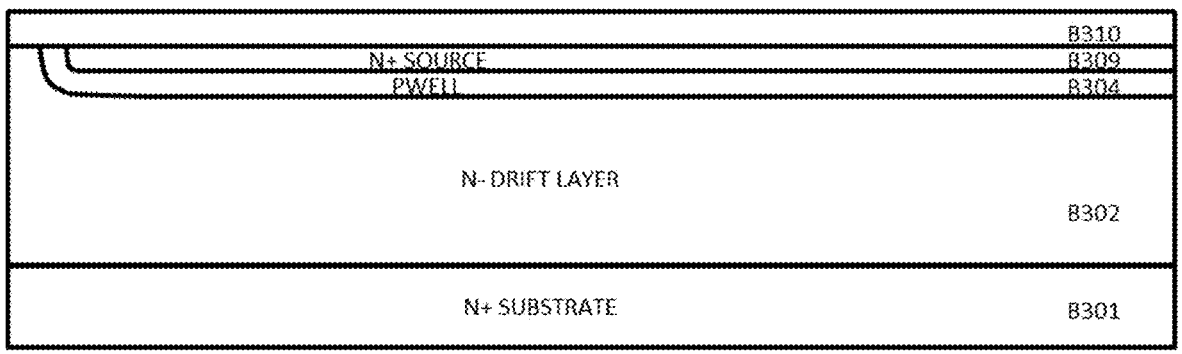
Figure 15M:
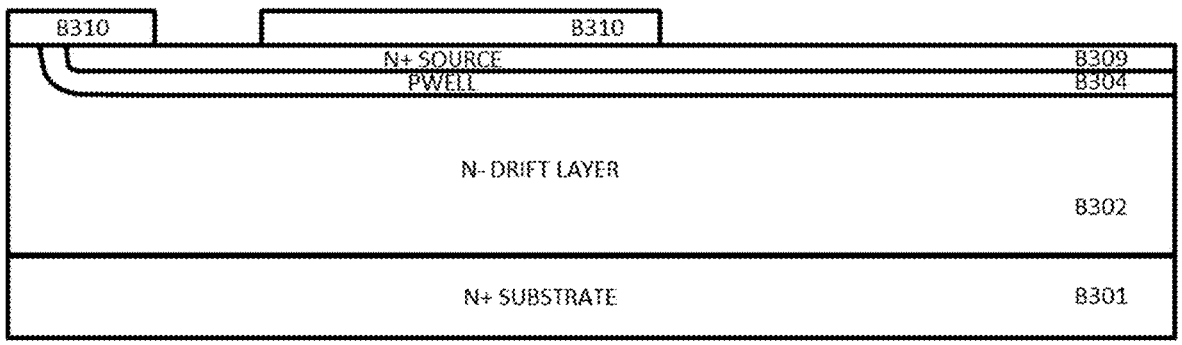
Figure 15N:
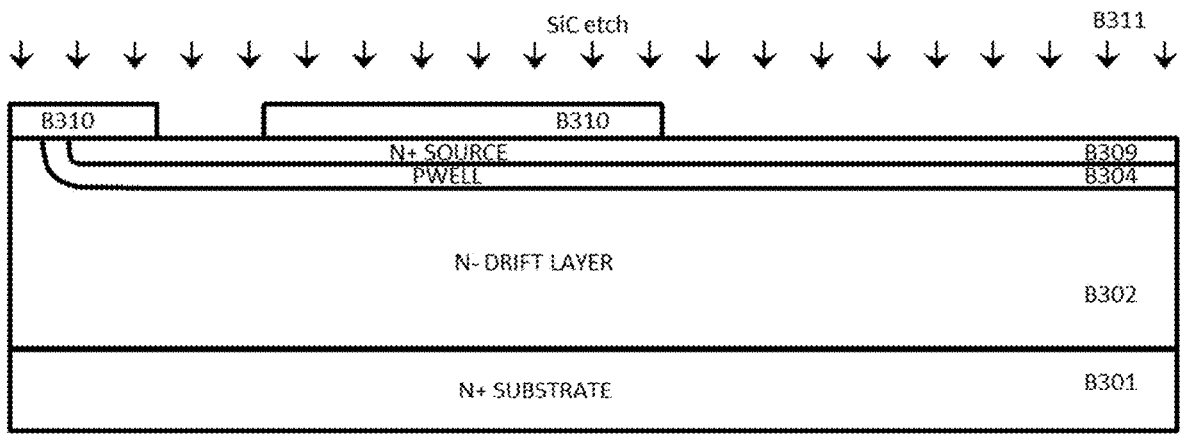
Figure 15O:
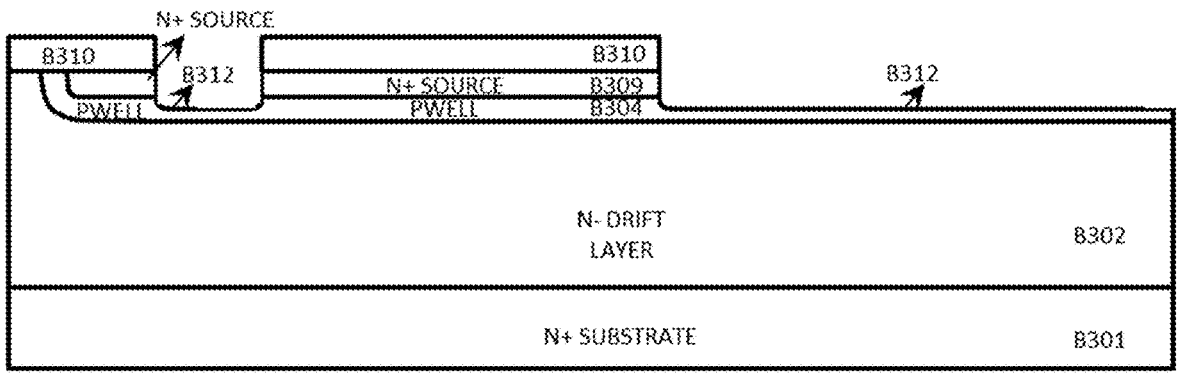
Figure 15P:
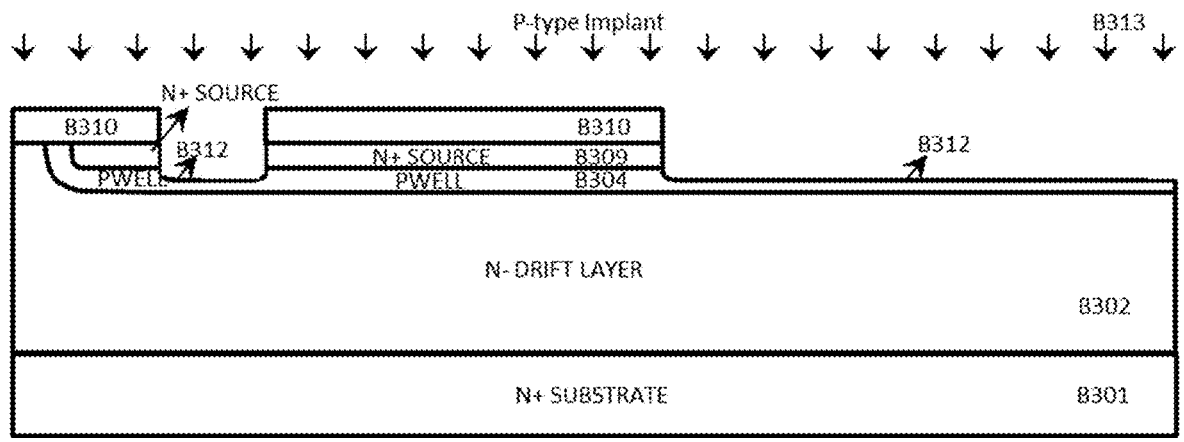
Figure 15Q:
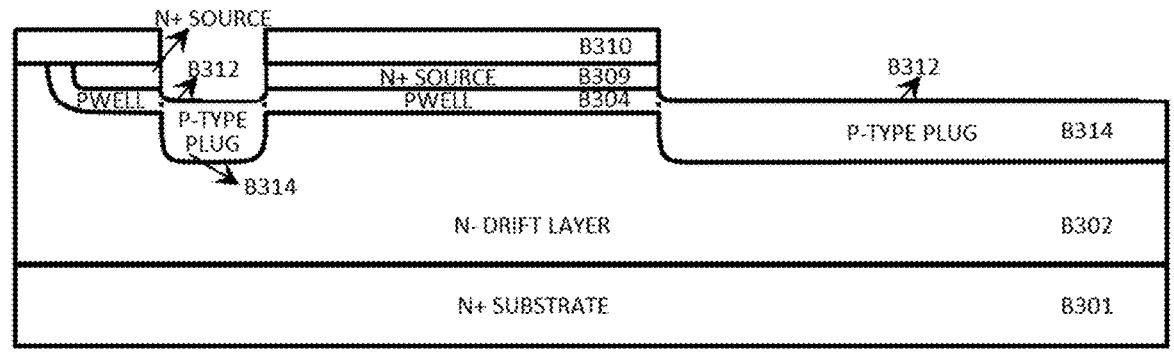
Figure 15R:
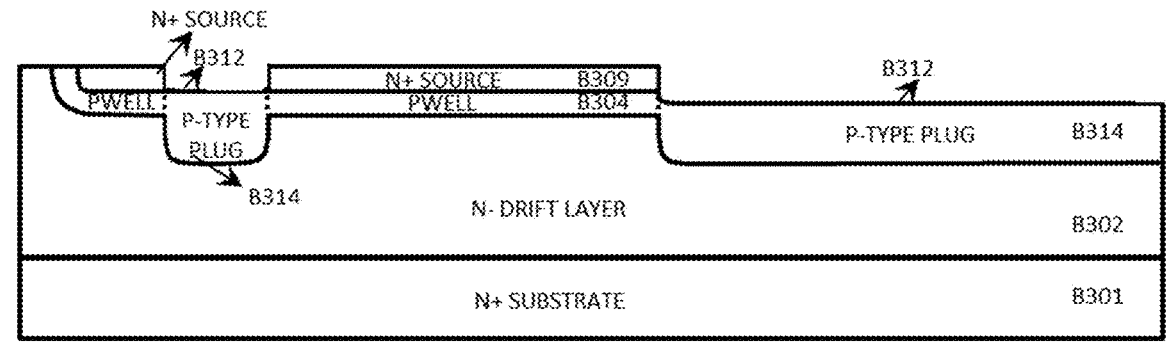

Another mask layer B310 is deposited by a CVD deposited layer of silicon dioxide, silicon nitride, silicon oxynitride, or a metallic layer such as nickel, with thickness ranging from 50 nm to 5 µm on the top in FIG. 15*l*. The mask layer B310 is patterned in FIG. 15*m*. The pattered mask B310 is used to etch into the substrate B311 in FIG. 15*n* using dry etch method to create a recessed region within the SiC. The recessed region is the source trench B312 formed in the substrate by penetrating the source region in FIG. 15*o*. The entire N+ source region is removed by dry etching at these selected locations of the device. Using the same hard mask B310, by implantation of a controlled dose of a p-type impurity B313 such as aluminum or boron in FIG. 15 *p* a P+ plug layer is formed in FIG. 15*q*. The depth of the P+ plug layer B314 may preferably exceed the depth of the N+ source implant and may even exceed the depth of the p-well region, in a particular implementation. A p-type implantation comprising boron or aluminum, at energies ranging from 10 keV to 800 keV, at implant doses ranging from $10^{13}$ cm$^{-2}$ to $10^{17}$ cm$^{-2}$ in FIG. 15*p* is performed to create a P+ plug region. The P+ plug region B314 is realized under the source trench B312, which is electrically connected to the p-well region B304. The mask layers are B310 removed in FIG. 15*r*. The wafer is annealed for activating the implanted impurities.

Figure 15S:
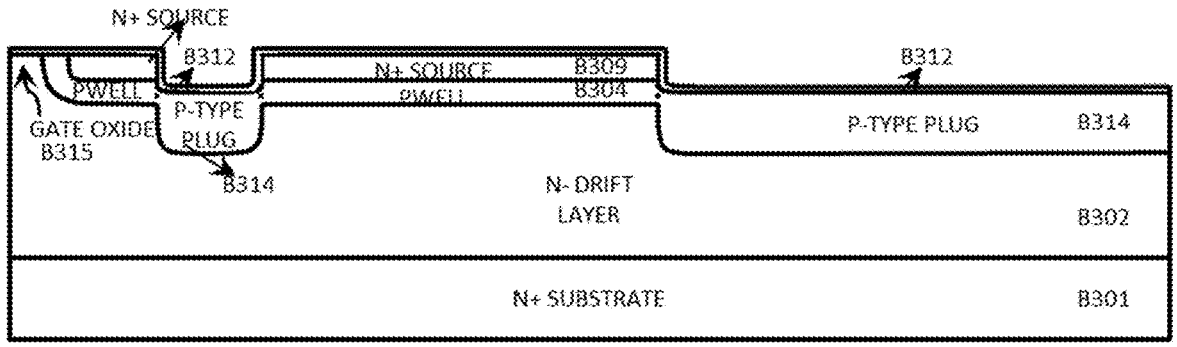
Figure 15T:
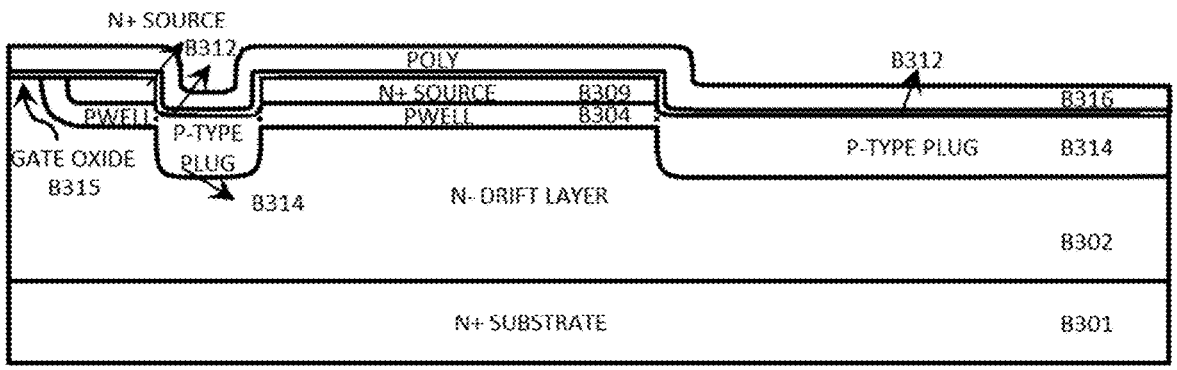
Figure 15U:
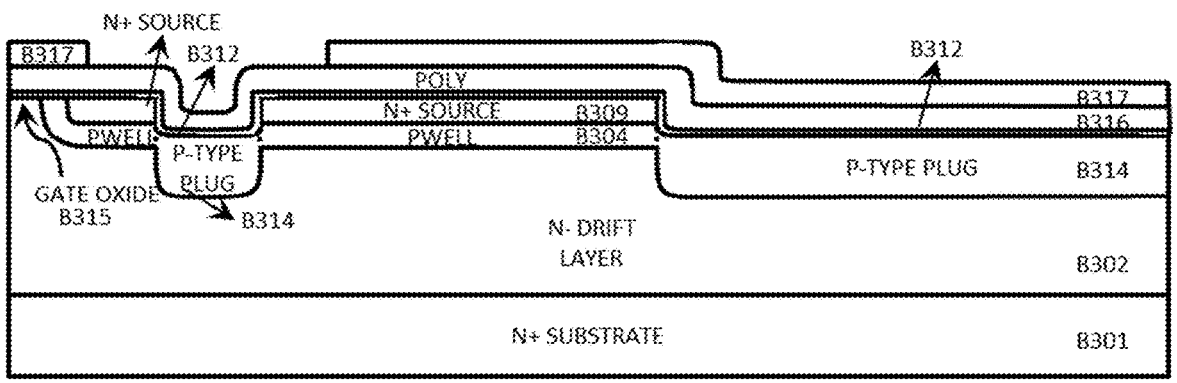
Figure 15V:
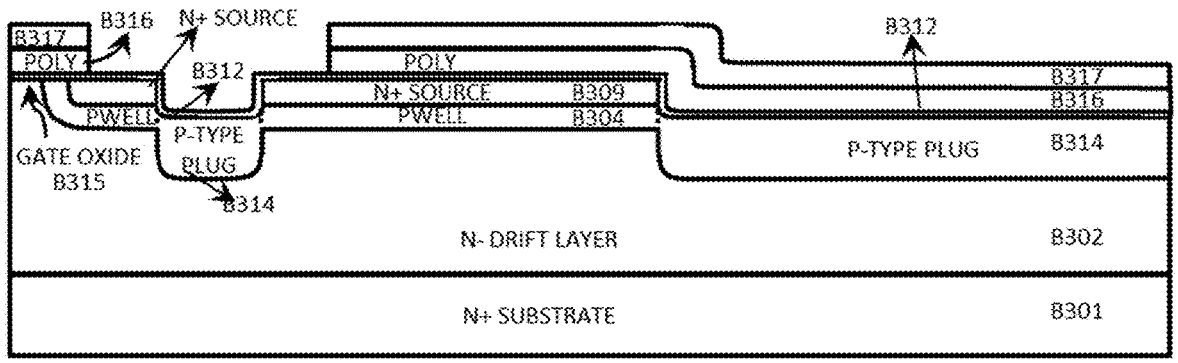
Figure 15W:
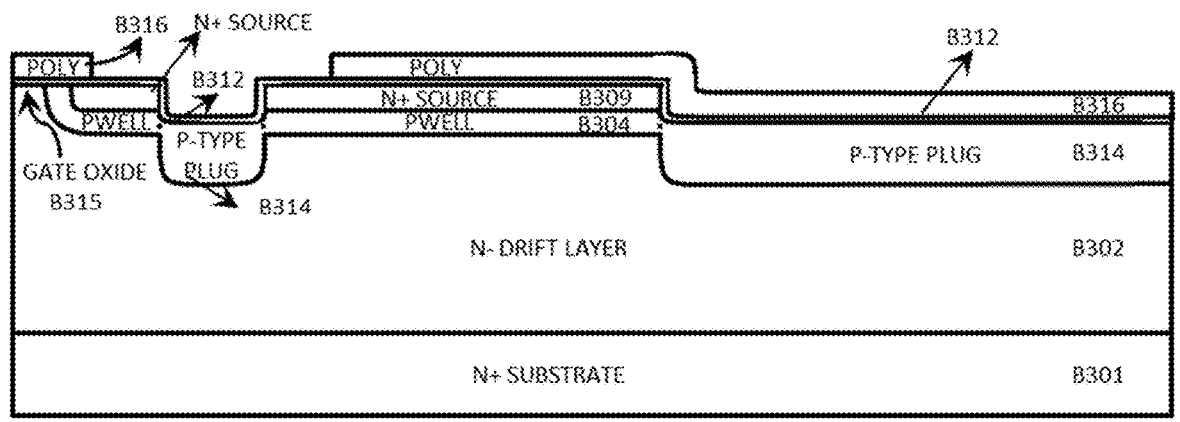
Figure 15X:
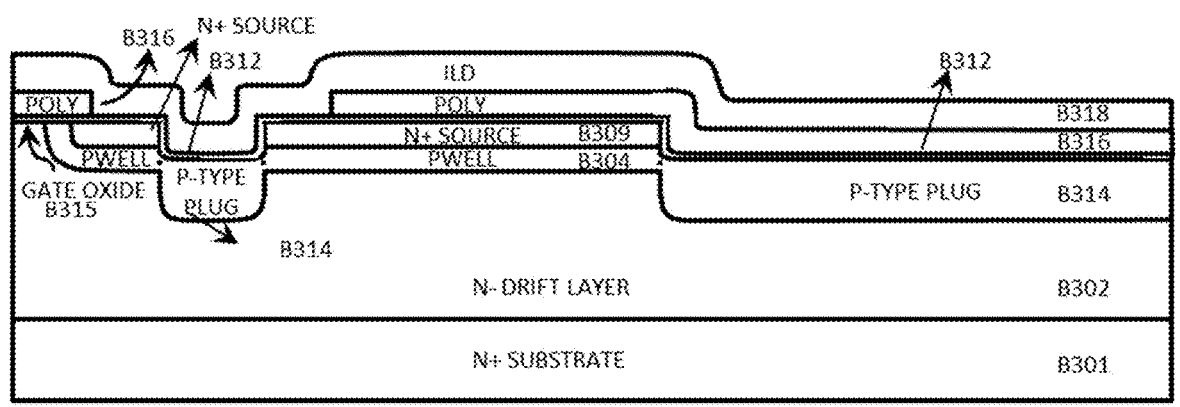

The oxide layer B315 which is the gate oxide is formed by thermal oxidation or using CVD of a dielectric layer such as silicon dioxide, silicon nitride, silicon oxynitride, etc. in FIG. 15*s*. The thickness of the gate oxide could range from 5 nm to 100 nm. Either dry or wet thermal oxidation could be used for oxide growth. Plasma-enhanced chemical vapor deposition (PECVD) or low-pressure chemical vapor deposition (LPCVD) could be used for gate oxide deposition. A polysilicon gate layer B316 is then deposited in FIG. 15*t*. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 600-900° C. A hard mask B317 is deposited by a CVD deposited layer of silicon dioxide, silicon nitride, silicon oxynitride, or a metallic layer such as nickel, with thickness ranging from 50 nm to 5 µm on the top and patterned as shown in FIG. 15*u*. The polysilicon layer B316 is etched by using the patterned mask layer B317 in FIG. 15*v*. The mask layer B317 is then removed in FIG. 15*w*. An ILD layer B318 comprising 50 nm-1000 nm thick silicon dioxide, silicon nitride, silicon oxynitride layers or a stacked combination thereof is deposited on the wafer in FIG. 15*x*.

Figure 15Y:
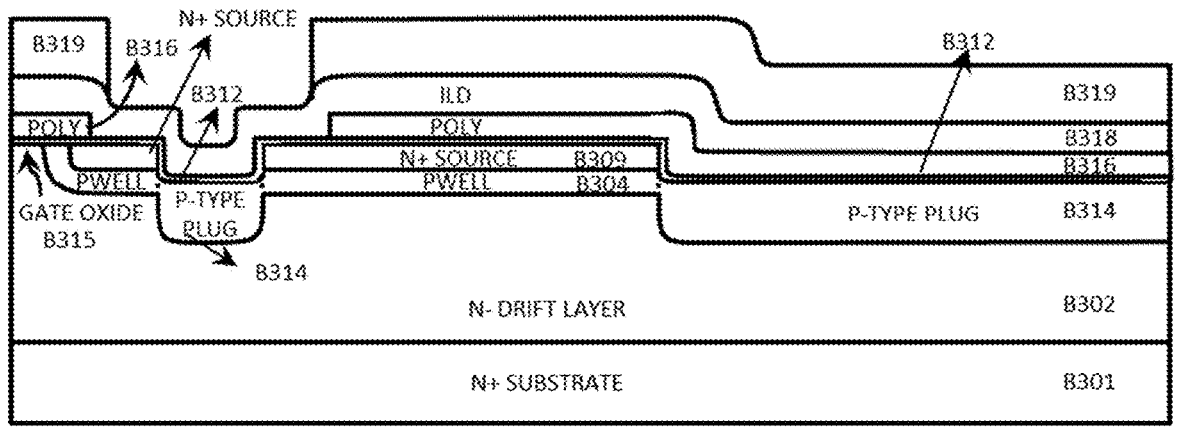
Figure 15Z:
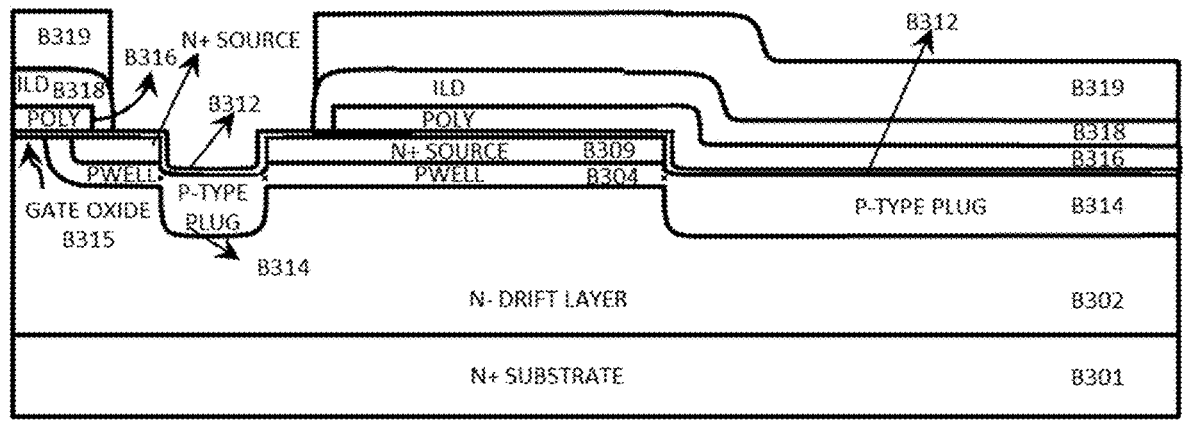
Figure 15A:
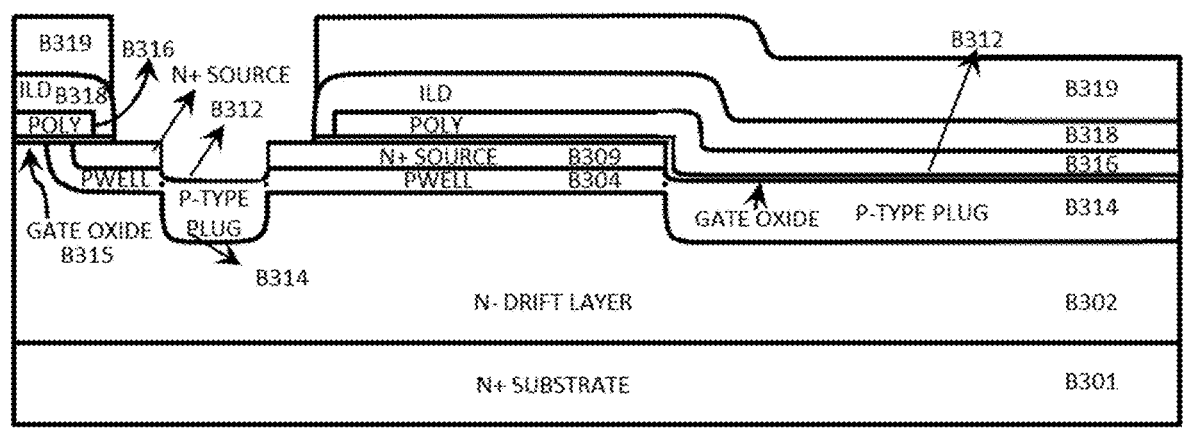
Figure 15B:
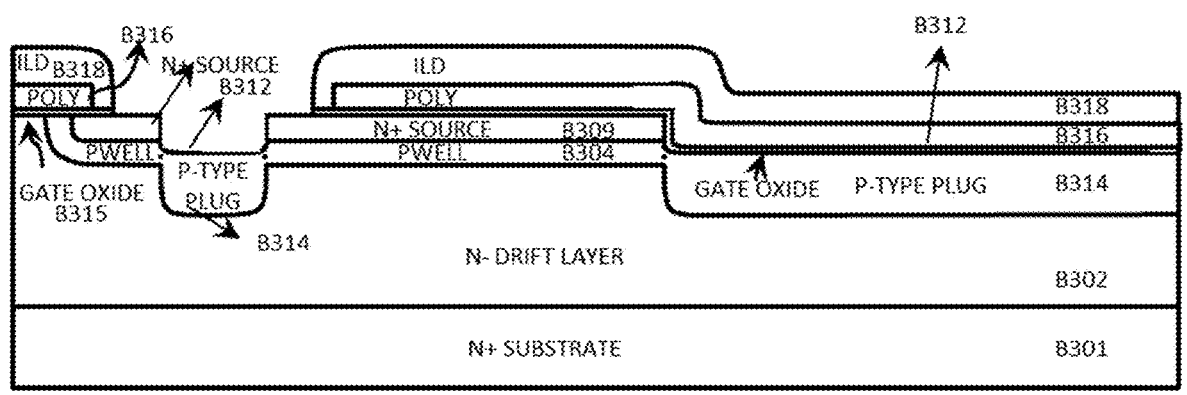
Figure 15C:
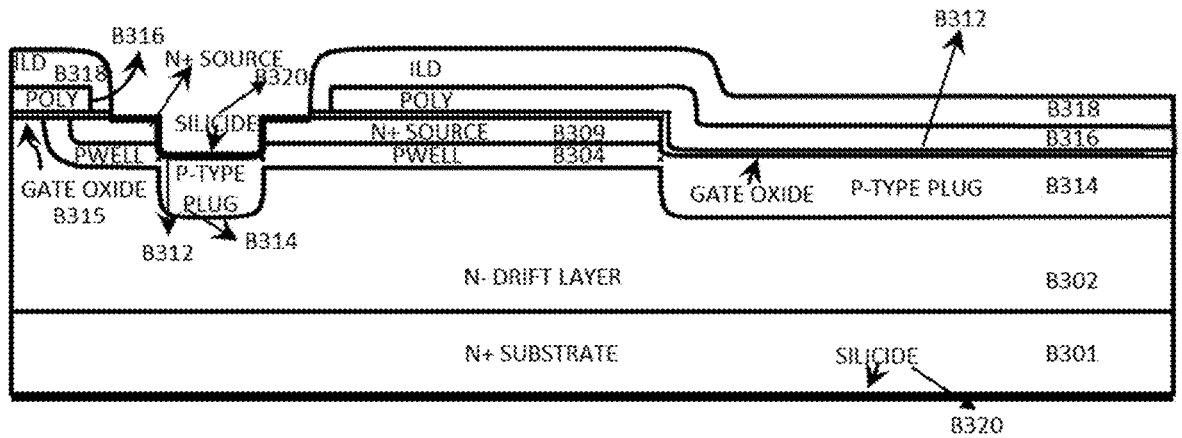
Figure 15D:
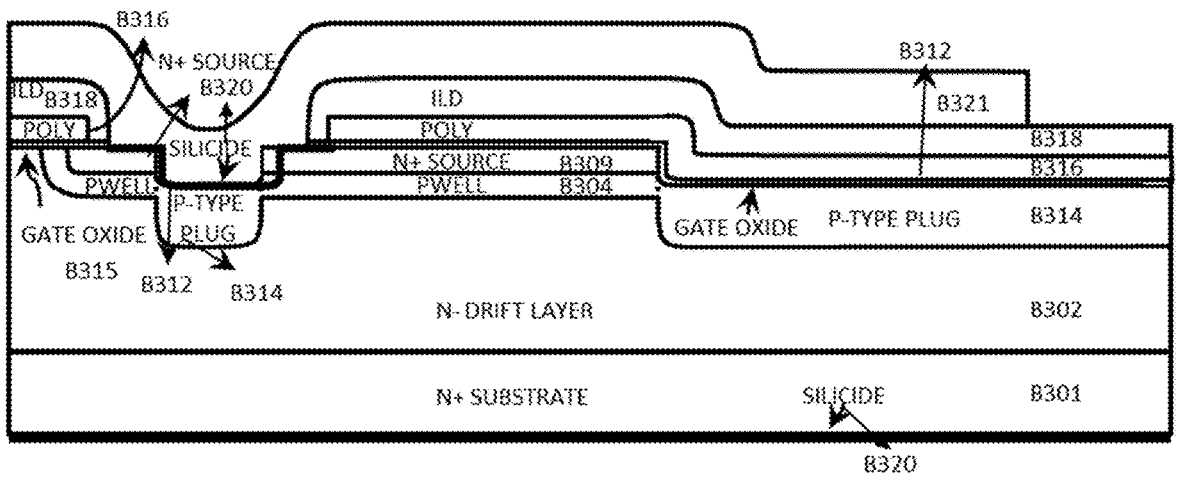
Figure 15E:
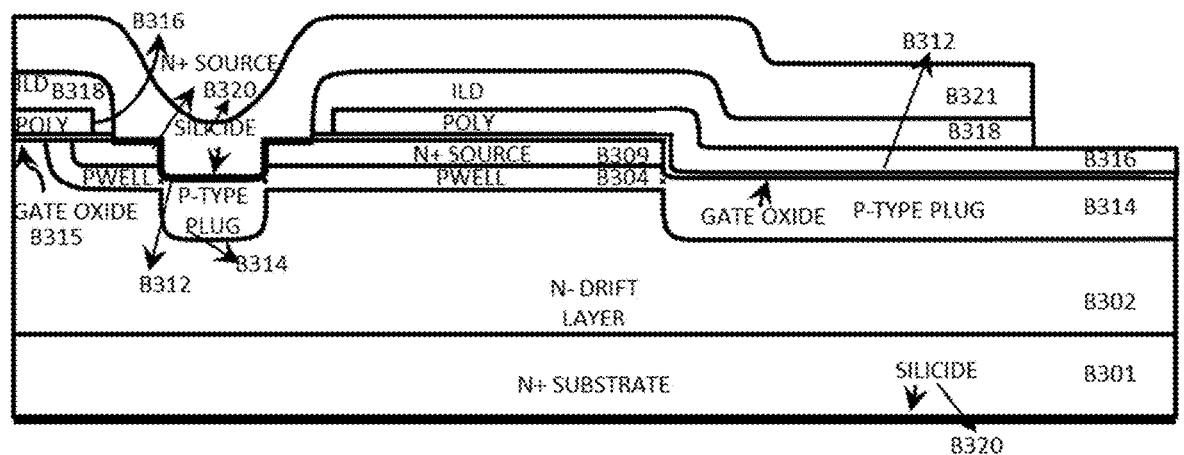
Figure 15F:
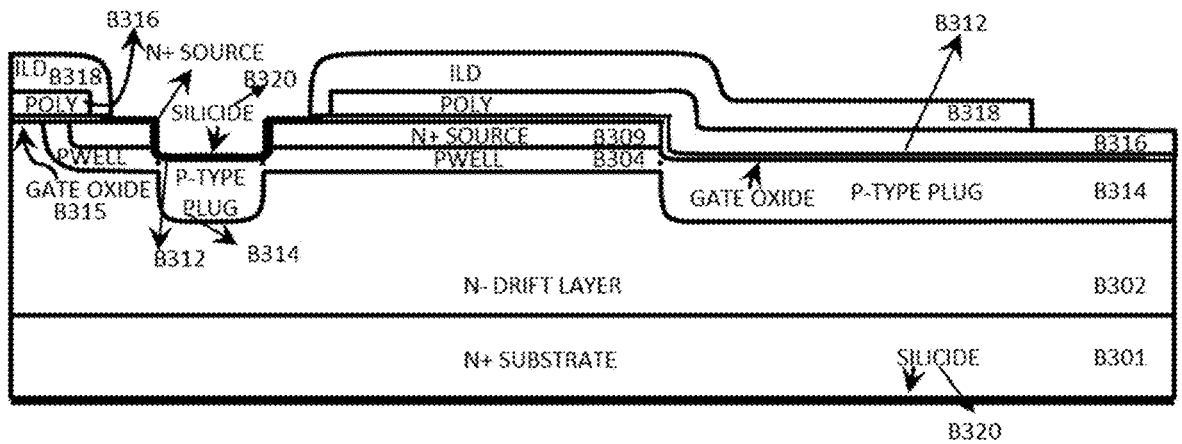
Figure 15G:
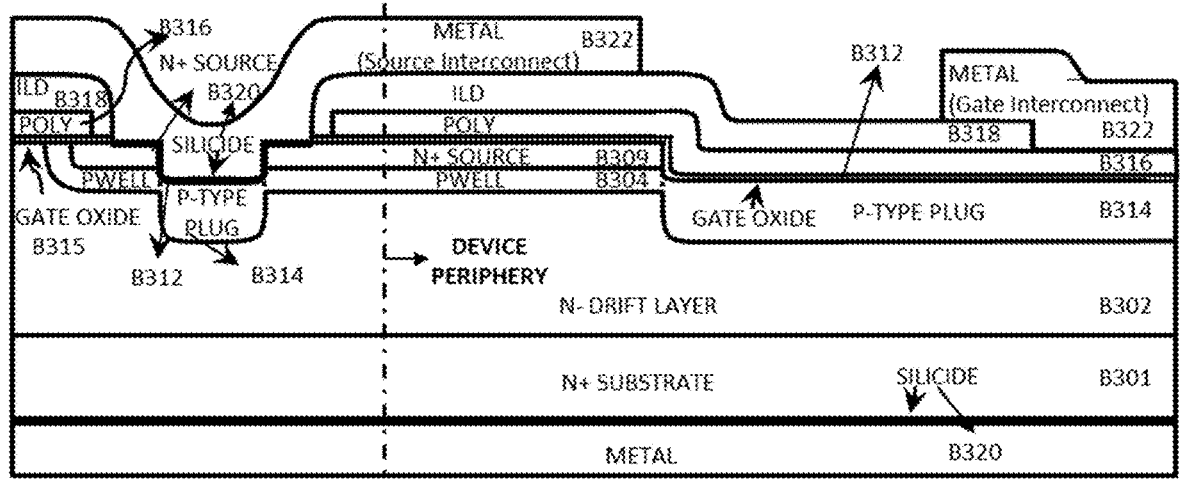

A hard mask B319 is deposited by a CVD deposited layer of silicon dioxide, silicon nitride, silicon oxynitride, or a metallic layer such as nickel, with thickness ranging from 50 nm to 5 µm on the top and patterned on top to define the ILD opening in FIG. 15*y*. The ILD layer B318 is etched using the hard mask B319 as shown in FIG. 15*z*. Further the gate oxide B315 is etched using the same mask B319 in FIG. 15*aa*. The mask B319 is then removed in FIG. 15*bb*. A nickel silicide region B320 is formed on the exposed SiC surface in FIG. 15*cc*. A mask layer B321 is formed by a CVD deposited layer of silicon dioxide, silicon nitride, silicon oxynitride, or a metallic layer such as nickel, with thickness ranging from 50 nm to 5 µm on the top and patterned in FIG. 15*dd*. The ILD layer B318 is etched using mask B321 in FIG. 15*ee*. The mask layer B321 is removed in FIG. 15*ff*. Interconnect metal layers B322 of either aluminum or silver or gold is deposited and patterned on the top and bottom of the substrate in. FIG. 15*gg*.

In the embodiment herein, the same final structure for forming the source trench region and P+ plug region may be alternatively realized using a slightly different approach. As in the above method, the p-well region and the N+ source region are realized using a self-aligned process. However, in the embodiment herein, the P-plug layer may be formed first using deep boron or aluminum implantation as a buried layer that is placed under the N+ source region. The dry etching for the N+ source trench realization may be performed later on in the process. The N+ source trench may be realized preferably after the high-temperature annealing process in one example implementation.

Figure 16:
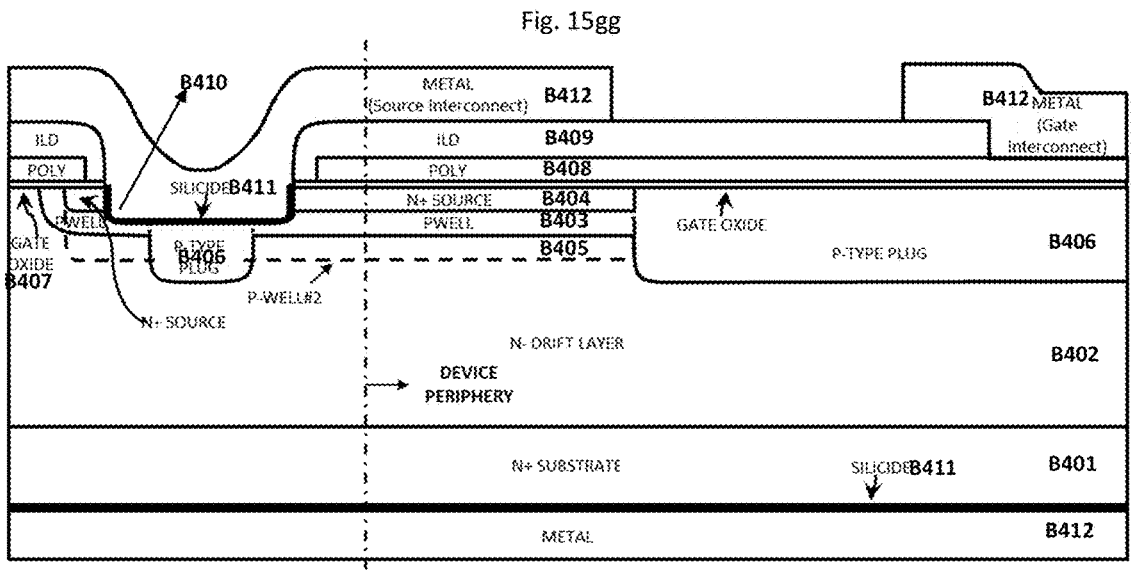
FIG. 16 shows an embodiment of a SiC DMOSFET with a dedicated process step is utilized for masking the implantation of the N+ source region in the device periphery.

An embodiment shown in FIG. 16 is the unit cell and the device periphery of a cross-sectional structure of a SiC DMOSFET. The key regions of this device are a p-well region B403, which is formed by ion– implantation or epitaxial re-growth of a p-type species such as aluminum or boron. There is an N+ source region B404, N– drift layer B402, and an N+ substrate B401. In the ON state when a gate voltage is applied to the polysilicon gate B408 the current flows vertically from the drain B401, through the inversion layer which is formed at the top of the p-well layer B403, through the N+ source region B404, and out through the source metallization B412. In the OFF state or the blocking state, a voltage is supported across the p-well B403, N– drift layer B402 junction and there is a PN junction which is formed between the p-well and the N– drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide B407. Another feature is an ILD layer B409 which is used to insulate the source interconnect metallization B412 from the polysilicon gate.

A dedicated masking step is interspersed between the formation of the sidewall spacer after the p-well implant and before the N+ source implant to mask the N+ source implant from the peripheral regions of the MOSFET. A second deeper p-well region (P-Well #2) B405 is formed using the same masking step used for the N+ source implant. P+ plug regions B406 are formed in a later step in both the active regions of the device as well as the device periphery. The P+ plug layer B406 is grounded with the N+ source metallization. The purpose of the P+ plug in SiC DMOSFET is to ground the p-well region with the N+ source contact.

A trench B410 is later etched through the N+ source regions at discrete locations in the active region to contact the P+ plug regions, which get shorted to the N+ source region by the ohmic silicide B411 metallization. The source trench B410 is etched into the SiC at selected regions using the same hard mask used for patterning the interlevel dielectric layer (ILD). In the embodiment herein, the source trench B410 serves two functions. First the source trench reveals the surface of the P+ plug layer that was previously buried under the N+ source region for subsequent contact with the ohmic silicide metal and second the source trench reveals the sidewalls of the N+ source region for subsequent contact with the ohmic silicide metal.

In the embodiment herein, a dedicated hard mask or photoresist layer is applied after the sidewall spacer is formed and before the N+ source implantation. This layer prevents the formation of the N+ source region in the device periphery and parasitic NPN structures in the device periphery are avoided In the embodiment herein, a second p-well region (P-Well #2) B405 is placed under the N+ source region B404 and electrically connected to the main p-well region provides additional electrical dose under the N+ source implant, for preventing reach-through breakdown, especially after the source trench formation. The etching of the source trench may inadvertently etch part of the primary p-well region under the N+ source region, thereby locally reducing the p-well dose in this region, resulting in undesirable reach through breakdown at these locations.

Figure 17A:
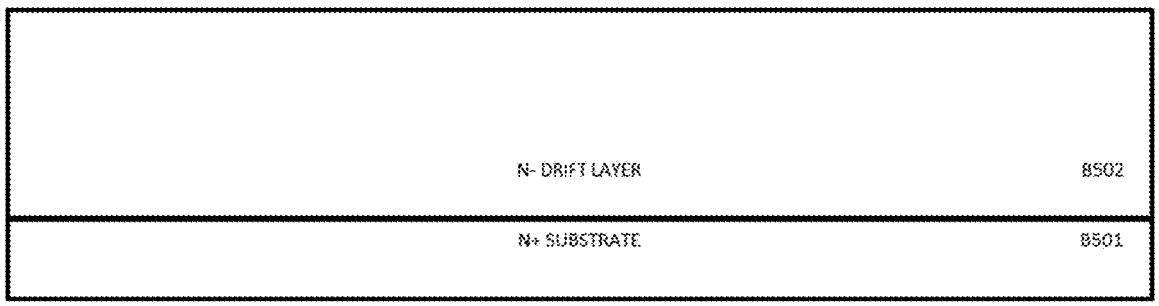
FIG. 17a to FIG. 17gg are cross sectional views showing the process steps for manufacturing the SiC DMOSFET structure in FIG. 16.
Figure 17B:
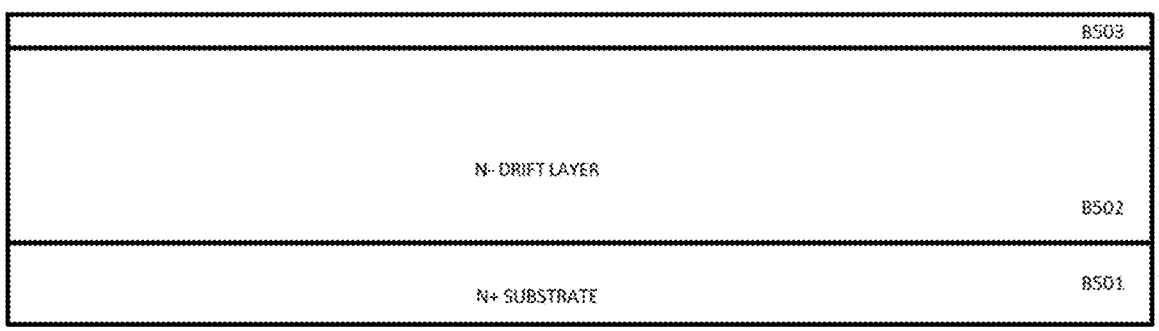
Figure 17C:
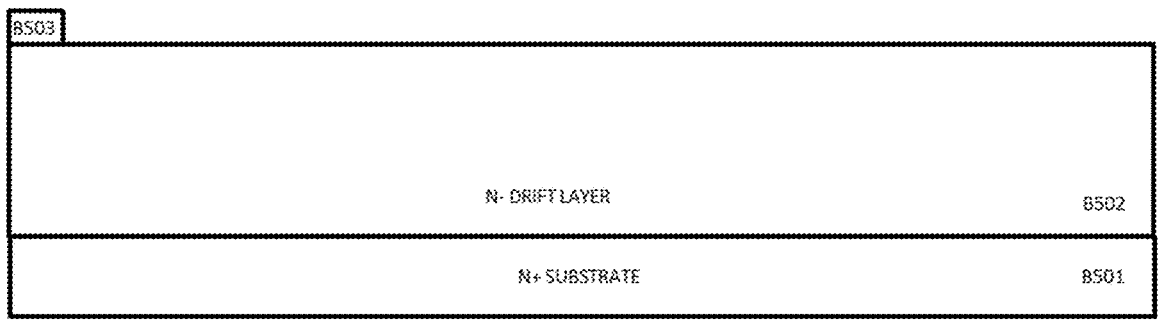
Figure 17D:
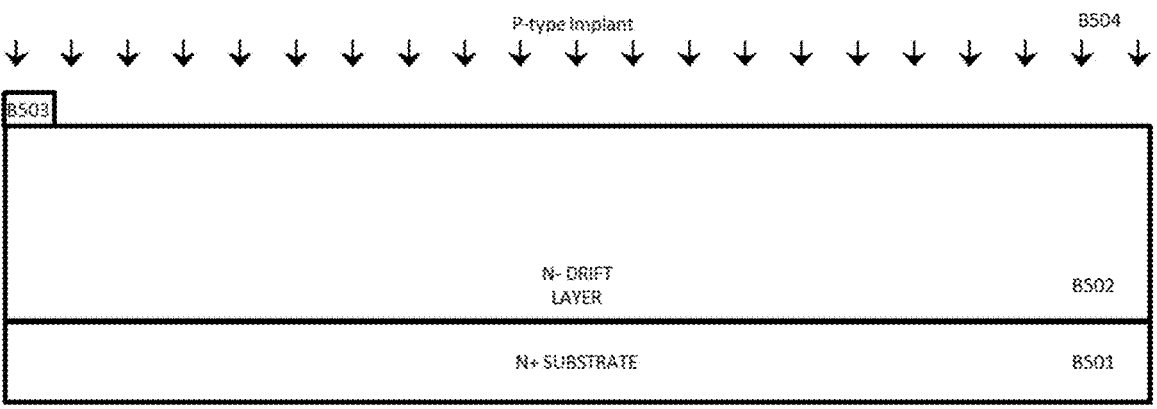
Figure 17E:
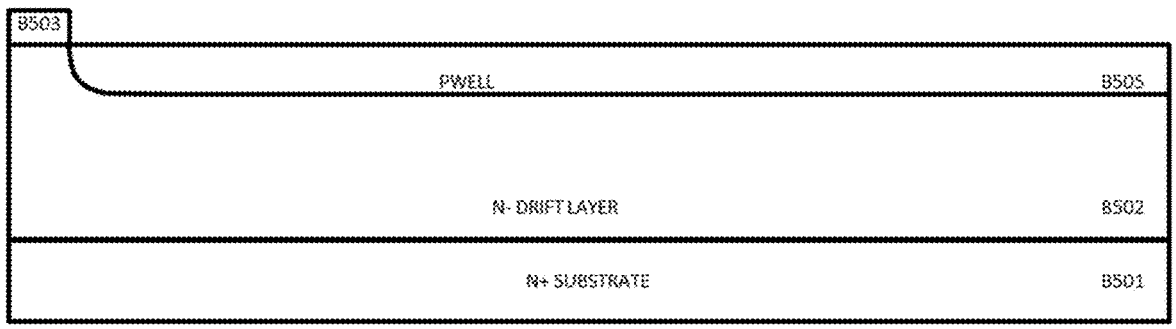

FIG. 17a to FIG. 17gg describes the process of manufacturing the structure shown in FIG. 16. The manufacturing process for a SiC DMOSFET is on a SiC substrate B501 and starts with using a 4H-SiC Si-face epi-wafer with suitable doping ($10^{14}$-$10^{18}$ cm$^{-3}$) and thickness (1 μm to 300 μm) for the epilayer B502 shown in FIG. 17a. A blanket hard mask B503 comprising a CVD deposited layer of silicon dioxide, silicon nitride, silicon oxynitride, or a metallic layer such as nickel, with thickness ranging from 50 nm to 5 μm is deposited in FIG. 17b and then patterned using photolithography followed by a dry etch using RIE for example as shown in FIG. 17c. Then p-well region is first formed by ion-implantation or epitaxial growth using aluminum or boron as the p-type impurity. A p-type implantation B504 comprising boron or aluminum, at energies ranging from 10 keV to 800 keV, at implant doses ranging from $10^{12}$ cm$^{-2}$ to $10^{15}$ cm$^{-2}$ in FIG. 17d is performed to create a p-well B505 in FIG. 17e.

Figure 17F:
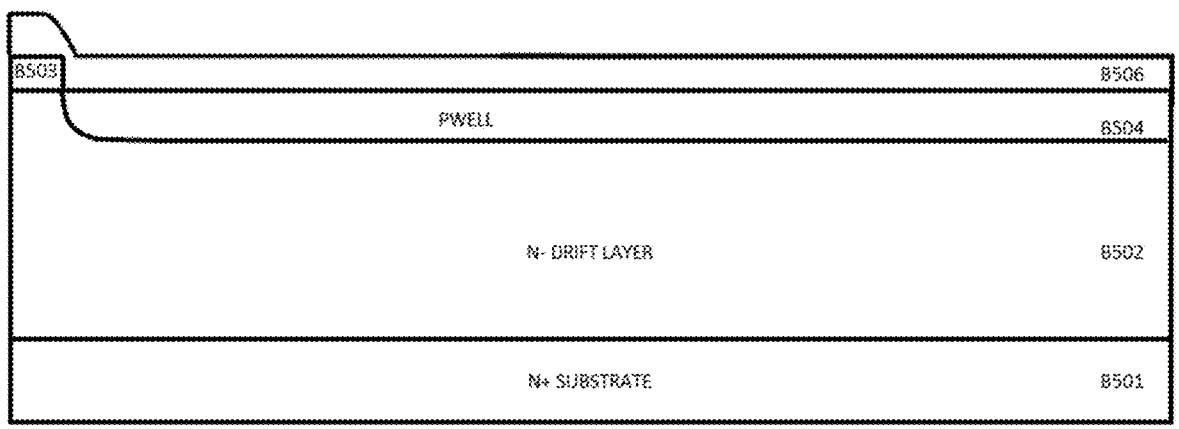
Figure 17G:
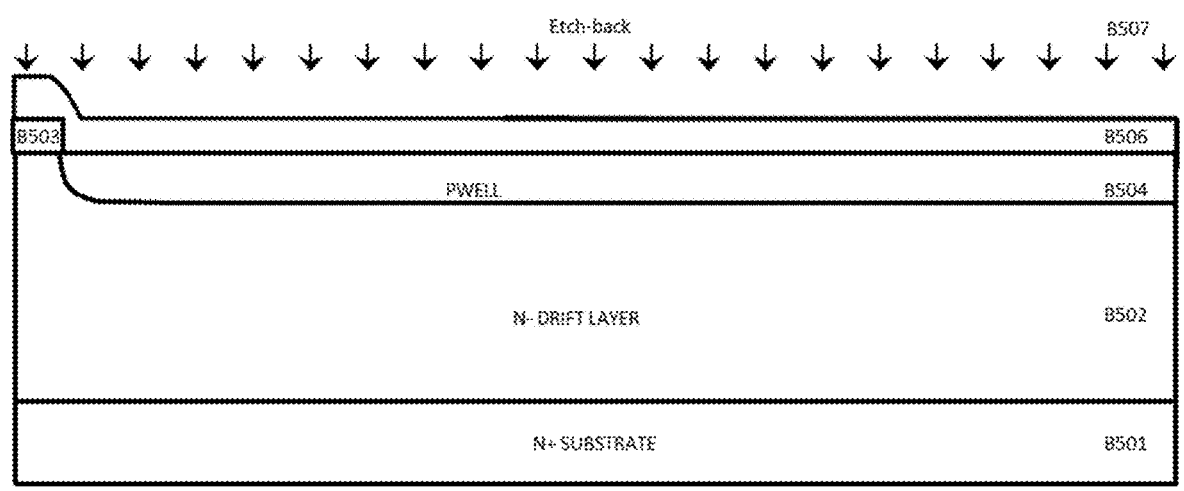
Figure 17H:
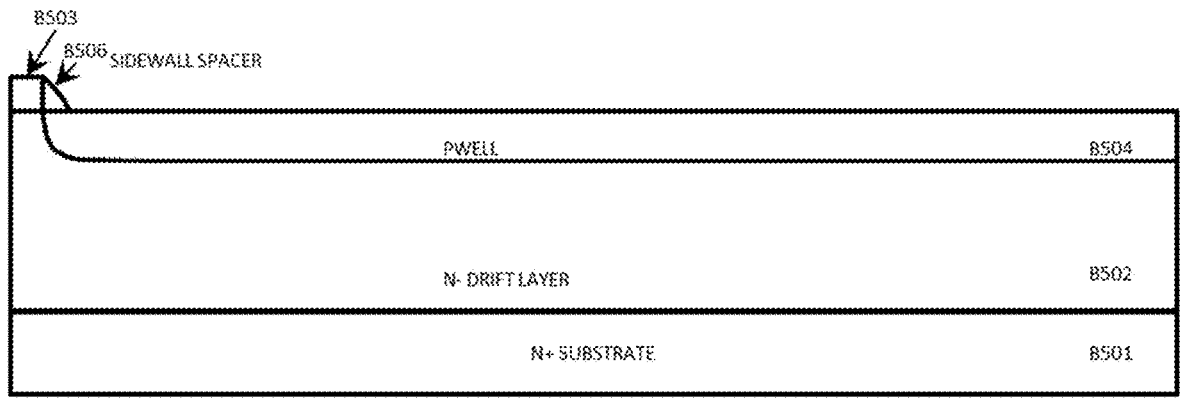
Figure 17I:
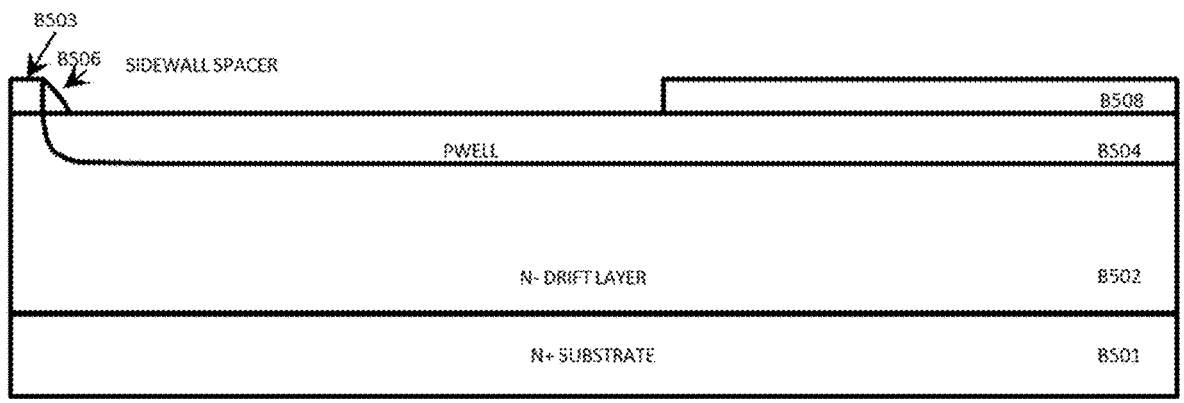

A second hard mask layer B506 is deposited by a CVD deposited layer of silicon dioxide, silicon nitride, silicon oxynitride, or a metallic layer such as nickel, with thickness ranging from 50 nm to 5 μm in FIG. 17f on top of the patterned first hard mask layer B503. This is followed by an anisotropic etching B507 in FIG. 17g to form a sidewall spacer B506 as shown in FIG. 17h. A patterned mask layer B508 is deposited by a CVD deposited layer of silicon dioxide, silicon nitride, silicon oxynitride, or a metallic layer such as nickel, with thickness ranging from 50 nm to 5 μm on the top alongside the patterned mask layer with the sidewall spacer in FIG. 17i. The hard mask layer B508 patterned over the peripheral regions of the device.

Figure 17J:
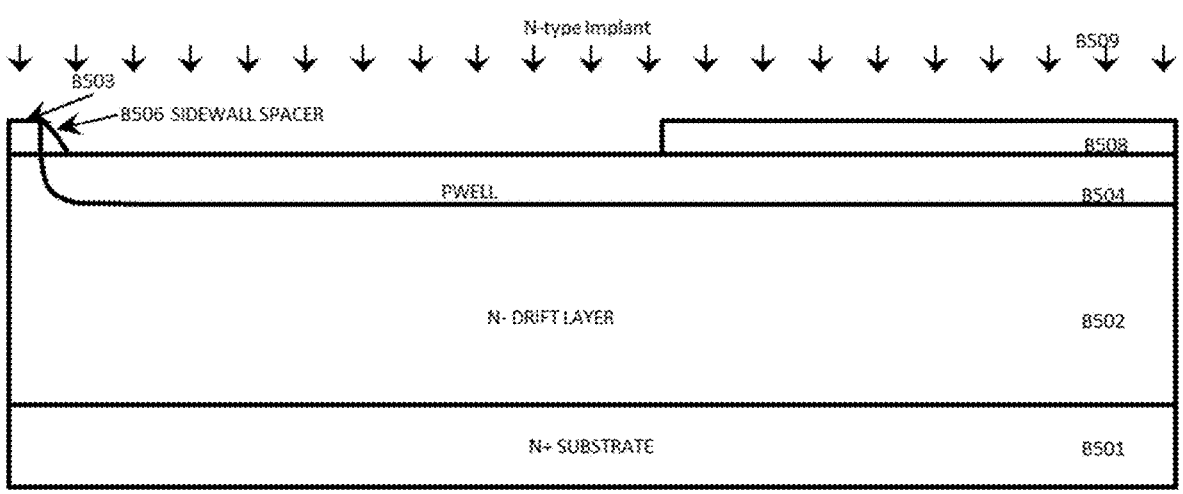
Figure 17K:
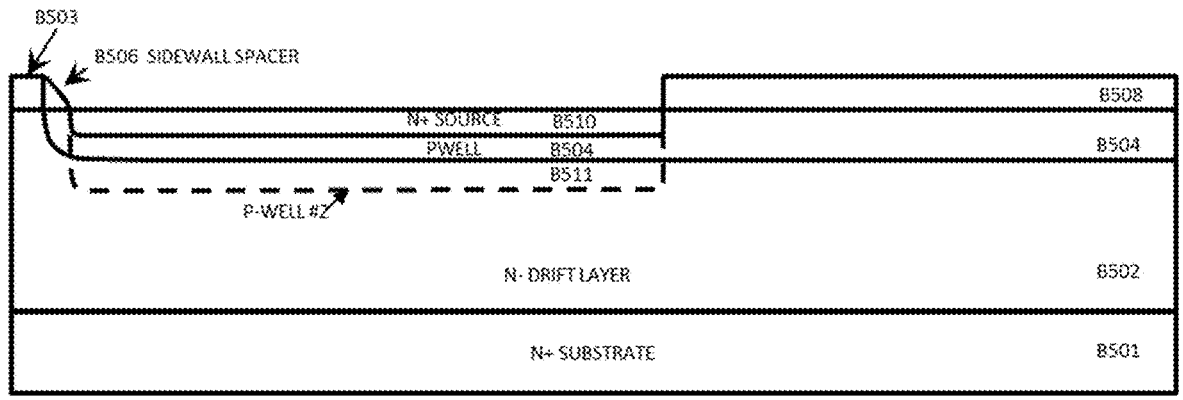

A n-type implant B509 is done in FIG. 17j for creating a N+ source region B510 in FIG. 17k. A N+ source region is formed by ion-implantation or by epitaxial re-growth by a n-type impurity such as nitrogen or phosphorus. The N+ source region B510 is formed in a self-aligned fashion with the p-well region B504. The source region is formed in a self-aligned fashion with the p-well region, while it is masked from the peripheral regions of the device. A deep second p-well region (P-Well #2) B511 may be formed at the same time as the N+ source region in FIG. 17k. The buried P-well #2 region may be formed using aluminum or boron, and placed under the N+ source region in the active area of the device. The P-Well #2 region may be preferably formed using the p-type species boron which has a higher ion-implantation range as compared to aluminum in SiC. It may not be necessary to mask the p-well region #2 from the peripheral regions of the device.

Figure 17L:
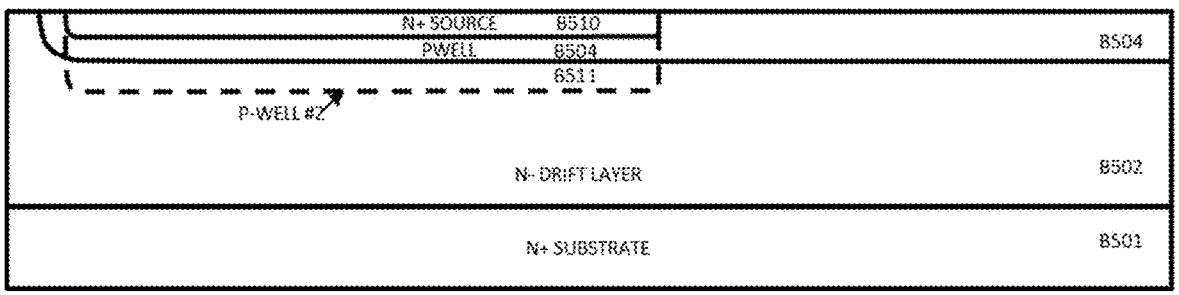
Figure 17M:
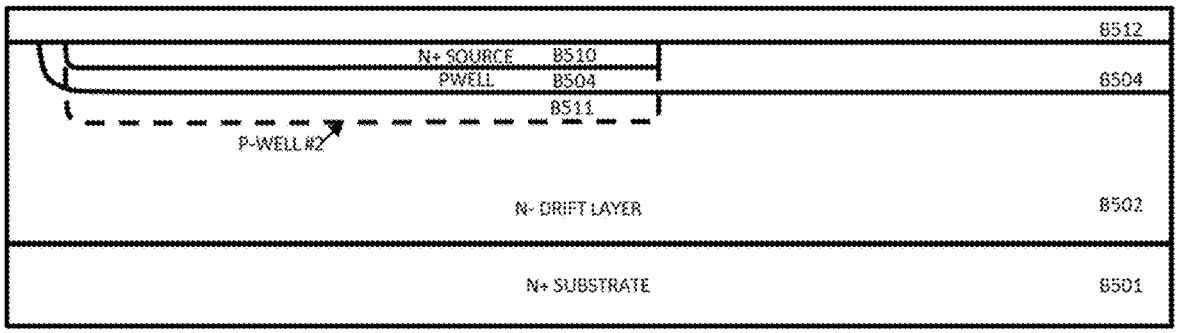
Figure 17N:
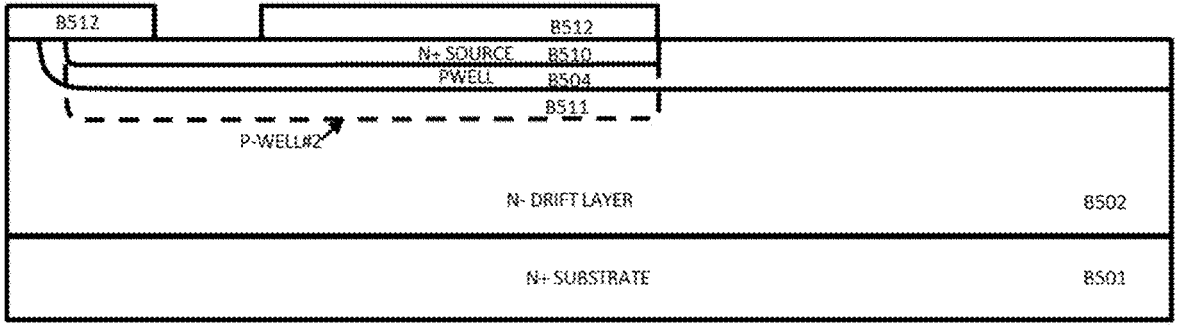
Figure 17O:
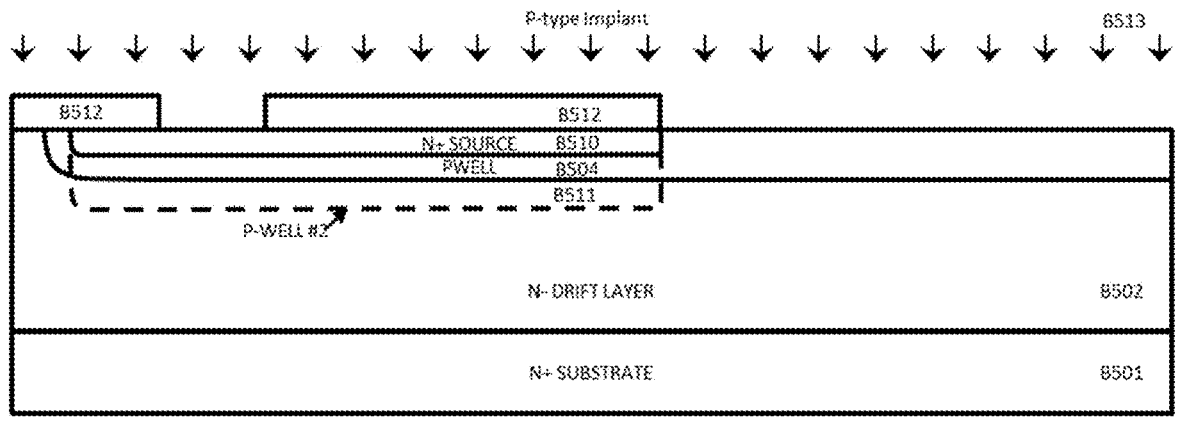
Figure 17P:
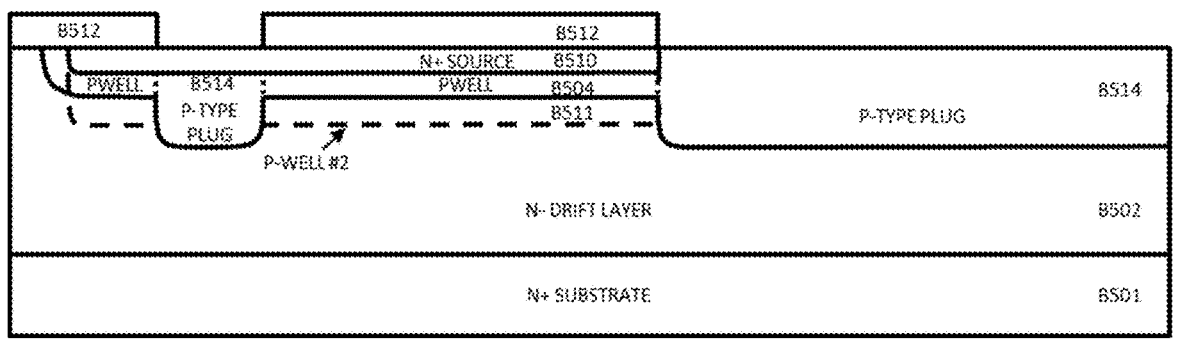
Figure 17Q:
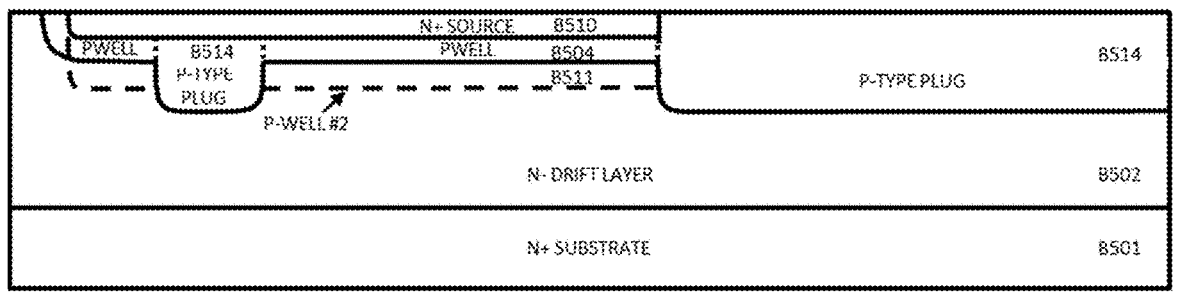

The first and second hard mask layers B503 and B506 respectively, are removed in FIG. 17l. Another mask layer B512 is deposited by a CVD deposited layer of silicon dioxide, silicon nitride, silicon oxynitride, or a metallic layer such as nickel, with thickness ranging from 50 nm to 5 μm on the top in FIG. 17m. The mask layer B512 is patterned in FIG. 17n. By implantation with a controlled dose of a p-type impurity B513 such as aluminum or boron in FIG. 17o a P+ plug region B514 buried under the N+ source region B510 is realized in FIG. 17p. The P+ plug region B514 is electrically connected to the p-well region B504 and the P-well #2 region B511. The P+ plug region may be formed deeper than the p-well and P-Well #2 regions. The mask layer B512 is then removed in FIG. 17q and the implants are activated by high-temperature annealing.

Figure 17R:
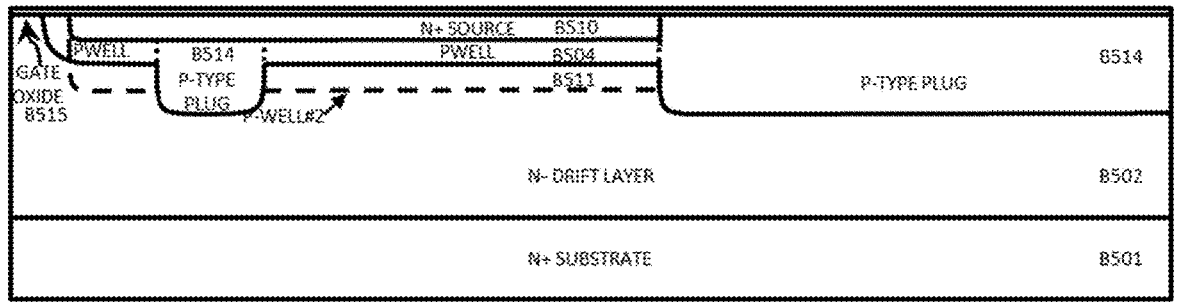
Figure 17S:
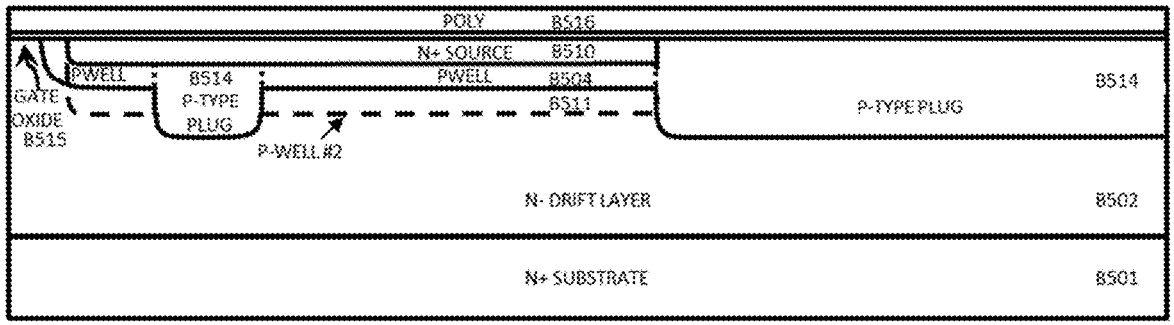
Figure 17T:
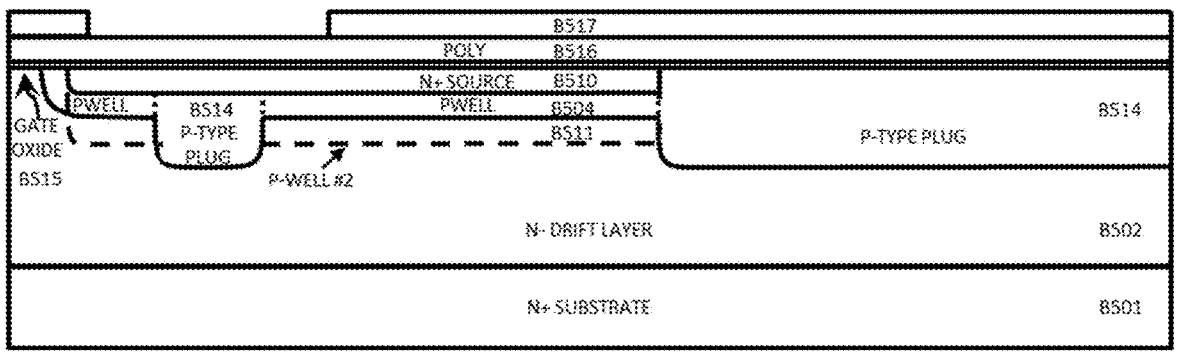
Figure 17U:
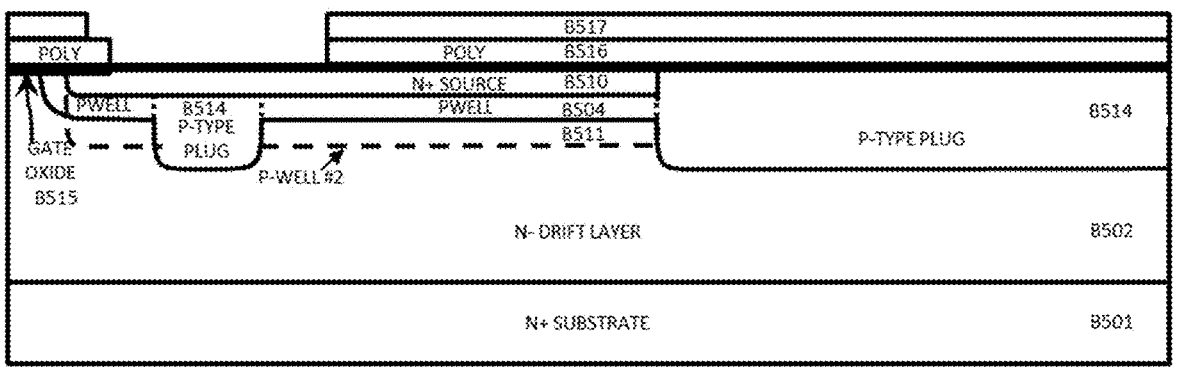
Figure 17V:
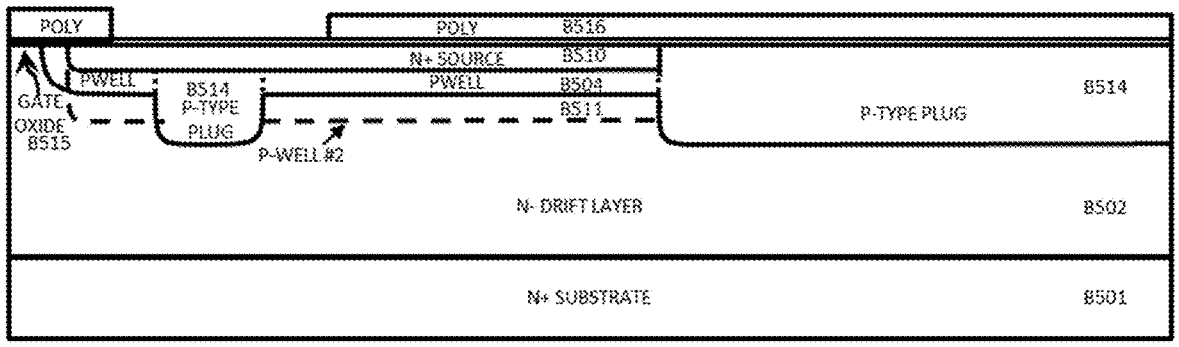
Figure 17W:
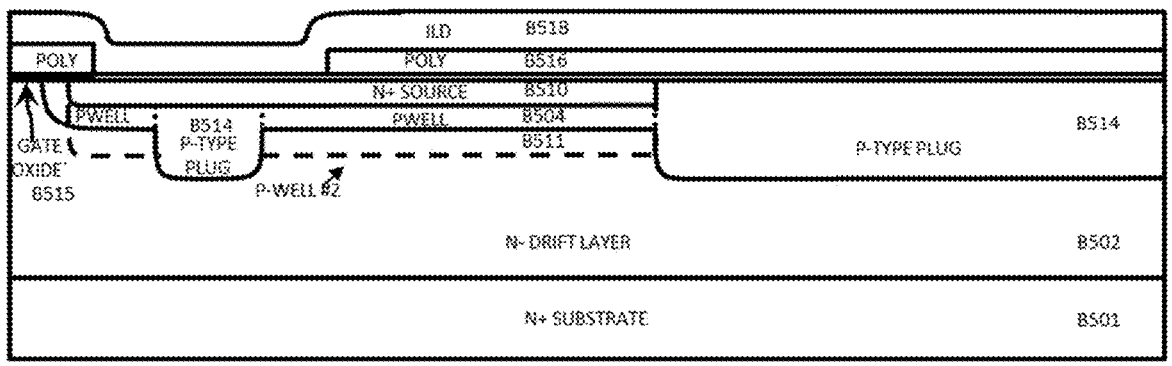
Figure 17X:
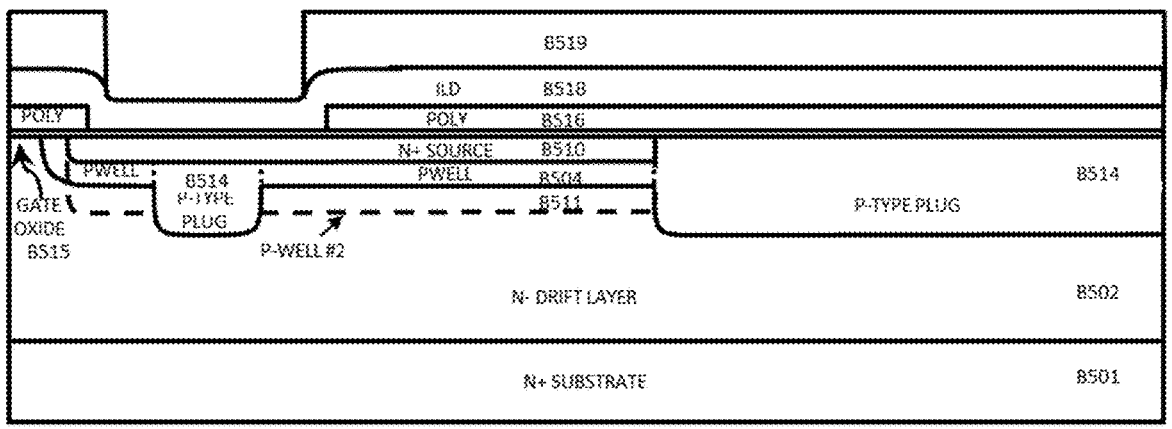
Figure 17Y:
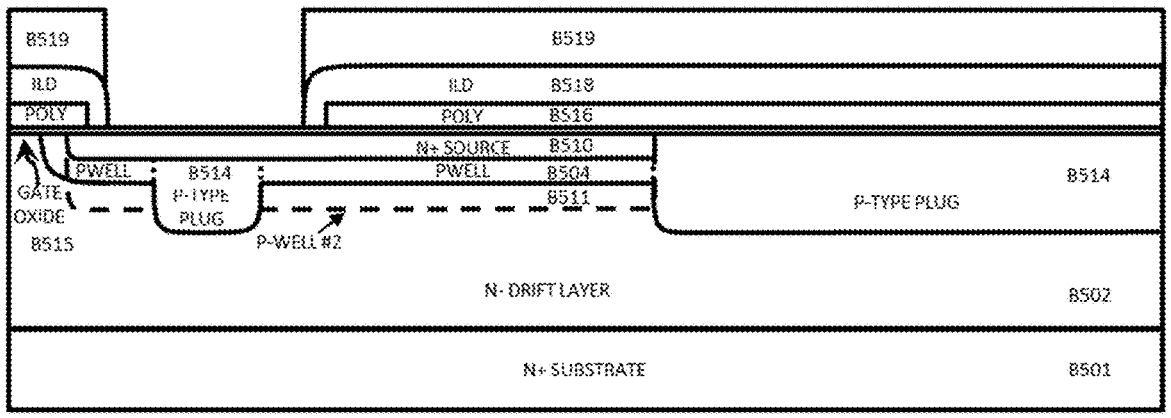
Figure 17Z:
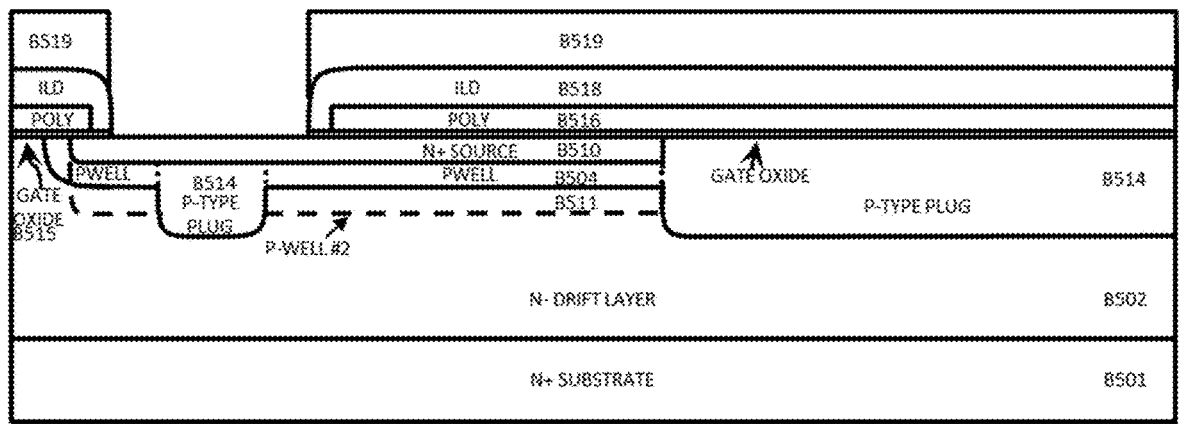
Figure 17A:
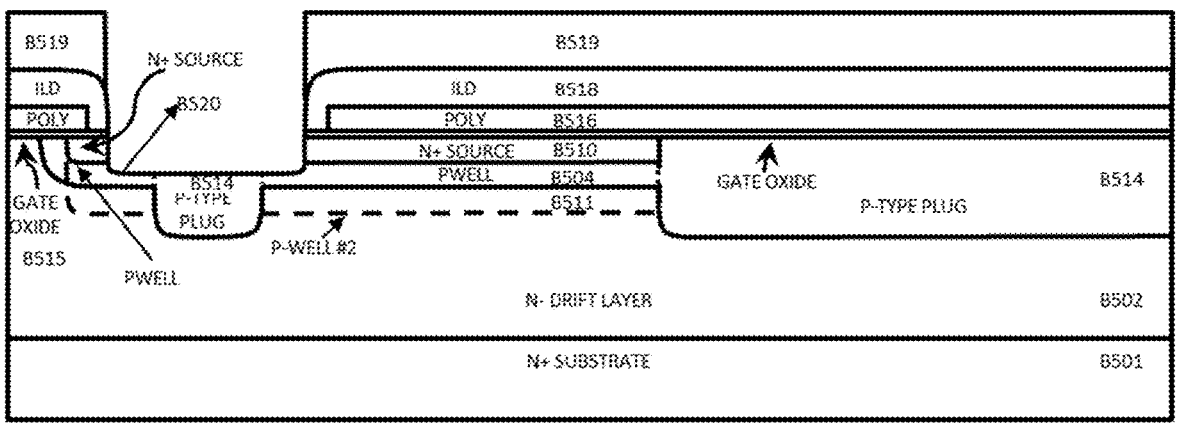
Figure 17B:
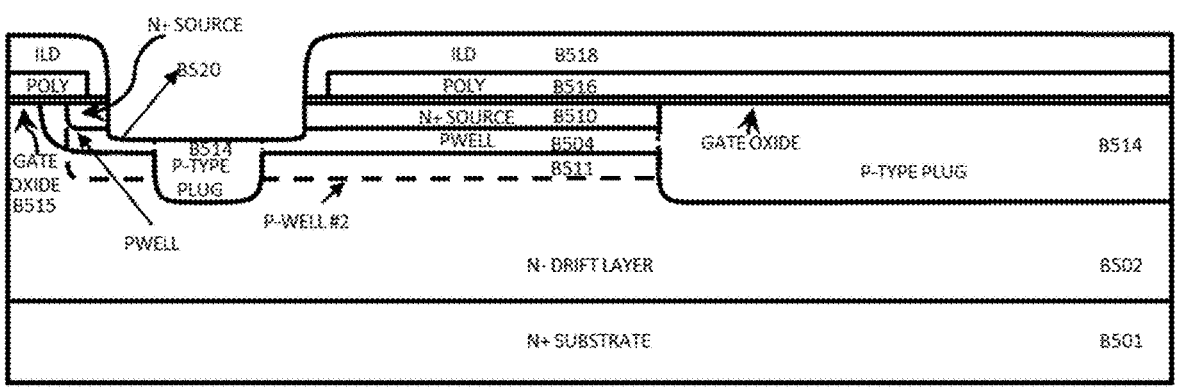
Figure 17C:
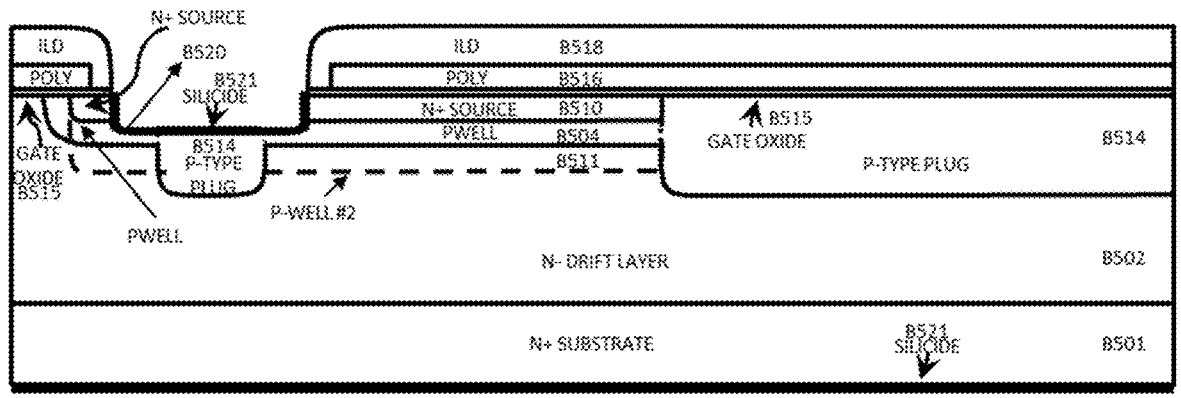
Figure 17D:
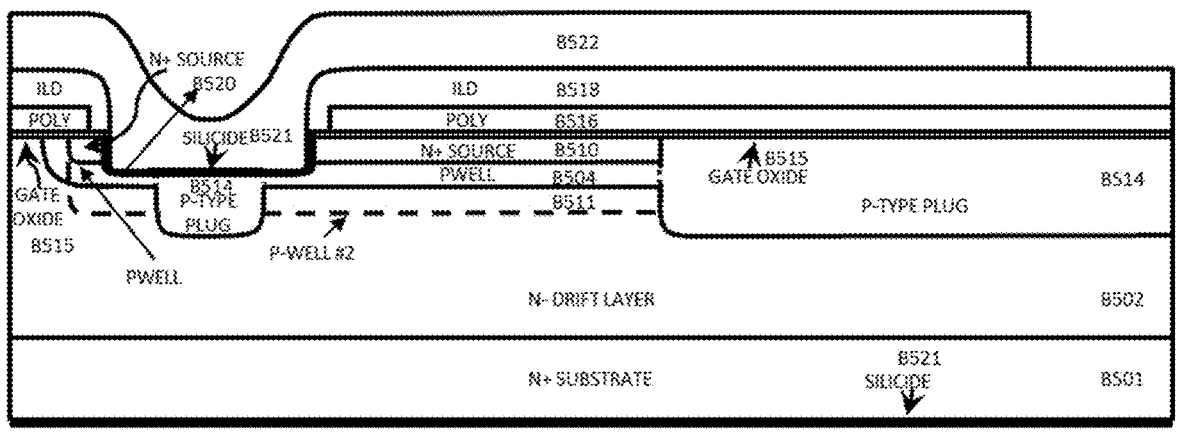
Figure 17E:
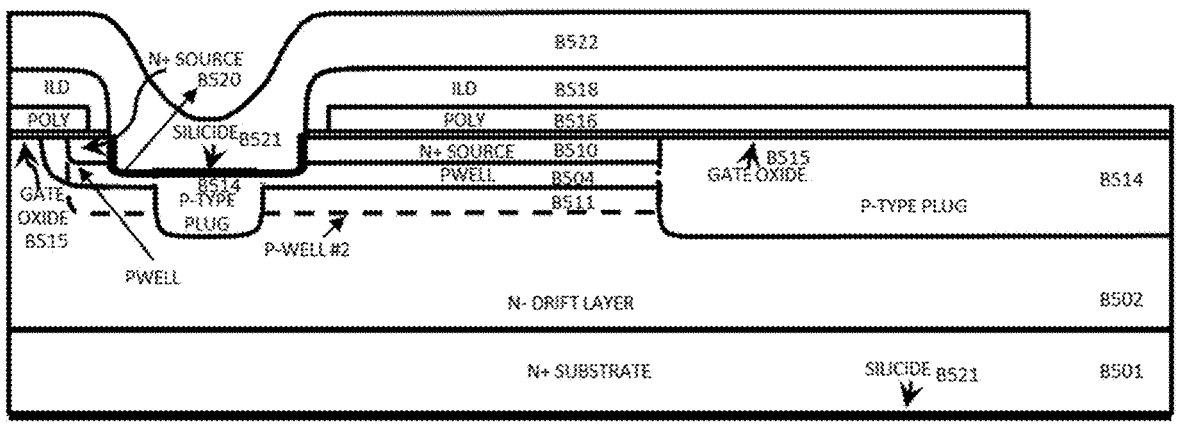
Figure 17F:
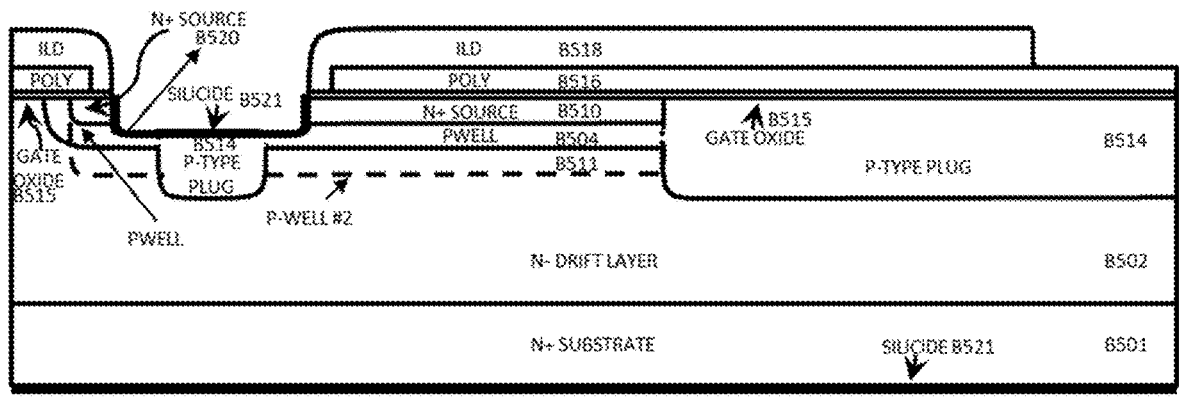
Figure 17G:
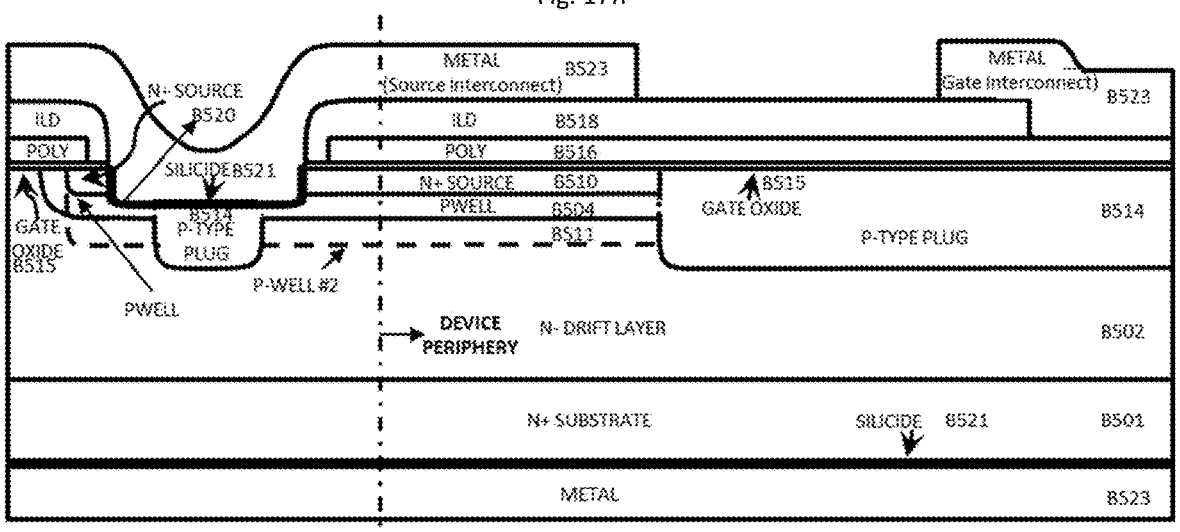

The oxide layer B515 which is the gate oxide is formed by thermal oxidation or using CVD of a dielectric layer such as silicon dioxide, silicon nitride, silicon oxynitride, etc. in FIG. 17r. The thickness of the gate oxide could range from 10 nm to 100 nm. Either dry or wet thermal oxidation could be used for oxide growth. PECVD or LPCVD could be used for gate oxide deposition. A polysilicon gate layer B516 is then deposited in FIG. 17s. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. A hard mask B517 is deposited by a CVD deposited layer of silicon dioxide, silicon nitride, silicon oxynitride, or a metallic layer such as nickel, with thickness ranging from 50 nm to 5 μm on the top and patterned as shown in FIG. 17t. The polysilicon layer B516 is etched by using the patterned mask layer B517 in FIG. 17u. The mask layer B517 is then removed in FIG. 17v. An ILD layer B518 comprising 50 nm-1000 nm thick silicon dioxide, silicon nitride, silicon oxynitride layers or a stacked combination thereof is deposited on the wafer in FIG. 17w. A hard mask B519 is deposited by a CVD deposited layer of silicon dioxide, silicon nitride, silicon oxynitride, or a metallic layer such as nickel, with thickness ranging from 50 nm to 5 µm on the top and patterned on top to define the ILD opening in FIG. 17x. The ILD layer B518 is etched using the hard mask as shown in FIG. 17y. Further the gate oxide B515 is etched using the same mask B519 in FIG. 17z. The hard mask that is used for patterning the ILD layer B519 is used to realize the source trench region B520 by etching completely through the N+ source layer and into the P+ plug layer in FIG. 17aa. The mask B519 is then removed in FIG. 17bb. A nickel silicide region B521 is formed on the exposed SiC surface in FIG. 17cc. A mask layer B522 is formed by a CVD deposited layer of silicon dioxide, silicon nitride, silicon oxynitride, or a metallic layer such as nickel, with thickness ranging from 50 nm to 5 µm on the top which is then patterned in FIG. 17dd. The ILD layer B518 is etched in FIG. 17ee. The mask layer B522 is removed in FIG. 17ff. Interconnect metal layers B523 of either aluminum or silver or gold is deposited and patterned on the top and bottom of the substrate in. FIG. 17gg. The ohmic contact to the N+ source regions is made through the etched sidewalls of the source trench regions in this embodiment, as opposed to the horizontal surfaces of the N+ source regions in conventional MOSFETs.

Figure 18:
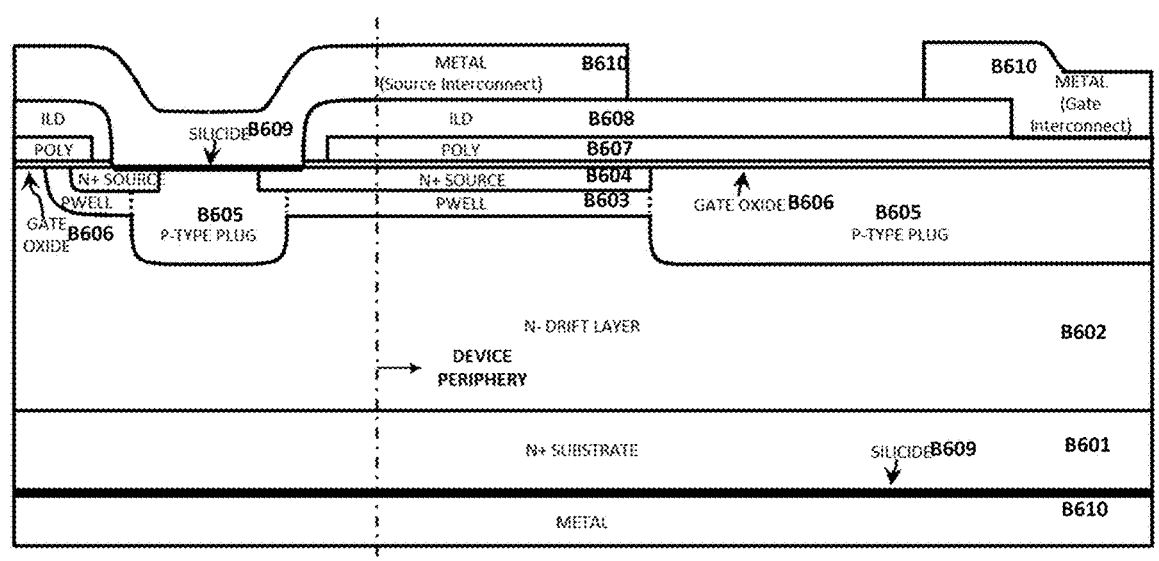
FIG. 18 shows an embodiment of a SiC DMOSFET with a dedicated process step for masking the implantation of the N+ source region in the device periphery as well as the N+ source region in the active region to enable ohmic contact to the p-well region FIG. 19a to FIG. 19ff are cross sectional views showing the process steps for manufacturing the SiC DMOSFET structure in FIG. 18.

An embodiment shown in FIG. 18 is the unit cell and the device periphery of a cross-sectional structure of a SiC DMOSFET. The key regions of this device are a p-well region B603, which is formed by ion-implantation or epitaxial re-growth of a p-type species such as aluminum or boron. There is an N+ source region B604, N− drift layer B602, and an N+ substrate B601. In the ON state when a gate voltage is applied to the polysilicon gate B607 the current flows vertically from the drain B601, through the inversion layer which is formed at the top of the p-well layer B603, through the N+ source region B604, and out through the source metallization B610. In the OFF state or the blocking state, a voltage is supported across the p-well B603, N− drift layer B602 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide B606. Another feature is an ILD layer B608 which is used to insulate the source interconnect metallization B610 from the polysilicon gate B607. A nickel silicide region B609 is formed on the exposed SiC surface. At the very center of the unit cell, there is a P+ plug layer B605 which is grounded with the N+ source metallization. The purpose of the P+ plug in SiC DMOSFET is to ground the p-well region with the N+ source contact.

In an embodiment herein, a dedicated masking step is interspersed between the formation of the sidewall spacer after the p-well implant and before the N+ source implant to mask the N+ source implant from the peripheral regions of the MOSFET. This also masks the N+ source implant from selected regions in the active area of the device, which enables ohmic contact to the p-well or P+ plug region. This embodiment obviates the need for a source trench that is present in earlier embodiments.

In the embodiment herein, a dedicated hard mask or photoresist layer is applied after the sidewall spacer is formed and before the N+ source implantation which prevents the formation of the N+ source region in the device periphery and parasitic NPN structures in the device periphery are avoided. The implantation of the N+ source region is avoided in selected areas in the active region and this enables ohmic contact to the p-well or P+ plug regions without an intervening N+ source region.

Figure 19A:
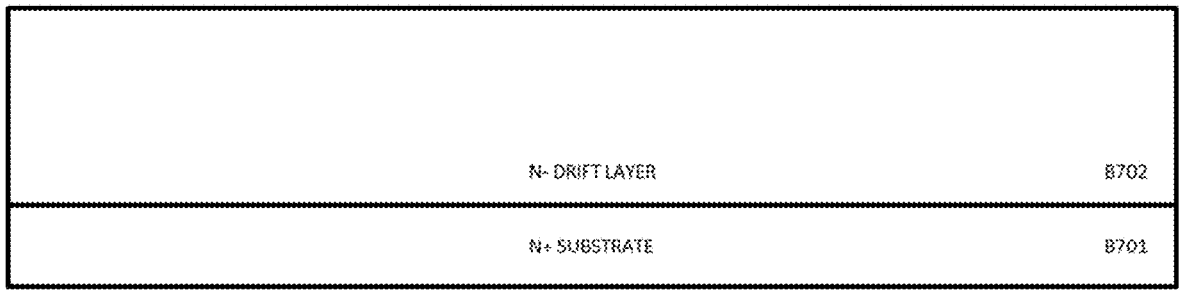
Figure 19B:
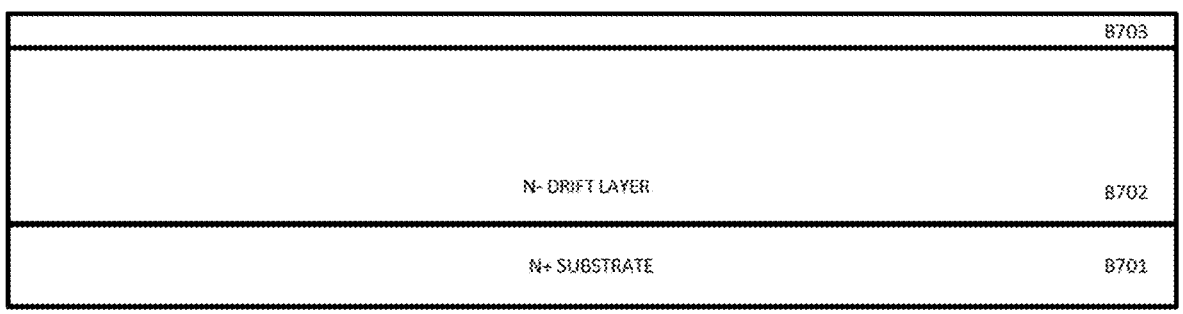
Figure 19C:
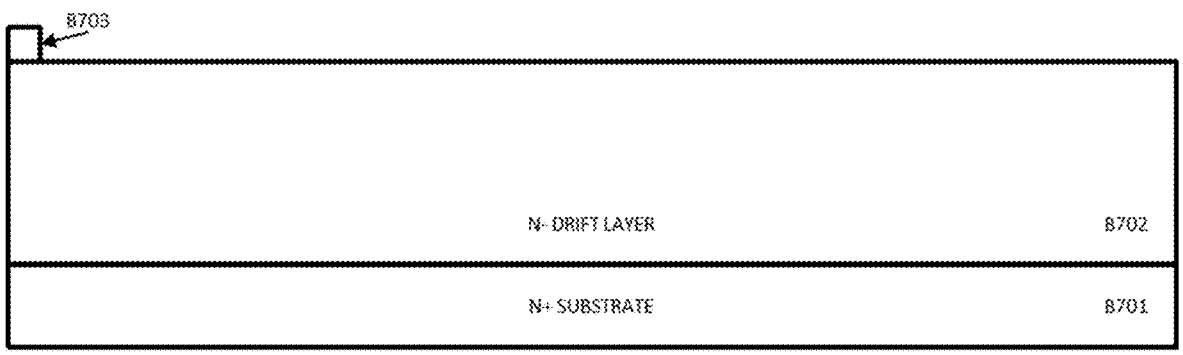
Figure 19D:
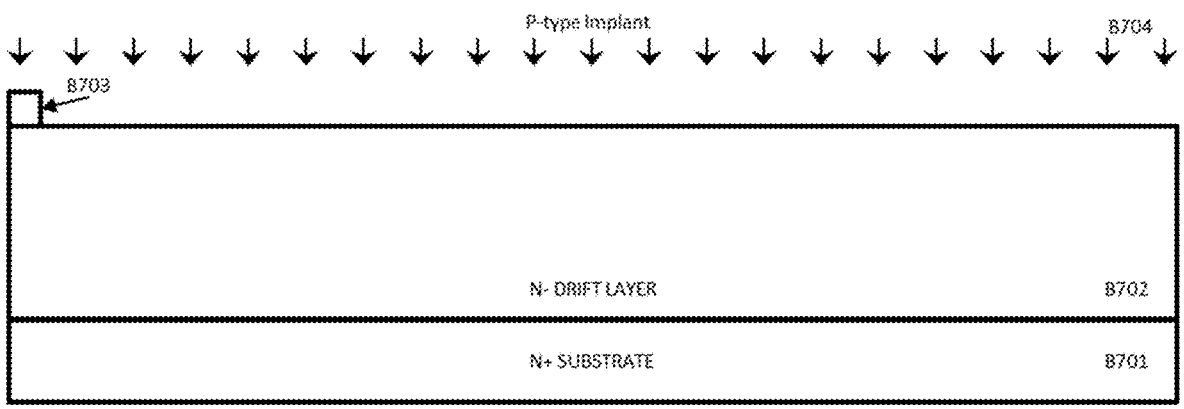
Figure 19E:
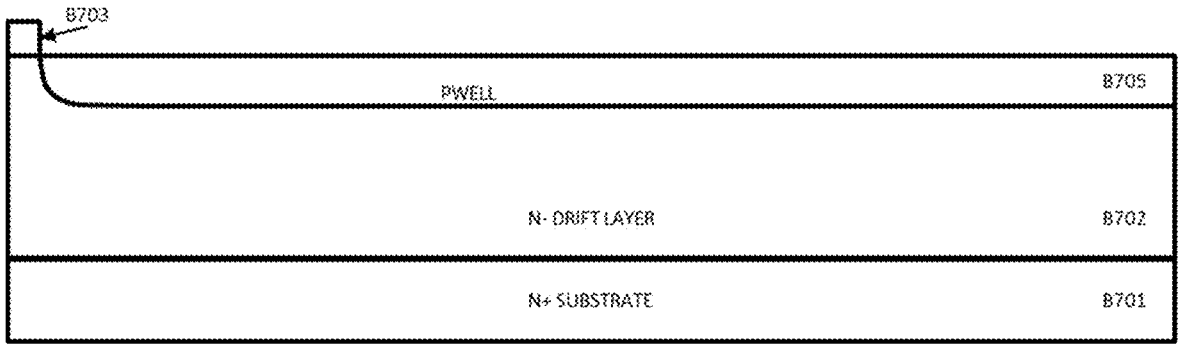

FIG. 19a to FIG. 19ff describes the process of manufacturing the structure shown in FIG. 18. The manufacturing process for a SiC DMOSFET is on a SiC substrate B701 and starts with using a 4H-SiC Si-face epi-wafer with suitable doping ($10^{14}$-$10^{18}$ cm$^{-3}$) and thickness (1 µm to 300 µm) for the epilayer B702 shown in FIG. 19a. A blanket hard mask B703 comprising a CVD deposited layer of silicon dioxide, silicon nitride, silicon oxynitride, or a metallic layer such as nickel, with thickness ranging from 50 nm to 5 µm is deposited in FIG. 19b and then patterned using photolithography followed by a dry etch using RIE for example as shown in FIG. 19c. Then p-well region is first formed by ion-implantation or epitaxial growth using aluminum or boron as the p-type impurity. A p-type implantation B704 comprising boron or aluminum, at energies ranging from 10 keV to 800 keV, at implant doses ranging from $10^{12}$ cm$^{-2}$ to $10^{15}$ cm$^{-2}$ in FIG. 19d is performed to create a p-well B705 in FIG. 19e.

Figure 19F:
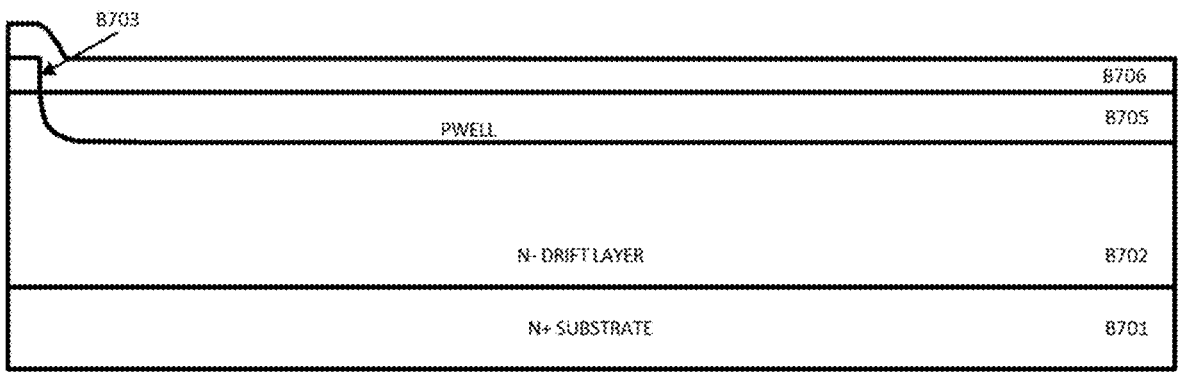
Figure 19G:
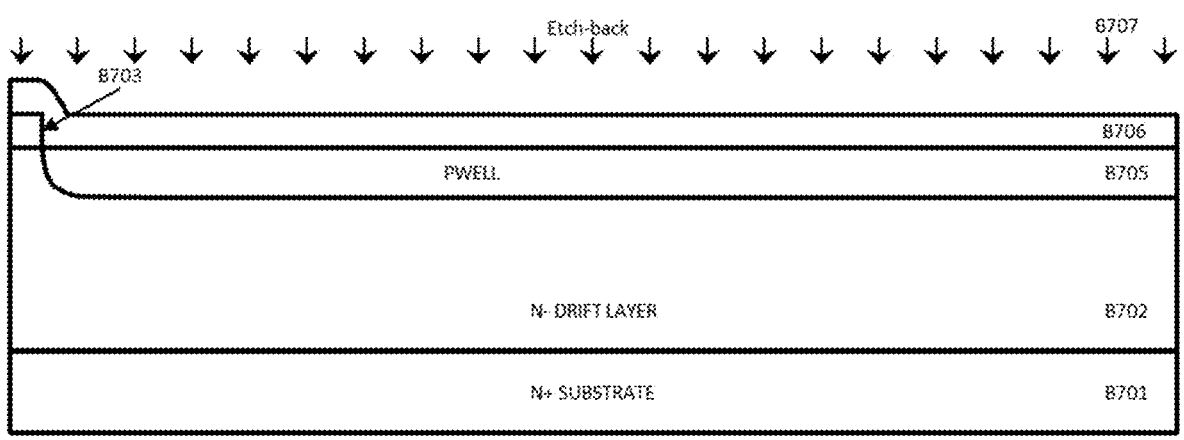
Figure 19H:
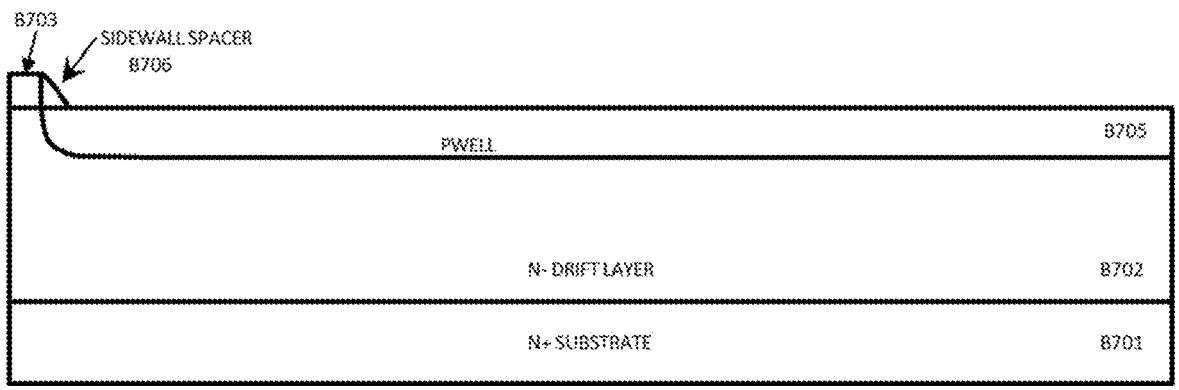
Figure 19I:
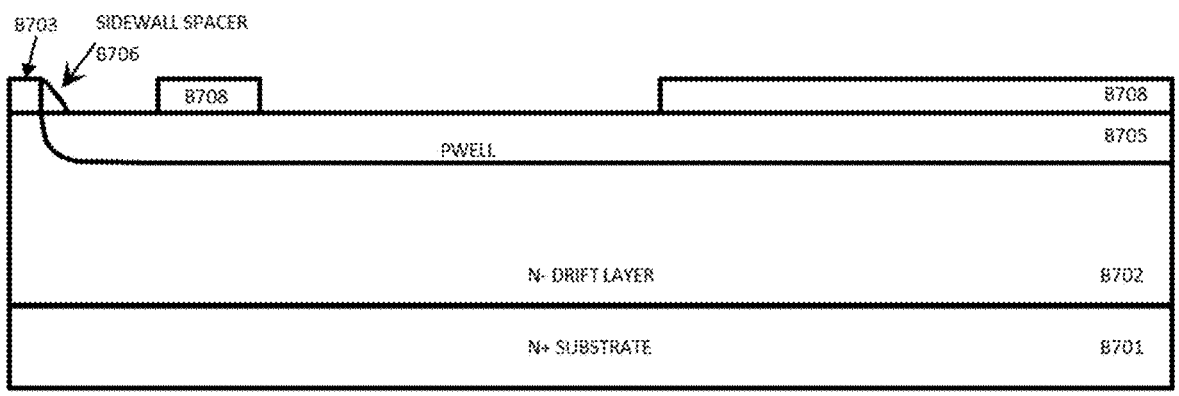
Figure 19J:
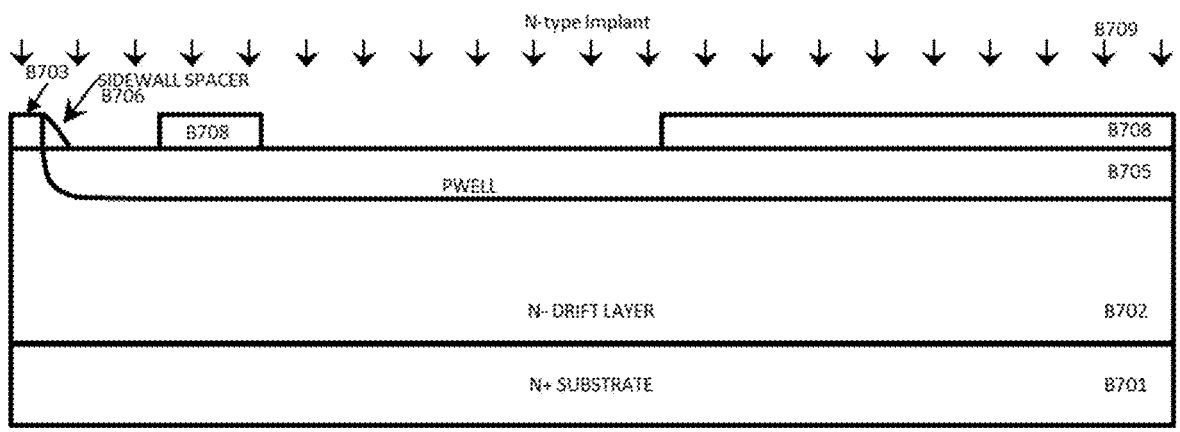
Figure 19K:
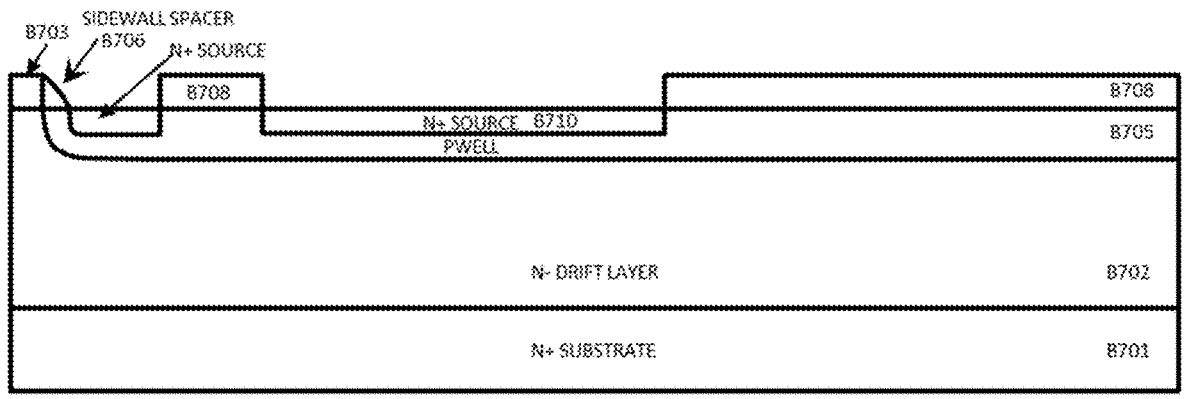
Figure 19L:
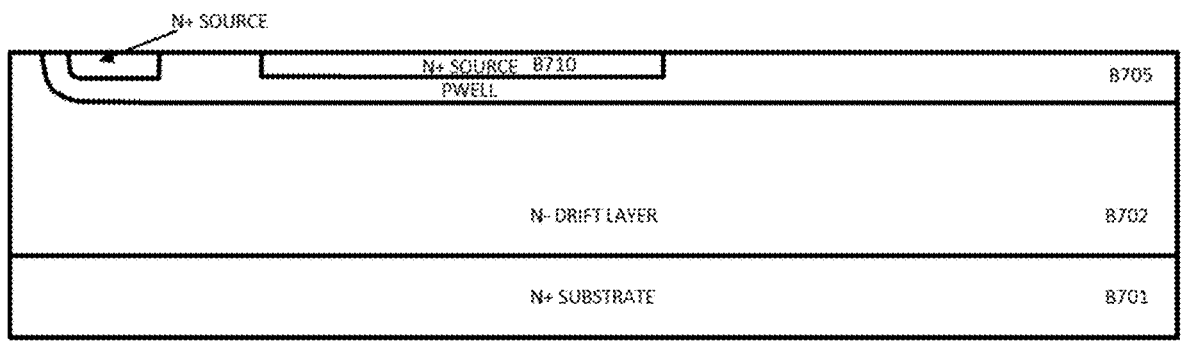
Figure 19M:
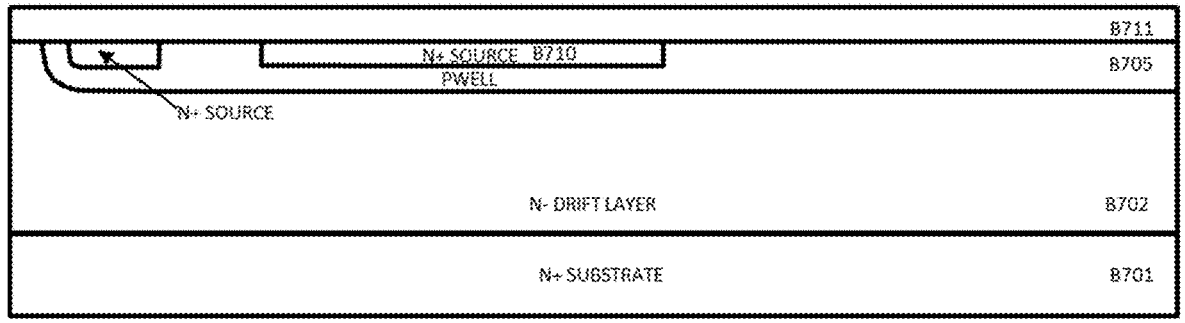
Figure 19N:
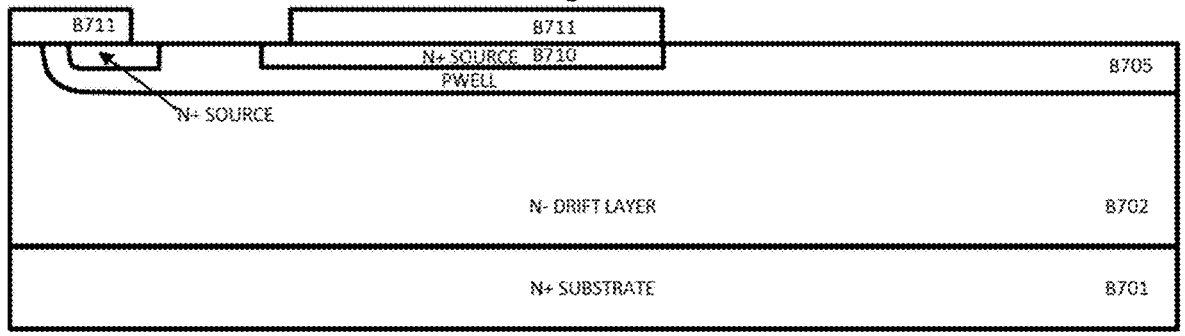

A second hard mask layer B706 is deposited by a CVD deposited layer of silicon dioxide, silicon nitride, silicon oxynitride, or a metallic layer such as nickel, with thickness ranging from 50 nm to 5 µm in FIG. 19f on top of the patterned first hard mask layer B703. This is followed by an anisotropic etching B707 in FIG. 19g to form a sidewall spacer B706 as shown in FIG. 19h. A hard mask layer B708 is deposited by a CVD deposited layer of silicon dioxide, silicon nitride, silicon oxynitride, or a metallic layer such as nickel, with thickness ranging from 50 nm to 5 µm and patterned in FIG. 19i. The patterned mask layer is formed on the top alongside the patterned mask layer with the sidewall spacer B706. A n-type implant B709 is done in FIG. 19j for creating a N+ source region B710 in FIG. 19k. A N+ source region is formed by ion-implantation or by epitaxial re-growth by a n-type impurity such as nitrogen or phosphorus. Thus, the source region B710 is formed in a self-aligned fashion with the p-well region B705 while it is masked from the peripheral regions of the device, as well as selected areas of the active region of the device, to enable contact with the source ohmic metallization. The first and second hard mask layers B703 and B708 respectively, are removed in FIG. 19l. Another mask layer B711 is deposited by a CVD deposited layer of silicon dioxide, silicon nitride, silicon oxynitride, or a metallic layer such as nickel, with thickness ranging from 50 nm to 5 µm on the top in FIG. 19m. The mask layer B711 is patterned in FIG. 19n.

Figure 19O:
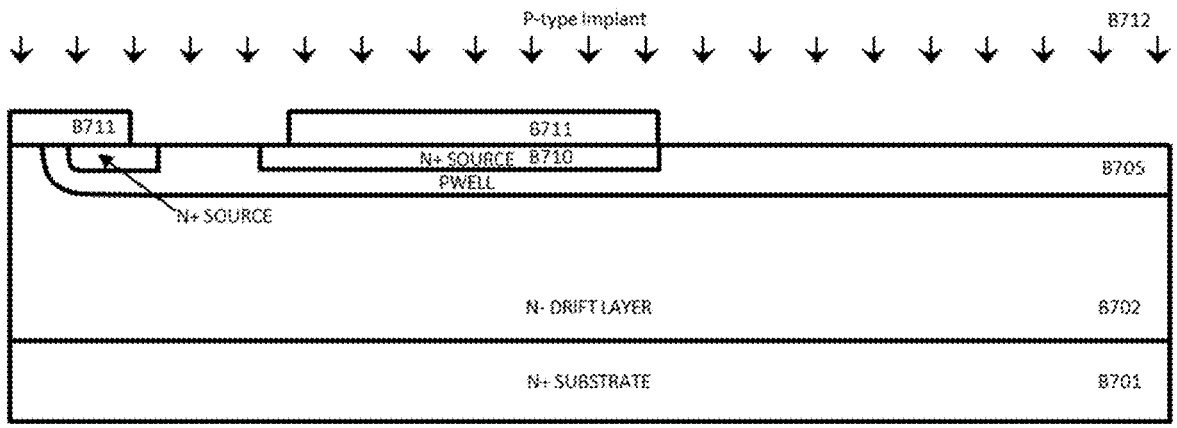
Figure 19P:
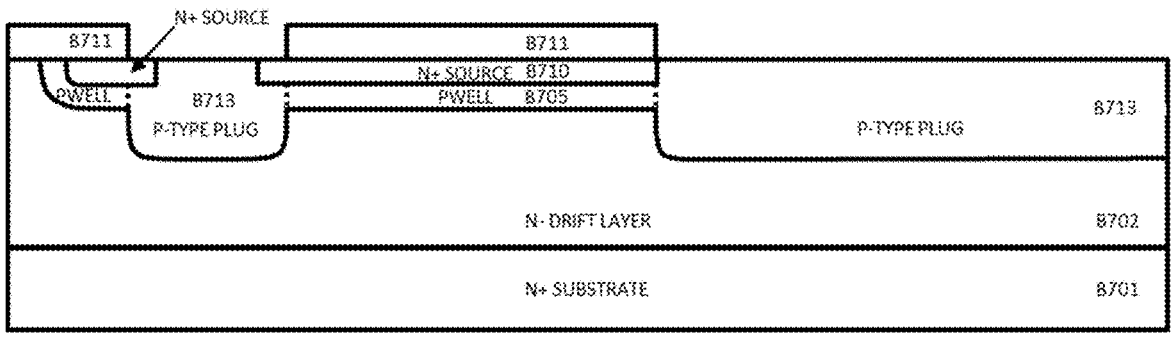
Figure 19Q:
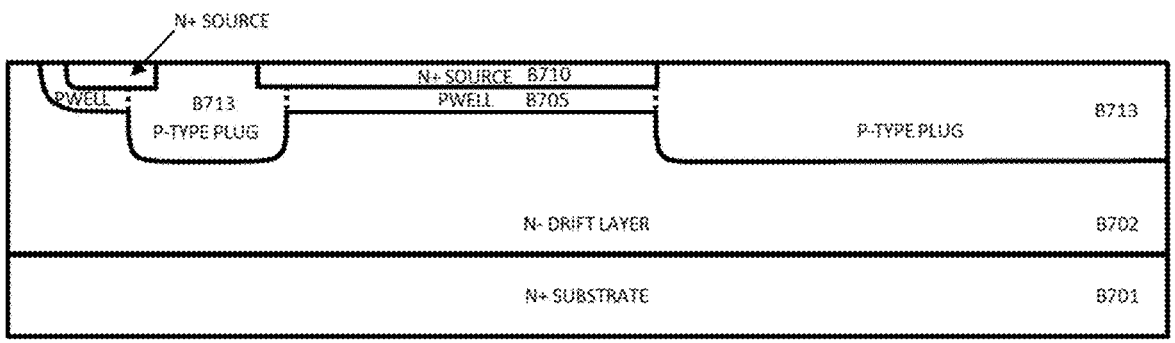

Using the hard mask B711, by implantation of a controlled dose of a p-type impurity B712 such as aluminum or boron in FIG. 19o a P+ plug region is realized in FIG. 19p. The depth of the P+ plug layer B713 may preferably exceed the depth of the N+ source implant and may even exceed the depth of the p-well region, in a particular implementation. The mask layer B711 is removed in FIG. 19q. The wafer is annealed for activating the implanted impurities.

Figure 19R:
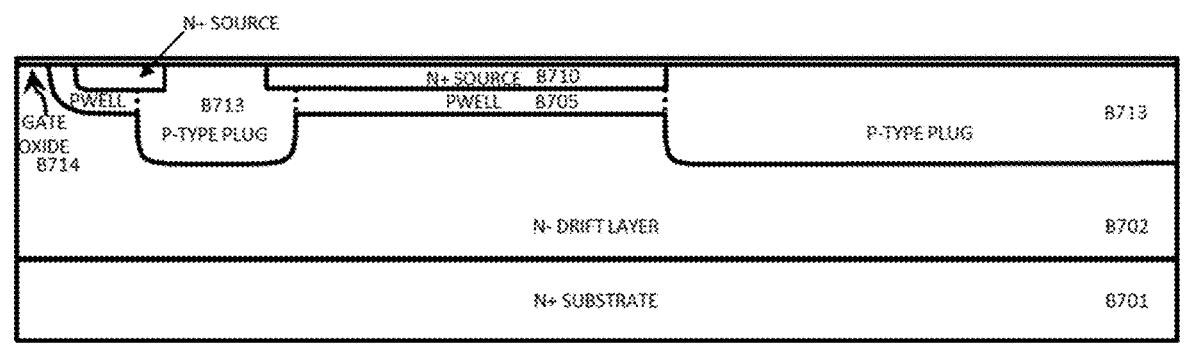
Figure 19S:
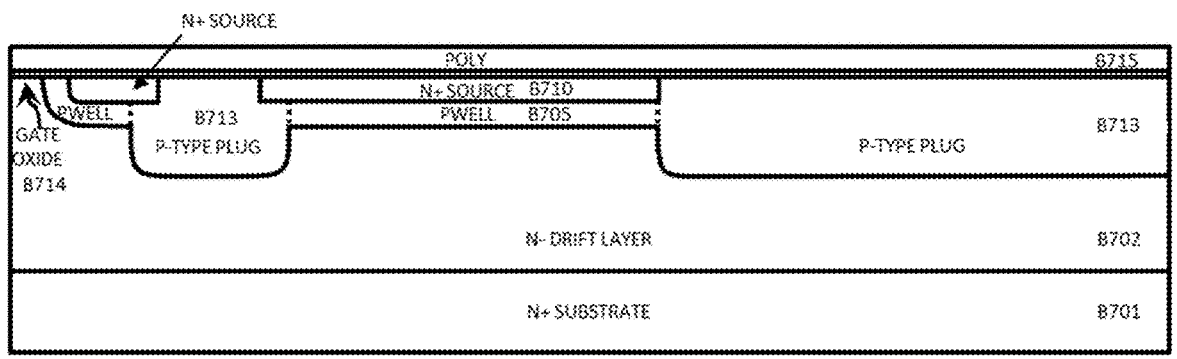
Figure 19T:
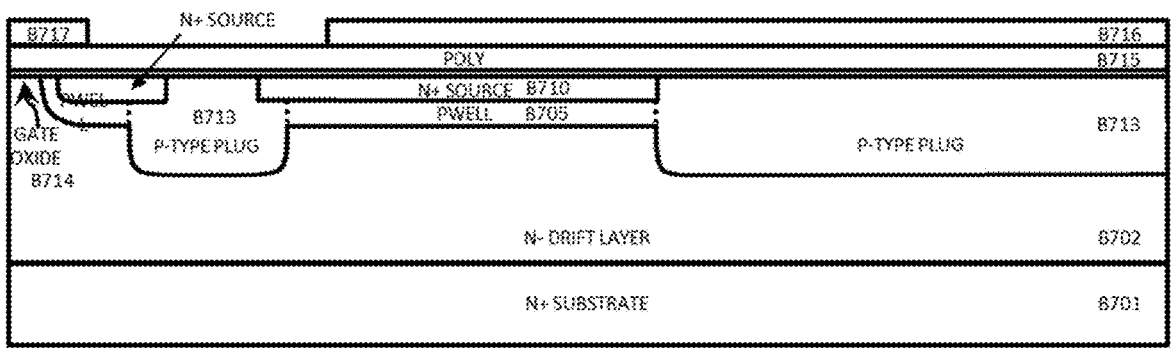
Figure 19U:
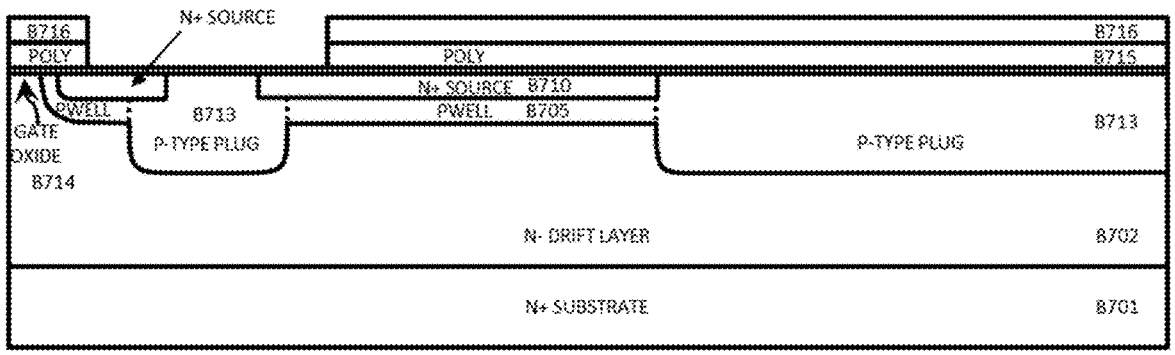
Figure 19V:
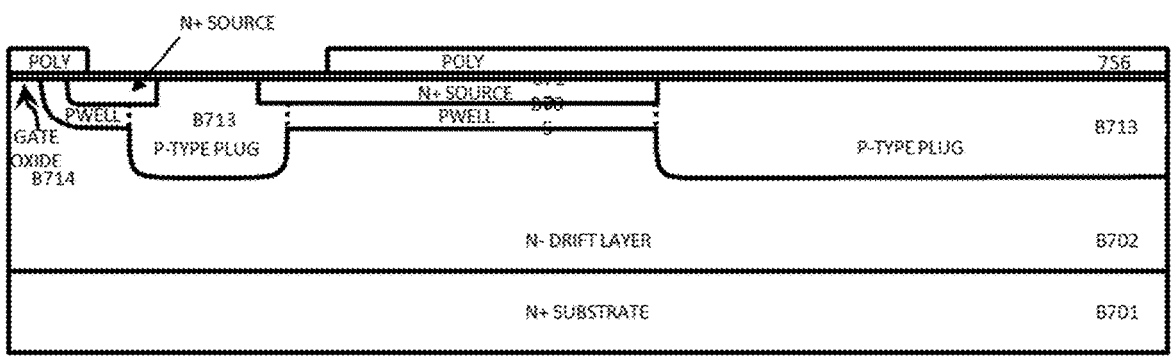
Figure 19W:
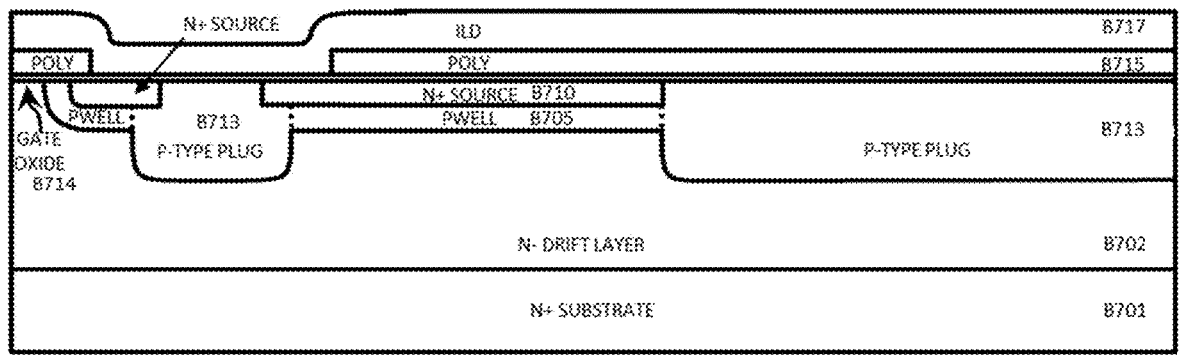

The oxide layer B714 which is the gate oxide is formed by thermal oxidation or using CVD of a dielectric layer such as silicon dioxide, silicon nitride, silicon oxynitride, etc. in FIG. 19r. The thickness of the gate oxide could range from 10 nm to 100 nm. Either dry or wet thermal oxidation could be used for oxide growth. PECVD or LPCVD could be used for gate oxide deposition. A polysilicon gate layer B715 is then deposited in FIG. 19s. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of $POCl_3$ followed by a drive-in step at temperatures ranging from 700-900° C. A hard mask B716 is deposited by a CVD deposited layer of silicon dioxide, silicon nitride, silicon oxynitride, or a metallic layer such as nickel, with thickness ranging from 50 nm to 5 µm on the top and patterned as shown in FIG. 19t. The polysilicon layer B715 is etched by using the patterned mask layer B716 in FIG. 19u. The mask layer B716 is then removed in FIG. 19v. An ILD layer B717 comprising 50 nm-1000 nm thick silicon dioxide, silicon nitride, silicon oxynitride layers or a stacked combination thereof is deposited on the wafer in FIG. 19w.

Figure 19X:
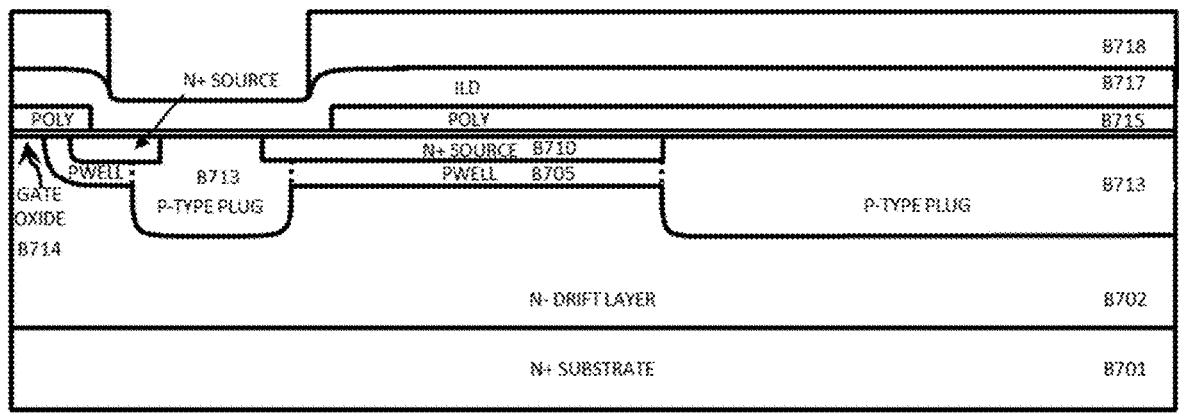
Figure 19Y:
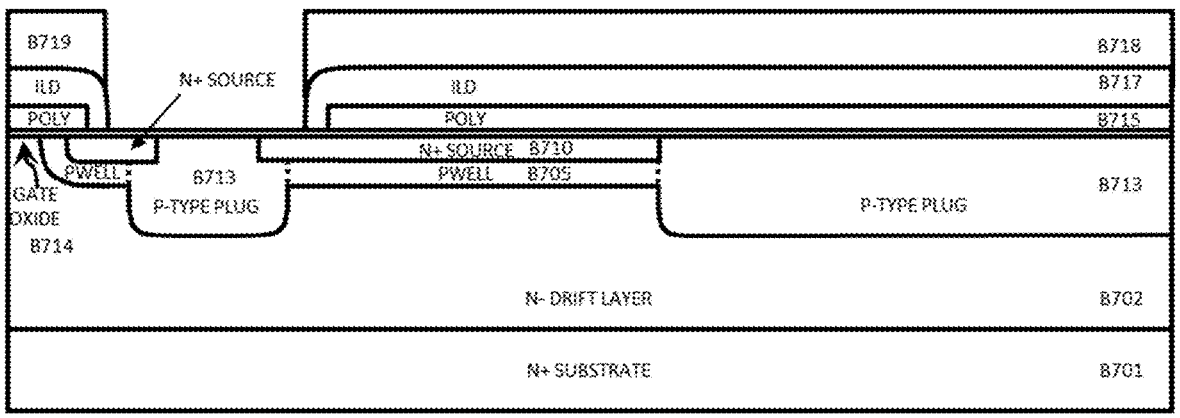
Figure 19Z:
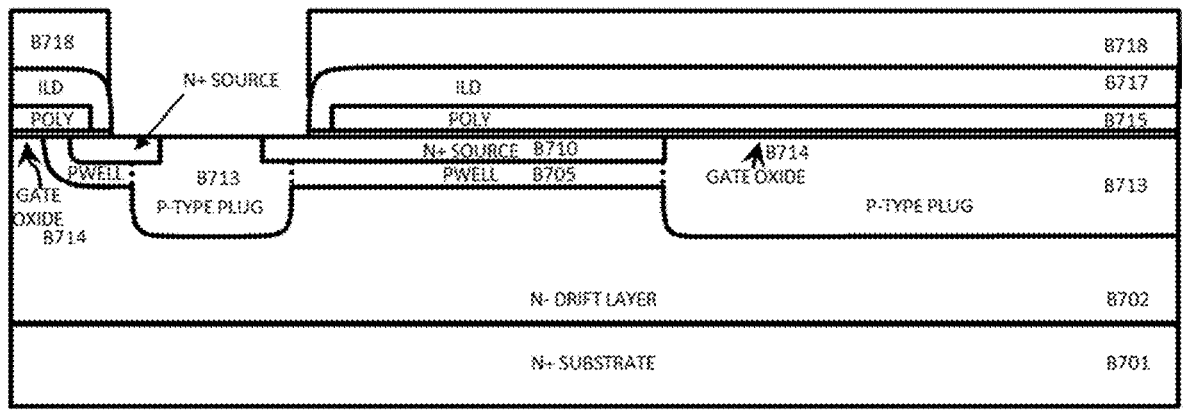
Figure 19A:
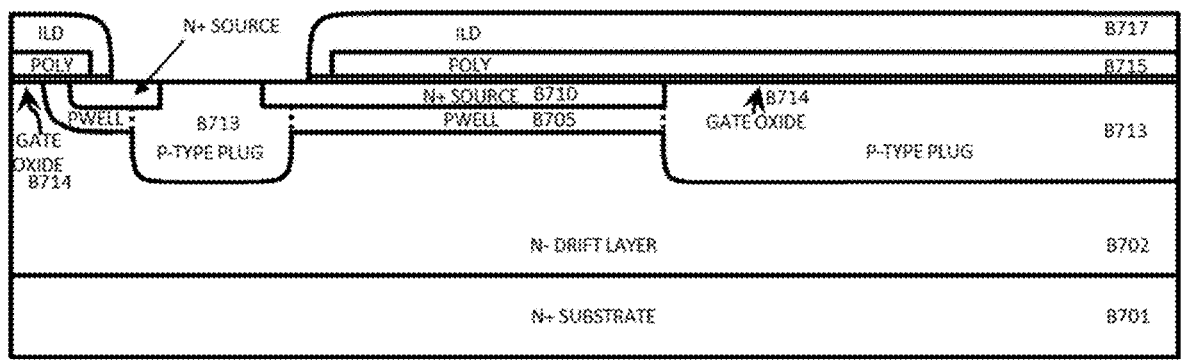
Figure 19B:
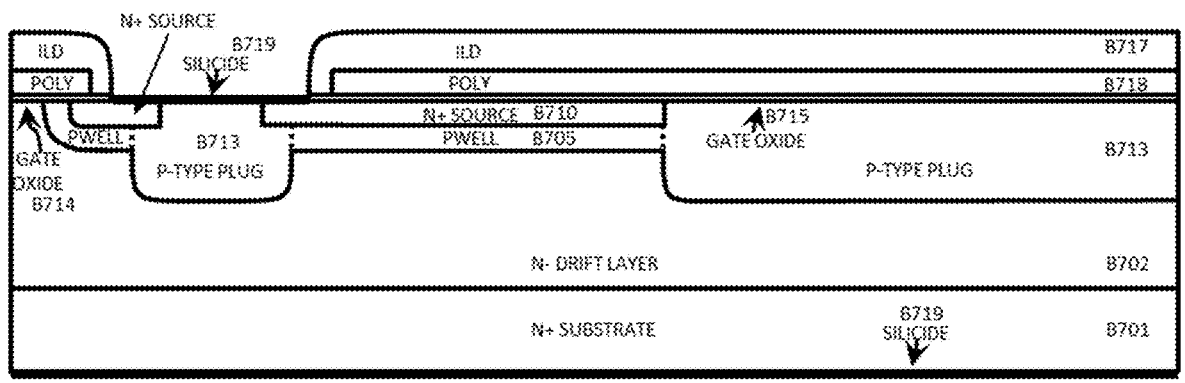
Figure 19C:
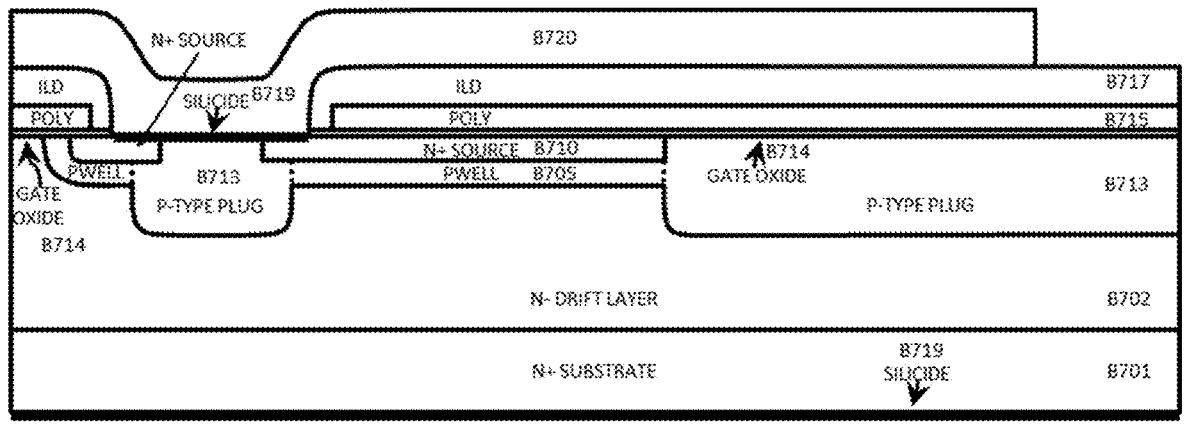
Figure 19D:
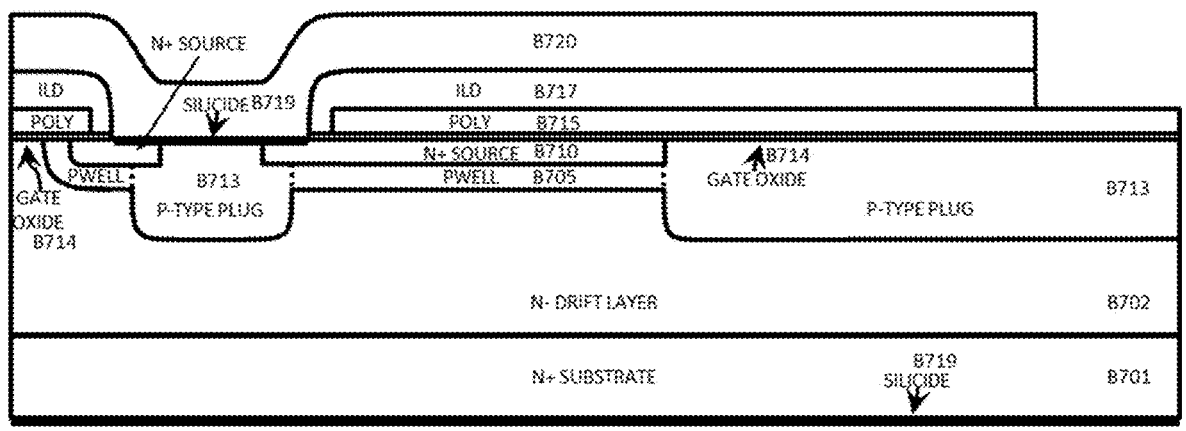
Figure 19E:
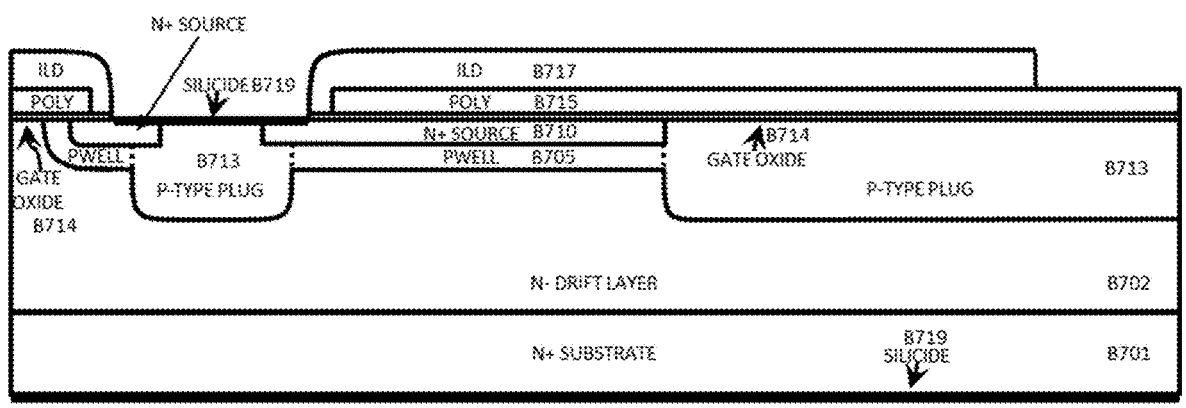
Figure 19F:
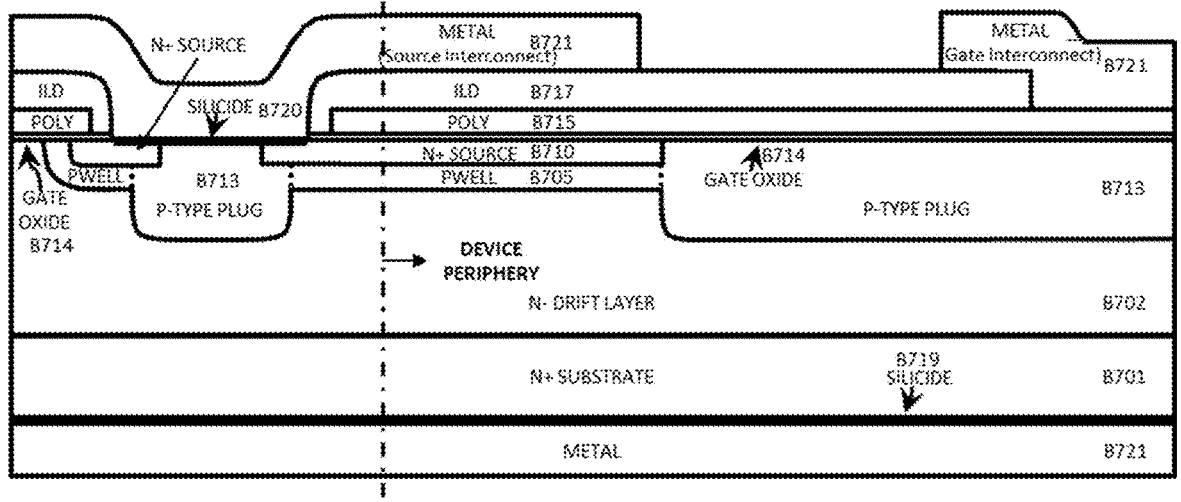

A hard mask B718 is deposited by a CVD deposited layer of silicon dioxide, silicon nitride, silicon oxynitride, or a metallic layer such as nickel, with thickness ranging from 50 nm to 5 µm on the top and patterned on top to define the ILD opening in FIG. 19x. The ILD layer B717 is etched using the hard mask as shown in FIG. 19y. Further the gate oxide B714 is etched using the same mask B718 in FIG. 19z. The mask B718 is then removed in FIG. 19aa. A nickel silicide region B719 is formed on the exposed SiC surface in FIG. 19bb. A mask layer B720 is formed by a CVD deposited layer of silicon dioxide, silicon nitride, silicon oxynitride, or a metallic layer such as nickel, with thickness ranging from 50 nm to 5 µm on the top which is then patterned in FIG. 19cc. The ILD layer B717 is etched in FIG. 19dd. The mask layer B720 is removed in FIG. 19ee. Interconnect metal layers B721 of either aluminum or silver or gold is deposited and patterned on the top and bottom of the substrate in FIG. 19ff.

Figure 20:
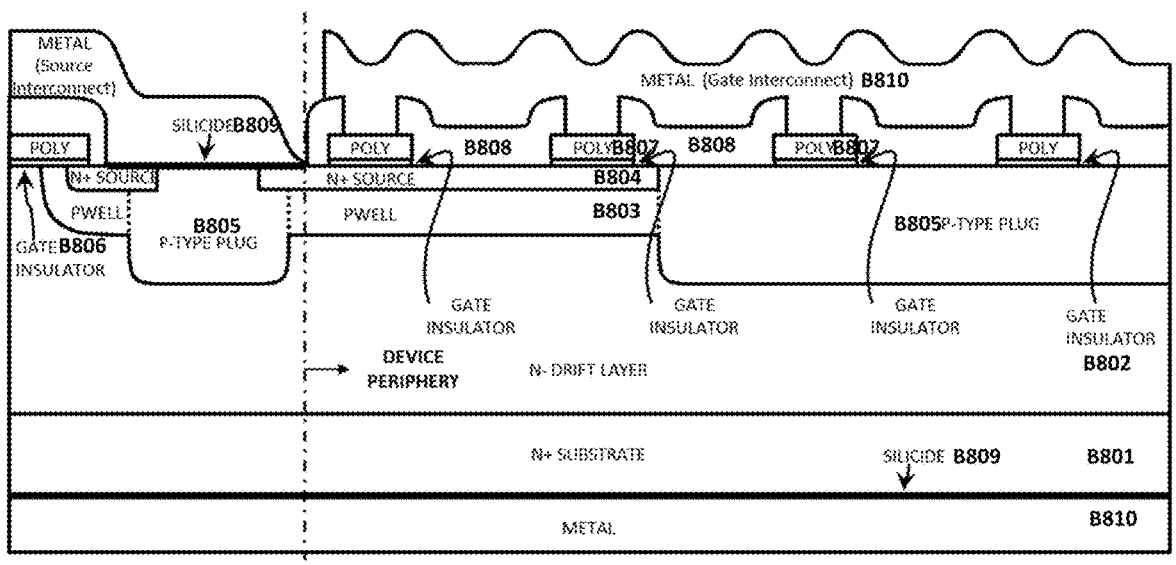
FIG. 20 shows an embodiment of a SiC DMOSFET where the polysilicon gate metallization layers are segmented in the peripheral region.

An embodiment shown in FIG. 20 is the unit cell and the device periphery of a cross-sectional structure of a SiC DMOSFET. The key regions of this device are a p-well region B803, which is formed by ion-implantation or epitaxial re-growth of a p-type species such as aluminum or boron. There is an N+ source region B804, N− drift layer B802, and an N+ substrate B801. In the ON state when a gate voltage is applied to the polysilicon gate B807 the current flows vertically from the drain B801, through the inversion layer which is formed at the top of the p-well layer B803, through the N+ source region B804, and out through the source metallization B810. In the OFF state or the blocking state, a voltage is supported across the p-well B803, N− drift layer B802 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the JFET region or the JFET gap and the thickness of the gate oxide B806. Another feature is an ILD layer B808 which is used to insulate the source interconnect metallization B810 from the polysilicon gate B807. A nickel silicide region B809 is formed on the exposed SiC surface. At the very center of the unit cell, there is a P+ plug layer B805 which is grounded with the N+ source metallization. The purpose of the P+ plug in SiC DMOSFET is to ground the p-well region with the N+ source contact.

In an embodiment herein, a dedicated masking step is interspersed between the formation of the sidewall spacer after the p-well implant and before the N+ source implant to mask the N+ source implant from the peripheral regions of the MOSFET. This also masks the N+ source implant from selected regions in the active area of the device, which enables ohmic contact to the p-well or P+ plug region. This embodiment obviates the need for a source trench that is present in some earlier embodiments.

In the embodiment herein, a dedicated hard mask or photoresist layer is applied after the sidewall spacer is formed and before the N+ source implantation which prevents the formation of the N+ source region in the device periphery and parasitic NPN structures in the device periphery are avoided. The implantation of the N+ source region is avoided in selected areas in the active region and this enables ohmic contact to the p-well or P+ plug regions without an intervening N+ source region.

In the embodiment herein, the polysilicon metallization in the peripheral regions of the device B807 are segmented and not a contiguous layer. In the embodiment herein, the formation of the segmented gate metallization in the periphery of the device instead of a contiguous gate bus could significantly decrease the gate-body capacitance of the MOSFET. This could result in a significant increase of the switching speed of the MOSFET.

Figure 21A:
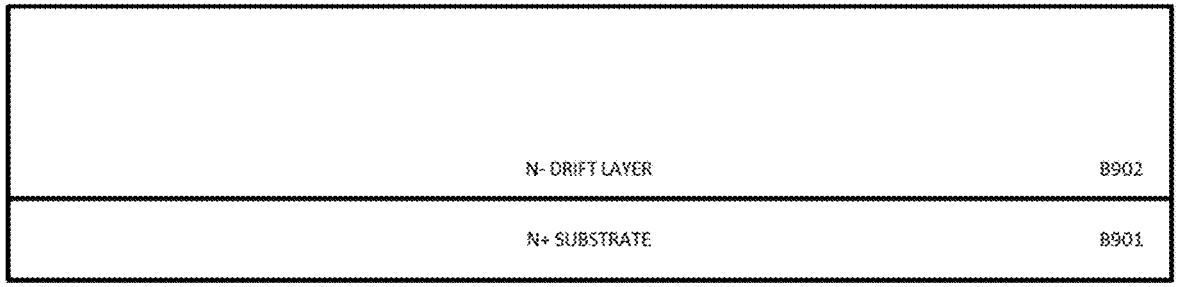
FIG. 21a to FIG. 21ff are cross sectional views showing the process steps for manufacturing the SiC DMOSFET structure in FIG. 20.
Figure 21B:
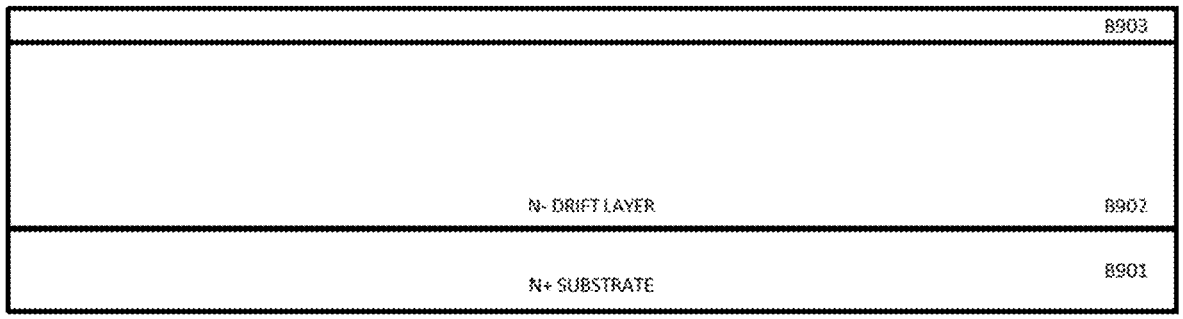
Figure 21C:
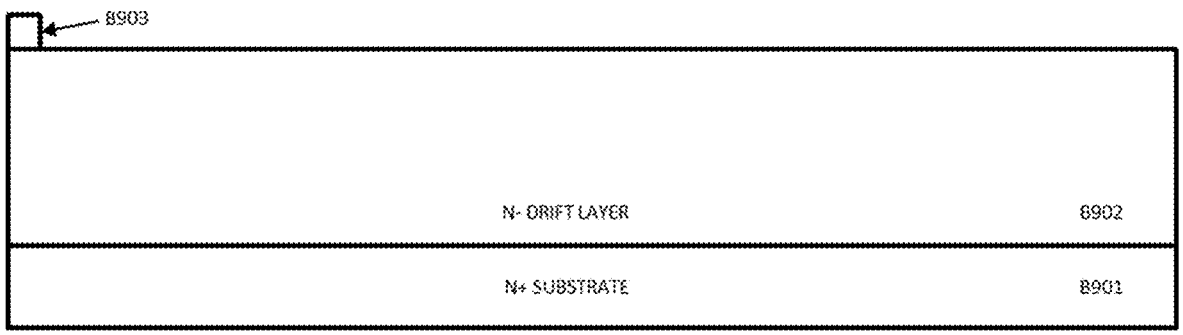
Figure 21D:
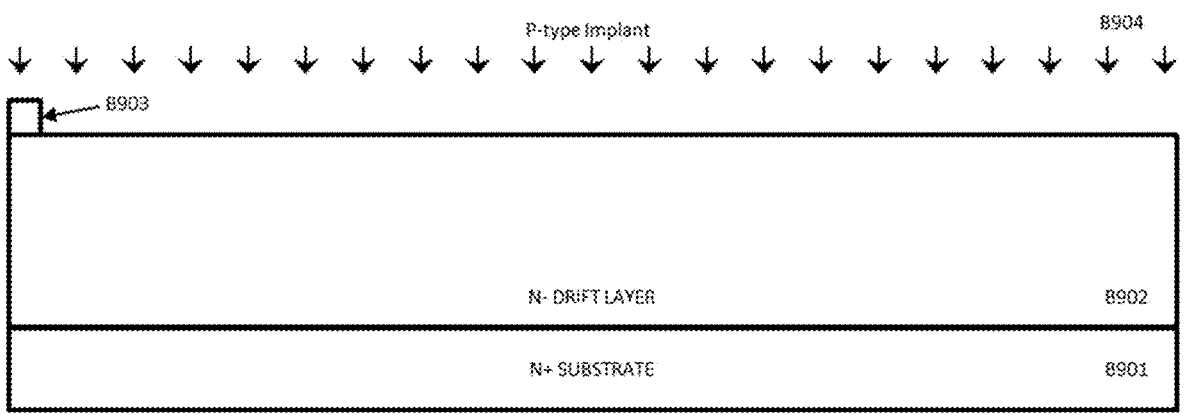
Figure 21E:
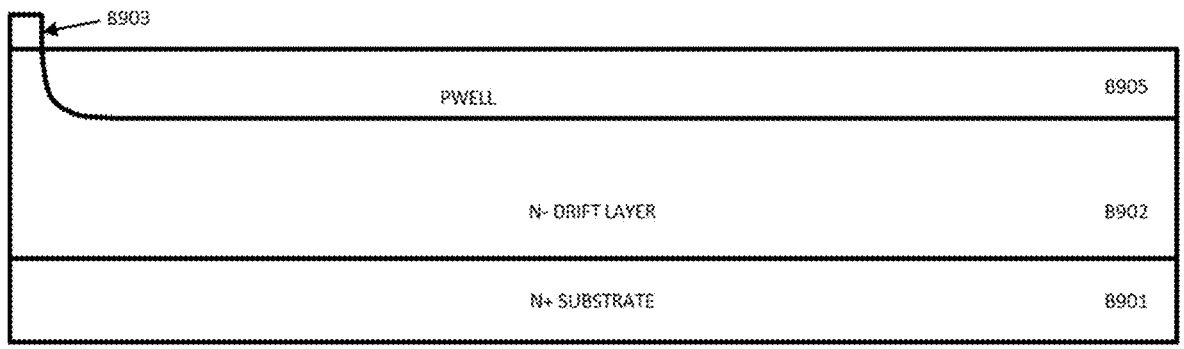

FIG. 21a to FIG. 21ff describes the process of manufacturing the structure shown in FIG. 20. The manufacturing process for a SiC DMOSFET is on a SiC substrate B901 and starts with using a 4H-SiC Si-face epi-wafer with suitable doping ($10^{14}$-$10^{18}$ cm$^{-3}$) and thickness (1 µm to 300 µm) for the epilayer B902 shown in FIG. 21a. A blanket hard mask B903 comprising a CVD deposited layer of silicon dioxide, silicon nitride, silicon oxynitride, or a metallic layer such as nickel, with thickness ranging from 50 nm to 5 µm is deposited in FIG. 21b and then patterned using photolithography followed by a dry etch using RIE for example as shown in FIG. 21c. Then p-well region is first formed by ion-implantation or epitaxial growth using aluminum or boron as the p-type impurity. A p-type implantation B904 comprising boron or aluminum, at energies ranging from 10 keV to 800 keV, at implant doses ranging from $10^{12}$ cm$^{-2}$ to $10^{15}$ cm$^{-2}$ in FIG. 21d is performed to create a p-well B905 in FIG. 21e.

Figure 21F:
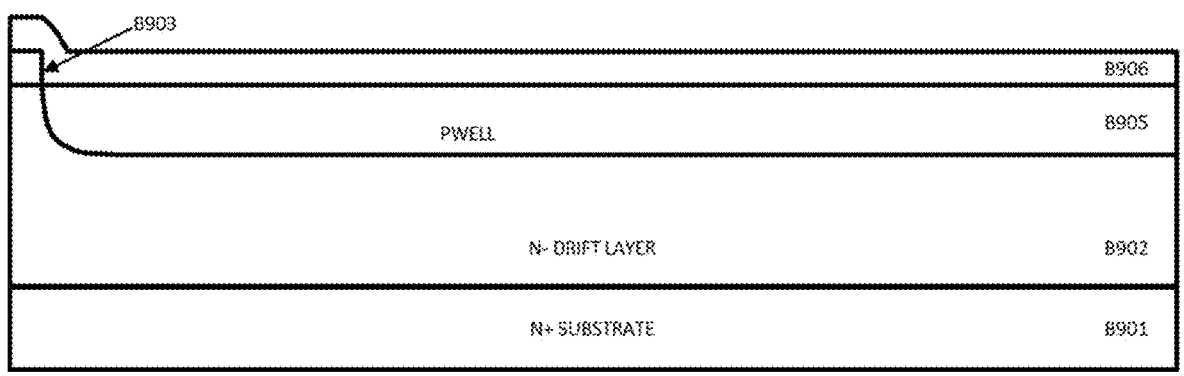
Figure 21G:
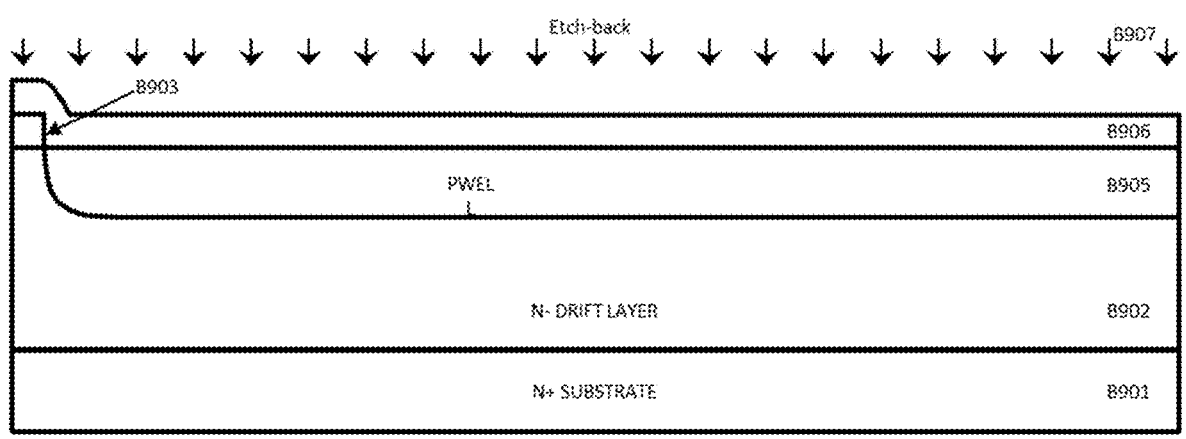
Figure 21H:
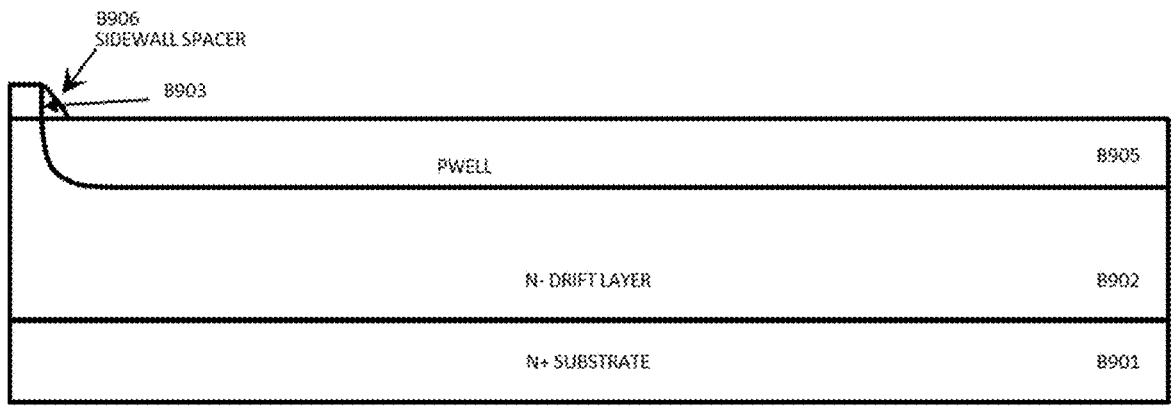
Figure 21I:
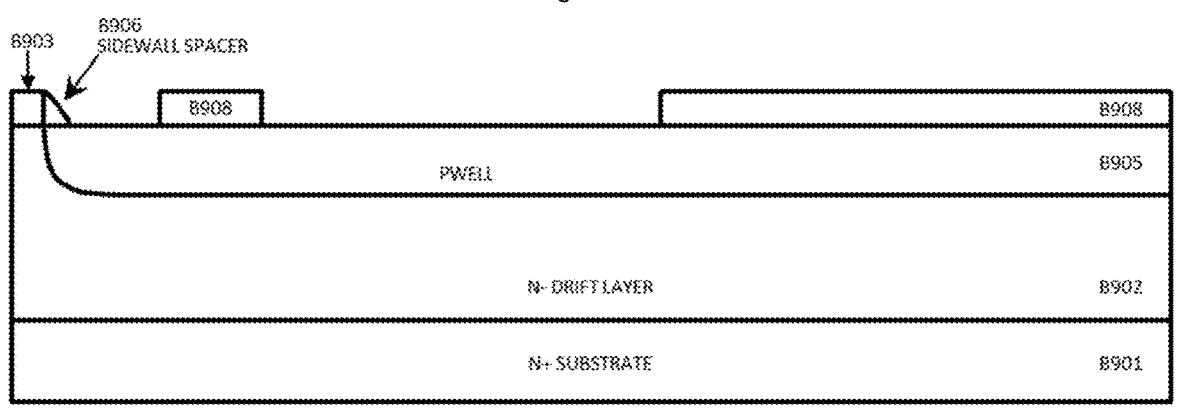
Figure 21J:
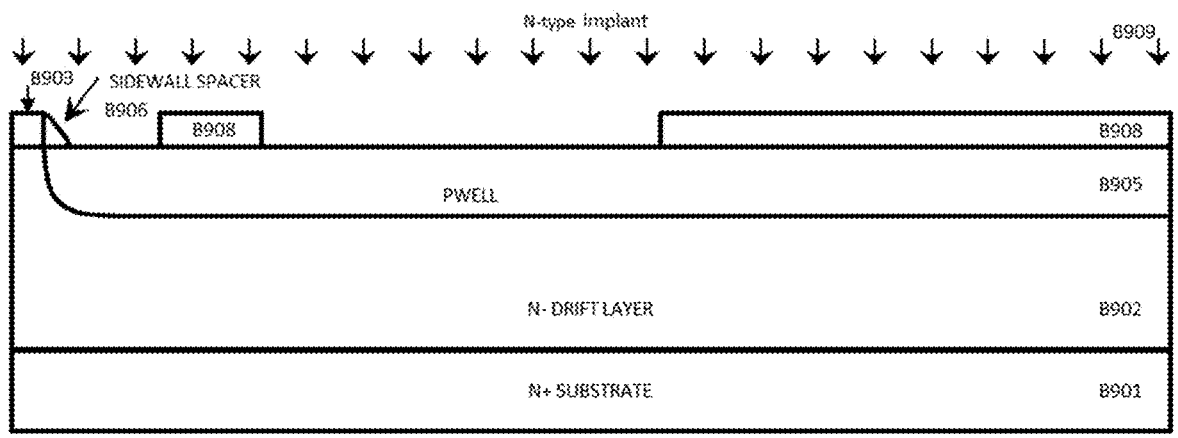
Figure 21K:
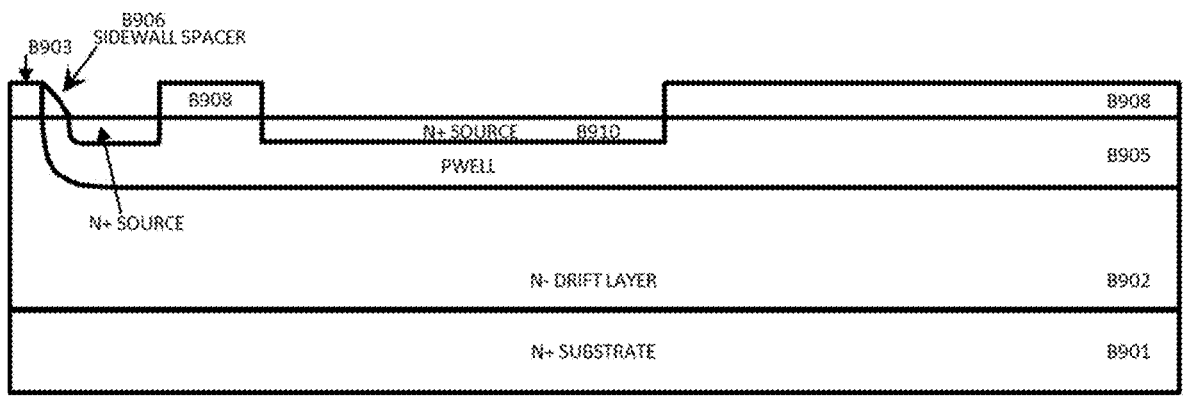
Figure 21L:
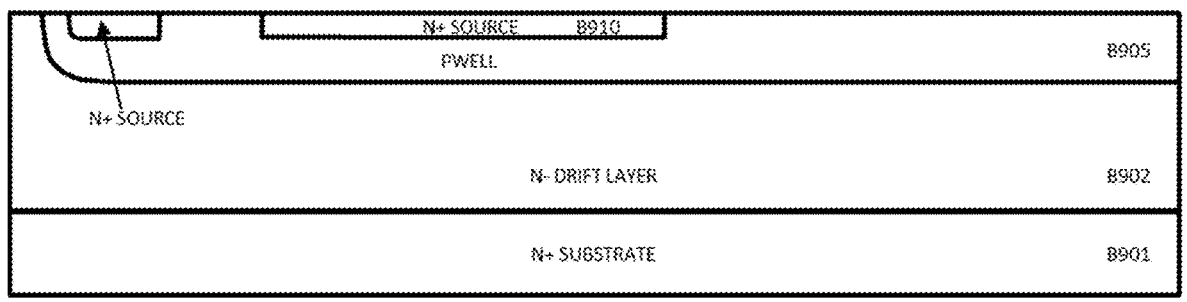
Figure 21M:
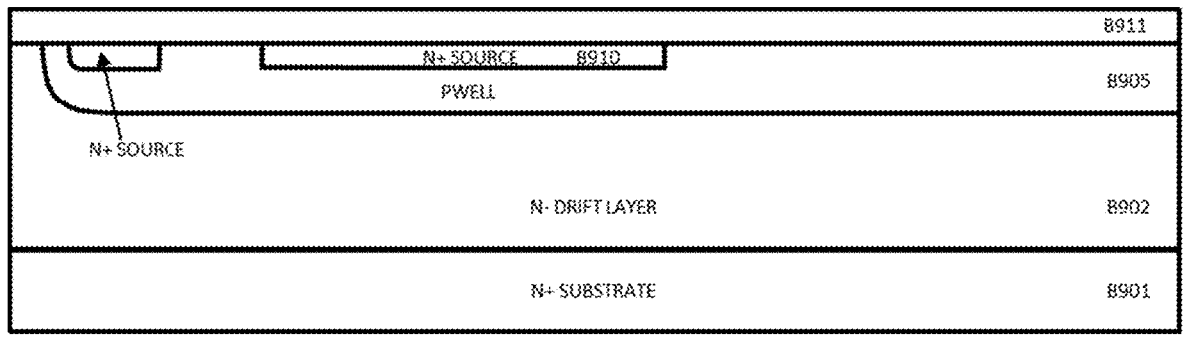
Figure 21N:
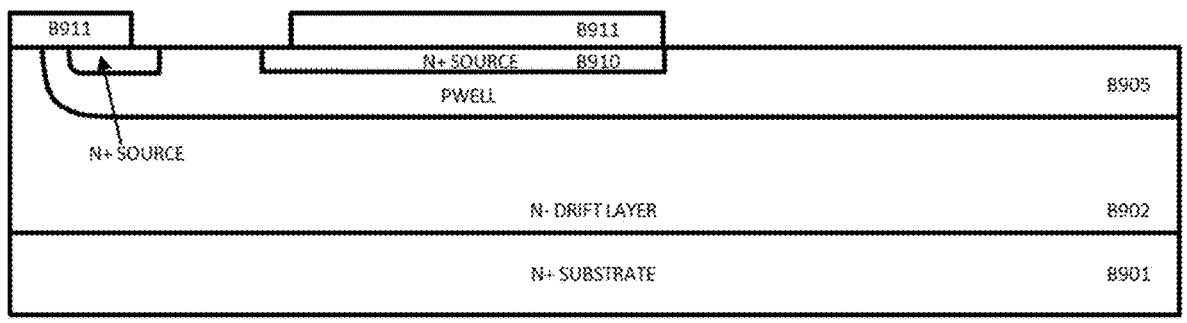

A second hard mask layer B906 is deposited by a CVD deposited layer of silicon dioxide, silicon nitride, silicon oxynitride, or a metallic layer such as nickel, with thickness ranging from 50 nm to 5 µm in FIG. 21f on top of the patterned first hard mask layer B903. This is followed by an anisotropic etching B907 in FIG. 21g to form a sidewall spacer B906 as shown in FIG. 21h. A hard mask layer B908 is deposited by a CVD deposited layer of silicon dioxide, silicon nitride, silicon oxynitride, or a metallic layer such as nickel, with thickness ranging from 50 nm to 5 µm and pattered in FIG. 21i. The patterned mask layer B908 is formed on the top alongside the patterned mask layer with the sidewall spacer. A n-type implant B909 is done in FIG. 21j for creating a N+ source region B910 in FIG. 21k. A N+ source region is formed by ion-implantation or by epitaxial re-growth by a n-type impurity such as nitrogen or phosphorus. Thus, the source region B910 is formed in a self-aligned fashion with the p-well region B905 while it is masked from the peripheral regions of the device, as well as selected areas of the active region of the device, to enable contact with the source ohmic metallization. The first and second hard mask layers B903 and B908 respectively, are removed in FIG. 21l. Another mask layer B911 is deposited by a CVD deposited layer of silicon dioxide, silicon nitride, silicon oxynitride, or a metallic layer such as nickel, with thickness ranging from 50 nm to 5 µm on the top in FIG. 21m. The mask layer B911 is patterned in FIG. 21n.

Figure 21O:
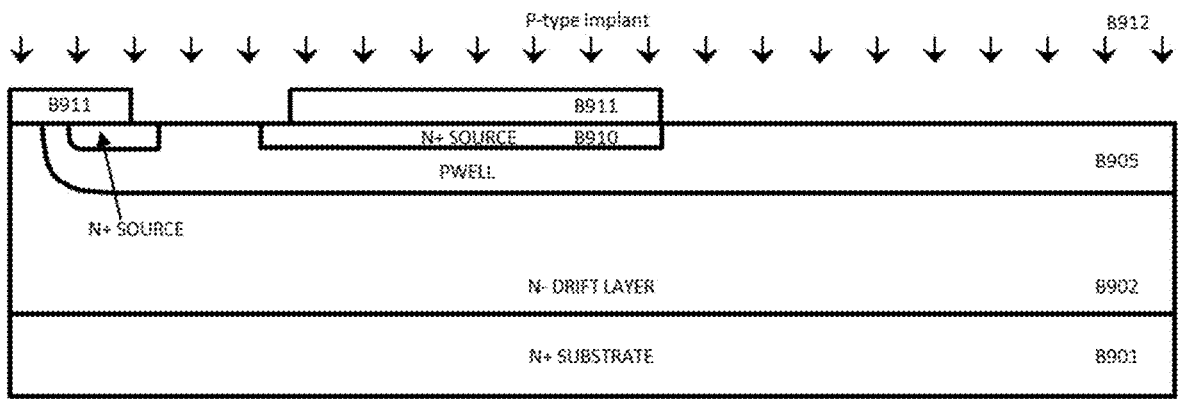
Figure 21P:
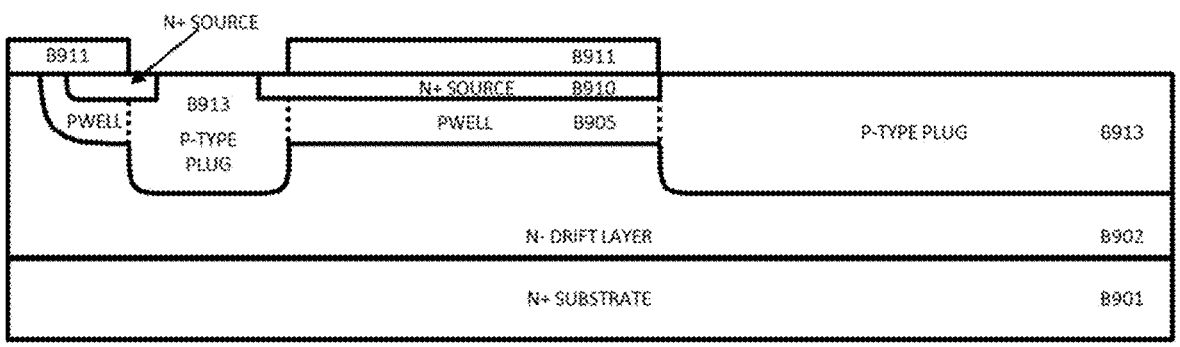
Figure 21Q:
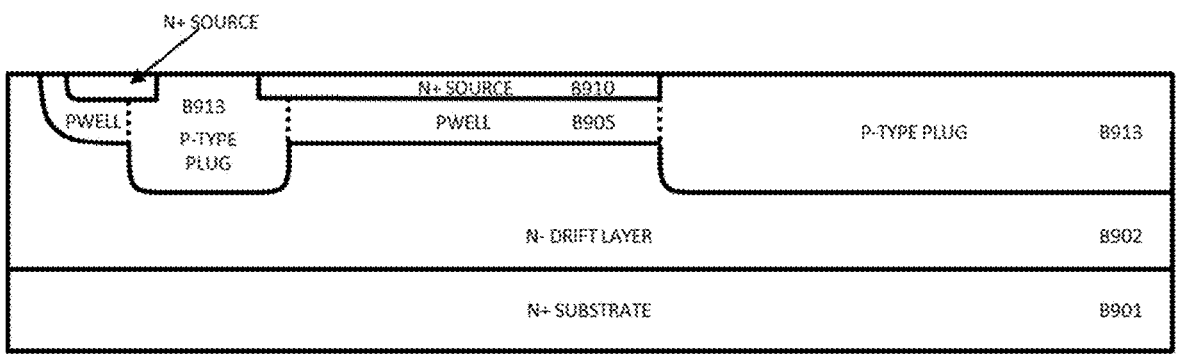

Using the hard mask B911 and by implantation of a controlled dose of a p-type impurity B912 like aluminum or boron in FIG. 21o a P+ plug region B913 is realized in FIG. 21p. The mask layer B911 is removed in FIG. 21q. The wafer is annealed for activating the implanted impurities.

Figure 21R:
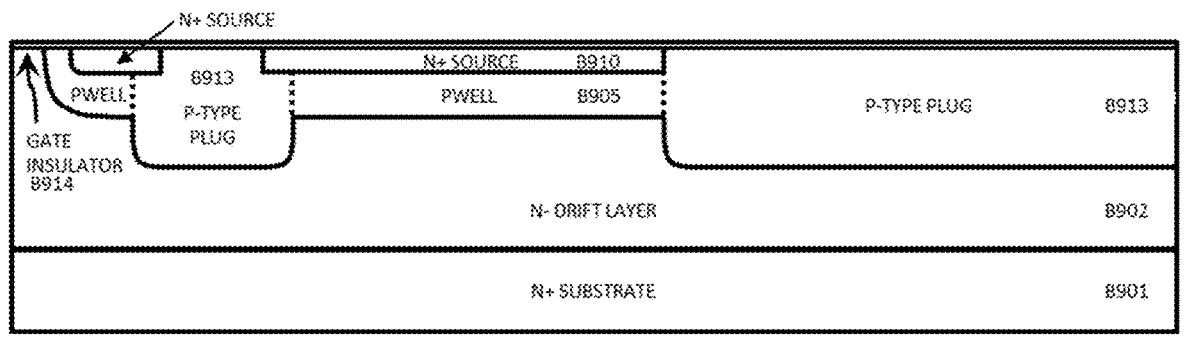
Figure 21S:
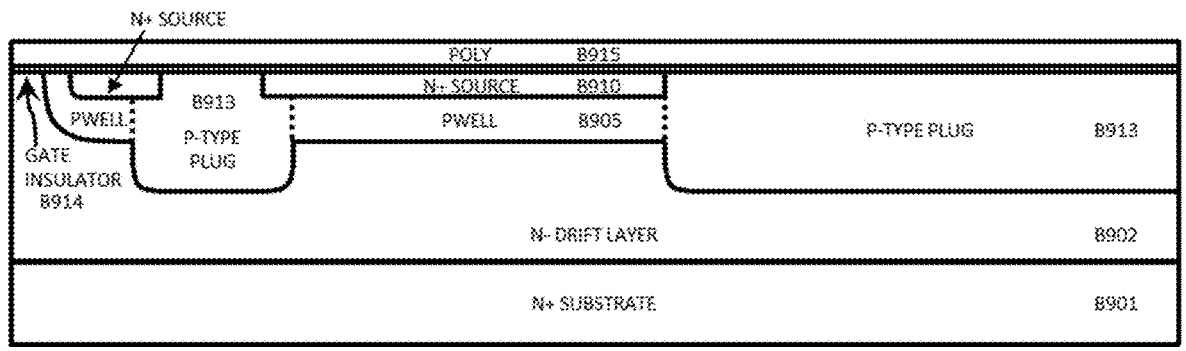
Figure 21T:
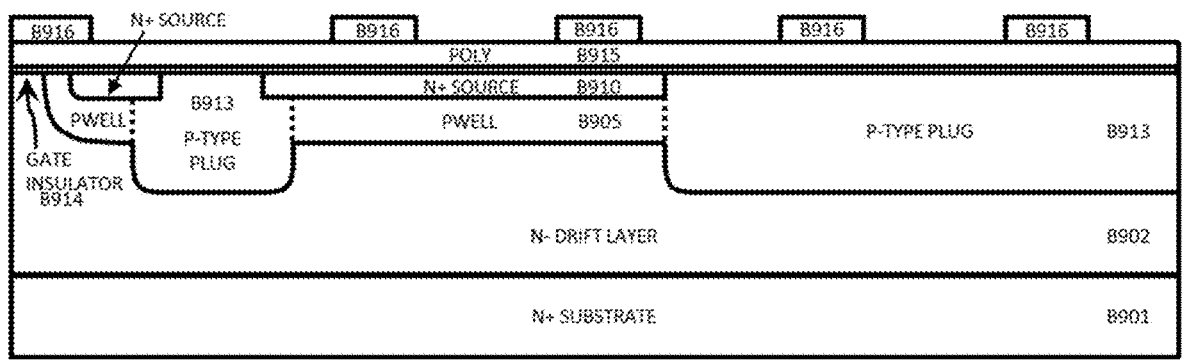
Figure 21U:
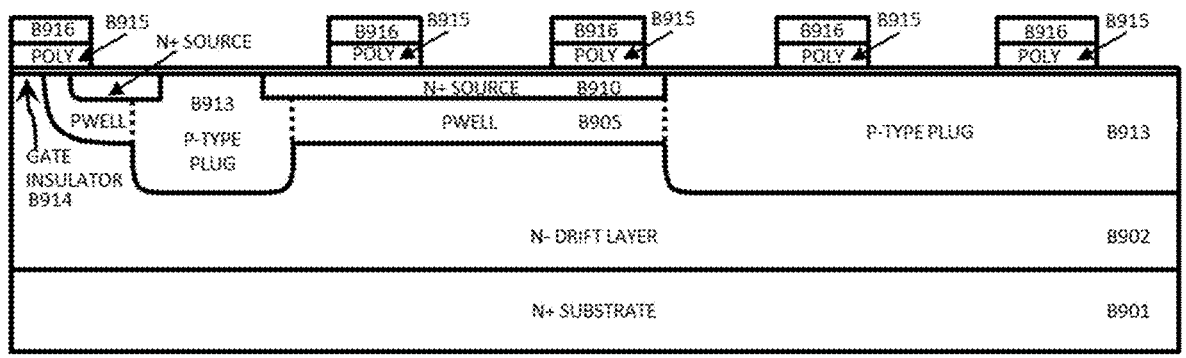
Figure 21V:
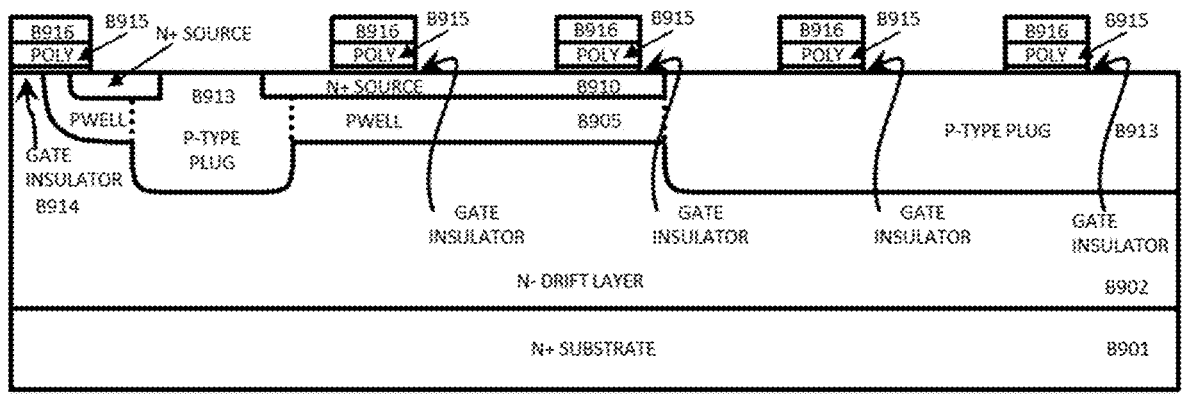
Figure 21W:
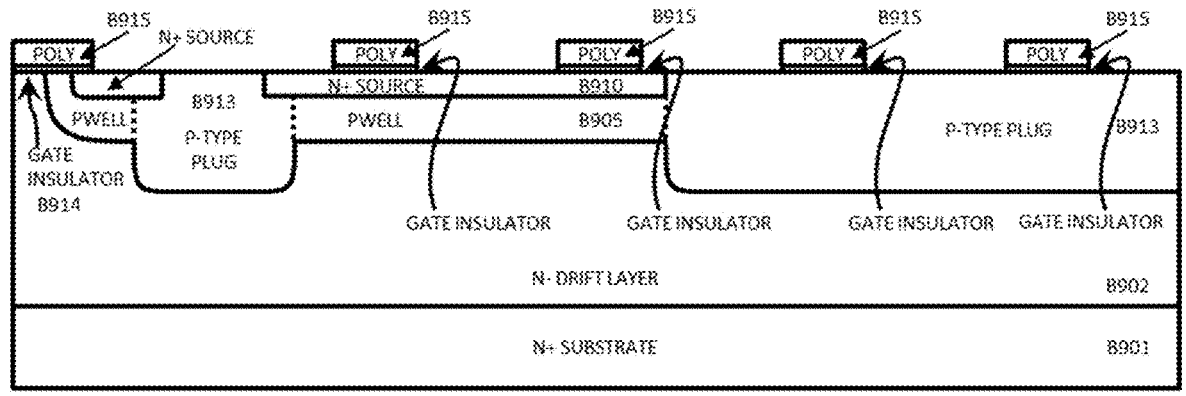
Figure 21X:
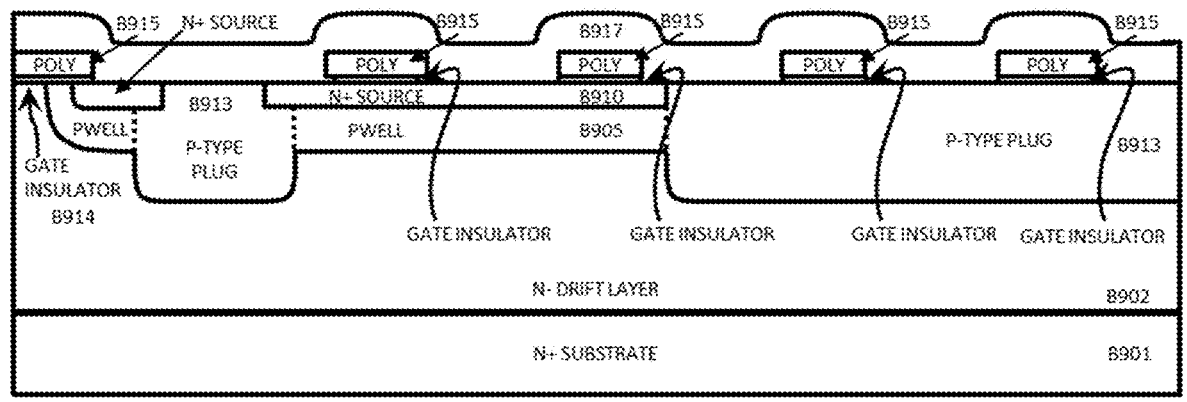

The oxide layer B914 which is the gate oxide is formed by thermal oxidation or using CVD of a dielectric layer such as silicon dioxide, silicon nitride, silicon oxynitride, etc. in FIG. 21r. The thickness of the gate oxide could range from 10 nm to 100 nm. Either dry or wet thermal oxidation could be used for oxide growth. PECVD or LPCVD could be used for gate oxide deposition. A polysilicon gate layer B915 is then deposited in FIG. 21s. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of $POCl_3$ followed by a drive-in step at temperatures ranging from 700-900° C. A hard mask B916 is deposited by a CVD deposited layer of silicon dioxide, silicon nitride, silicon oxynitride, or a metallic layer such as nickel, with thickness ranging from 50 nm to 5 µm on the top and patterned as shown in FIG. 21t. The polysilicon layer B915 is etched by using the patterned mask layer B916 in FIG. 21u. In the embodiment described herein, the masking step used to pattern the polysilicon gate metal, results in a partially segmented polysilicon pattern. While not apparent in the cross-sectional schematic, the disjointed gate fingers would be connected at a position orthogonal to the plane of the drawing. The gate insulator B914 is etched in FIG. 21v using the patterned mask B916. The mask layer B916 is then removed in FIG. 21w. An ILD layer B917 comprising 50 nm-1000 nm thick silicon dioxide, silicon nitride, silicon oxynitride layers or a stacked combination thereof is deposited on the wafer in FIG. 21x.

Figure 21Y:
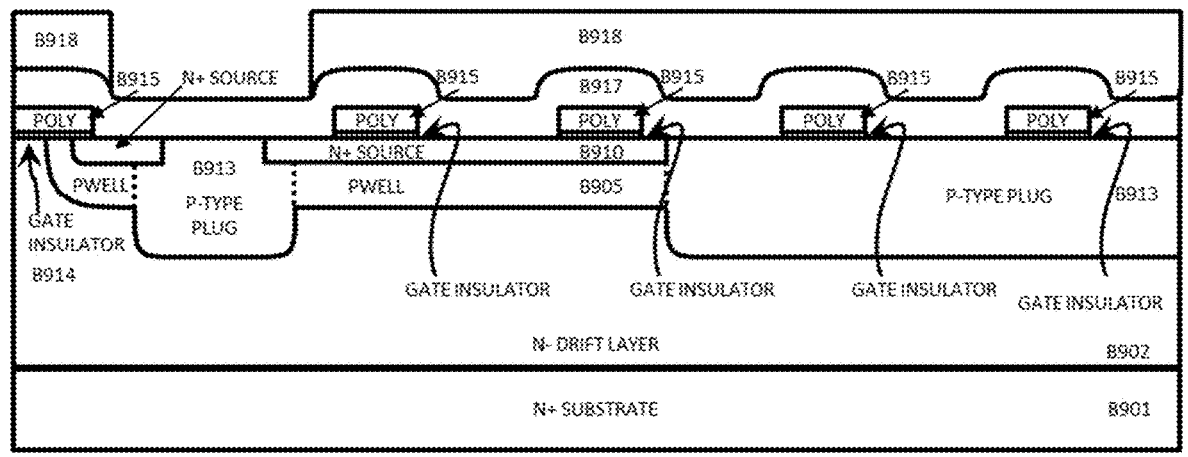
Figure 21Z:
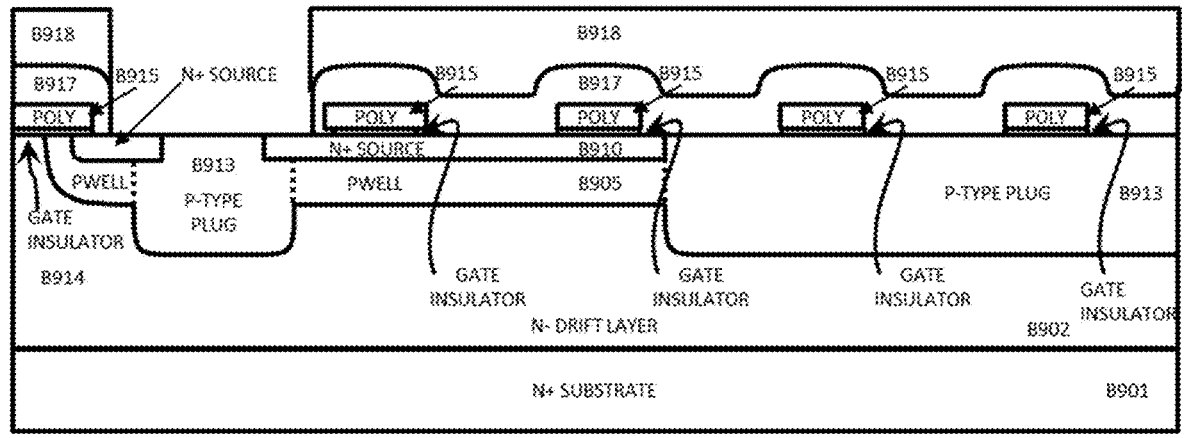
Figure 21A:
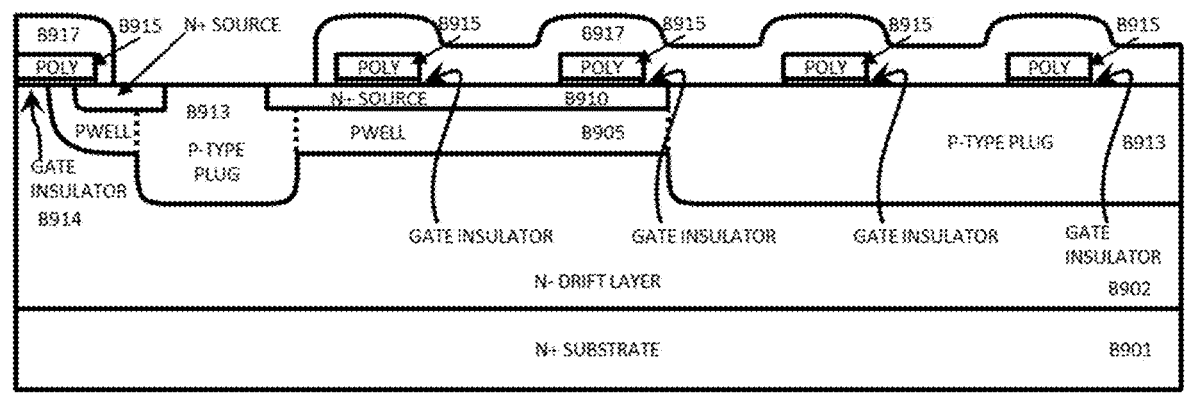
Figure 21B:
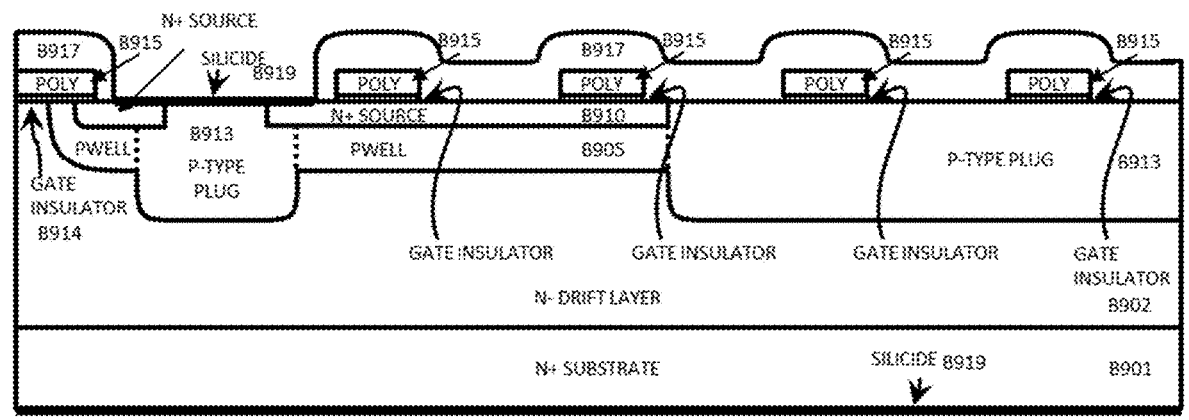
Figure 21C:
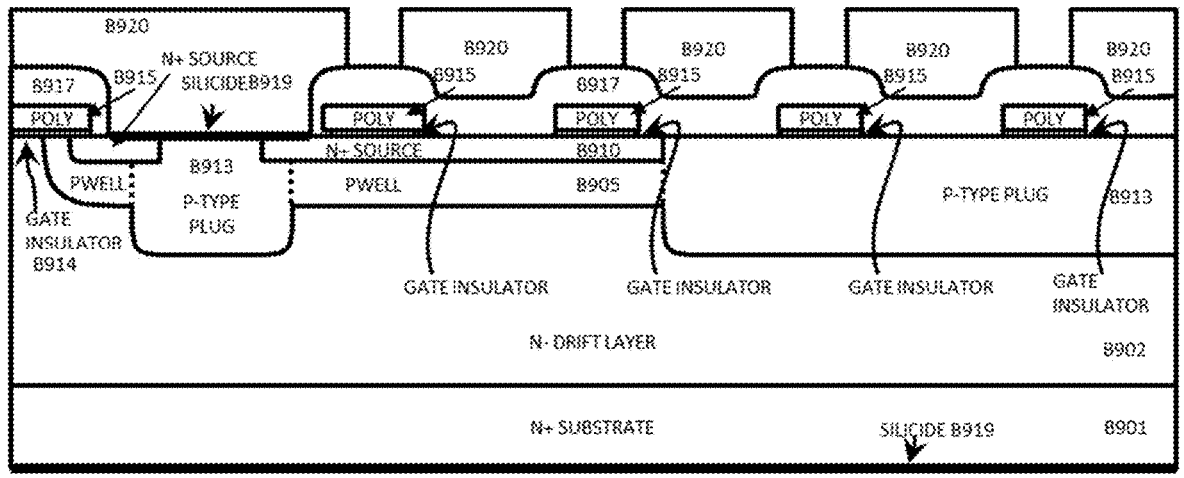
Figure 21D:
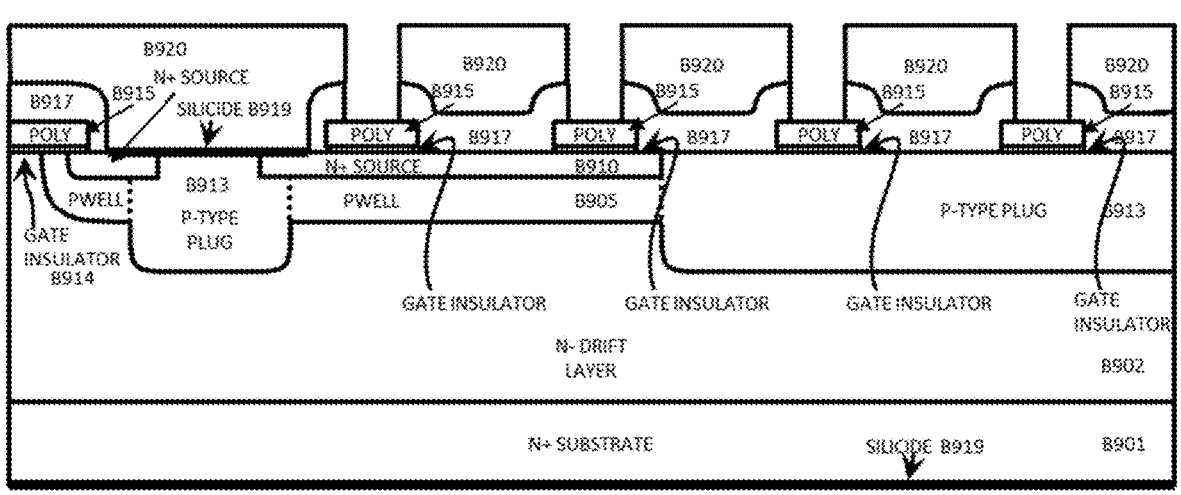
Figure 21E:
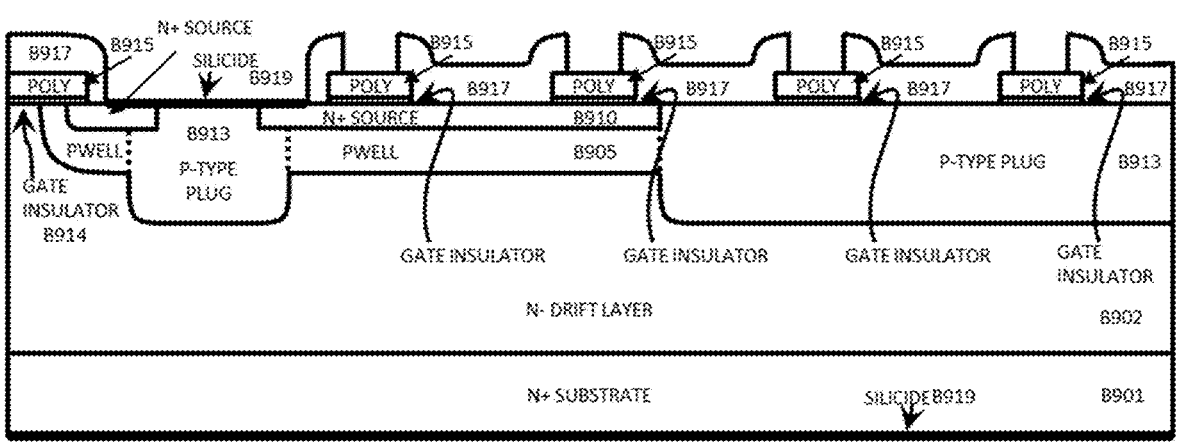
Figure 21F:
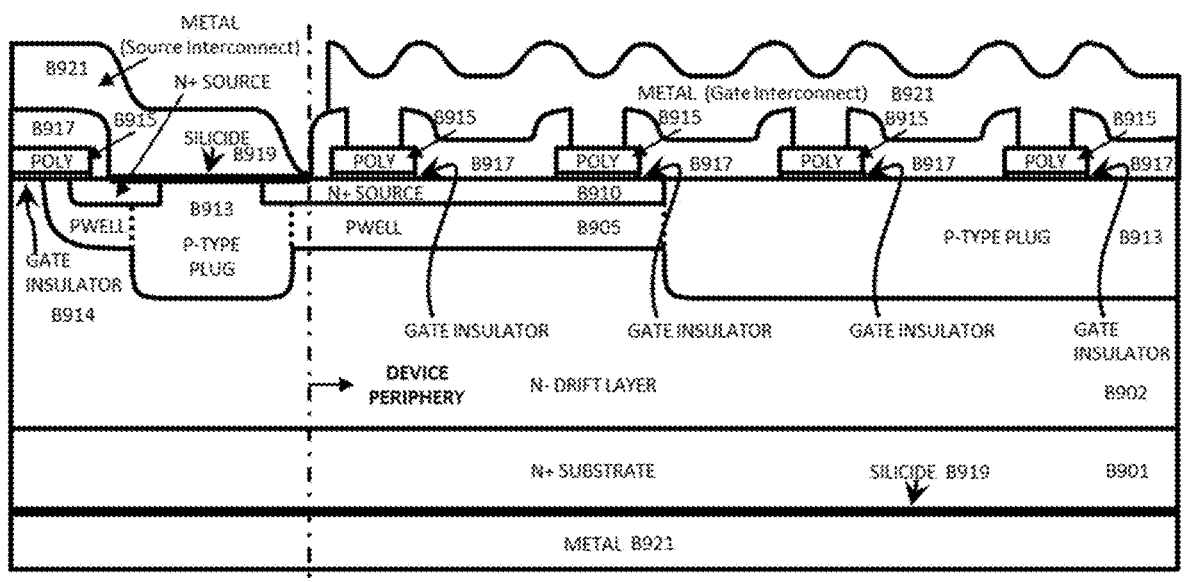

A hard mask B918 is deposited by a CVD deposited layer of silicon dioxide, silicon nitride, silicon oxynitride, or a metallic layer such as nickel, with thickness ranging from 50 nm to 5 µm on the top and patterned on top to define the ILD opening in FIG. 21y. The ILD layer B917 is etched using the hard mask as shown in FIG. 21z. The mask B918 is then removed in FIG. 21aa. A nickel silicide region B919 is formed on the exposed SiC surface in FIG. 21bb. A mask layer B920 is formed by a CVD deposited layer of silicon dioxide, silicon nitride, silicon oxynitride, or a metallic layer such as nickel, with thickness ranging from 50 nm to 5 µm on the top which is then patterned in FIG. 21cc. The ILD layer B917 is etched in FIG. 21dd. The mask layer B920 is removed in FIG. 21ee. Interconnect metal layers B921 of either aluminum or silver or gold is deposited and patterned on the top and bottom of the substrate in. FIG. 21ff.

Figure 22:
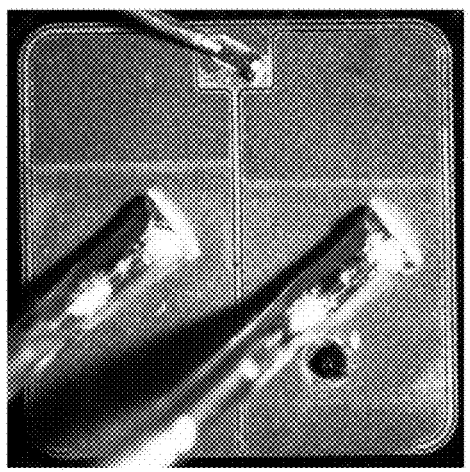
FIG. 22 is photograph showing a SiC DMOSFET fabricated using the teachings of these inventions and tested for single-pulse avalanche energy test.

FIG. 22 is photograph showing a SiC DMOSFET fabricated using the teachings of these inventions and tested for single-pulse avalanche energy test.

An embodiment described herein relates to design and manufacturing of a short-channel SiC MOSFET.

An embodiment described herein relates to minimizing the DIBL effect of the high voltage, short-channel SiC MOSFETs.

An embodiment described herein relates to improved device reliability.

An embodiment described herein relates to reducing ON resistance for a given chip size.

An embodiment described herein relates to design and manufacturing MOS channels with sub-micron channel lengths.

The embodiments described herein achieve a device with both low enough ON resistance as well as, high enough short circuit withstand time.

The embodiments described herein relate to increasing the doping concentration of the channel locally in certain regions of the channel. The non-uniformly doped channels for SiC MOSFET provide better tradeoff between ON resistance, threshold voltage and short circuit withstand time.

In the embodiments described herein relate to increasing the doping concentration in the channel locally such that they do not increase the threshold voltage too much, but at the same time reduce the DIBL effect to achieve a better trade of.

In an embodiment described herein a p-type shielding layer called the p-shield is formed within the p-well region. The p-shield always originates within the p-well region, but it can extend beyond the vertical extent of the p-well region.

In an embodiment described herein the bottom of the p-shield region can extended beneath the p-well.

In an embodiment described herein there can be multiple p-shield regions. The doping concentrations in the different p-shield region can be different from each other.

The embodiment described herein relates to device where a p-shield region is formed buried within the p-well structure. The p-shield region always originates within the p-well region, but can extend beyond the vertical extent of the p-well region.

In an embodiment herein, device structures can have multiple p-shield regions. In these cases, their doping concentration profiles of the different p-shield regions do not necessarily have be the same and can be different from each other.

In the race to achieve a lower ON stage resistance in planar gate SiC MOSFET, especially with high breakdown voltage ratings, it's a common practice to make the channel lengths as short as possible because this reduces a great part of the conduction loss that is associated with SiC channels. The MOS mobility in SiC MOS structures is significantly smaller as compared to those found in silicon MOSFETS and as a result to achieve a low enough ON resistance, one needs to make the channel lengths quite short and sometimes in the sub-micron range.

As the channel lengths become shorter, short channel effects becomes a problem in a SiC power MOSFET causing the drain induced barrier lowering effect, also called the DIBL effect which is responsible for a lot of reliability issues in SiC MOSFETs.

One associated problem is a roll off of the threshold voltage at high drain bias where the designed device achieves a certain desired threshold voltage only at very low drain bias. But, as the drain bias approaches it's blocking value, the threshold voltage gets reduced substantially which is undesirable since the channel could inadvertently turn on.

Also, a device suffering the DIBL effect has extremely large saturation currents under high drain bias. which results in excessive power dissipation under short circuit load conditions. This results in a low short circuit withstand time. While limited MOS channel mobility of SiC MOSFETS can be overcome with short channel lengths, it is associated with problems due to DIBL effects.

One approach to mitigating this problem is to increase the doping concentration in the channel region which uniformly increases the threshold voltage of the device. While this approach can reduce the saturation drain current, this also increases the ON resistance of the device.

The embodiments described herein can help achieve a device with both low enough ON resistance as well as, high enough short circuit withstand time. While the conventional approach is to just uniformly increase the doping concentration in the channel region, the embodiments described herein do not increase the doping concentration of the other channel uniformly but increases it locally in certain regions of the channel. The non-uniformly doped channels for SiC MOSFET provide better tradeoff between ON resistance, threshold voltage and short circuit withstand time.

In the embodiments herein the doping concentration are increased such that they do not increase the threshold voltage too much, but at the same time reduce the DIBL effect and hence achieving a better trade of.

In an embodiment herein a p-type shielding layer called the p-shield is formed within the p-well region. The p-shield always originates within the p-well region, but in certain examples of this embodiment, it can extend beyond the vertical extent of the p-well region.

In an embodiment herein the bottom of the p-shield region can be extended further down and can reach beneath the p-well. In an embodiment herein there can be multiple p-shield regions. The doping concentrations in the different p-shield region can be different from each other.

In an embodiment herein a p-type shielding layer called the p-shield is formed buried within the p-well region. The p-shield always originates within the p-well region, but in certain examples of this embodiment, it can extend beyond the vertical extent of the p-well region.

In an embodiment herein the bottom of the p-shield region can be extended further down and can reach beneath the p-well. In an embodiment herein there can be multiple p-shield regions buried in the p-well region. The doping concentrations in the different p-shield region can be different from each other.

A p-shield region is formed buried within the p-well structure re-enforces" the doping of the p-well region locally and provides better shielding of the MOSFET channel at the surface, while minimizing the DIBL effect. In the embodiment described herein since the p-shield is not directly connected to the channel, the p-shield does not change the $V_{TH}$.

Figure 23A:
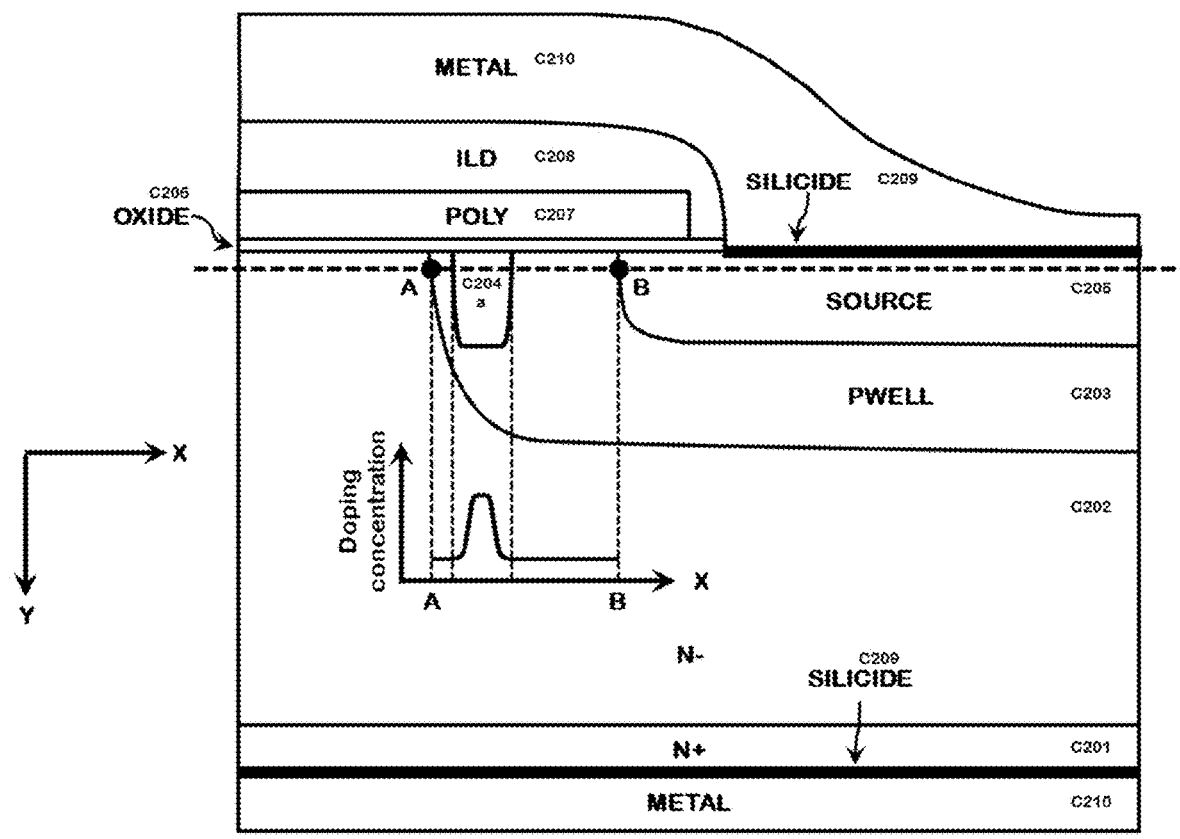
FIG. 23a to FIG. 23d shows embodiments of a SiC DMOSFET structure for field shielding within the p-well region.

An embodiment shown in FIG. 23a is the half unit cell of a cross-sectional structure of a SiC DMOSFET. The key regions of this device are a p-well region C203, which is formed by ion-implantation or epitaxial re-growth of a p-type species such as aluminum or boron. There is an N+ source region C205, N− drift layer C202, and an N+ substrate C201. In the ON state when a gate voltage is applied to the polysilicon gate C207 the current flows vertically from the drain C201, through the inversion layer which is formed at the top of the p-well layer C203, through the N+ source region C205, and out through the source metallization C210. In the OFF state or the blocking state, a voltage is supported across the p-well C203, N− drift layer C202 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the junction field-effect transistor (JFET) region or the JFET gap and the thickness of the gate oxide C206. Another feature is an ILD layer C208 which is used to insulate the source interconnect metallization C210 from the polysilicon gate C207. Nickel silicide regions C209 are formed on the exposed SiC surface.

In the embodiments herein a p-type shielding layer which is called p-shield C204a is formed within the p-well region. The p-shield can be located inside the p-well such that its lateral location of the point whose doping concentration is the highest as compared to the average background doping concentration of the p-well is positioned within the boundary of the p-well. The p-shield region always originates within the p-well region. Point A and B are given as the reference points for describing how the doping profile of the implanted p-shield region looks like.

Figure 23B:
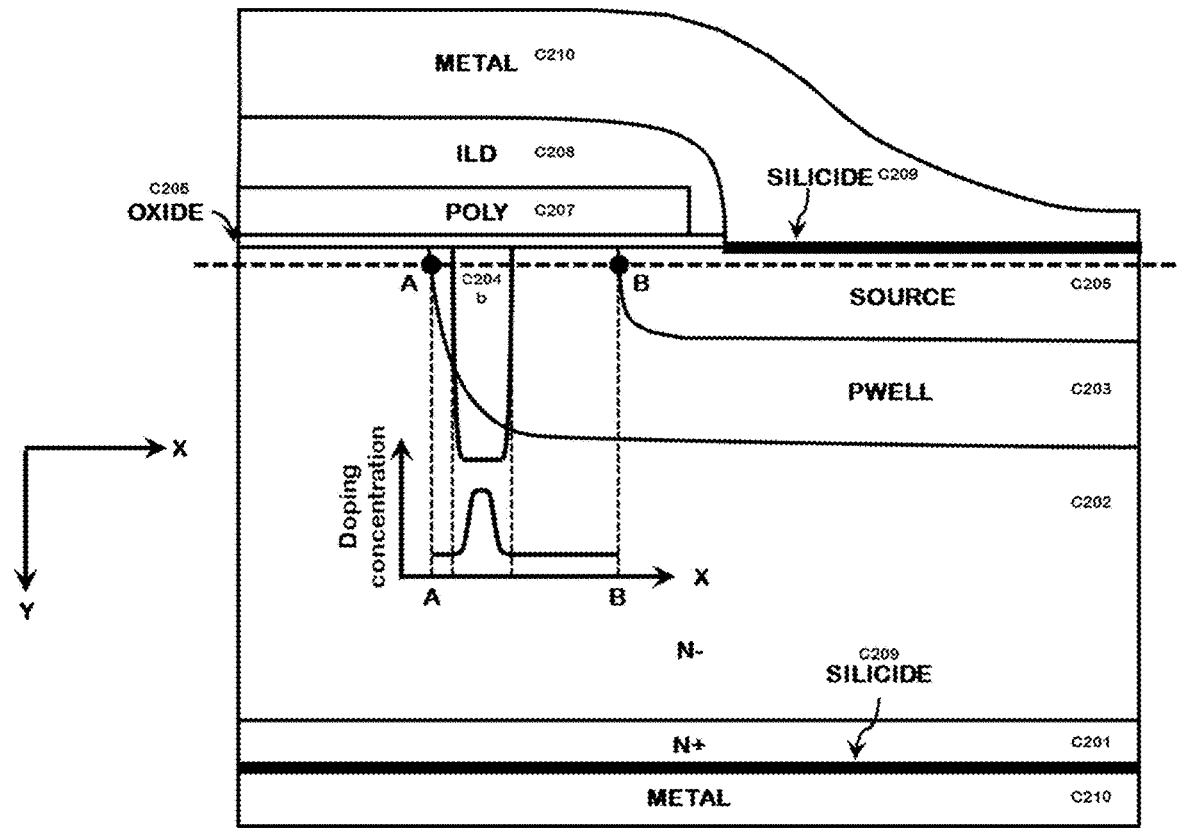

The embodiment shown in FIG. 23b is similar to that of FIG. 23a except that the bottom of the p-shield region C204b is extended further down into the p-well and can reach outside the p-well region.

Figure 23C:
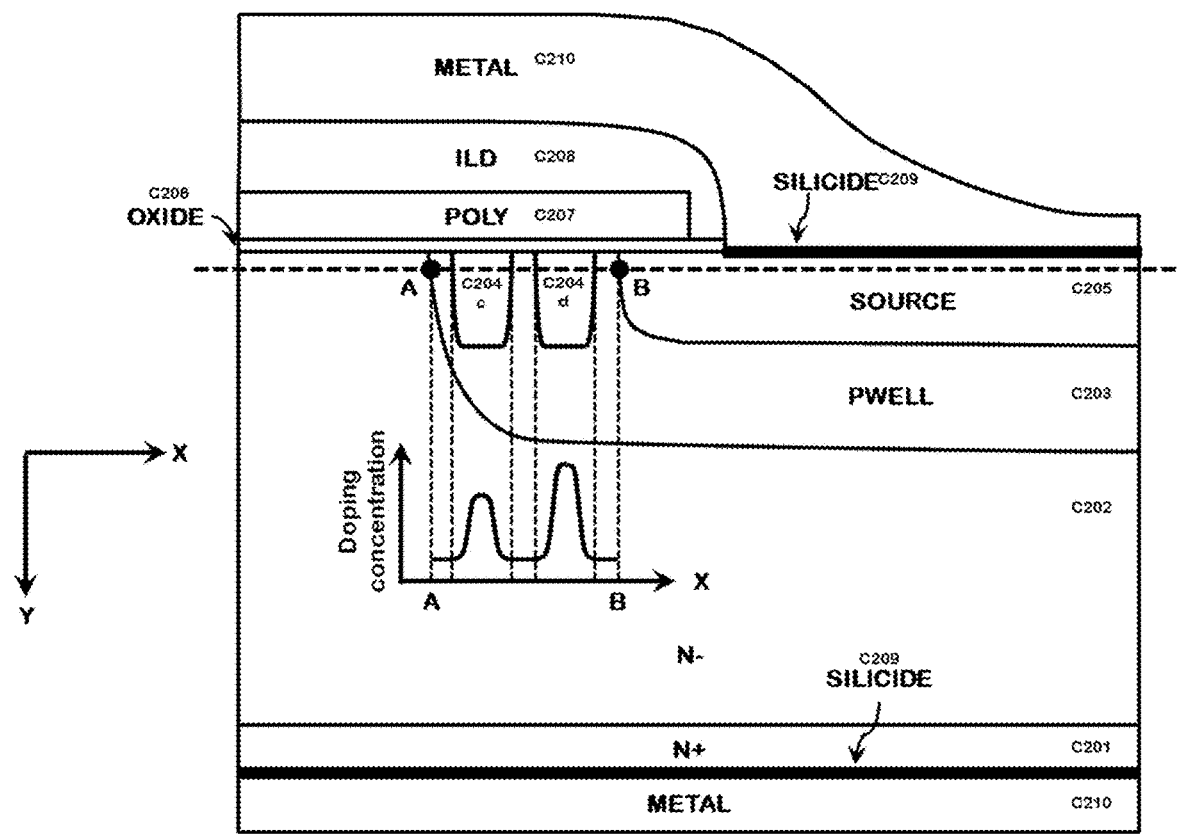
Figure 23D:
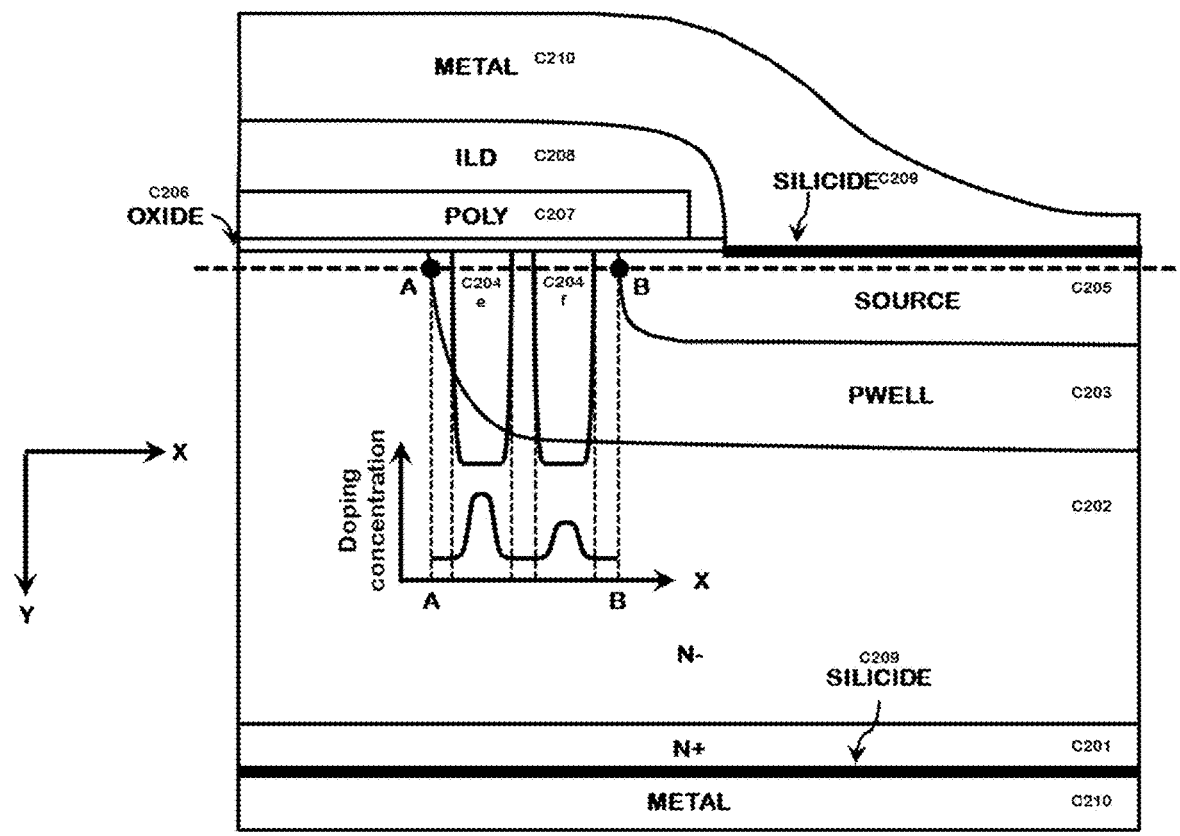

In an embodiment shown in FIG. 23c and FIG. 23d the devices are similar to FIG. 23a. The devices in FIG. 23c and FIG. 23d exemplify the case where there are multiple p-shield regions namely C204c and C204d in FIG. 23c and C204e and C204f in FIG. 23d. In these cases, their doping concentration profiles of the different p-shield regions do not necessarily have be the same and can be different from each other.

In case of biasing the drain with high voltage, the p-shield that is formed in the middle of the channel can help in mitigating the expansion of the drain bias-induced depletion region, which eliminates the DIBL effect. In addition to the mitigation of the DIBL effect, the p-shield region also provides a simple way for controlling the VTH of the MOSFET, which enables improving the short circuit time ($t_{SC}$). The p-shield enables a local increase of the doping concentration of the p-well at critical locations in the device structure, as opposed to an uniform increase of the p-well doping concentration. A better trade-off with respect to lower Vth, ON resistance and better immunity to short-channel effects is obtained by methods described in the embodiment. In the case, where the depth of the p-shield region is greater than the p-well region, i.e. the p-shield extends beyond the p-well region in the vertical direction, the p-shield can also provide better shielding of the electric field to the channel region which further mitigates the DIBL effect in the channel. The device structure with multiple p-shield regions can be designed with different doping concentrations in the different p-shield regions. In an embodiment described herein, a higher doping concentration can be applied to the p-shield region/s close to the edge of the p-well (POINT A), while the p-shield regions closer to POINT B can be made with lower doping concentrations. This structure will have the benefit of a lower gate threshold voltage as well as excellent immunity to short-channel effects, for a given channel length.

Figure 24A:
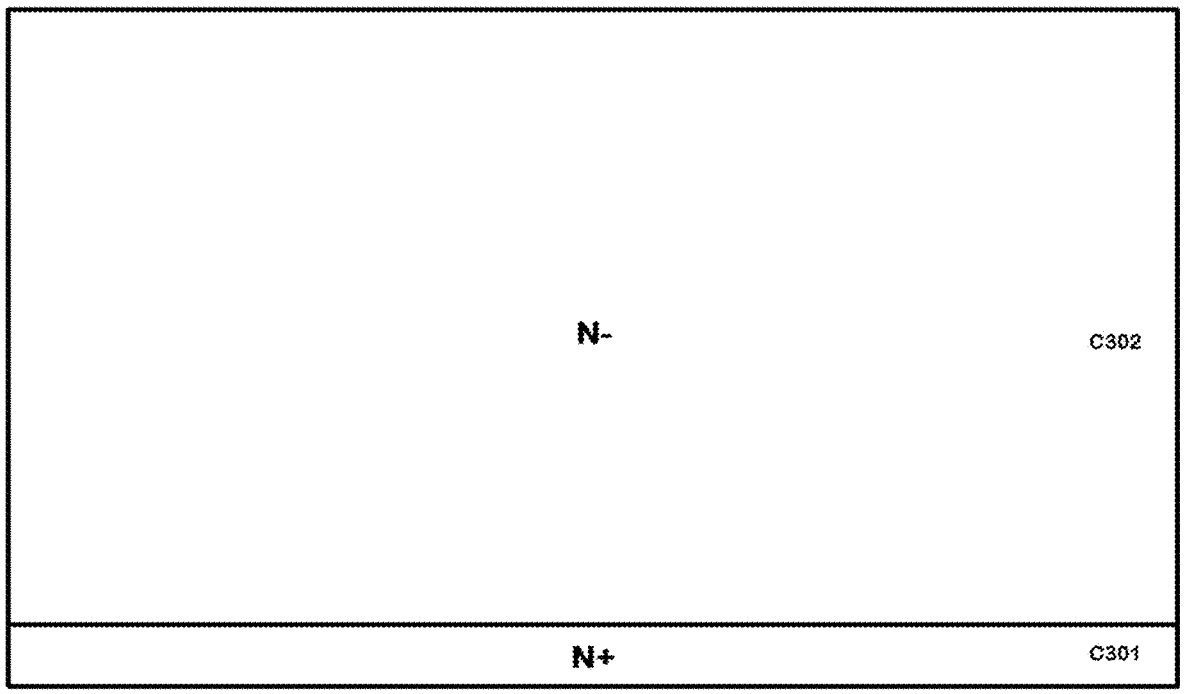
Figure 24B:
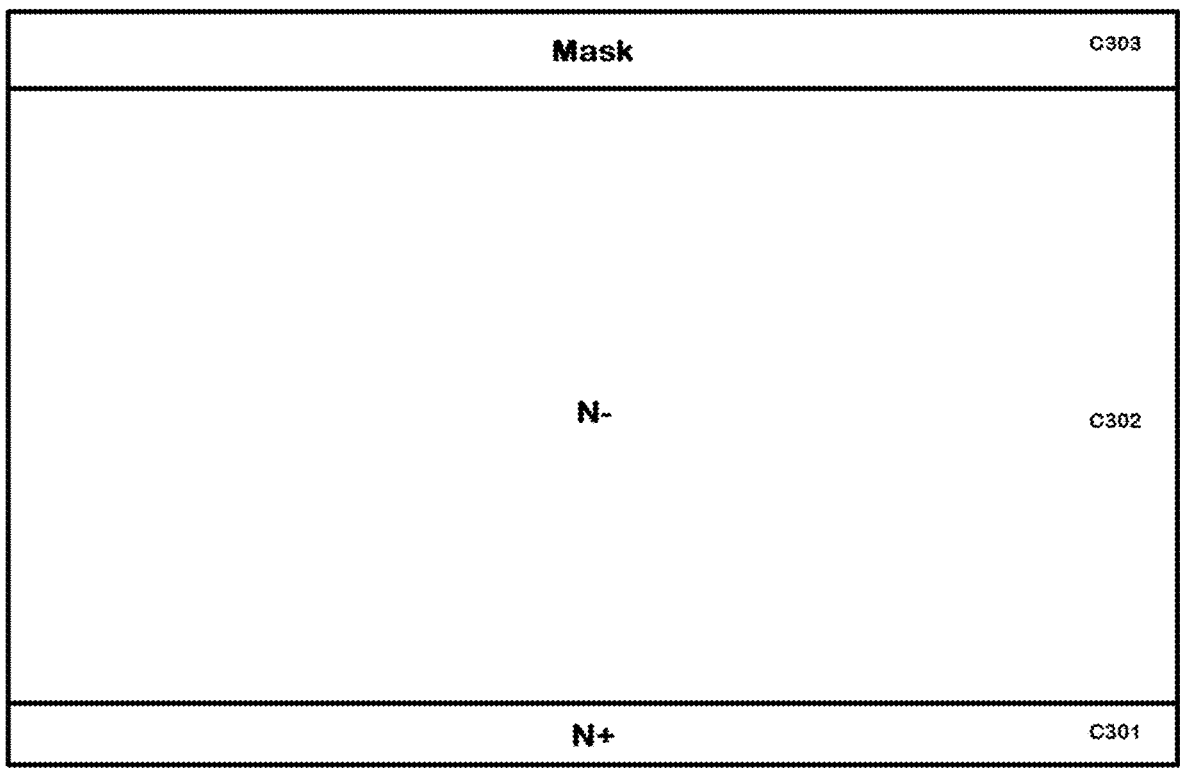
Figure 24C:
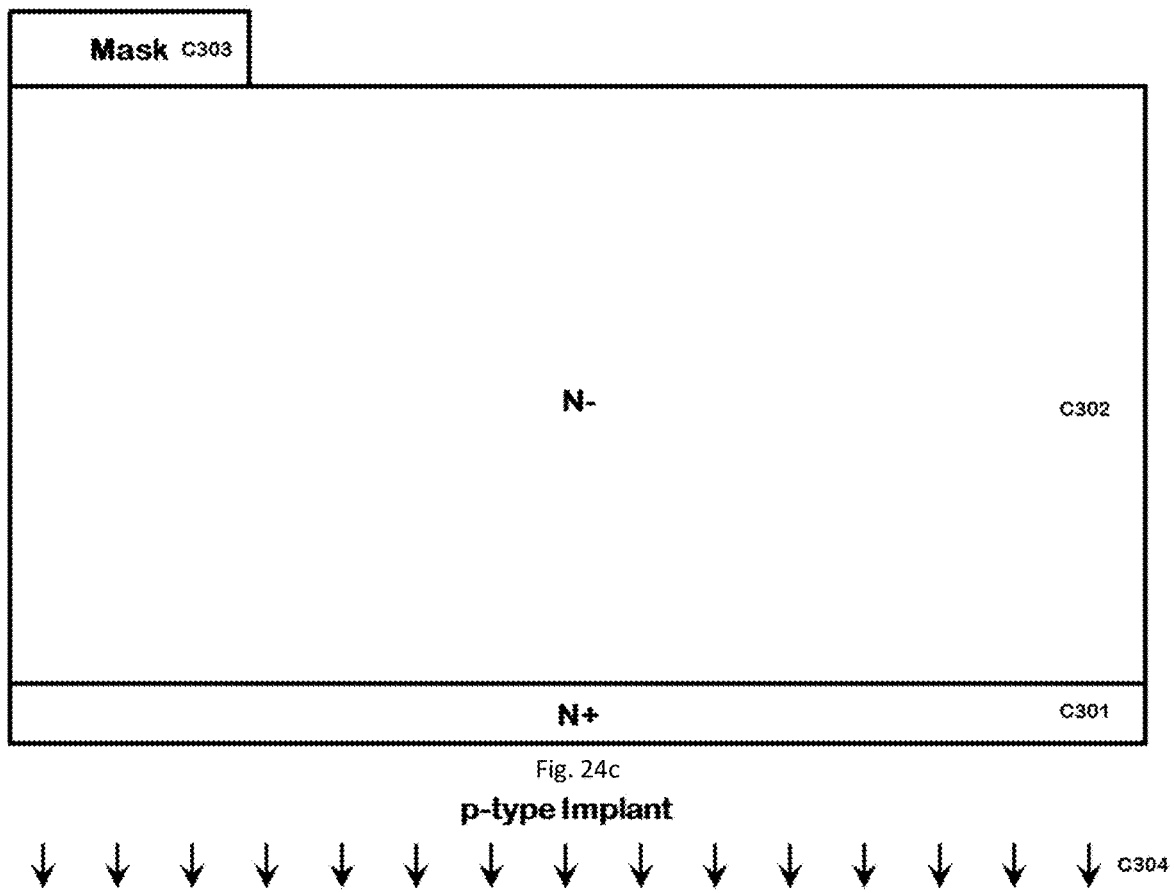
Figure 24D:
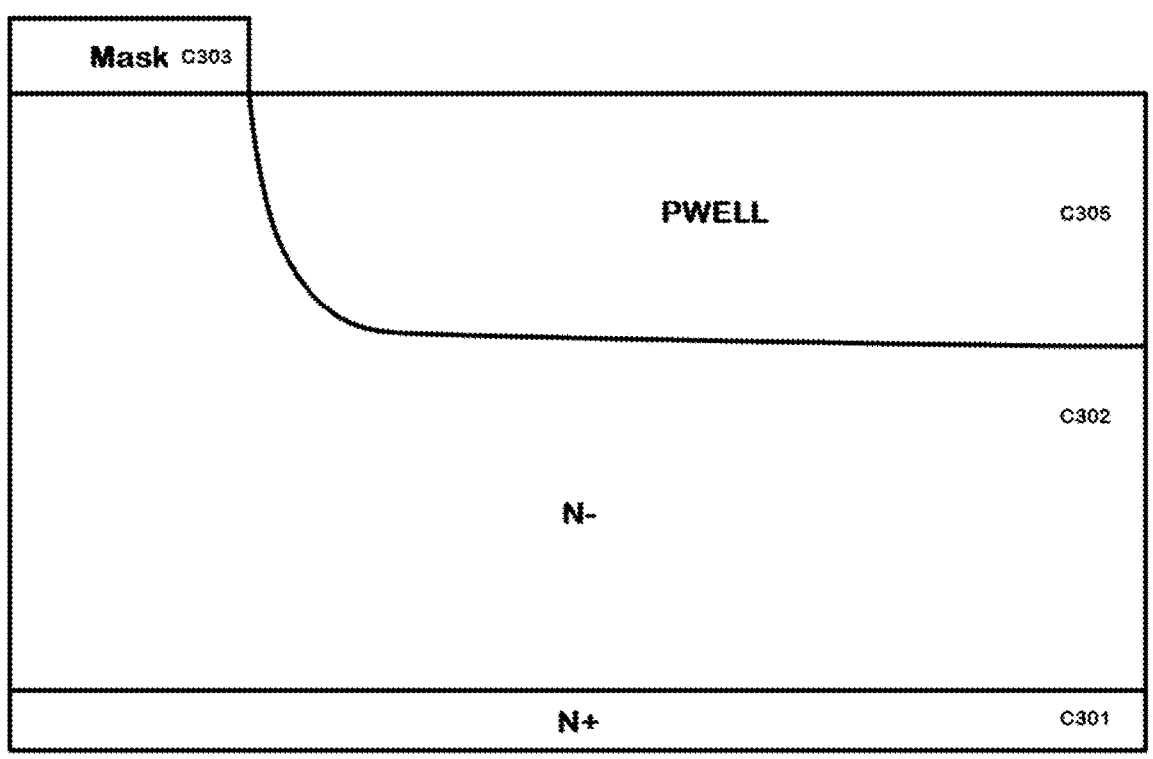
Figure 24E:
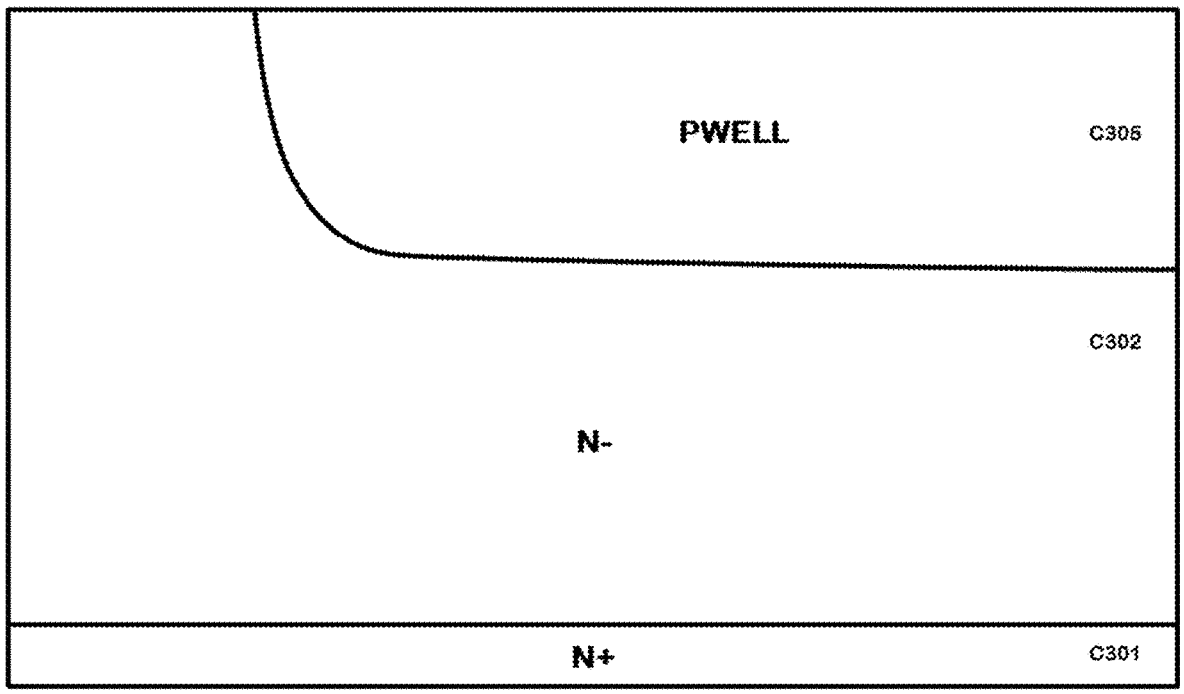
Figure 24F:
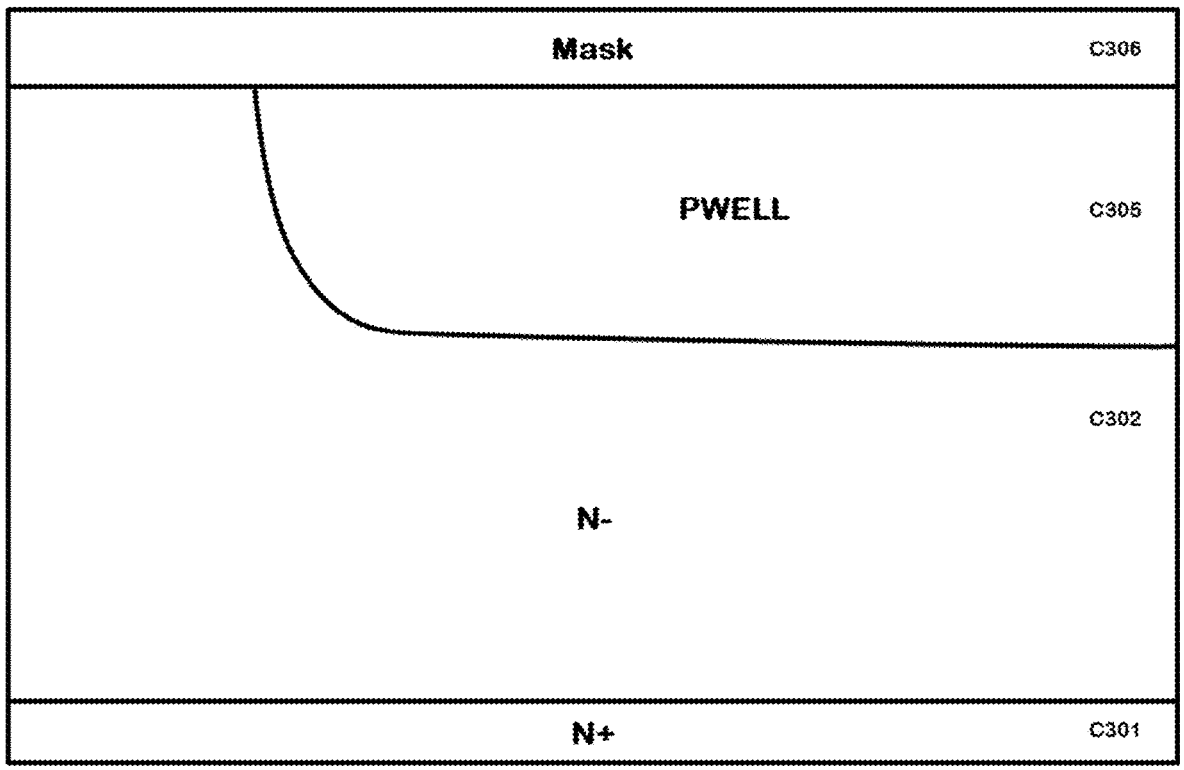
Figure 24G:
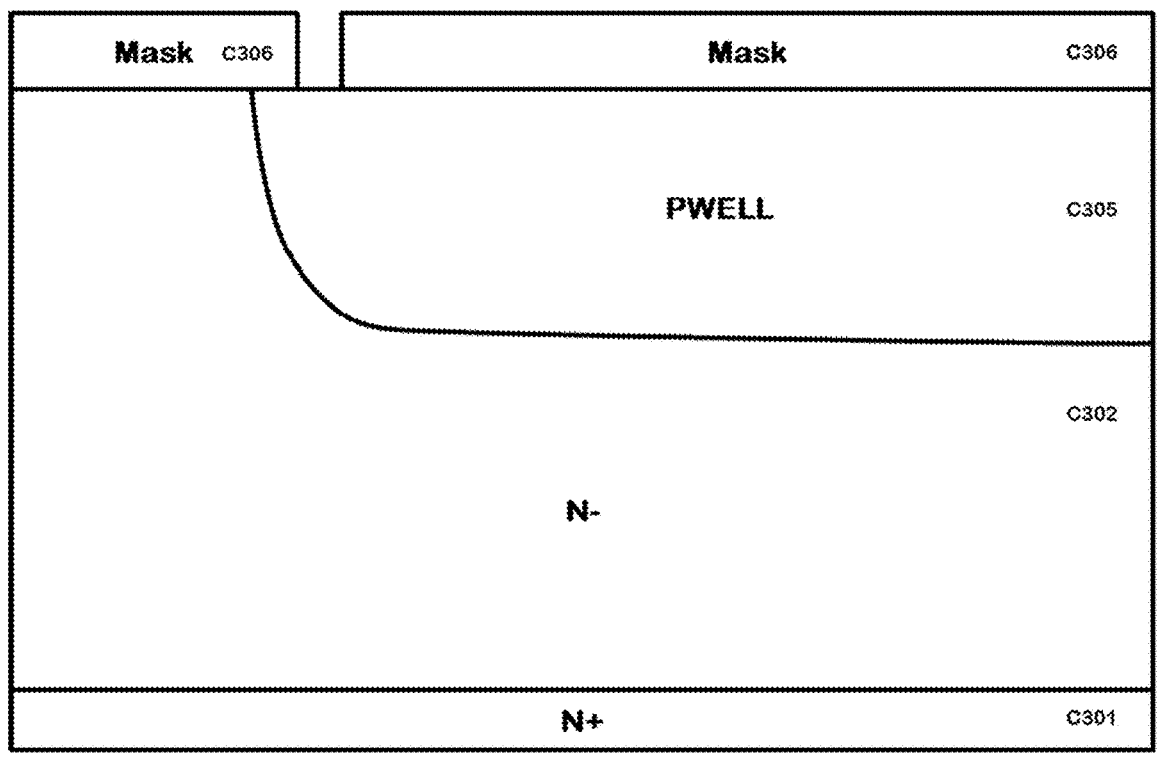
Figure 24H:
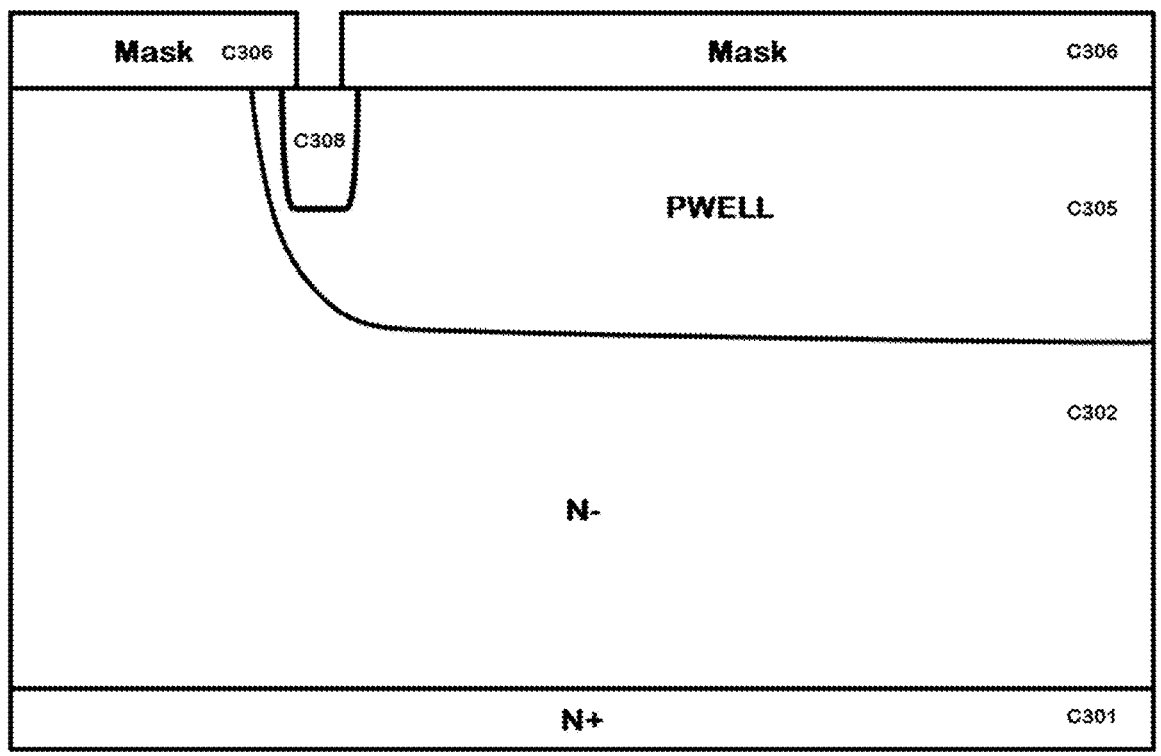
Figure 24I:
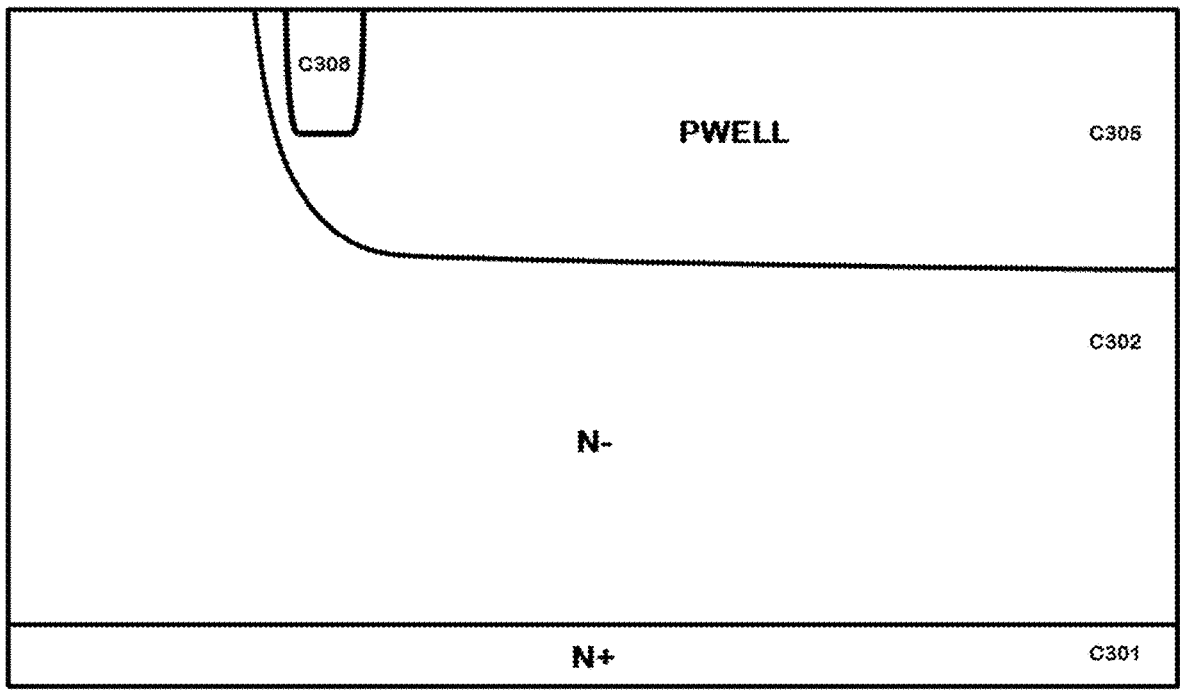
Figure 24J:
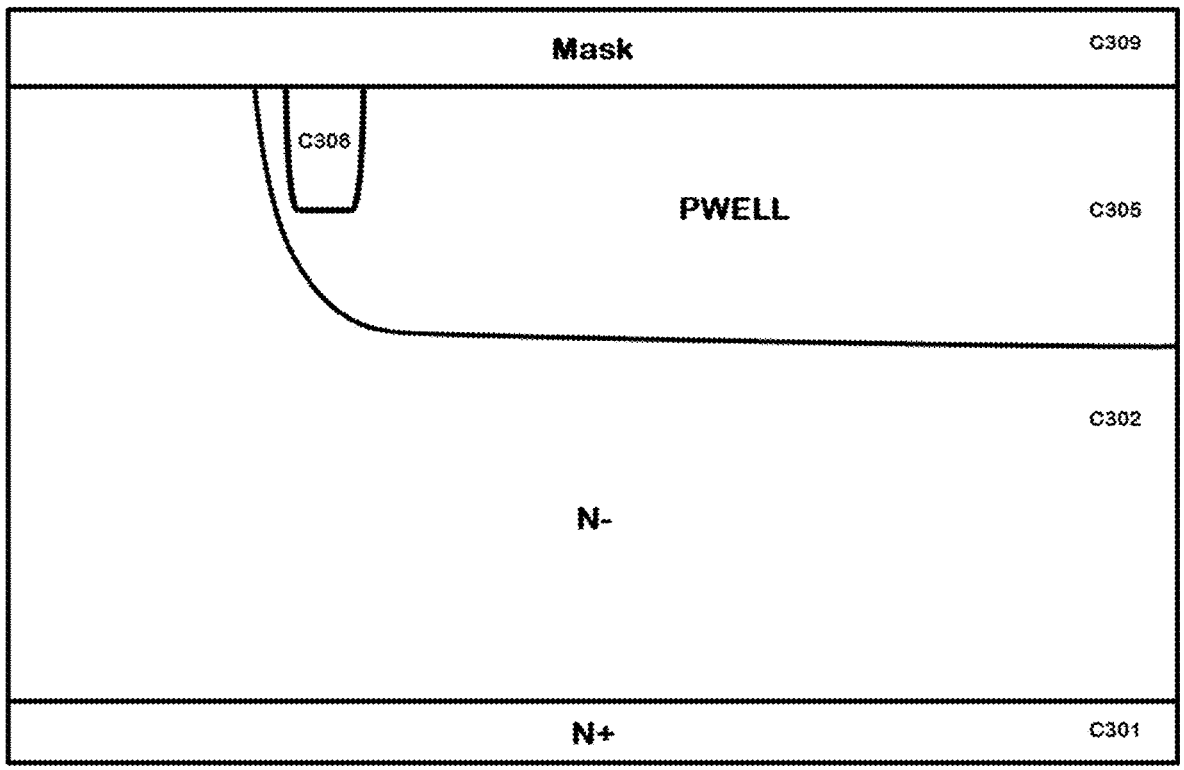
Figure 24K:
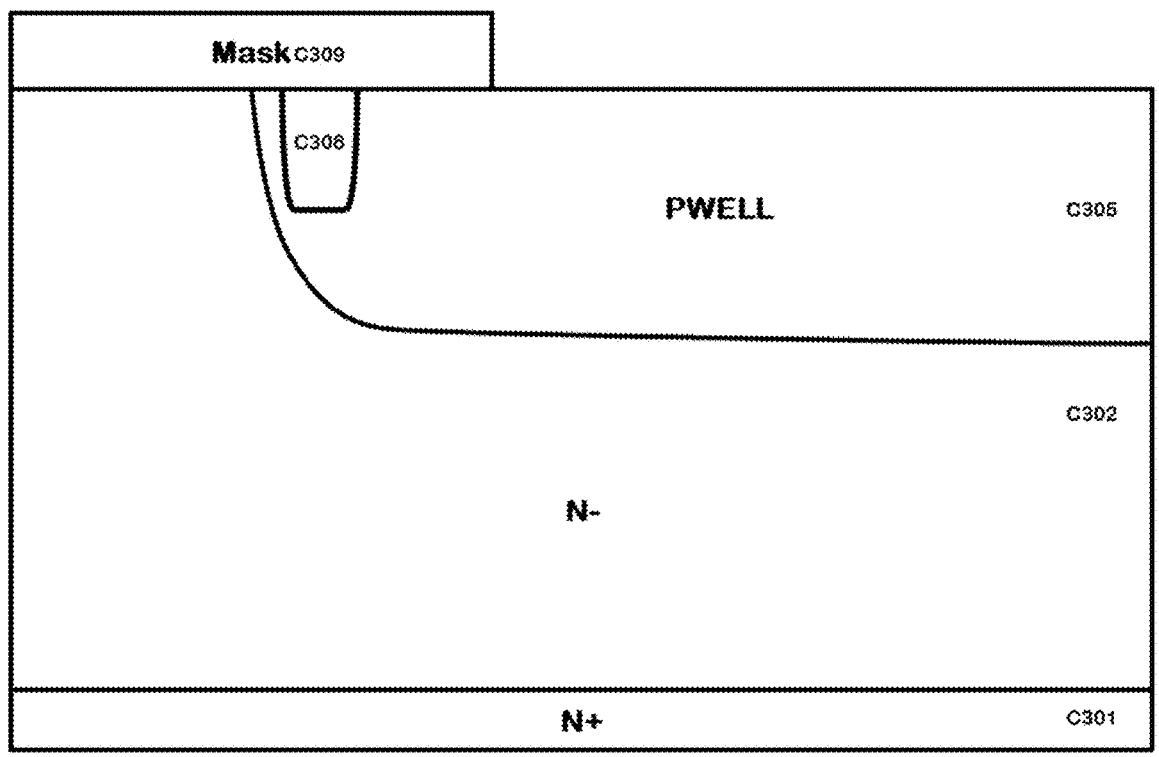
Figure 24L:
Figure 24L:
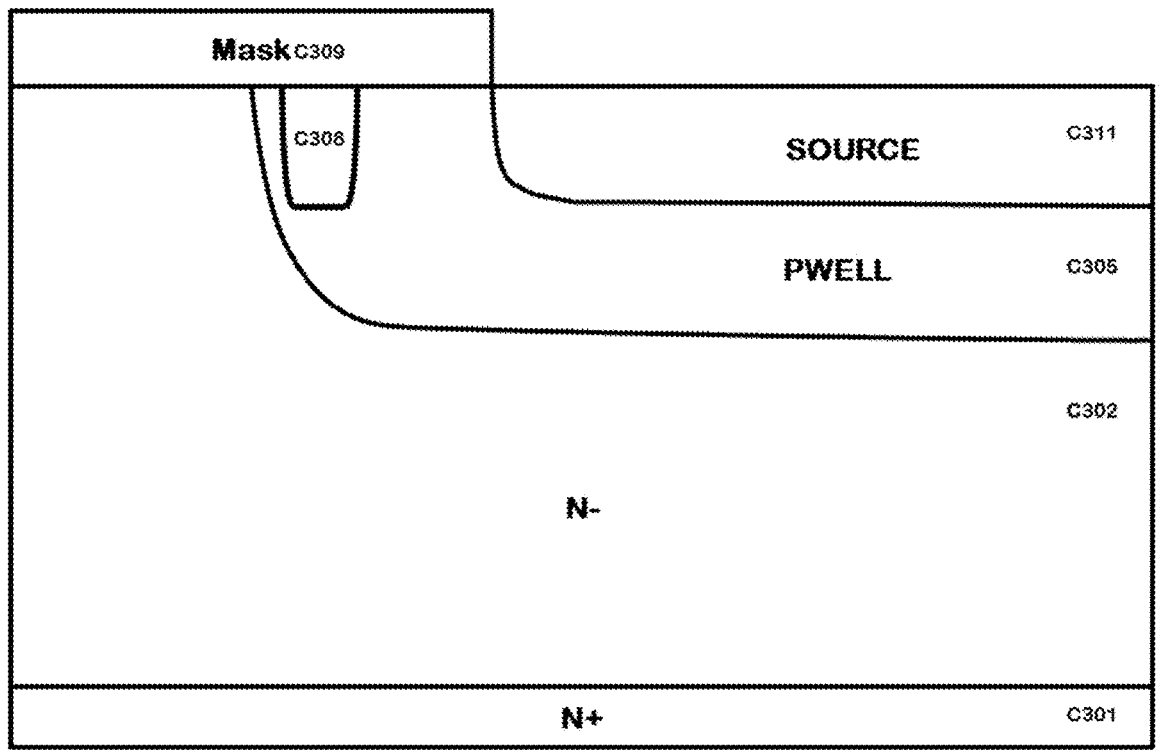
Figure 24M:
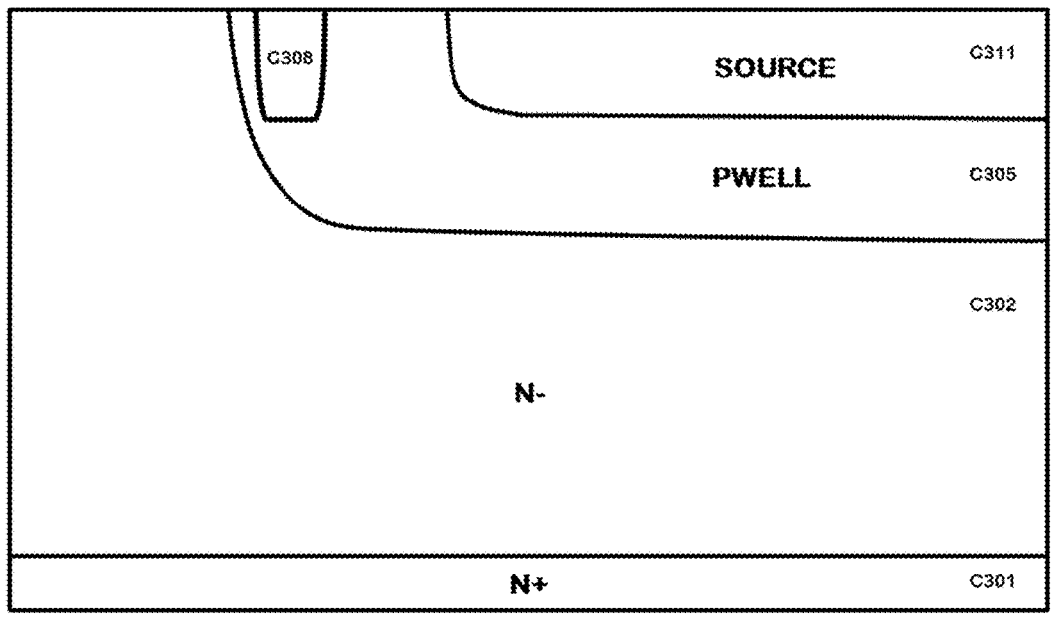
Figure 24N:
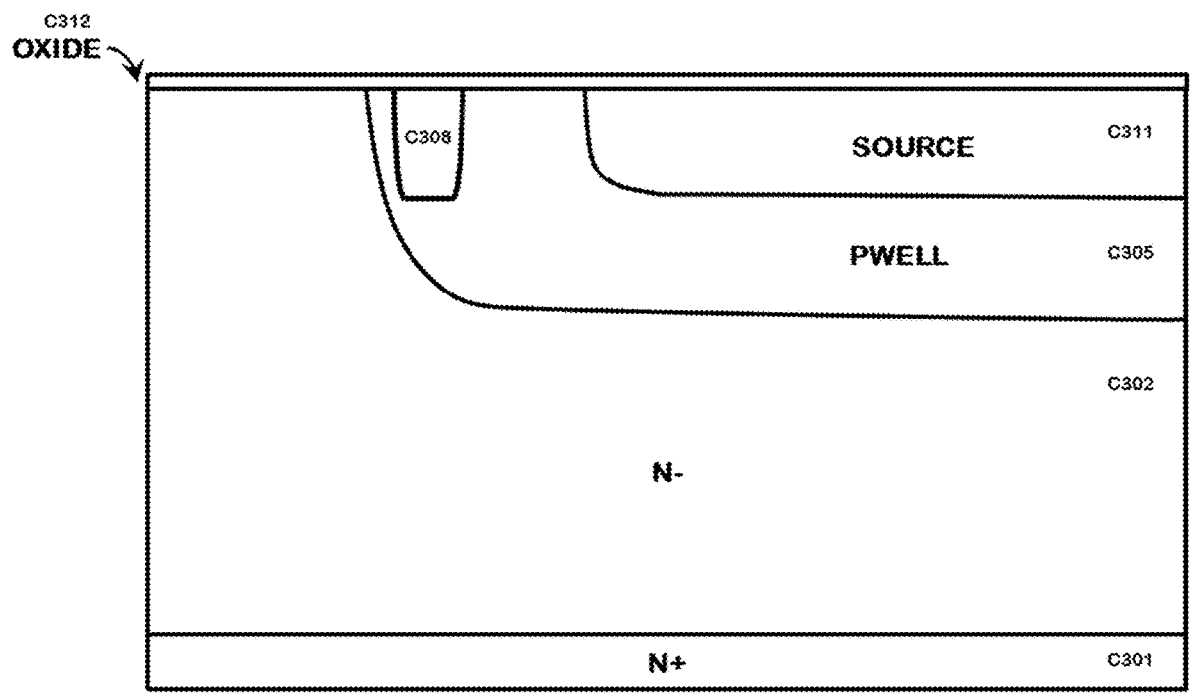
Figure 24O:
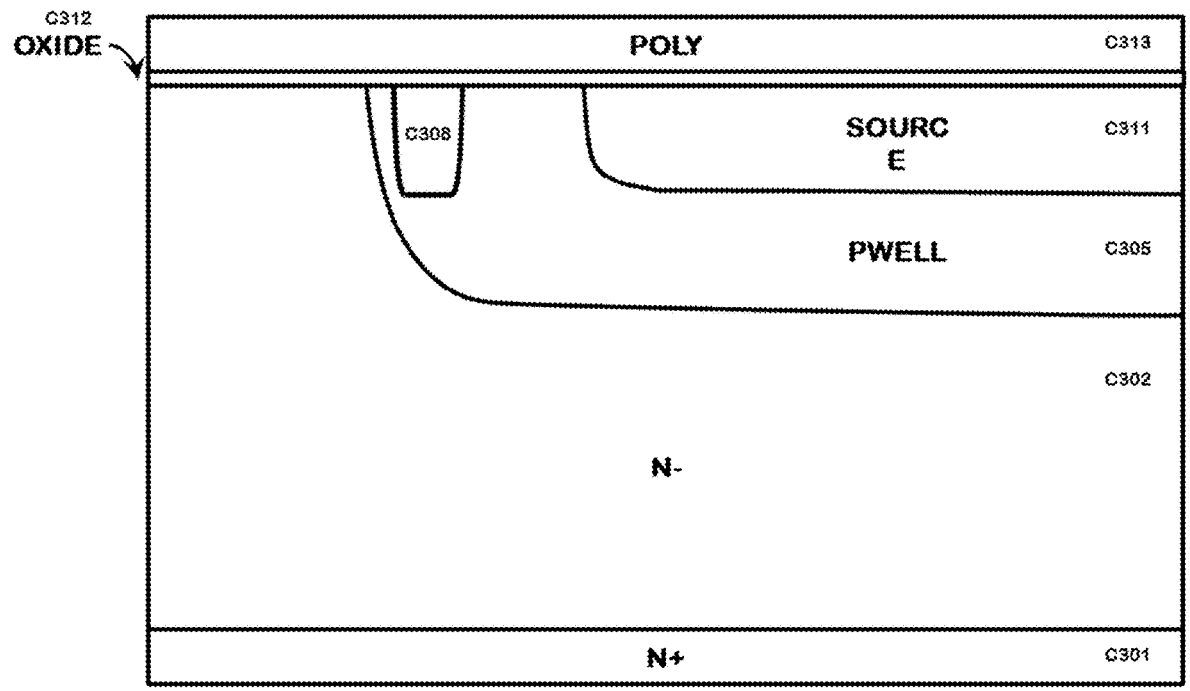
Figure 24P:
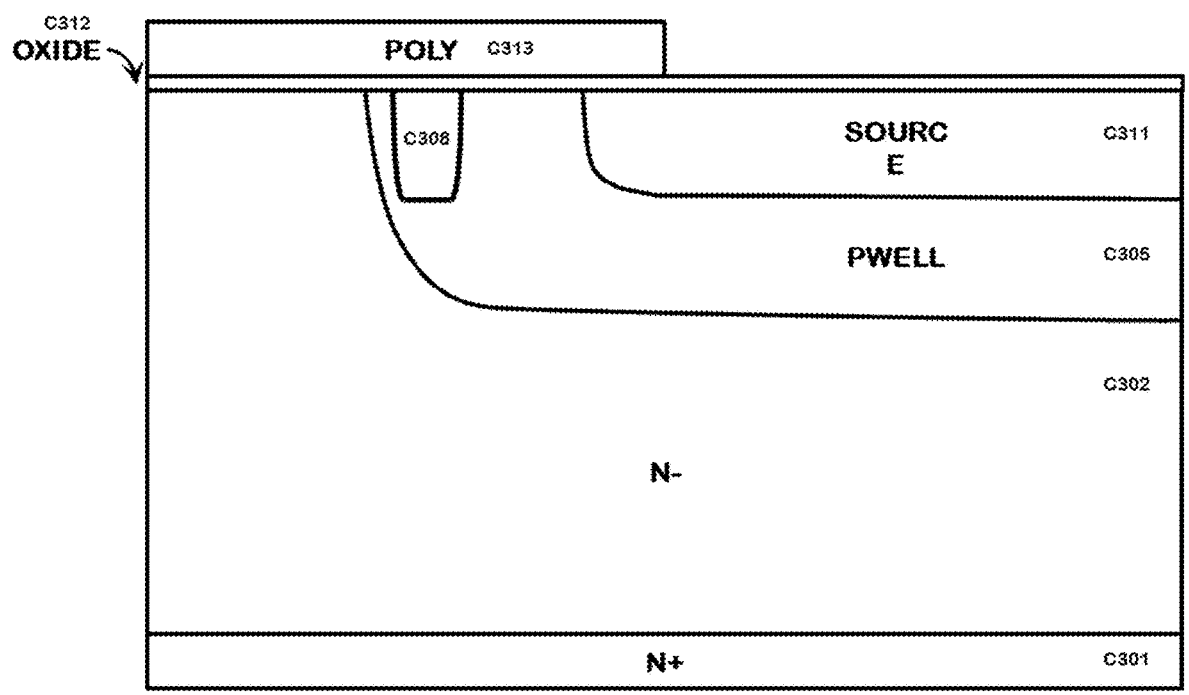
Figure 24Q:
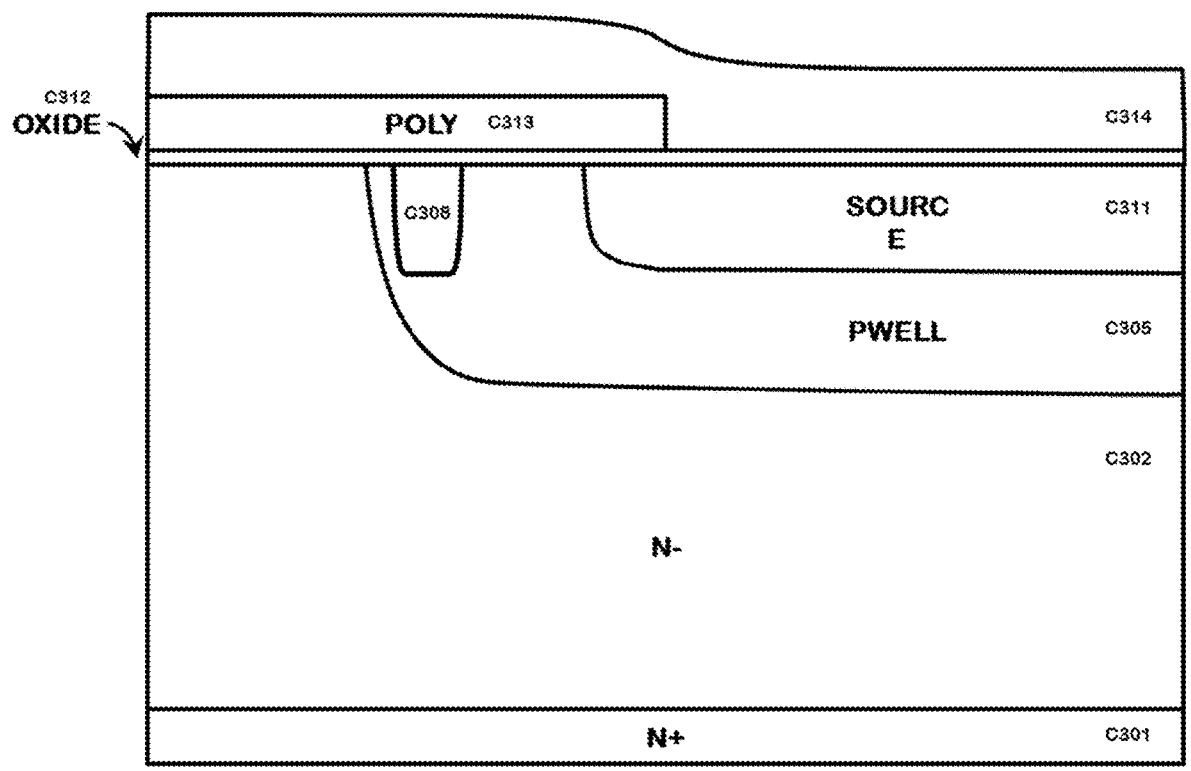
Figure 24R:
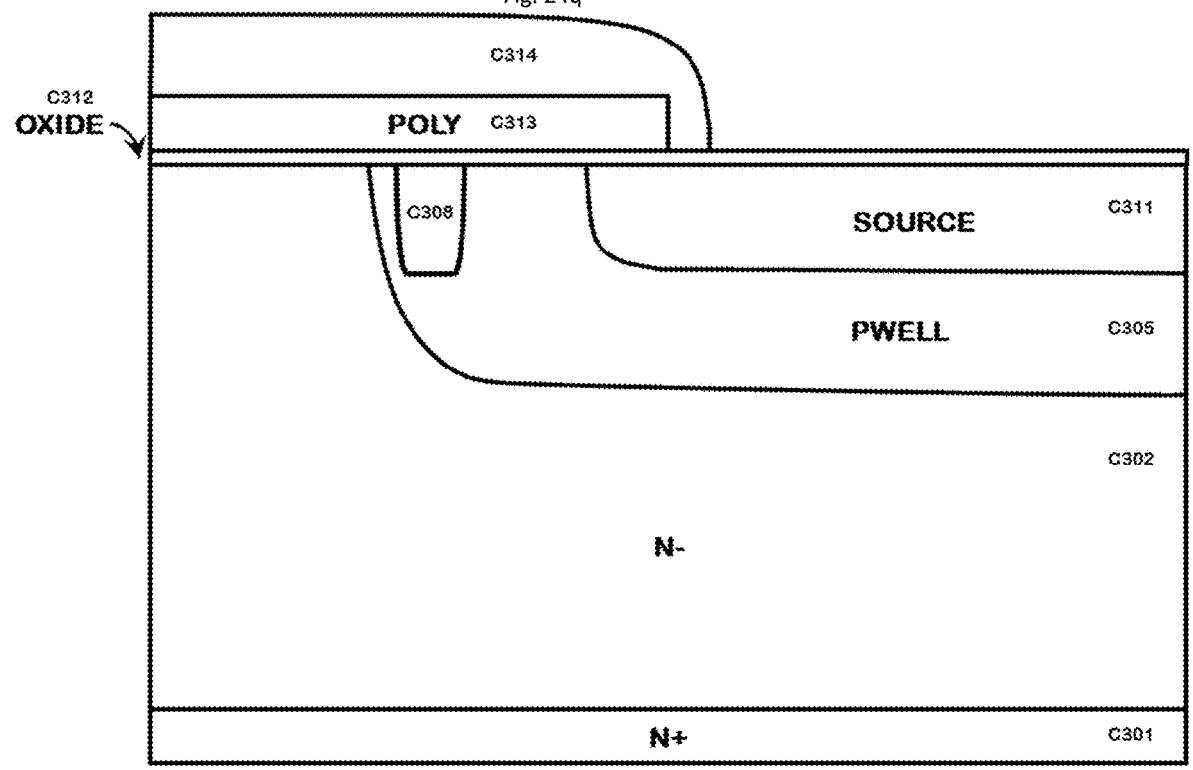
Figure 24S:
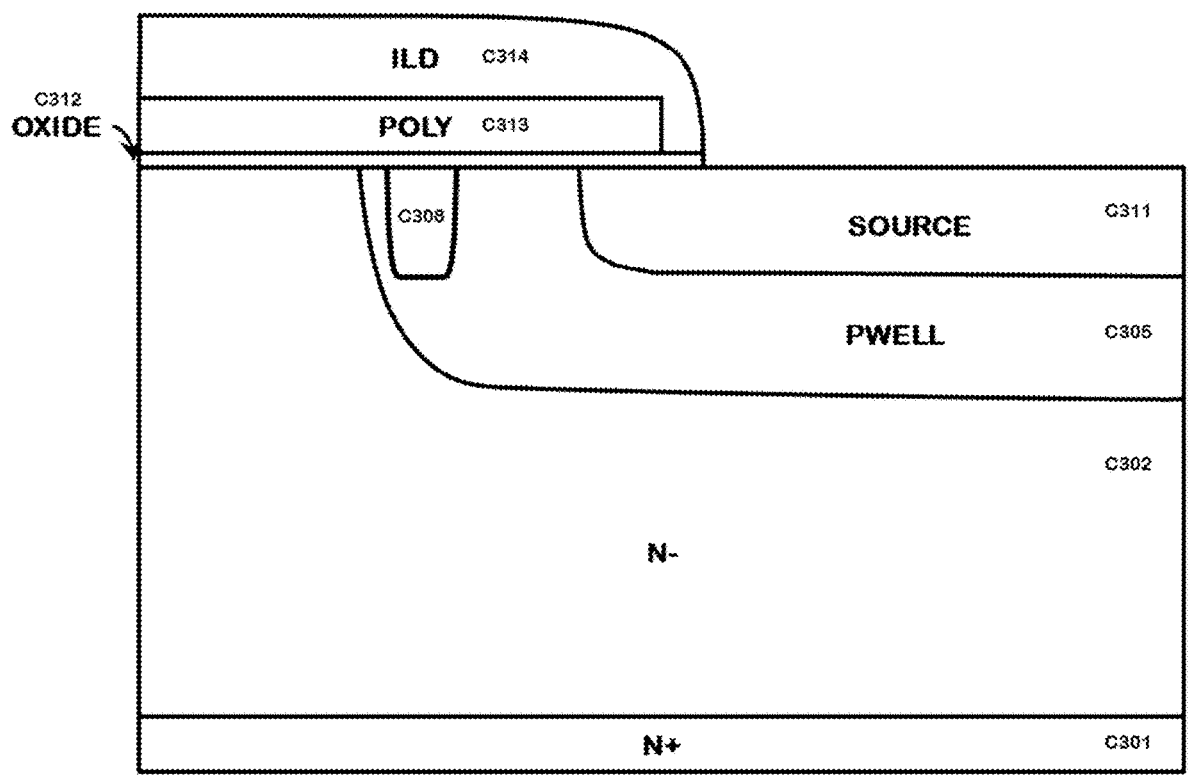
Figure 24T:
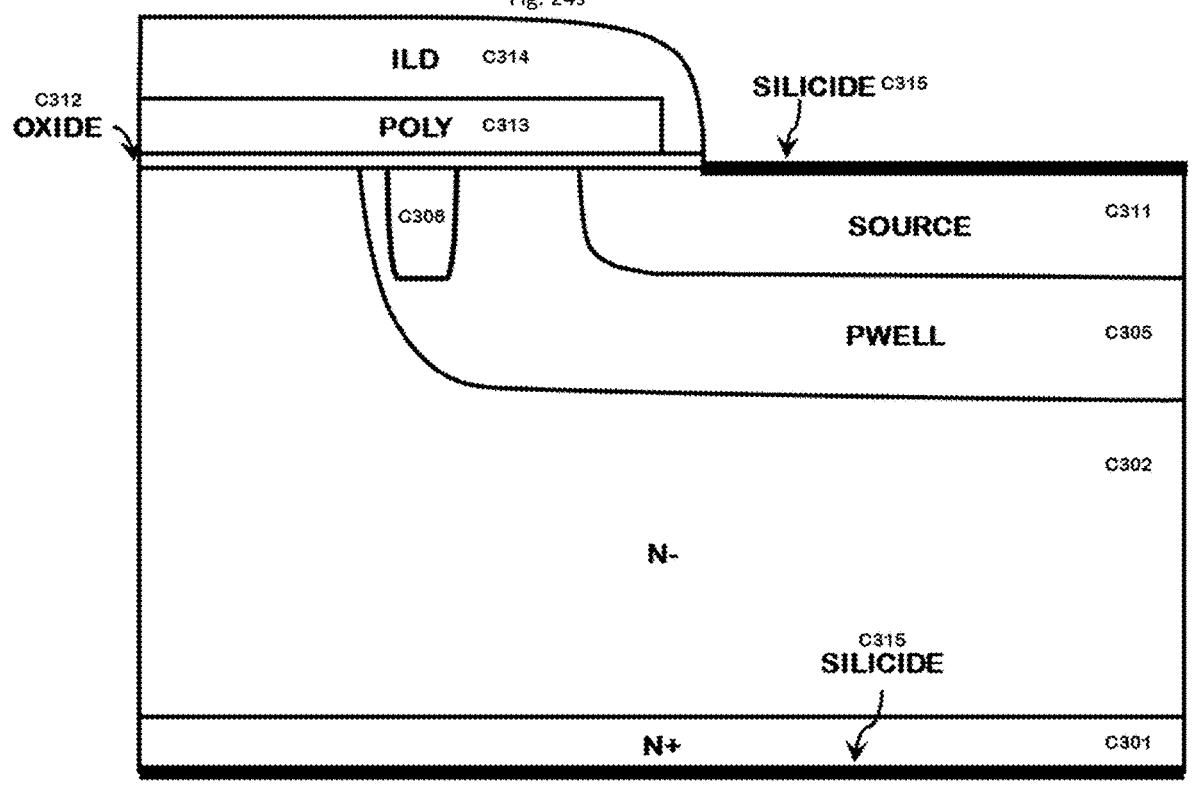
Figure 24U:
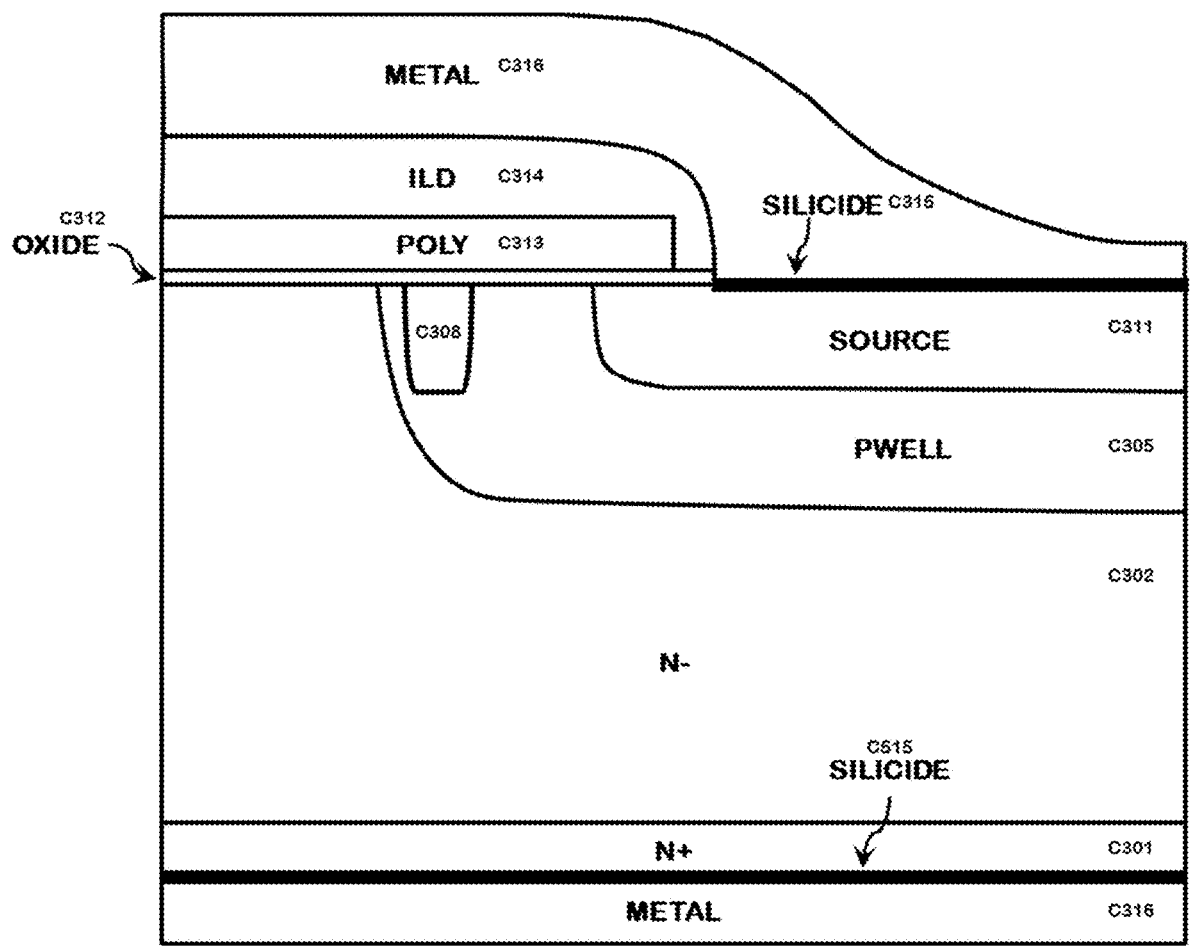

FIG. 24a to FIG. 24u describes the process of manufacturing the structure shown in FIG. 23a. The manufacturing process for a SiC DMOSFET is on a SiC substrate C301 and starts with using a 4H-SiC Si-face epi-wafer with suitable doping ($10^{14}$-$10^{18}$ cm$^{-3}$) and thickness (1 µm to 300 µm) for the epilayer C302 shown in FIG. 24a. A blanket hard mask C303 comprising a chemical vapor deposition (CVD) deposited layer of silicon dioxide, silicon nitride, silicon oxynitride, or a metallic layer such as nickel, with thickness ranging from 50 nm to 5 µm is deposited in FIG. 24b and then patterned using photolithography followed by a dry etch using reactive ion etching (ME) for example as shown in FIG. 24c. The p-well region is first formed by ion-implantation or epitaxial growth using aluminum or boron as the p-type impurity. A p-type implantation C304 comprising boron or aluminum, at energies ranging from 10 keV to 1000 keV, at implant doses ranging from $10^{12}$ cm$^{-2}$ to $10^{15}$ cm$^{-2}$ is performed to create a p-well C305 in FIG. 24d. The patterned mask layer C303 is removed in FIG. 24e.

A hard mask layer C306 is deposited by a CVD deposited layer of silicon dioxide, silicon nitride, silicon oxynitride, or a metallic layer such as nickel, with thickness ranging from 50 nm to 5 µm in FIG. 24f. The mask layer C306 is patterned using photolithography followed by a dry etch using ME for example in FIG. 24g.

A p-type implant C307 is done as shown in FIG. 24h for creating a p-type region inside the p-well called p-shield C308. The p-shield region C308 can be formed using aluminum or boron as the p-type impurity. The doping concentration in the p-shield region may be in the range of 1E16 cm-3 to 1E21 cm-3. The patterned mask layer C306 is removed in FIG. 24i.

A blanket hard mask C309 comprising a chemical vapor deposition (CVD) deposited layer of silicon dioxide, silicon nitride, silicon oxynitride, or a metallic layer such as nickel, with thickness ranging from 50 nm to 5 µm is deposited in FIG. 24j and then patterned using photolithography followed by a dry etch using RIE for example as shown in FIG. 24k.

A N+ source region C311 is formed by ion-implantation or by epitaxial re-growth by a n-type impurity such as nitrogen or phosphorus C310 in FIG. 24l. The patterned mask layer C309 is removed in FIG. 24m.

The oxide layer C312 which is the gate oxide is formed by thermal oxidation or using CVD of a dielectric layer such as silicon dioxide, silicon nitride, silicon oxynitride, etc. in FIG. 24n. The thickness of the gate oxide could range from 10 nm to 100 nm. Either dry or wet thermal oxidation could be used for oxide growth. Plasma-enhanced chemical vapor deposition (PECVD) or low-pressure chemical vapor deposition (LPCVD) could be used for gate oxide deposition. A polysilicon gate layer C313 is then deposited in FIG. 24o. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. The polysilicon layer C313 is patterned in FIG. 24p. An ILD layer C314 comprising 50 nm-1000 nm thick silicon dioxide, silicon nitride, silicon oxynitride layers or a stacked combination thereof is deposited on the wafer in FIG. 24q. The ILD layer C314 is patterned in FIG. 24r. The gate oxide C312 is patterned in FIG. 24s.

Nickel silicide regions C315 are formed on the exposed SiC surface in FIG. 24t. Interconnect metal layers C316 of either aluminum or silver or gold is deposited and patterned on the top and bottom of the substrate in. FIG. 24u.

Figure 25A:
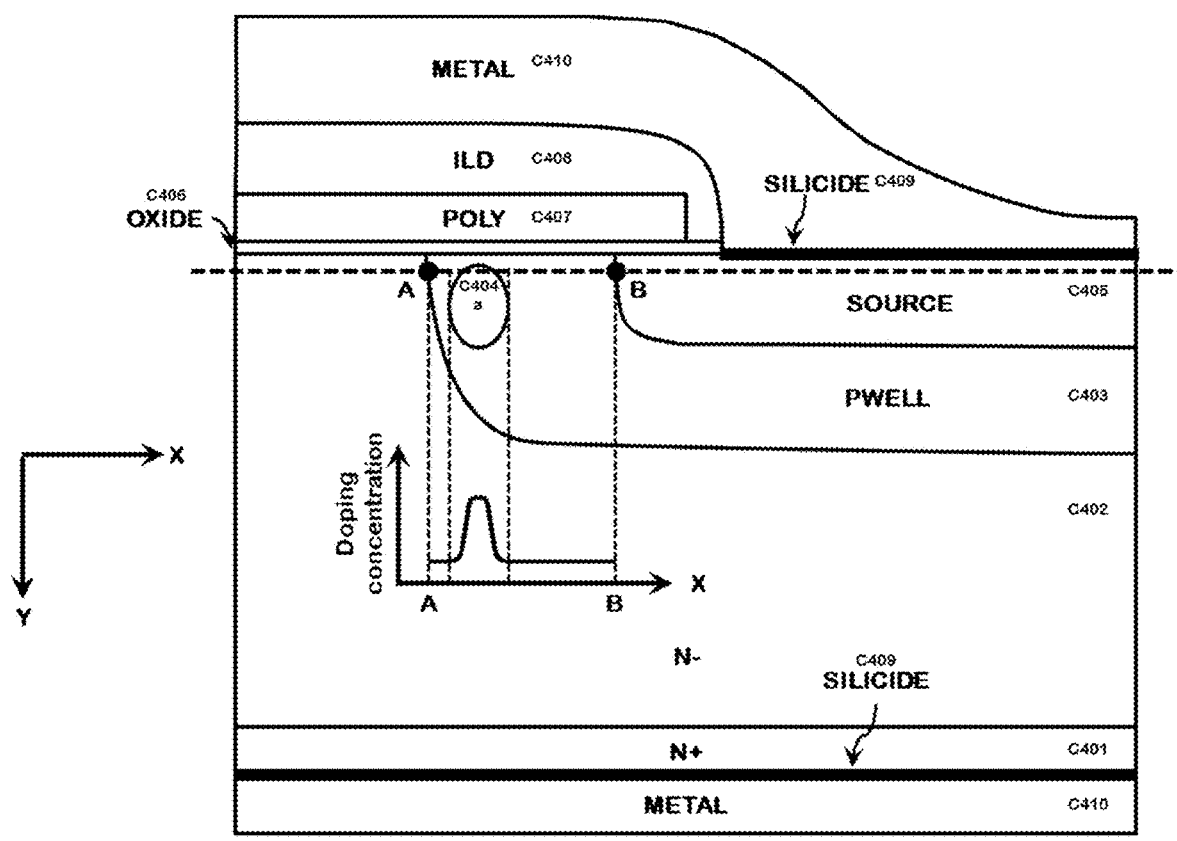
FIG. 25a to FIG. 25d show embodiments of a SiC DMOSFET structure for field shielding formed buried within the p-well structure.

An embodiment shown in FIG. 25a is the half unit cell of a cross-sectional structure of a SiC DMOSFET. The key regions of this device are a p-well region C403, which is formed by ion-implantation or epitaxial re-growth of a p-type species such as aluminum or boron. There is an N+ source region C405, N− drift layer C402, and an N+ substrate C401. In the ON state when a gate voltage is applied to the polysilicon gate C407 the current flows vertically from the drain C401, through the inversion layer which is formed at the top of the p-well layer C403, through the N+ source region C405, and out through the source metallization C410. In the OFF state or the blocking state, a voltage is supported across the p-well C403, N− drift layer C402 junction and there is a PN junction which is formed between the p-well and the N− drift layer. The voltage applied to the structure is supported across this PN junction in the reverse bias. There are several key features in a power MOSFET, which include the pitch of the unit cell, which is the repeat unit for the MOSFET, the channel length, which is the portion of the p-well in which the inversion channel is formed, the distance between two successive p-wells, which is referred to as the junction field-effect transistor region (JFET region) or the JFET gap and the thickness of the gate oxide C406. Another feature is an ILD layer C408 which is used to insulate the source interconnect metallization C410 from the polysilicon gate C407. Nickel silicide regions C209 are formed on the exposed SiC surface.

A p-shield region C404a is formed buried within the p-well structure. In other words, the p-shield is formed beneath the SiC surface, where the MOSFET channel is located. The p-shield region always originates within the p-well region as seen in FIG. 25a, but may in certain examples of this embodiment the p-well region C404b extend beyond the vertical extent of the p-well region as shown in FIG. 25b.

Figure 25B:
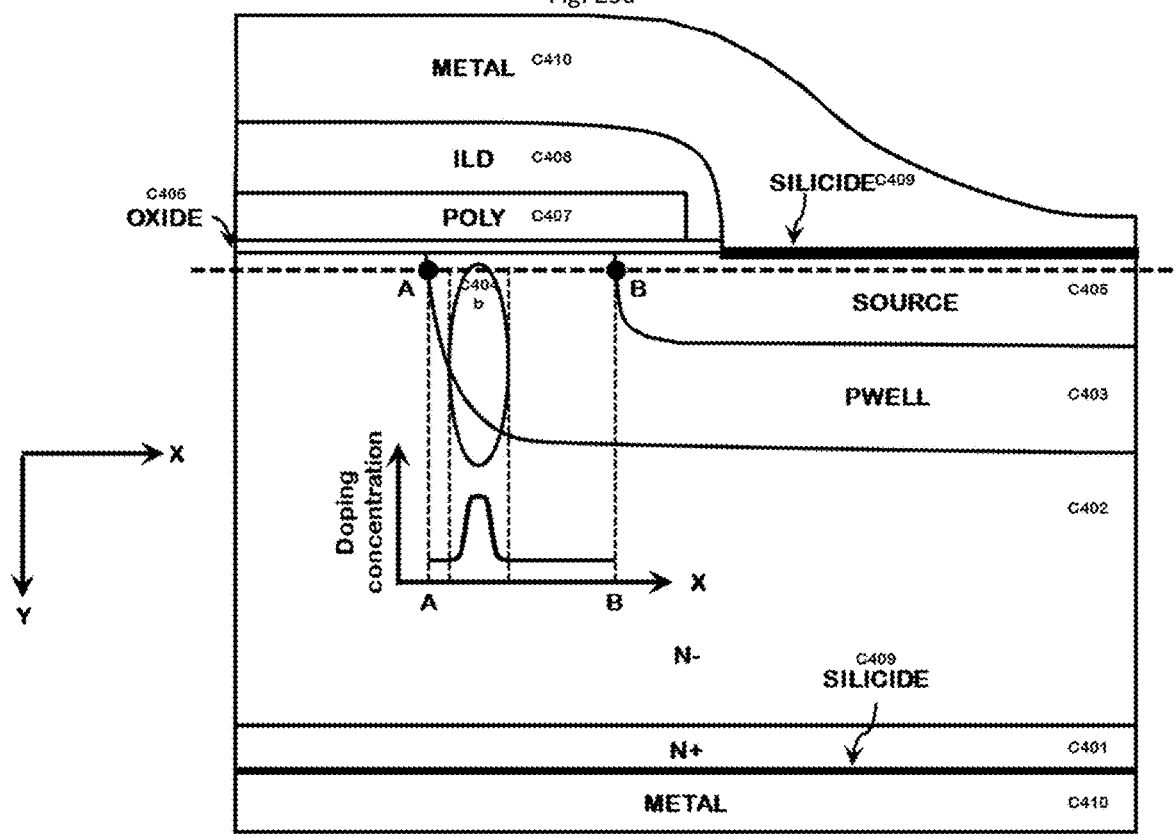

The embodiment shown in FIG. 25b is similar to that of FIG. 25a except that the bottom of the p-shield region C404b is extended further down into the p-well and can reach outside the p-well region.

Figure 25C:
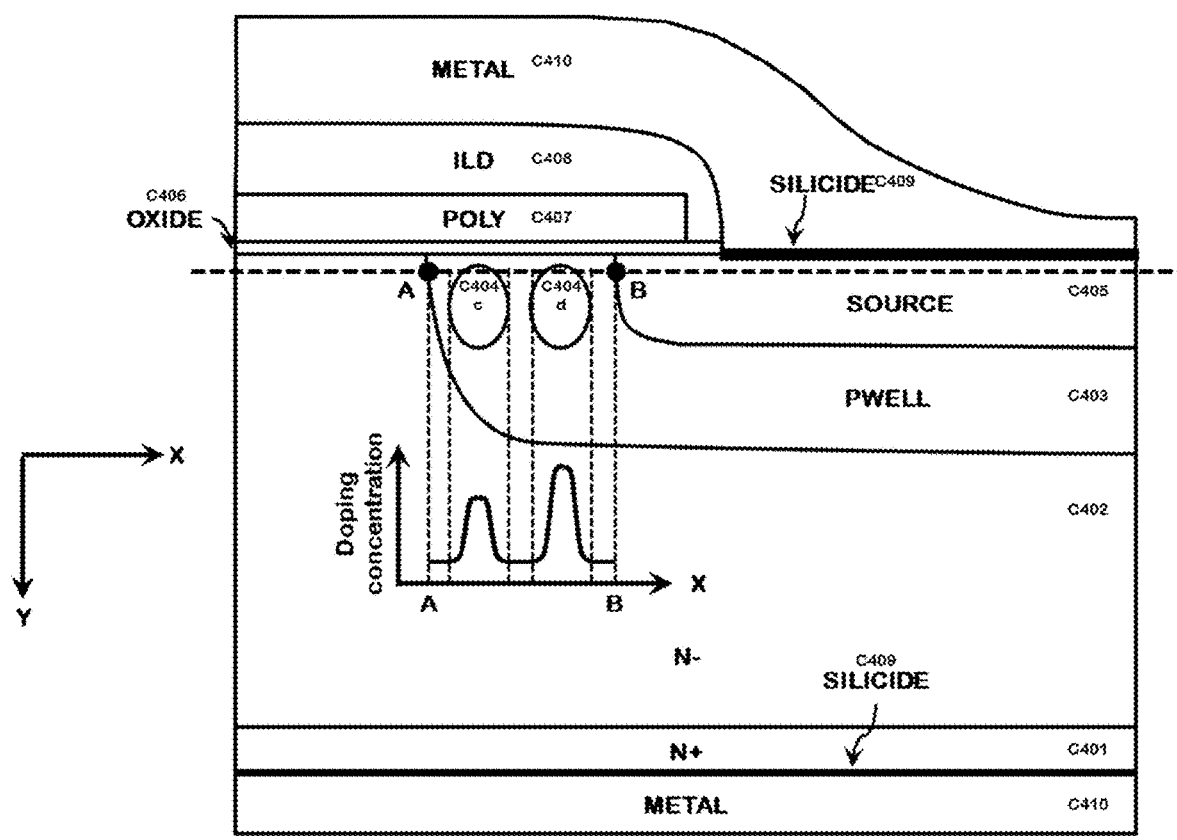
Figure 25D:
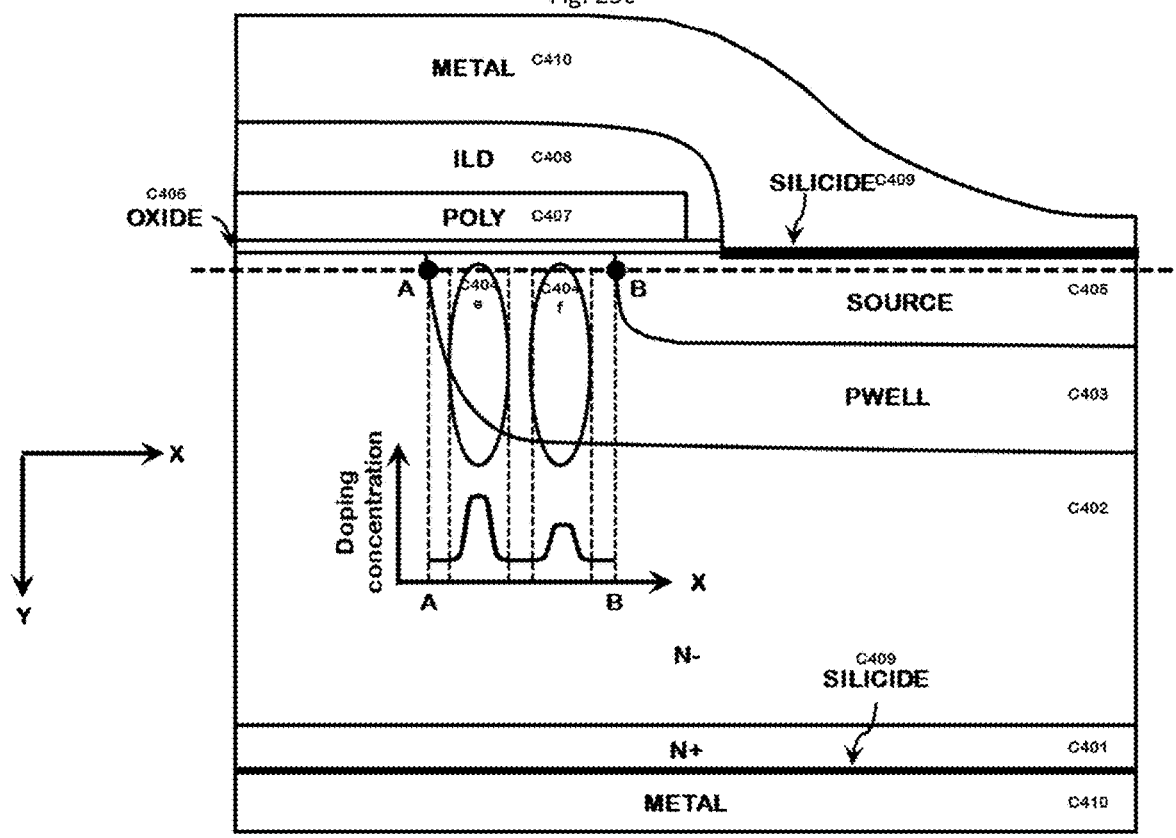

Device structures shown in FIG. 25c and FIG. 25d are also similar to the device in FIG. 25a but they exemplify the case where there are multiple p-shield regions. The devices in FIG. 25c and FIG. 25d exemplify the case where there are multiple p-shield regions namely C404c and C404d in FIG. 25c and C404e and C404f in FIG. 25d. In these cases, their doping concentration profiles of the different p-shield regions do not necessarily have be the same and can be different from each other. Point A and B in each of these figures are given as the reference points for describing how the doping profile of the implanted p-shield region looks like.

The p-shield in FIG. 25a to FIG. 25d "re-enforces" the doping of the p-well region locally and provides better shielding of the MOSFET channel at the surface, while minimizing the DIBL effect. Since the p-shield is not directly connected to the channel, the p-shield in this case does not change the threshold voltage. The device shown in FIG. 25a provides the same kind of field shielding for mitigating the DIBL but does not require the change of the threshold voltage value where it is inevitable for the device of FIG. 23a.

Figure 26A:
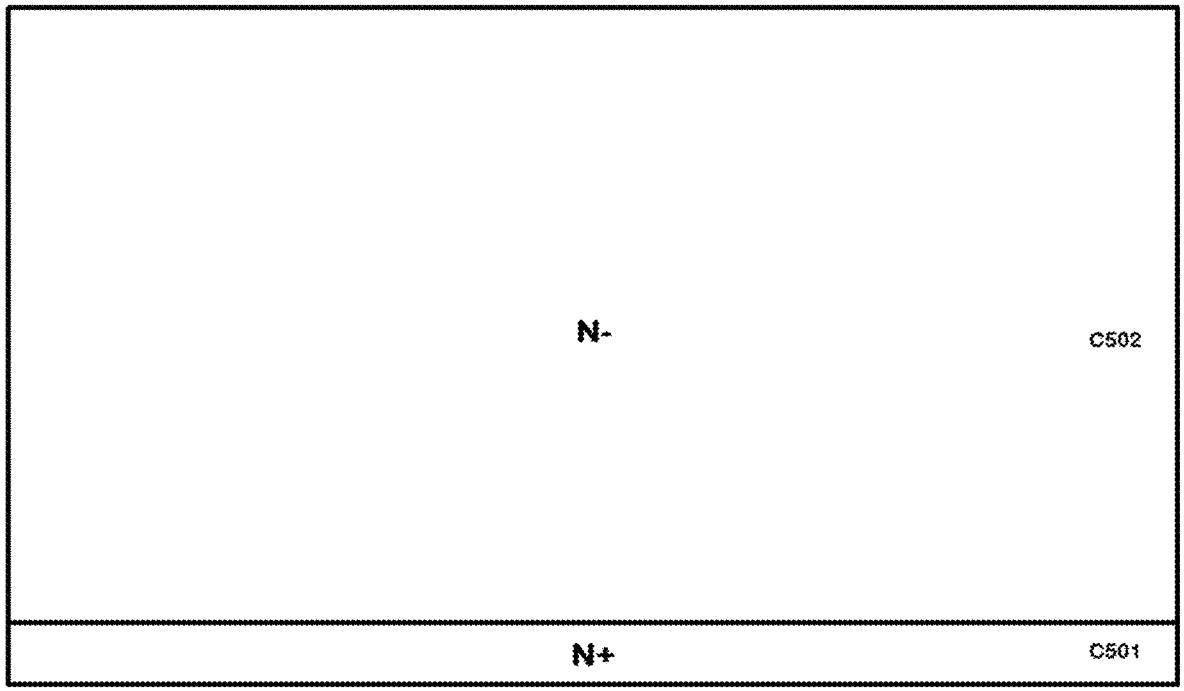
Figure 26B:
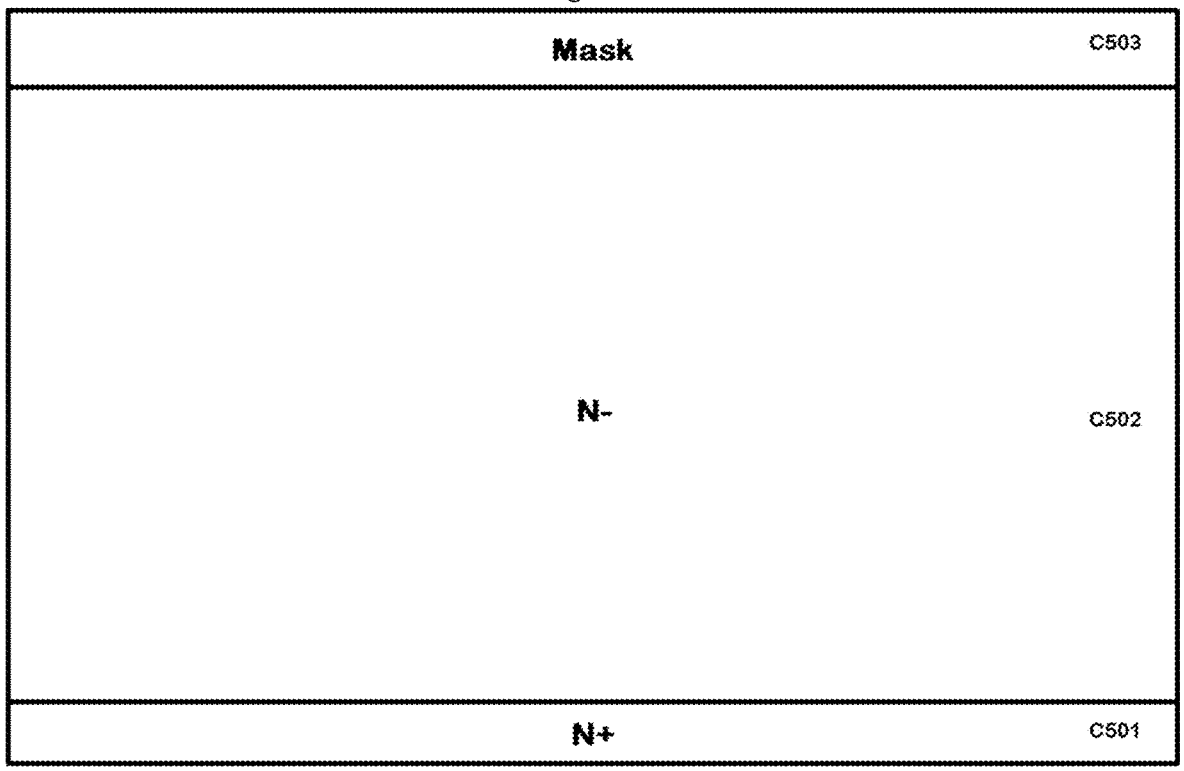
Figure 26C:
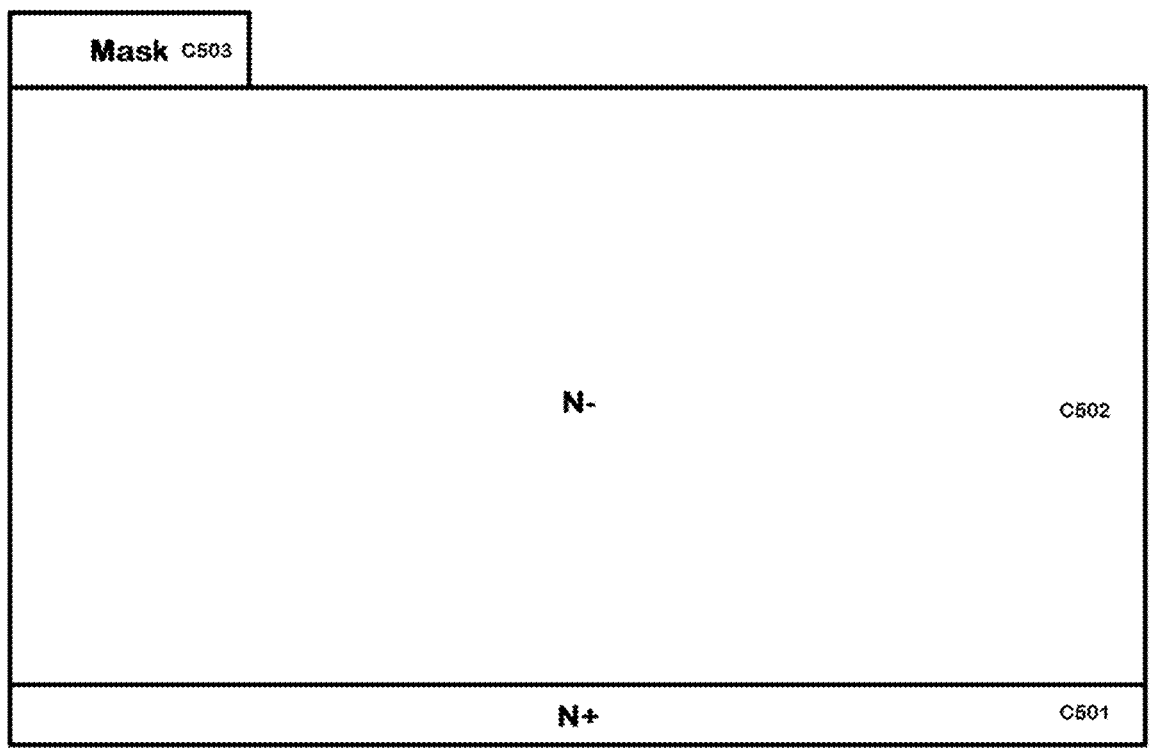
Figure 26D:
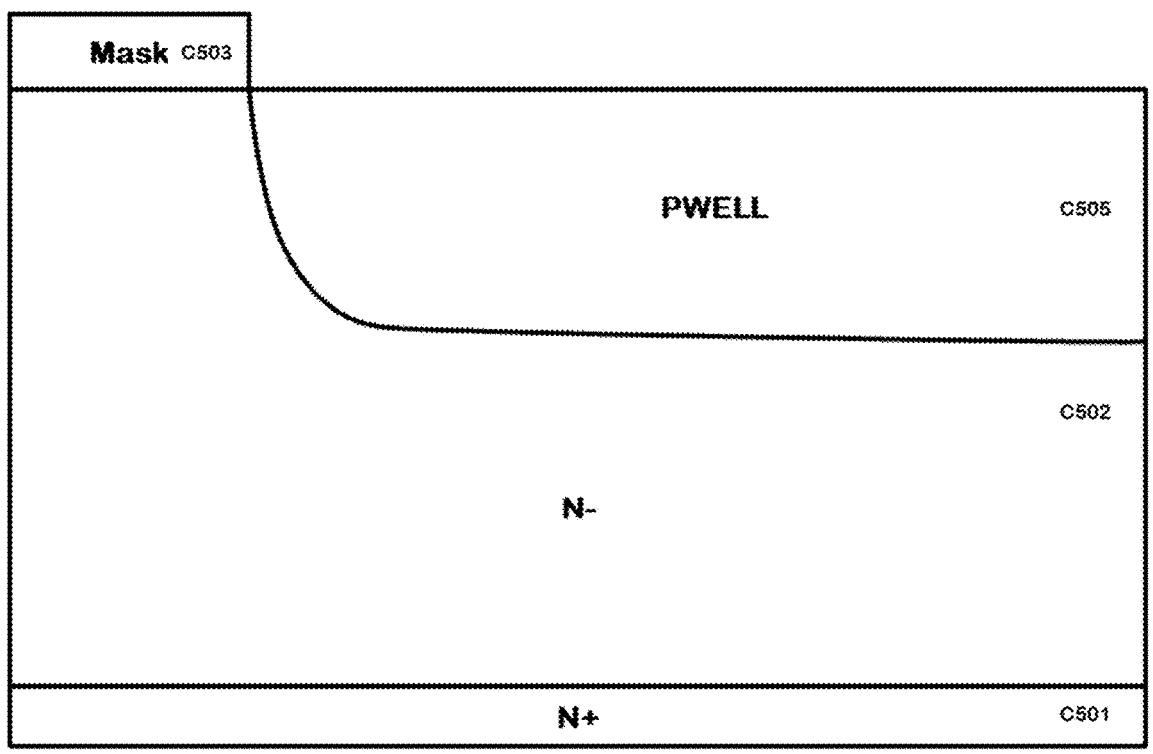
Figure 26E:
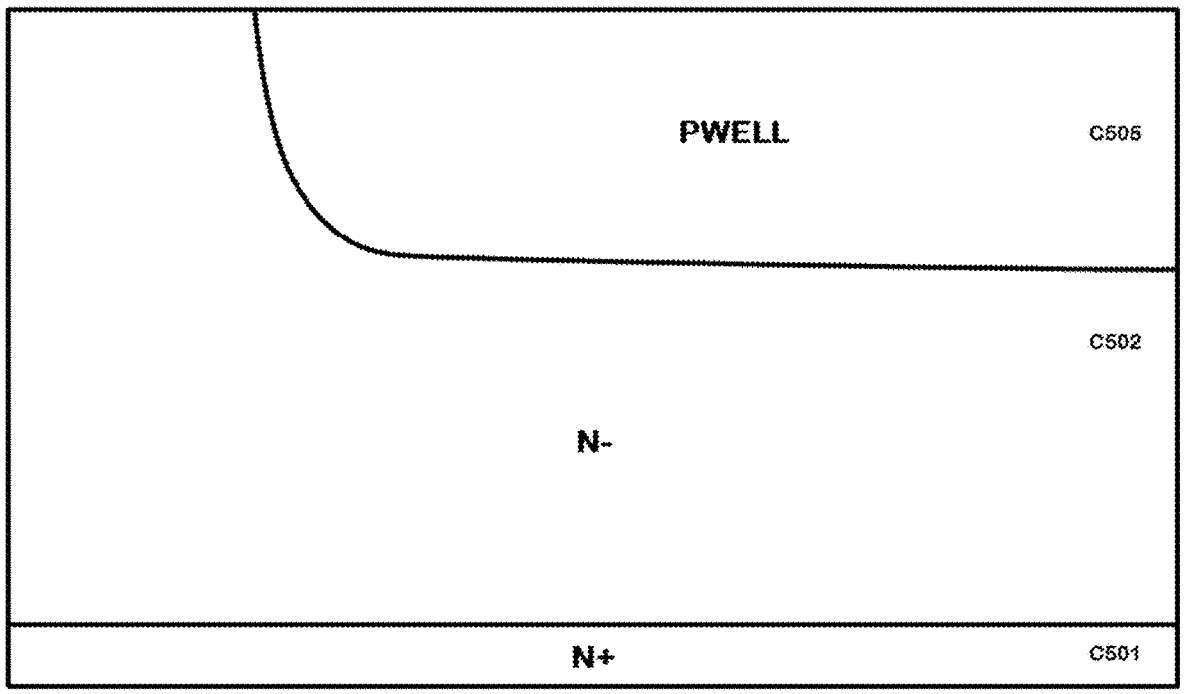
Figure 26F:
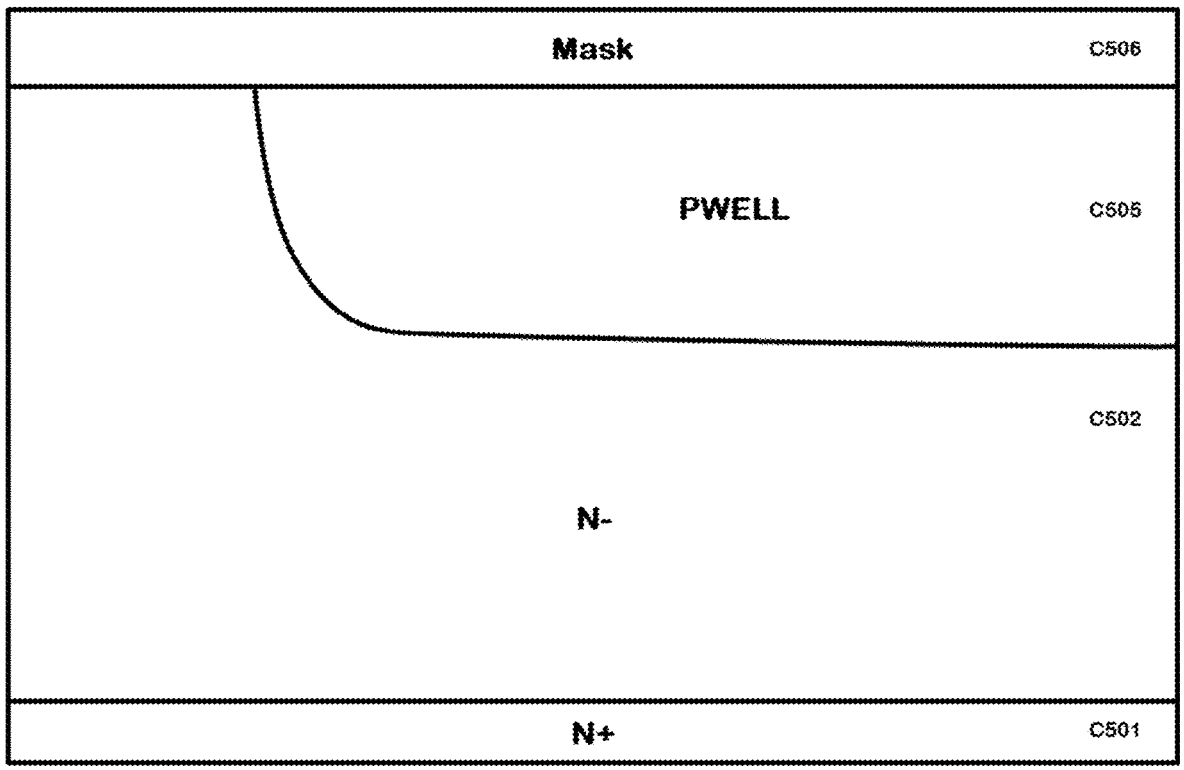
Figure 26G:
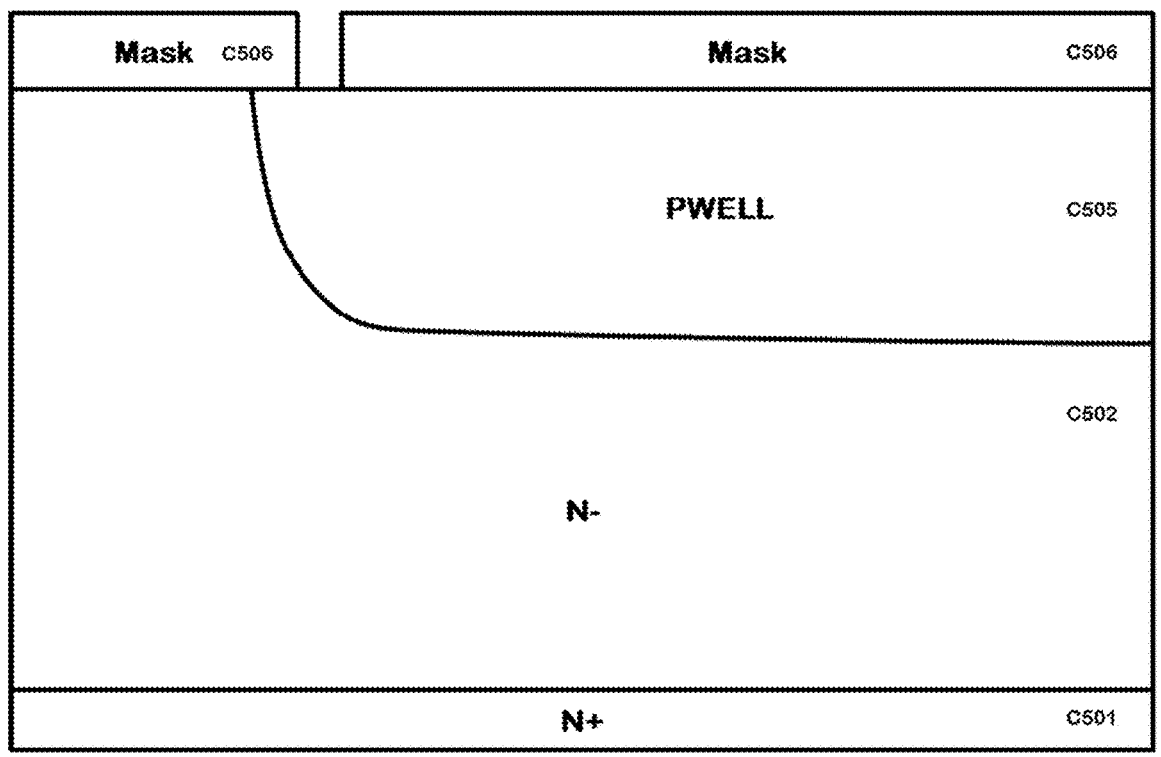
Figure 26H:
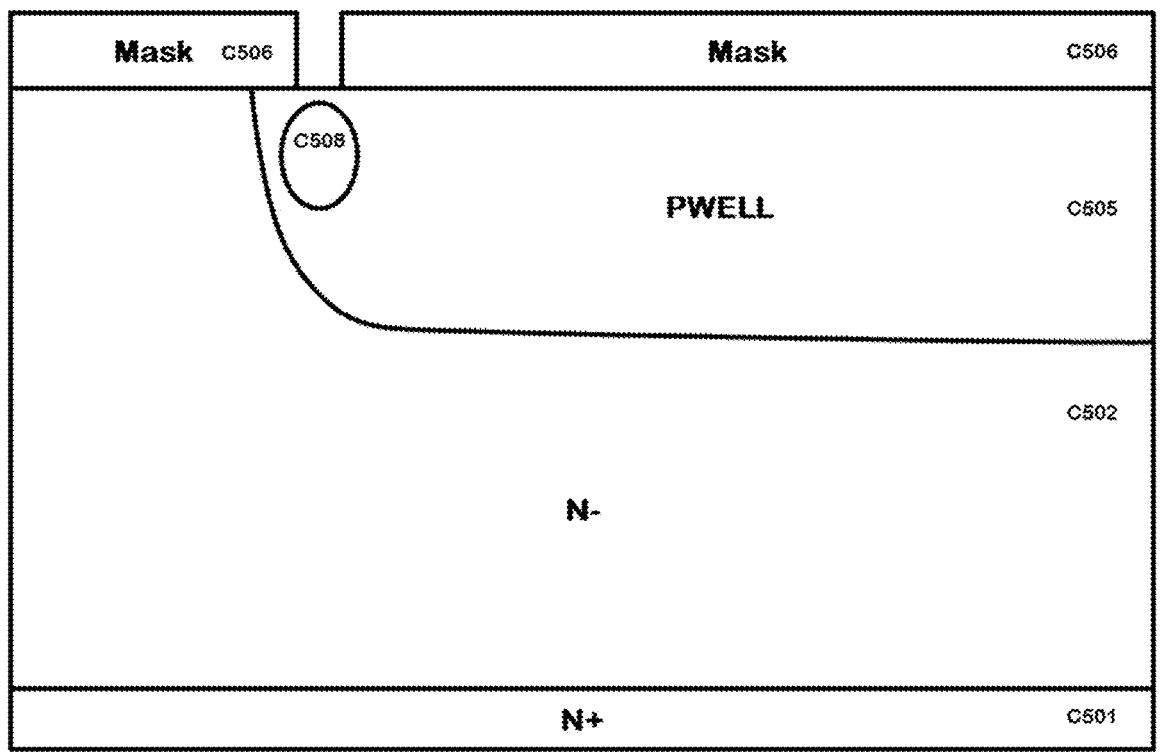
Figure 26I:
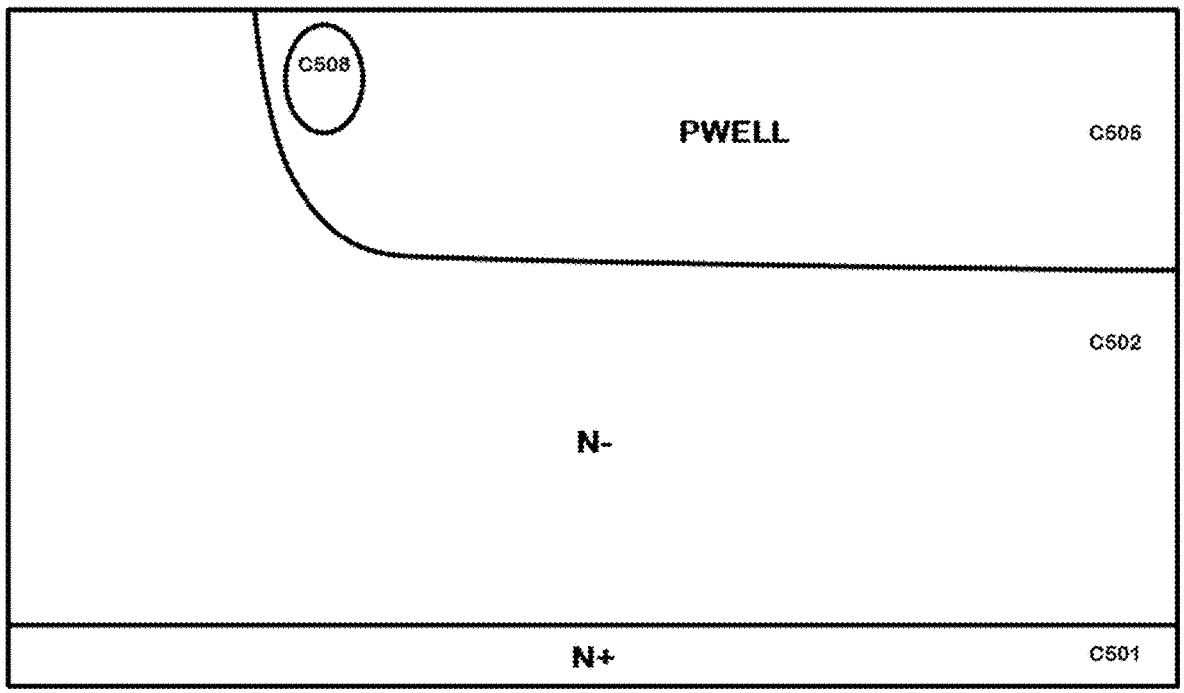
Figure 26J:
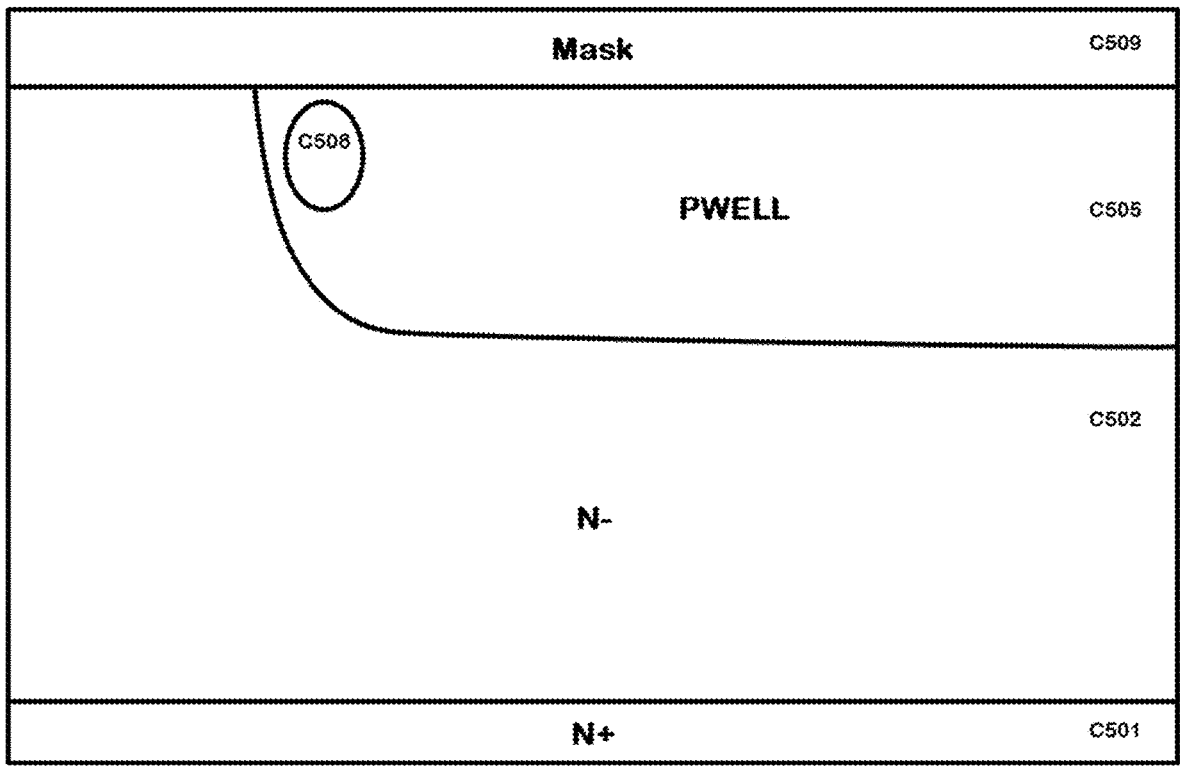
Figure 26K:
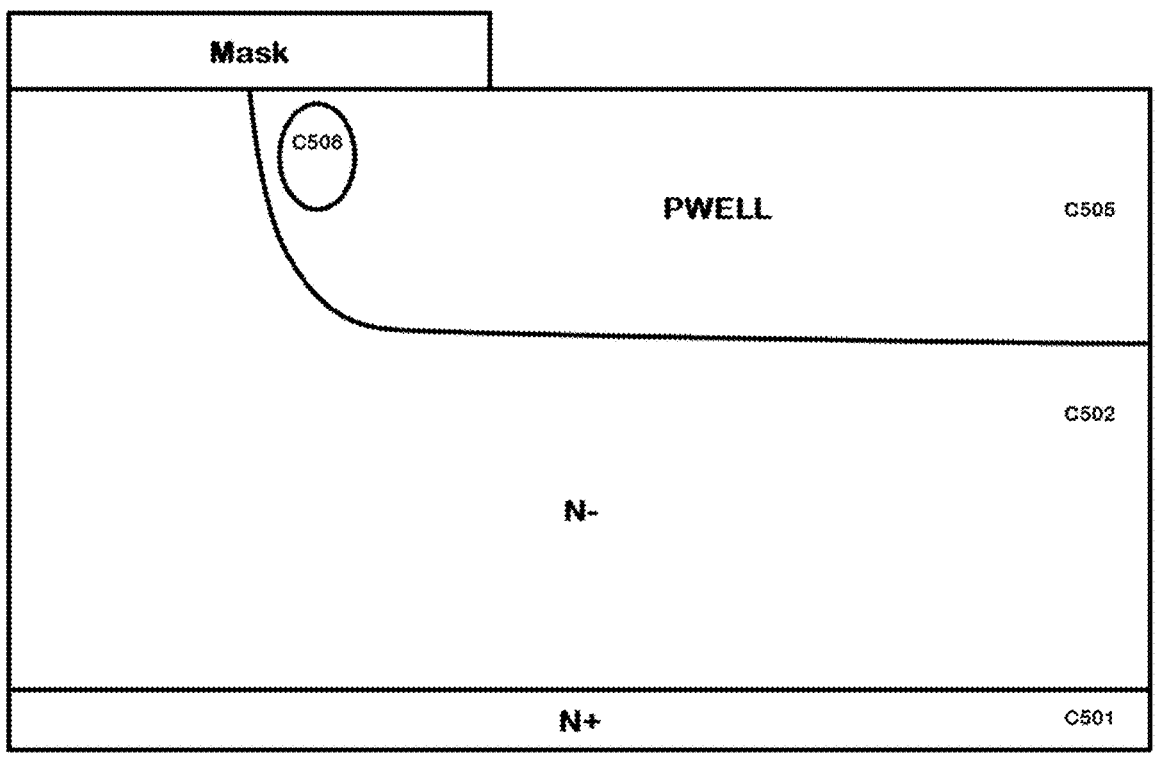
Figure 26L:
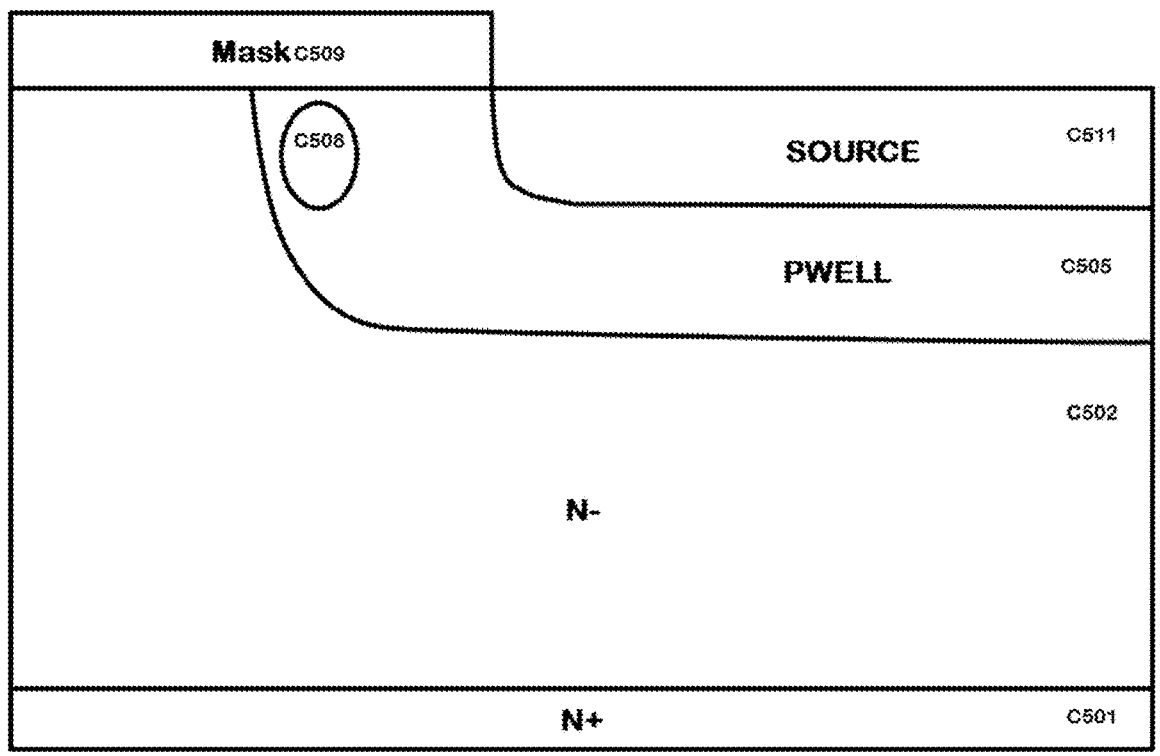
Figure 26M:
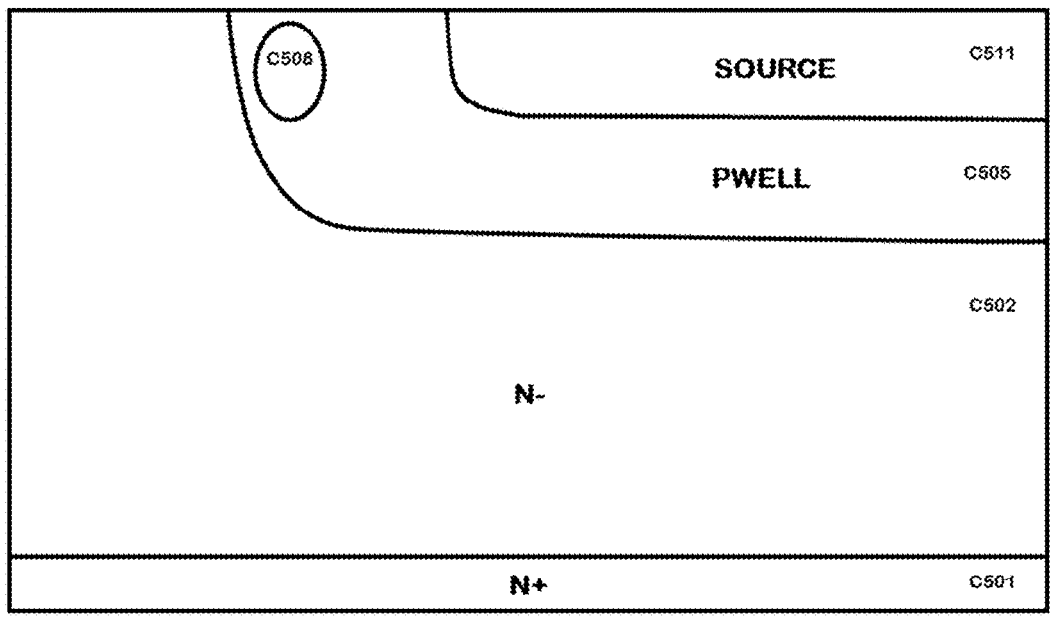
Figure 26N:
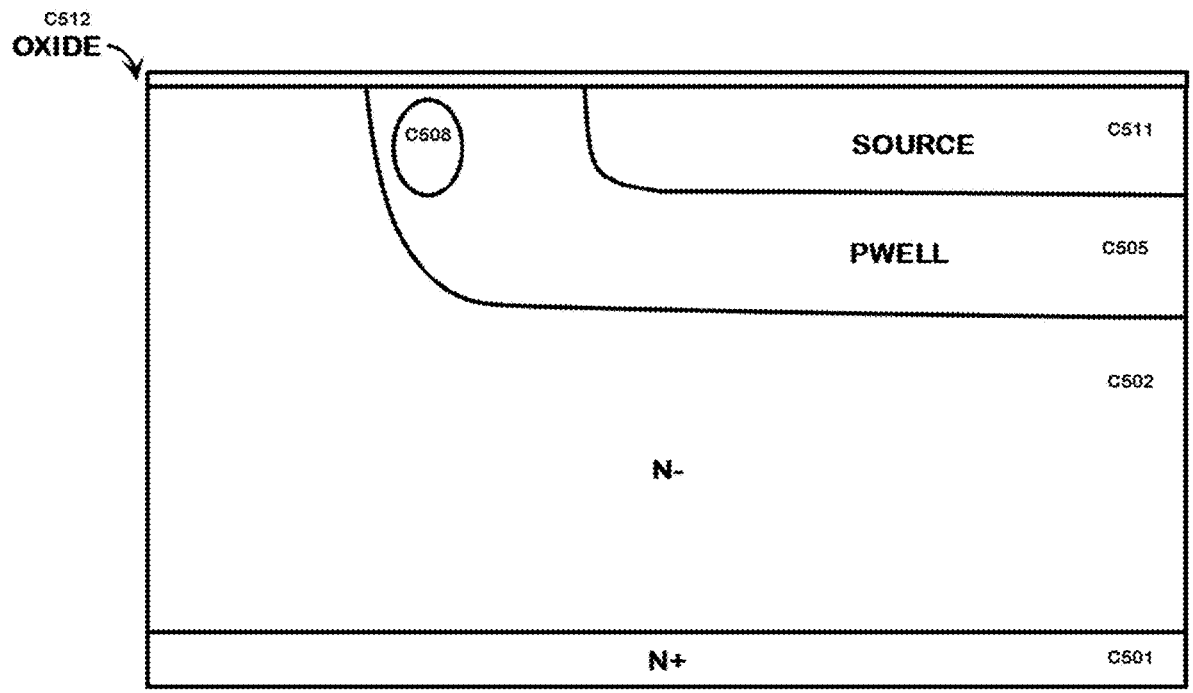
Figure 26O:
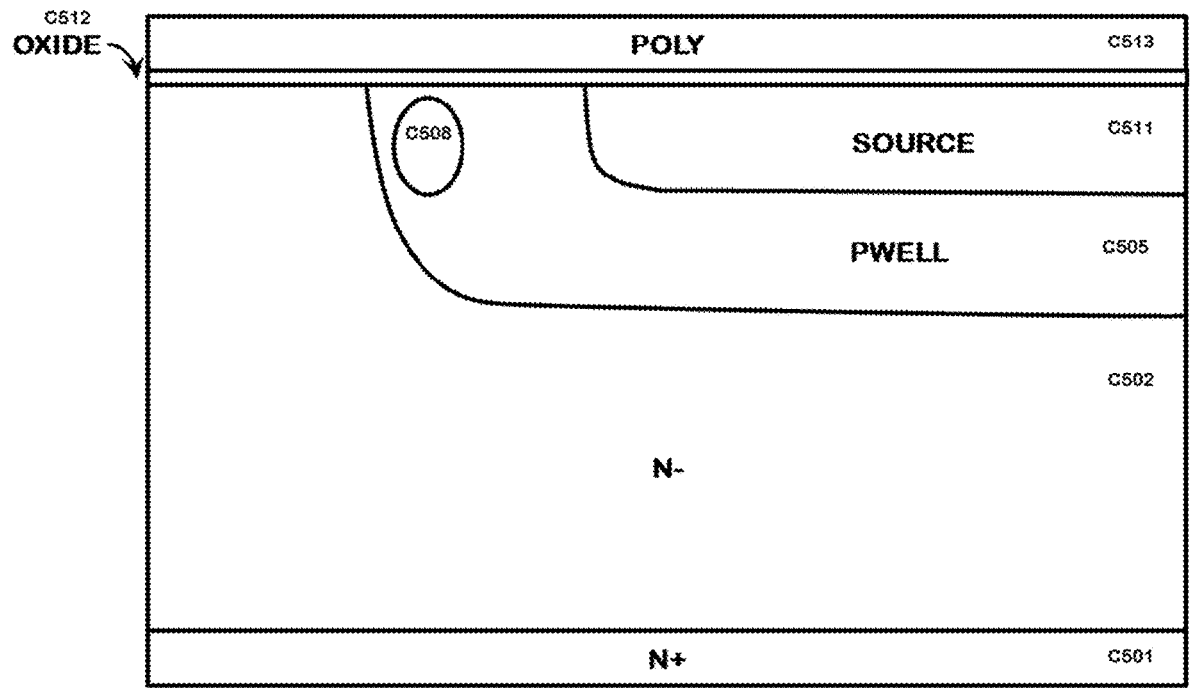
Figure 26P:
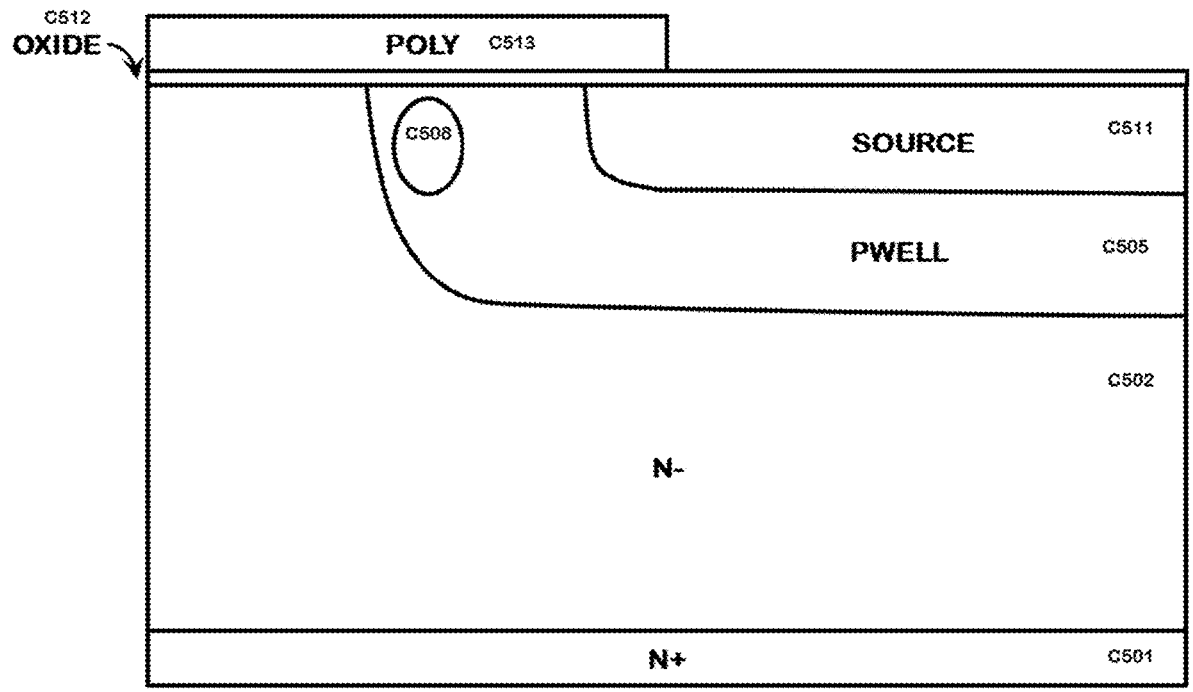
Figure 26Q:
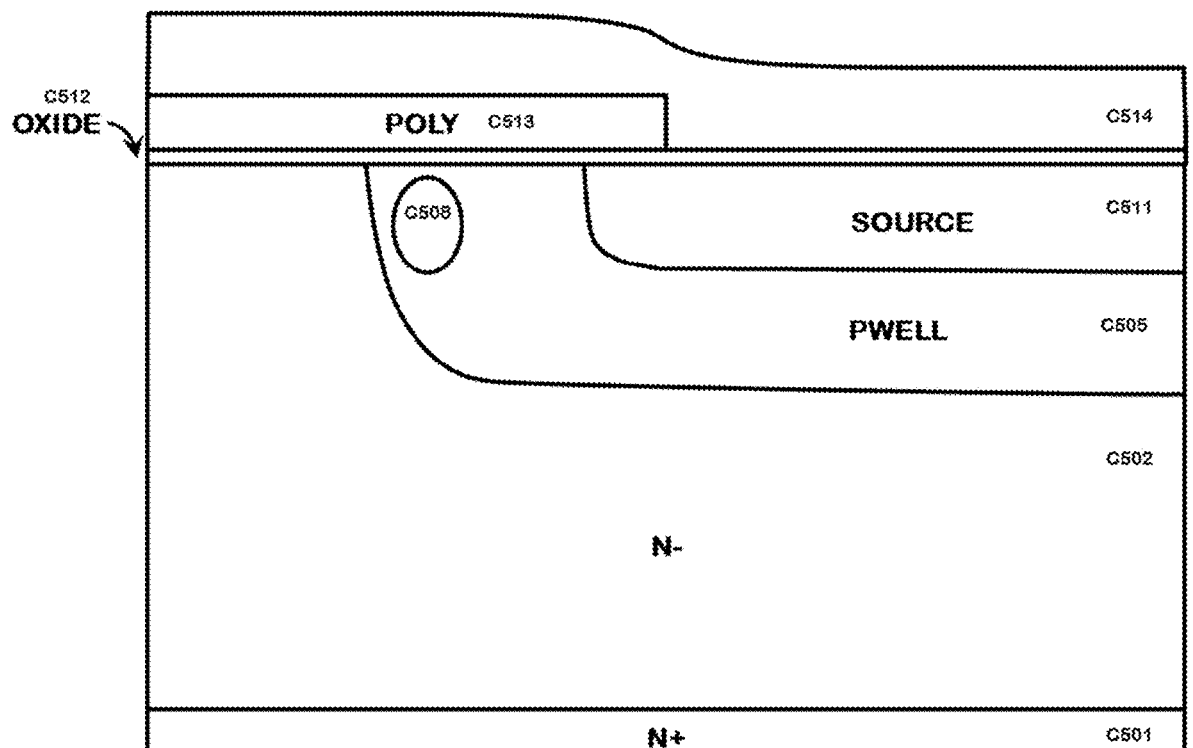
Figure 26R:
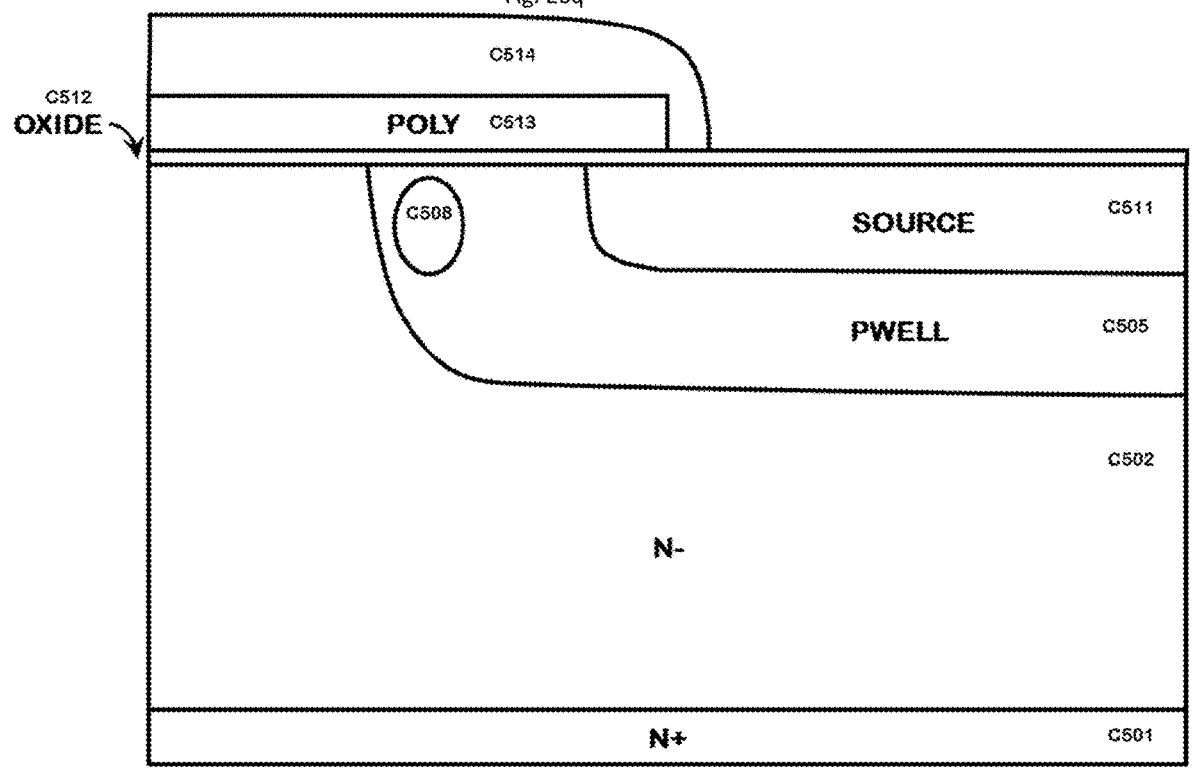
Figure 26S:
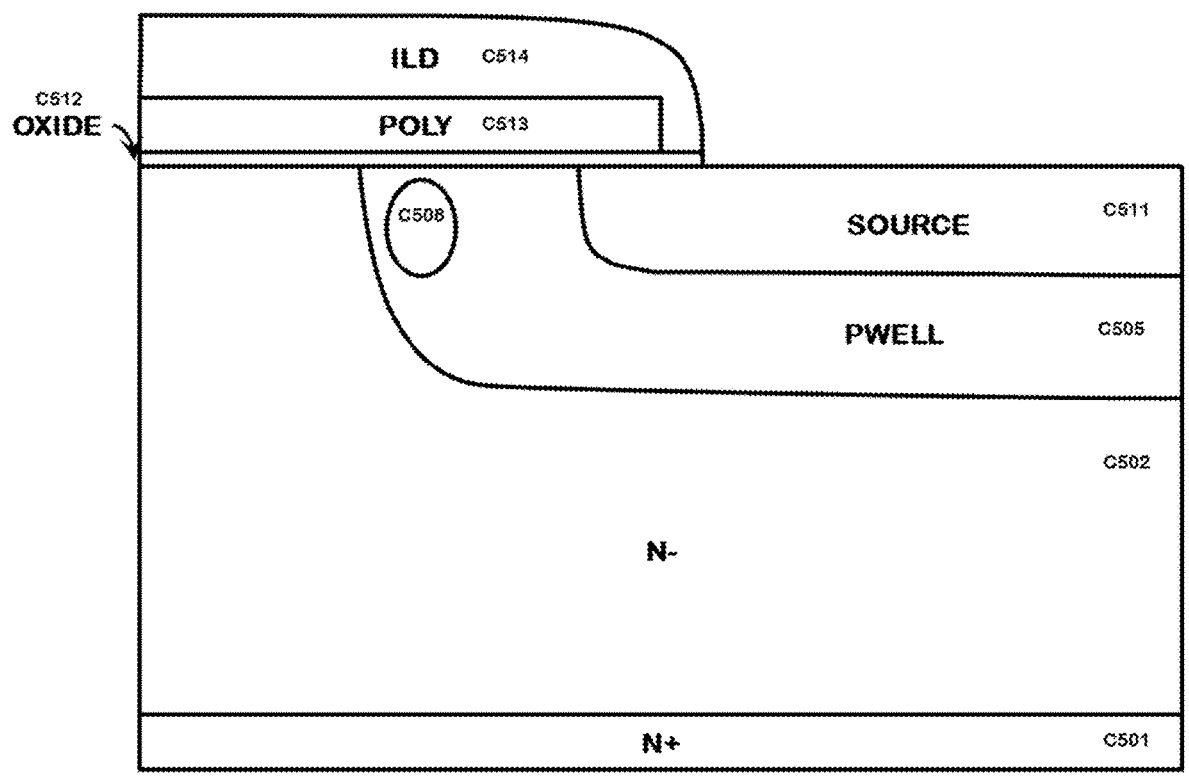
Figure 26T:
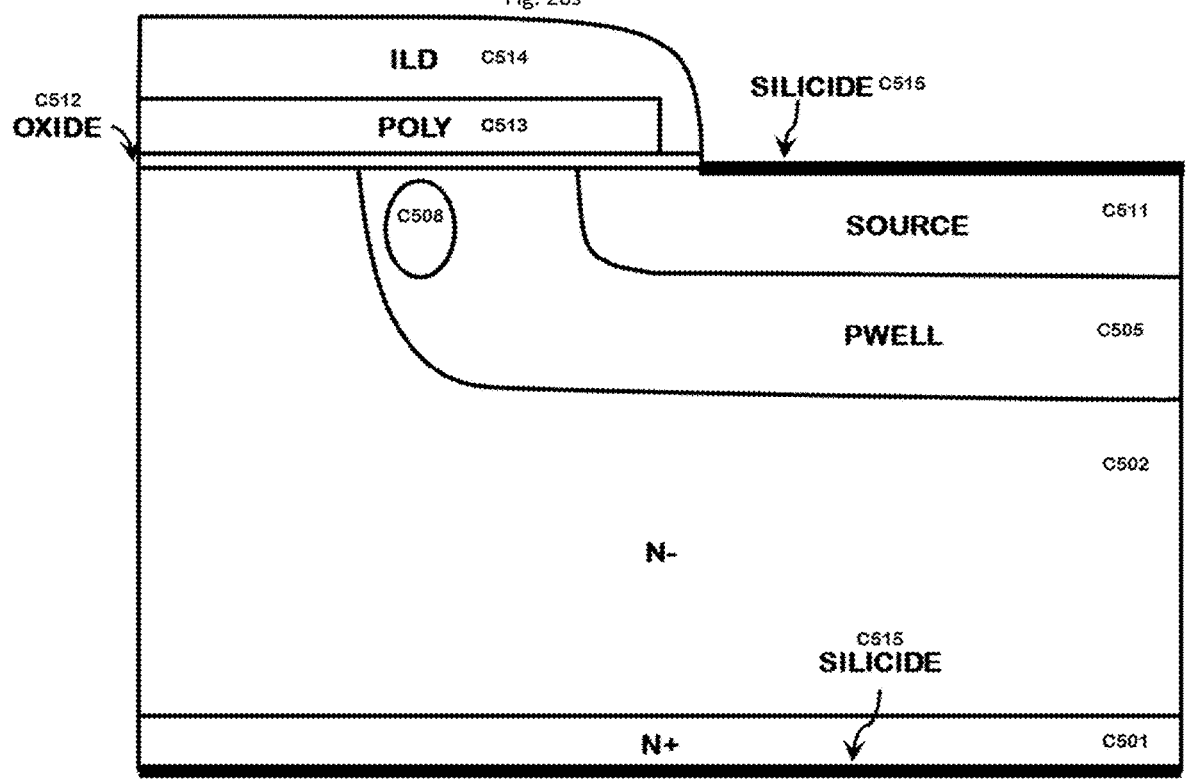
Figure 26U:
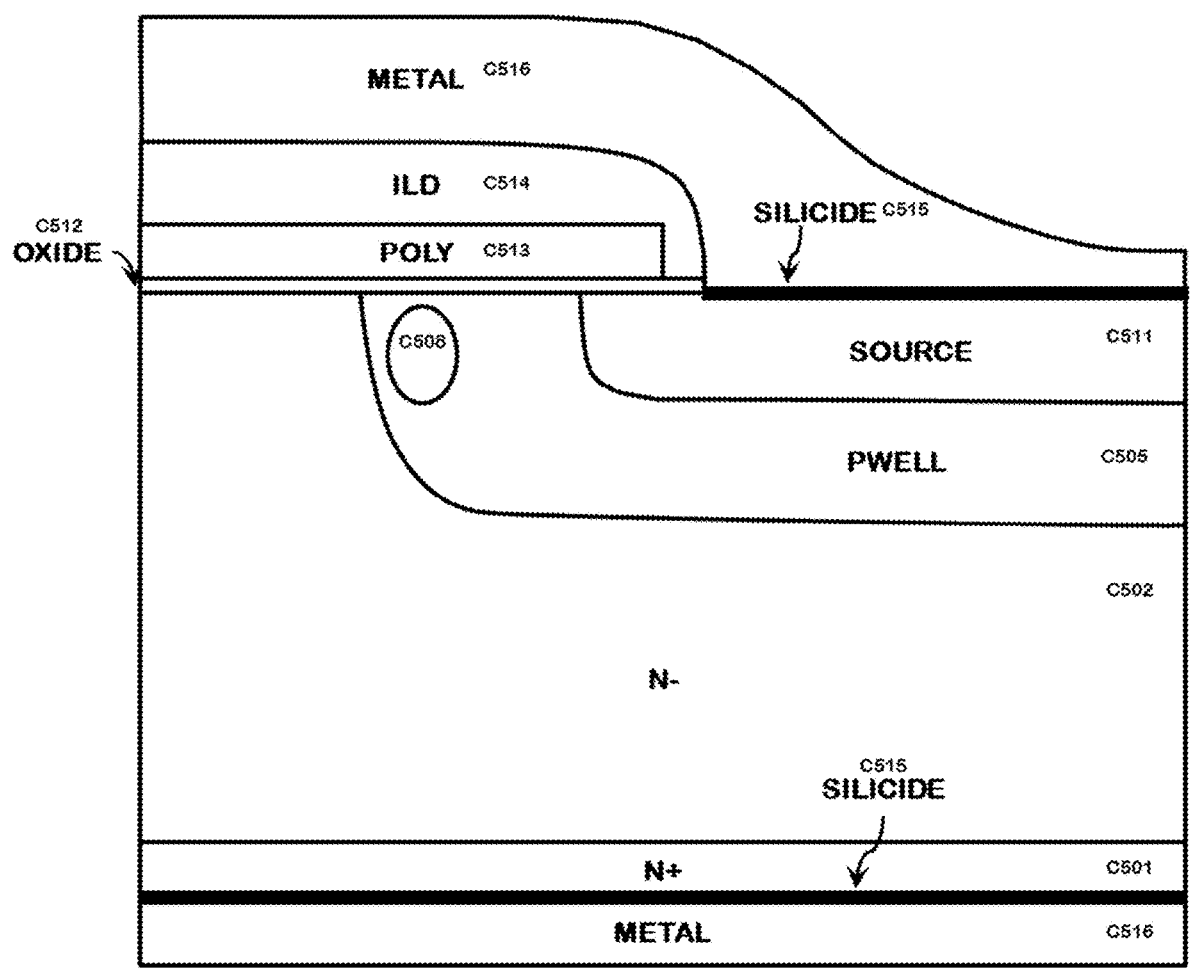

FIG. 26a to FIG. 26u describes the process of manufacturing the structure shown in FIG. 25a. The manufacturing process for a SiC DMOSFET is on a SiC substrate C501 and starts with using a 4H-SiC Si-face epi-wafer with suitable doping ($10^{14}$-$10^{18}$ cm$^{-3}$) and thickness (1 µm to 300 µm) for the epilayer C502 shown in FIG. 25a. A blanket hard mask C503 comprising a chemical vapor deposition (CVD) deposited layer of silicon dioxide, silicon nitride, silicon oxynitride, or a metallic layer such as nickel, with thickness ranging from 50 nm to 5 µm is deposited in FIG. 26b and then patterned using photolithography followed by a dry etch using reactive ion etching (ME) for example as shown in FIG. 26c. Then p-well region is first formed by ion-implantation or epitaxial growth using aluminum or boron as the p-type impurity. A p-type implantation C504 comprising boron or aluminum, at energies ranging from 10 keV to 1000 keV, at implant doses ranging from $10^{12}$ cm$^{-2}$ to $10^{15}$ cm$^{-2}$ is performed to create a p-well C505 in FIG. 26d. The patterned mask layer C503 is removed in FIG. 26e.

A hard mask layer C506 is deposited by a CVD deposited layer of silicon dioxide, silicon nitride, silicon oxynitride, or a metallic layer such as nickel, with thickness ranging from 50 nm to 5 µm in FIG. 26f. The mask layer C506 is patterned using photolithography followed by a dry etch using ME for example in FIG. 26g.

A p-type implant C507 is done in FIG. 26h for creating a p-type region inside the p-well called p-shield C508. The p-shield region C508 can be formed using aluminum or boron as the p-type impurity. A p-shield region is formed buried within the p-well structure. In other words, the p-shield is formed beneath the SiC surface, where the MOSFET channel is located. The p-shield region always originates within the p-well region. The location of the p-shield region, which is controlled by careful adjustment of the implant energies used for realizing the p-shield region.

The p-shield region may be created by a p-type ion-implantation step comprising boron or aluminum, at energies ranging from 25 keV to 800 keV, at implant doses ranging from $10^{12}$ cm$^{-2}$ to $10^{15}$ cm$^{-2}$. The patterned mask layer C506 is removed in FIG. 26i.

A blanket hard mask C509 comprising a chemical vapor deposition (CVD) deposited layer of silicon dioxide, silicon nitride, silicon oxynitride, or a metallic layer such as nickel, with thickness ranging from 50 nm to 5 µm is deposited in FIG. 26j and then patterned using photolithography followed by a dry etch using RIE for example as shown in FIG. 26k.

A N+ source region C511 is formed by ion-implantation or by epitaxial re-growth by a n-type impurity such as nitrogen or phosphorus C510 in FIG. 26l. The patterned mask layer C509 is removed in FIG. 26m.

The oxide layer C512 which is the gate oxide is formed by thermal oxidation or using CVD of a dielectric layer such as silicon dioxide, silicon nitride, silicon oxynitride, etc. in FIG. 26n. The thickness of the gate oxide could range from 10 nm to 100 nm. Either dry or wet thermal oxidation could be used for oxide growth. Plasma-enhanced chemical vapor deposition (PECVD) or low-pressure chemical vapor deposition (LPCVD) could be used for gate oxide deposition. A polysilicon gate layer C513 is then deposited in FIG. 26o. The polysilicon layer may be deposited using PECVD or LPCVD. The polysilicon layer may be degenerately doped using boron or phosphorus, either in-situ or in a subsequent step. In-situ doping may be performed by the addition of PH3 precursor to the polysilicon deposition chemistry. Post-deposition doping of polysilicon may be performed by depositing a layer of POCl$_3$ followed by a drive-in step at temperatures ranging from 700-900° C. The polysilicon layer C513 is patterned in FIG. 26p. An ILD layer C514 comprising 50 nm-1000 nm thick silicon dioxide, silicon nitride, silicon oxynitride layers or a stacked combination thereof is deposited on the wafer in FIG. 26q. The ILD layer C514 is patterned in FIG. 26r. The gate oxide C512 is patterned in FIG. 26s.

Nickel silicide regions C515 are formed on the exposed SiC surface in FIG. 26t. Interconnect metal layers C516 of either aluminum or silver or gold is deposited and patterned on the top and bottom of the substrate in. FIG. 26u.

Figure 27A:
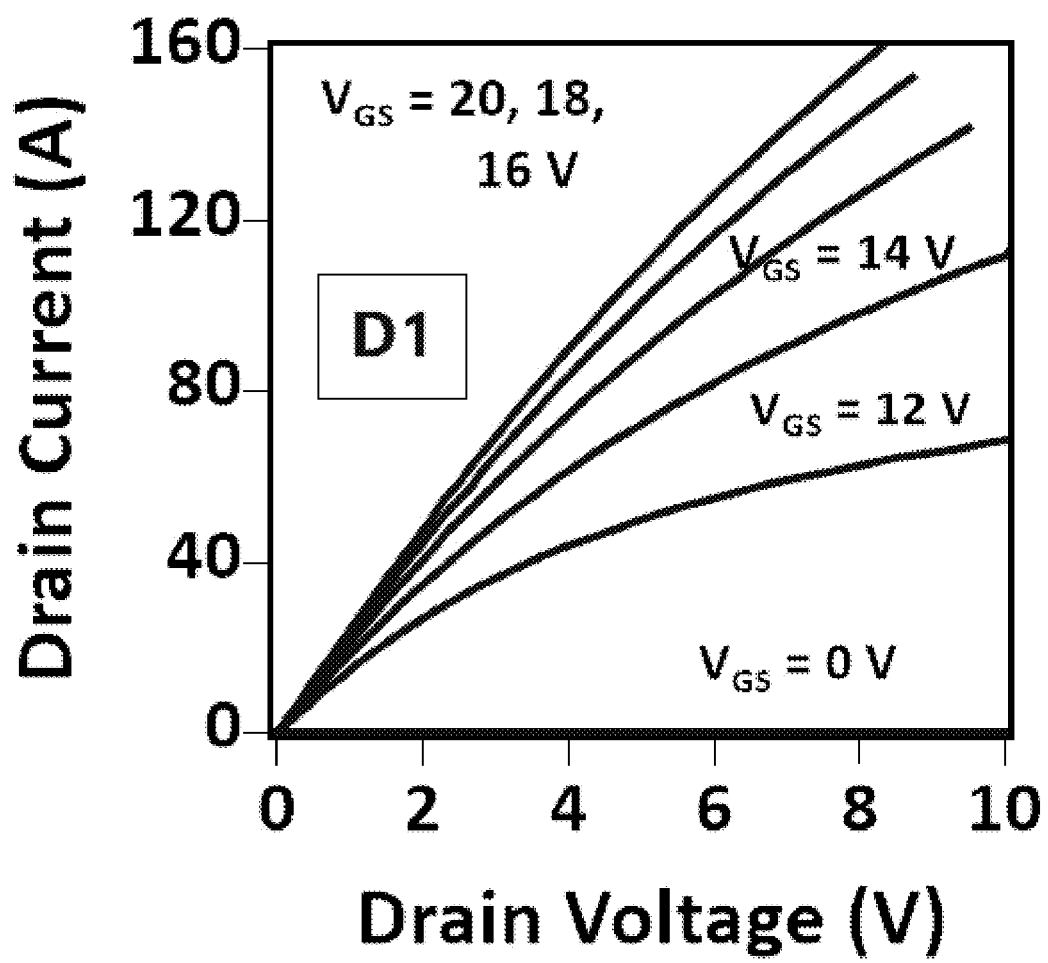
FIG. 27a and FIG. 27b are output characteristics of two 3.3 kV SiC MOSFETs fabricated using the teachings of these inventions.
Figure 27B:
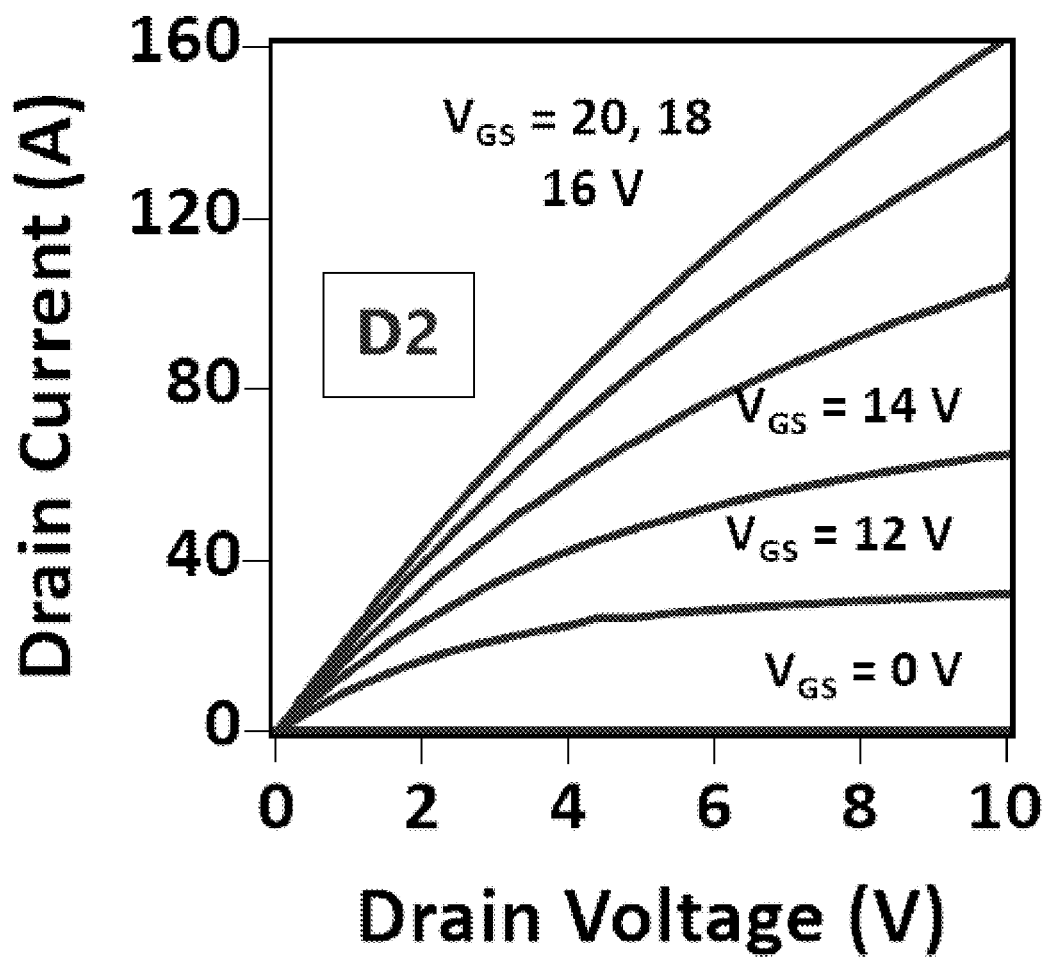

FIG. 27a and FIG. 27b are output characteristics of two 3.3 kV SiC MOSFETs fabricated using the teachings of this invention are shown. The FIG. 27a device features a gate threshold voltage of 2.5 V, while the FIG. 27b device features a gate threshold voltage of 3.8 V. The higher gate threshold voltage is achieved by employing the novel non-uniformly doped channel concept introduced in this invention. A 156% increase of gate threshold voltage is achieved for only a 11% increase of on-resistance (Vgs=20 V), by using the device design concepts introduced in this invention.

Figure 27C:
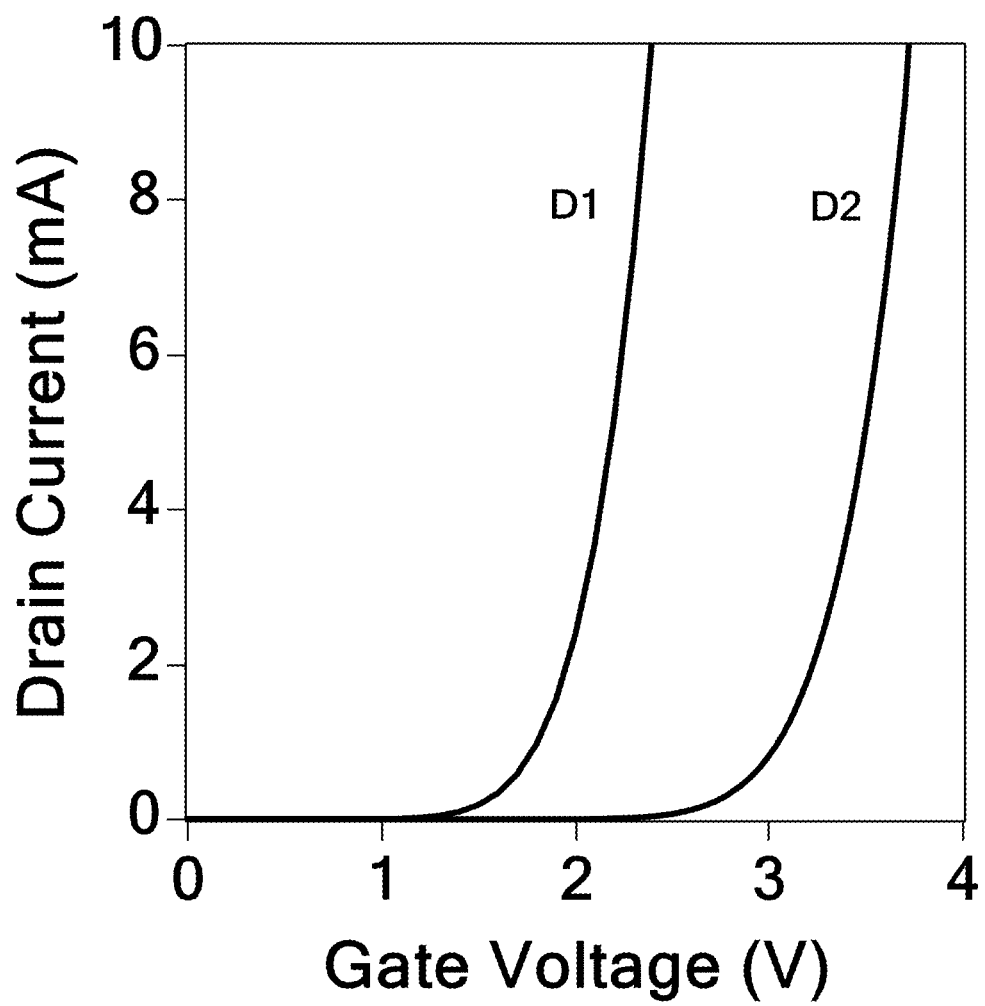
FIG. 27c is transfer characteristics of two 3.3 kV SiC MOSFETs fabricated using the teachings of these inventions.

FIG. 27c is transfer characteristics of two 3.3 kV SiC MOSFETs fabricated using the teachings of these inventions.

Figure 27D:
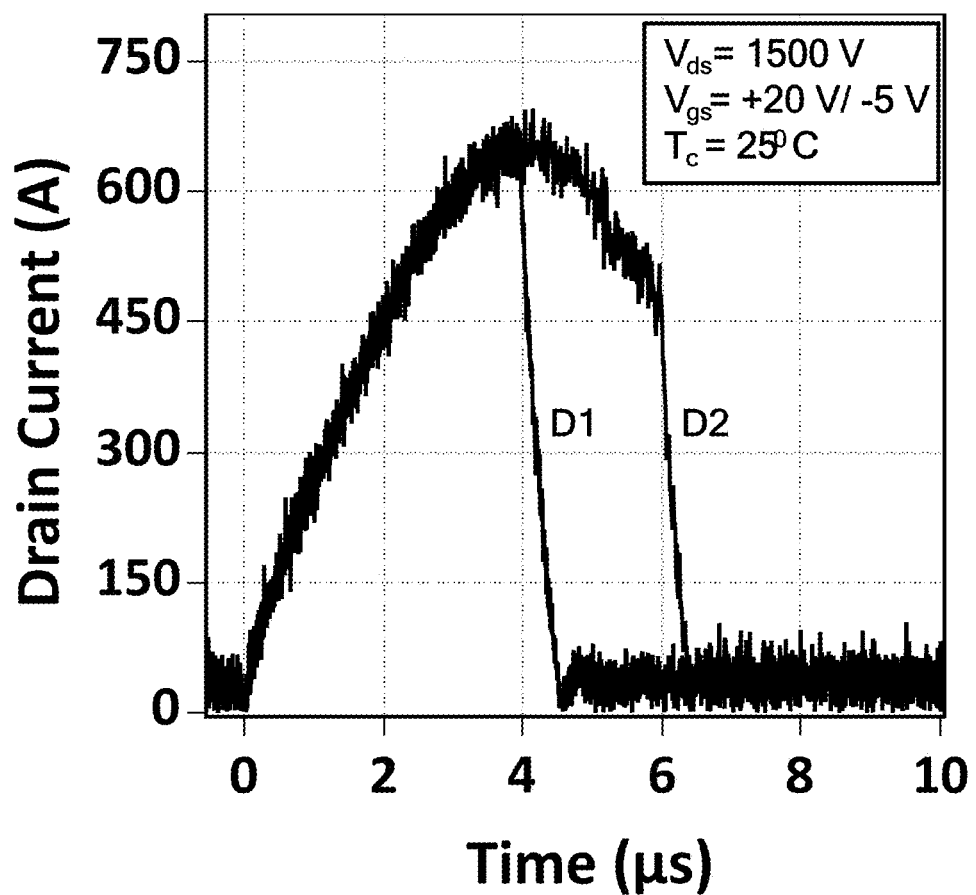
FIG. 27d is a short-circuit test measured for two 3.3 kV SiC MOSFETs fabricated using the teachings of this invention.

FIG. 27d is a short-circuit test measured for two 3.3 kV SiC MOSFETs fabricated using the teachings of this invention.

Other embodiments are also within the scope of the following claims.

Although, various embodiments which incorporate the teachings described in detail herein, those skilled in the art can readily devise many other varied embodiments that still incorporate these teachings. For example, a complementary SiC MOSFET device with a P+ substrate, P− drift layer and P+ source can be created in a N-well region. The embodiments described are all applicable to the complementary MOSFET as well.

In the embodiments and claims herein, the terms "first conductivity type region" and "second conductivity type region" are used to describe n-type and p-type regions respectively for a N type device. For a P type device "first conductivity type region" and "second conductivity type region" are used to describe p-type and n-type regions respectively.

All documents (patents, patent publications or other publications) mentioned in the specification are incorporated herein in their entirety by reference.

The invention claimed is:

1. A device comprising a unit cell on a SiC substrate, the unit cell comprising:
a gate insulator film,
a trench in a well region,
a first sinker region having a second conduction type, wherein the first sinker region has a depth that is equal to or greater than a depth of the well region, and
a second sinker region having the second conduction type;
wherein each of the first sinker region and the second sinker region is in contact with a region having a first conduction type to form a p-n junction.

2. The device of claim 1, wherein the device comprises a semiconductor metal-insulator-semiconductor transistor component.

3. The device of claim 1, wherein the well region is next to an insulator-semiconductor interface; and a source region of the first conduction type formed within the well region.

4. The device of claim 3, wherein a depth of the trench is greater than or equal to a thickness of the source region.

5. The device of claim 1, wherein the first sinker region is located below the trench.

6. The device of claim 1, wherein a depth of the second sinker region is less than a depth of the first sinker region.

7. The device of claim 1, wherein a depth of the second sinker region is greater than a depth of the well region.

8. The device of claim 1, wherein the device has an on-resistance of less than 4 milliohm centimeter squared, a gate threshold voltage of greater than 1.5 Volt, a breakdown voltage of greater than 500 Volt, and an electric field of less than 3.5 megavolt per cm in the gate insulator film.

9. A device comprising a unit cell on a SiC substrate, the unit cell comprising:
a gate insulator film, a trench in a well region,
a first sinker region of a second conduction type,
a second sinker region of the second conduction type, and
a source region;
wherein the source region is in direct contact with the second sinker region.

10. The device of claim 9, wherein the device comprises a semiconductor metal-insulator-transistor component.

11. The device of claim 9, wherein the unit cell further comprises a semiconductor body of a first conduction type that comprises a drift zone; the well region of the second conduction type next to an insulator-semiconductor interface; and a source region of the first conduction type formed within the well region.

12. The device of claim 11, wherein a depth of the trench is greater than or equal to a thickness of the source region.

13. The device of claim 9, wherein a depth of the trench is greater than a depth of the source region.

14. The device of claim 9, wherein the device has an avalanche energy of greater than 10 Joule per centimeter squared, calculated by dividing an avalanche energy in Joules by a total die area in centimeter squared.

15. The device of claim 9, wherein an avalanche failure is located within the unit cell.

16. A device comprising a unit cell on a SiC substrate, the unit cell comprising:
a gate insulator film,
a trench in a well region,
a first sinker region of a second conduction type,
a second sinker region of the second conduction type, and
a source region;
wherein the first sinker region has a depth that is greater than a depth of the second sinker region;
wherein the second sinker has a width that is greater than that of the first sinker.

17. The device of claim 16, wherein the first sinker region is located below the trench.

18. The device of claim 16, wherein a depth of the second sinker region is less than a depth of the first sinker region.

19. The device of claim 16, wherein a depth of the second sinker region is greater than a depth of the well region.

* * * * *